(12) United States Patent
Hatakeyama et al.

(10) Patent No.: US 9,846,360 B2
(45) Date of Patent: Dec. 19, 2017

(54) RESIST COMPOSITION AND PATTERNING PROCESS

(71) Applicant: SHIN-ETSU CHEMICAL CO., LTD., Tokyo (JP)

(72) Inventors: Jun Hatakeyama, Joetsu (JP); Teppei Adachi, Joetsu (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 0 days.

(21) Appl. No.: 15/196,865

(22) Filed: Jun. 29, 2016

(65) Prior Publication Data
US 2017/0003590 A1 Jan. 5, 2017

(30) Foreign Application Priority Data

Jun. 30, 2015 (JP) ................................ 2015-130588

(51) Int. Cl.
| | | |
|---|---|---|
| *G03F 7/004* | (2006.01) | |
| *G03F 7/38* | (2006.01) | |
| *C08F 220/22* | (2006.01) | |
| *C08F 220/18* | (2006.01) | |
| *C08F 220/24* | (2006.01) | |
| *C08F 220/28* | (2006.01) | |
| *G03F 7/20* | (2006.01) | |
| *G03F 7/40* | (2006.01) | |
| *C08F 220/30* | (2006.01) | |
| *H01L 21/027* | (2006.01) | |
| *G03F 7/039* | (2006.01) | |

(52) U.S. Cl.
CPC .......... *G03F 7/0046* (2013.01); *C08F 220/18* (2013.01); *C08F 220/22* (2013.01); *C08F 220/24* (2013.01); *C08F 220/28* (2013.01); *C08F 220/30* (2013.01); *G03F 7/0048* (2013.01); *G03F 7/0397* (2013.01); *G03F 7/2037* (2013.01); *G03F 7/2041* (2013.01); *G03F 7/38* (2013.01); *G03F 7/40* (2013.01); *H01L 21/0274* (2013.01)

(58) Field of Classification Search
CPC ...... G03F 7/0045; G03F 7/0046; G03F 7/039; G03F 7/0392; G03F 7/0297; G03F 7/2041; G03F 7/38; G03F 7/40; G03F 7/2037; C08F 220/22; C08F 220/18; C08F 220/24; C08F 220/28; C08F 220/30; H01L 21/0274

USPC ..... 430/270.1, 322, 325, 330, 331; 526/242, 526/308, 326, 320, 329.4
See application file for complete search history.

(56) References Cited

U.S. PATENT DOCUMENTS

| | | | |
|---|---|---|---|
| 7,531,287 B2 | 5/2009 | Kanda et al. | |
| 7,700,260 B2 * | 4/2010 | Kanna ............... | G03F 7/0046 430/270.1 |
| 7,771,914 B2 | 8/2010 | Hatakeyama et al. | |
| 8,080,363 B2 * | 12/2011 | Kanda ............... | G03F 7/0046 428/482 |
| 8,389,200 B2 * | 3/2013 | Kanna ............... | G03F 7/0046 430/270.1 |
| 8,541,160 B2 * | 9/2013 | Shibuya ............. | G03F 7/0045 430/270.1 |
| 8,841,058 B2 * | 9/2014 | Chang ............... | G03F 7/0046 430/270.1 |
| 8,871,421 B2 * | 10/2014 | Kanda ............... | G03F 7/0046 430/270.1 |
| 9,250,523 B2 | 2/2016 | Hatakeyama et al. | |
| 9,563,125 B2 * | 2/2017 | Masuyama .......... | G03F 7/0045 |
| 2015/0024326 A1 | 1/2015 | Nawrocki et al. | |

FOREIGN PATENT DOCUMENTS

| | | |
|---|---|---|
| JP | 2006-48029 A | 2/2006 |
| JP | 2008-122932 A | 5/2008 |
| JP | 4857208 B2 | 1/2012 |
| JP | 5360065 B2 | 12/2013 |
| JP | 2014-67012 A | 4/2014 |
| WO | 2010/029982 A1 | 3/2010 |

OTHER PUBLICATIONS

Office Action dated Mar. 2, 2017, issued in counterpart Taiwanese Application No. 105120248. (5 pages).

* cited by examiner

*Primary Examiner* — Amanda C Walke
(74) *Attorney, Agent, or Firm* — Westerman, Hattori, Daniels & Adrian, LLP

(57) ABSTRACT

A resist composition is provided comprising (A) a fluorine-containing polymer, (B) a base resin, (C) an acid generator, and (D) a solvent mixture of a first solvent which is a $C_5$-$C_8$ ketone, $C_4$-$C_6$ alcohol, $C_3$-$C_6$ ether or $C_4$-$C_9$ ester and a second solvent which is a lactone ring-containing $C_6$-$C_9$ compound. A pattern is formed by coating the resist composition, prebake, exposure, and development. In immersion lithography, the resist film is improved in water slip. In EB or EUV lithography, outgassing is suppressed and edge roughness is reduced.

13 Claims, No Drawings

RESIST COMPOSITION AND PATTERNING PROCESS

CROSS-REFERENCE TO RELATED APPLICATION

This non-provisional application claims priority under 35 U.S.C. §119(a) on Patent Application No. 2015-130588 filed in Japan on Jun. 30, 2015, the entire contents of which are hereby incorporated by reference.

TECHNICAL FIELD

This invention relates to a resist composition and a pattern forming process for use in the fabrication of microelectronic devices.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and a light source with a shorter wavelength.

Resist materials adapted for KrF excimer laser (248 nm) started use on the 0.3 μm process and entered the mass production phase on the 0.13 μm rule. A wavelength changeover from KrF to shorter wavelength ArF excimer laser (193 nm) is expected to enable miniaturization of the design rule to below 0.13 μm. Since commonly used novolak resins and polyvinylphenol resins have very strong absorption in proximity to 193 nm, they cannot be used as the base resin for resists. To ensure transparency and dry etch resistance, acrylic resins and alicyclic (typically cycloolefin) resins are investigated, leading to mass-scale production of devices by the ArF lithography.

For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the $F_2$ lithography was postponed and instead, the early introduction of ArF immersion lithography was advocated. This enables mass-scale production of 45-nm node devices. For the mass-scale production of 32-nm node devices, the double patterning process utilizing sidewall spacer technology is used although the process suffers from complexity and length.

For the purpose of increasing the throughput of an ArF immersion lithography tool, an attempt is made to increase the scanning rate of the scanner. To this end, it is necessary to improve water slip on the surface of a resist film in contact with immersion water. Patent Documents 1 and 2 disclose a liquid immersion resist composition to which a fluorinated additive is added to increase water repellency on the resist surface. Although a water repellent polymer is mixed with a base resin, acid generator and other components in a resist composition, the polymer will segregate, after spin coating, on the resist surface to improve water repellency. Another advantage of the water repellent polymer is that by virtue of fluoroalcohol groups, it dissolves in alkaline developer, causing few defects after development. To compensate for a lowering of productivity by double patterning, stepper manufacturers make efforts to accelerate the scanning rate of the scanner. It is thus necessary to further improve water slip on the resist surface.

For the fabrication of sub-32-nm node devices, the onset of extreme ultraviolet (EUV) lithography using an exposure wavelength of 13.5 nm which is shorter than the conventional lasers by one order of magnitude and thus featuring improved resolution is expected rather than the double patterning process with noticeable costs.

In the EUV lithography, a low laser power and light attenuation by reflecting mirror lead to a reduced quantity of light. Then light with a low intensity reaches the wafer surface. It is urgently demanded to develop a high-sensitivity resist material in order to gain a throughput despite a low light quantity. However, a trade-off relationship of sensitivity is pointed out that the sensitivity of resist material can be increased at the sacrifice of resolution and edge roughness (LER, LWR).

For the purpose of suppressing outgassing from a resist film during EUV exposure, Patent Document 3 proposes to add a copolymer comprising fluoroalcohol-containing recurring units and aromatic group-containing recurring units to a resist composition. After spin coating, the copolymer will segregate on the resist surface so that the aromatic groups serve to shut out outgassing from the resist film.

Patent Document 4 discloses a resist composition comprising a fluorine-containing polymer, 100 parts by weight of a base resin, and 50 to 200 parts by weight of a lactone compound as a solvent. Exemplary of the lactone compound are γ-butyrolactone, valerolactone, mevalonic lactone, and norbornanelactone.

Patent Document 5 proposes a process of forming a pattern in a resist film having a thickness of up to 200 nm using a lactone compound of 5 to 9 carbon atoms as the solvent. As the resist film becomes thinner, evaporation of the solvent is accelerated, giving rise to phenomena including poor rectangularity and degraded edge roughness. For suppressing rapid evaporation of the solvent, the use of a lactone compound of 5 to 9 carbon atoms having a high boiling point is effective.

CITATION LIST

Patent Document 1: JP-A 2006-048029
Patent Document 2: JP-A 2008-122932 (U.S. Pat. No. 7,771,914)
Patent Document 3: JP-A 2014-067012
Patent Document 4: JP 5360065 (WO 2010/029982)
Patent Document 5: JP 4857208

SUMMARY OF INVENTION

As the feature size is miniaturized, the chemically amplified resist composition suffers from image blurs due to acid diffusion, which lead to a lowering of resolution and an increase of edge roughness. For the purpose of suppressing acid diffusion, artisans make efforts to develop acid generators having a higher molecular weight and polymer-bound acid generators. In most cases, ionic compounds such as sulfonium salts and iodonium salts are used as the acid generator. The problem associated with the acid generators having a higher molecular weight and polymer-bound acid generators is a low solvent solubility.

An object of the invention is to provide a resist composition comprising a base resin, a fluorine-containing polymer, an acid generator, and a solvent, which composition ensures that the acid generator and the fluorine-containing polymer are dissolved, and the fluorine-containing polymer segregates toward the resist film surface, and is successful in further enhancing water slip on the resist film surface in the case of immersion lithography, and in suppressing outgassing and reducing edge roughness (LWR) in the case of EB or EUV lithography; and a pattern forming process using the composition.

The inventors have found that the above object is attained by using a mixture of a first solvent which is a $C_5$-$C_8$ ketone, $C_4$-$C_6$ alcohol having an alkoxy, carbonyl or ester group, $C_3$-$C_6$ ether having a hydroxyl group or two ether groups, or $C_4$-$C_9$ ester having an ether or hydroxyl group, and a second solvent which is a monocyclic lactone ring-containing $C_6$-$C_9$ compound, as the solvent for a resist composition comprising a base resin, a fluorine-containing polymer, and an acid generator. The solvent mixture ensures that both the acid generator and the fluorine-containing polymer are dissolved, and the fluorine-containing polymer segregates toward the resist film surface. In the case of immersion lithography, the resist film is improved in water repellency and water slip on its surface, and in consequence, the scanning rate of the scanner is accelerated, and the throughput is increased. In the case of EB or EUV lithography, since the fluorine-containing polymer effectively segregates on the surface, outgassing from the resist film is significantly suppressed, and edge roughness (LWR) after pattern formation is reduced.

In one aspect, the invention provides a resist composition comprising (A) a fluorine-containing polymer, (B) a base resin adapted to increase its solubility in alkaline developer under the action of acid, (C) an acid generator, and (D) an organic solvent. The solvent is a mixture containing (D-1) a first solvent selected from the group consisting of $C_5$-$C_8$ ketones, $C_4$-$C_6$ alcohols having at least one group selected from alkoxy, carbonyl and ester groups, $C_3$-$C_6$ ethers having a hydroxyl group or two ether groups, and $C_4$-$C_9$ esters having an ether or hydroxyl group, and (D-2) a second solvent which is a monocyclic lactone ring-containing $C_6$-$C_9$ compound. The second solvent is added in an amount of more than 200 parts to 1,000 parts by weight per 100 parts by weight of the base resin.

Preferably, the $C_5$-$C_8$ ketones include cyclohexanone, cyclopentanone, 2-heptanone, and 2-octanone; the $C_4$-$C_6$ alcohols having at least one group selected from alkoxy, carbonyl and ester groups include 3-methoxybutanol, 3-methyl-3-methoxybutanol, 1-methoxy-2-propanol, 1-ethoxy-2-propanol, and diacetone alcohol; the $C_3$-$C_6$ ethers having a hydroxyl group or two ether groups include propylene glycol monomethyl ether, ethylene glycol monomethyl ether, propylene glycol monoethyl ether, ethylene glycol monoethyl ether, propylene glycol dimethyl ether, and diethylene glycol dimethyl ether; and the $C_4$-$C_9$ esters having an ether or hydroxyl group include ethylene glycol monoacetate, propylene glycol monoacetate, propylene glycol monomethyl ether acetate, propylene glycol monoethyl ether acetate, propylene glycol monopropyl ether acetate, propylene glycol monobutyl ether acetate, ethyl lactate, ethyl pyruvate, butyl pyruvate, butyl acetate, pentyl acetate, isopentyl acetate, hexyl acetate, methyl 3-methoxypropionate, ethyl 3-methoxypropionate, ethyl 3-ethoxypropionate, t-butyl acetate, t-butyl propionate, and propylene glycol mono-t-butyl ether acetate.

Preferably, the second solvent is selected from among γ-hexalactone, δ-hexalactone, γ-heptalactone, δ-heptalactone, γ-octalactone, δ-octalactone, and mixtures thereof.

In a preferred embodiment, the fluorine-containing polymer contains an α-trifluoromethylhydroxy group and/or fluorinated hydrocarbon group.

In a more preferred embodiment, the fluorine-containing polymer comprises recurring units having the formula (1) and/or recurring units having the formula (2).

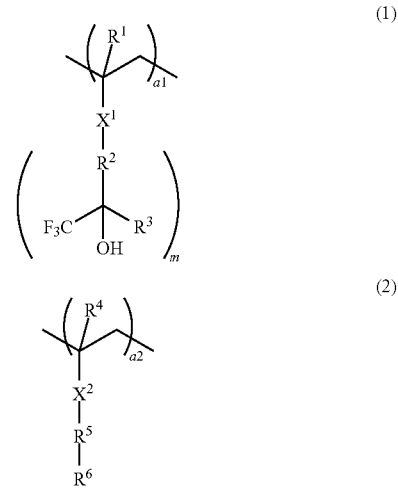

Herein $R^1$ and $R^4$ are each independently hydrogen or methyl; $R^2$ is a single bond, a straight, branched or cyclic $C_1$-$C_{12}$ alkylene group which may contain an ether, ester or carbonyl moiety, or a phenylene group; $R^3$ is hydrogen, fluorine, methyl, trifluoromethyl or difluoromethyl, or $R^3$ may bond with $R^2$ to form a ring which may contain an ether, fluorinated alkylene or trifluoromethyl moiety; $R^5$ is a single bond or a straight, branched or cyclic $C_1$-$C_{12}$ alkylene group which may contain an ether, ester or carbonyl moiety; $R^6$ is a fluorinated, straight, branched or cyclic $C_1$-$C_{10}$ alkyl or phenyl group, which may contain an ether, ester, sulfone, sulfonic acid ester or sulfonamide moiety; m is 1 or 2; in case of m=1, $X^1$ is a single bond, phenylene group, —O—, —C(=O)—O—$R^7$— or —C(=O)—NH—$R^7$—, $R^7$ is a straight, branched or cyclic $C_1$-$C_{10}$ alkylene group which may contain an ester or ether moiety; in case of m=2, $X^1$ is benzenetriyl, —C(=O)—O—$R^8$= or —C(=O)—NH—$R^8$=, $R^8$ is an optionally ester or ether-containing, straight, branched or cyclic $C_1$-$C_{10}$ alkylene group, with one hydrogen atom eliminated; $X^2$ is a single bond, phenylene group, —O—, —C(=O)—O—$R^7$— or —C(=O)—NH—$R^7$—; a1 and a2 are numbers satisfying 0≤a1<1.0, 0≤a2<1.0, and 0.5≤a1+a2≤1.0.

In a preferred embodiment, the base resin comprises recurring units having the formula (7) and/or recurring units having the formula (8).

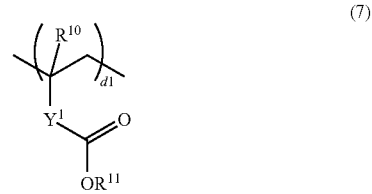

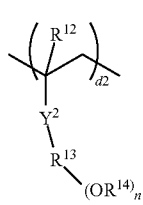

(8)

Herein $R^{10}$ and $R^{12}$ are each independently hydrogen or methyl; $R^{11}$ and $R^{14}$ are each independently an acid labile group; $Y^1$ is a single bond, phenylene, naphthylene or —C(=O)—O—$R^{15}$—, $R^{15}$ is a straight, branched or cyclic $C_1$-$C_{10}$ alkylene group which may contain an ether moiety, ester moiety, lactone ring or hydroxyl moiety, a phenylene group or naphthylene group; $Y^2$ is a single bond, phenylene, naphthylene, —C(=O)—O—$R^{16}$—, —C(=O)—NH—$R^{16}$—, —O—$R^{16}$— or —S—$R^{16}$—, $R^{16}$ is a straight, branched or cyclic $C_1$-$C_{10}$ alkylene group which may contain an ether moiety, ester moiety, lactone ring or hydroxyl moiety; $R^{13}$ is a single bond, a straight, branched or cyclic $C_1$-$C_{16}$ divalent to pentavalent aliphatic hydrocarbon group which may contain an ether or ester moiety, or a phenylene group; d1 and d2 are numbers satisfying 0≤d1<1.0, 0≤d2<1.0, and 0<d1+d2≤1.0, and n is an integer of 1 to 4.

In a preferred embodiment, 0.1 to 15 parts by weight of the fluorine-containing polymer is present per 100 parts by weight of the base resin.

In another aspect, the invention provides a pattern forming process comprising the steps of coating the resist composition defined above onto a substrate, prebaking the composition to form a resist film, exposing the resist film, and developing the exposed resist film.

In a preferred embodiment, the exposure step is to expose the resist film to KrF excimer laser of wavelength 248 nm, ArF excimer laser of wavelength 193 nm, EUV of wavelength 3 to 15 nm, or EB. In a more preferred embodiment, the exposure step is to expose the resist film to ArF excimer laser by immersion lithography.

Advantageous Effects of Invention

The resist composition comprising a fluorine-containing polymer, a base resin, an acid generator, and a solvent mixture ensures that the acid generator and the fluorine-containing polymer are effectively dissolved in the solvent, and that the fluorine-containing polymer segregates on the resist film surface. In the case of immersion lithography, the resist film is improved in water repellency and water slip on its surface, and in consequence, the scanning rate of the scanner is accelerated, and the throughput is increased. The invention is also effective for suppressing leach-out of the acid generator from the resist film in the immersion water and outgassing from the resist film. In the case of EB or EUV lithography involving exposure in vacuum, since the resist film surface is effectively covered with the fluorine-containing polymer, outgassing from the resist film during exposure in vacuum is suppressed, and edge roughness (LWR) after development is reduced.

DESCRIPTION OF PREFERRED EMBODIMENT

The singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group. In chemical formulae, the broken line denotes a valence bond; Me stands for methyl, Ac for acetyl, and Ph for phenyl.

The abbreviations have the following meaning.
EB: electron beam
UV: ultraviolet
EUV: extreme ultraviolet
PAG: photoacid generator
PEB: post-exposure bake
LWR: line width roughness
Resist Composition Briefly stated, the invention provides a resist composition comprising (A) a fluorine-containing polymer, (B) a base resin, (C) an acid generator, and (D) an organic solvent, which are described in detail.

A. Fluorine-Containing Polymer

The fluorine-containing polymer used herein is preferably a polymer comprising recurring units containing an α-trifluoromethylalcohol group and/or fluorinated hydrocarbon group. Preferably, the fluorine-containing polymer is defined as comprising recurring units containing an α-trifluoromethylalcohol group, represented by the formula (1) and/or recurring units containing a fluorinated hydrocarbon group, represented by the formula (2), which are referred to as recurring units (a1) and (a2), respectively.

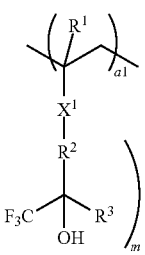

(1)

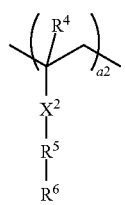

(2)

Herein $R^1$ and $R^4$ are each independently hydrogen or methyl. $R^2$ is a single bond, a straight, branched or cyclic $C_1$-$C_{12}$ alkylene group which may contain an ether, ester or carbonyl moiety, or a phenylene group. $R^3$ is hydrogen, fluorine, methyl, trifluoromethyl or difluoromethyl, or $R^3$ may bond with $R^2$ to form a ring which may contain an ether moiety, fluorinated alkylene moiety or trifluoromethyl moiety. $R^5$ is a single bond or a straight, branched or cyclic $C_1$-$C_{12}$ alkylene group which may contain an ether, ester or carbonyl moiety. $R^6$ is a fluorinated, straight, branched or cyclic $C_1$-$C_{10}$ alkyl or phenyl group, which may contain an ether, ester, sulfone, sulfonic acid ester, or sulfonamide moiety. The subscript m is 1 or 2. In case of m=1, $X^1$ is a single bond, phenylene group, —O—, —C(=O)—O—$R^7$— or —C(=O)—NH—$R^7$—, wherein $R^7$ is a straight, branched or cyclic $C_1$-$C_{10}$ alkylene group which may contain an ester or ether moiety. In case of m=2, $X^1$ is benzenetriyl, —C(=O)—O—$R^8$= or —C(=O)—NH—$R^8$=, wherein $R^8$ is an optionally ester or ether-containing, straight, branched or cyclic $C_1$-$C_{10}$ alkylene group, with one hydrogen atom eliminated. X is a single bond, phenylene group, —O—, —C(=O)—O—$R^7$— or —C(=O)—NH—$R^7$—, a1 and a2 are numbers satisfying 0≤a1<1.0, 0≤a2<1.0, and 0.5≤a1+a2≤1.0. It is noted that the term "fluorinated alkyl" refers to an alkyl group in which at least one carbon-bonded hydrogen atom is substituted by fluorine.

Examples of the monomer from which recurring unit (a1) is derived are given below, but not limited thereto. Notably, $R^1$ is as defined above.

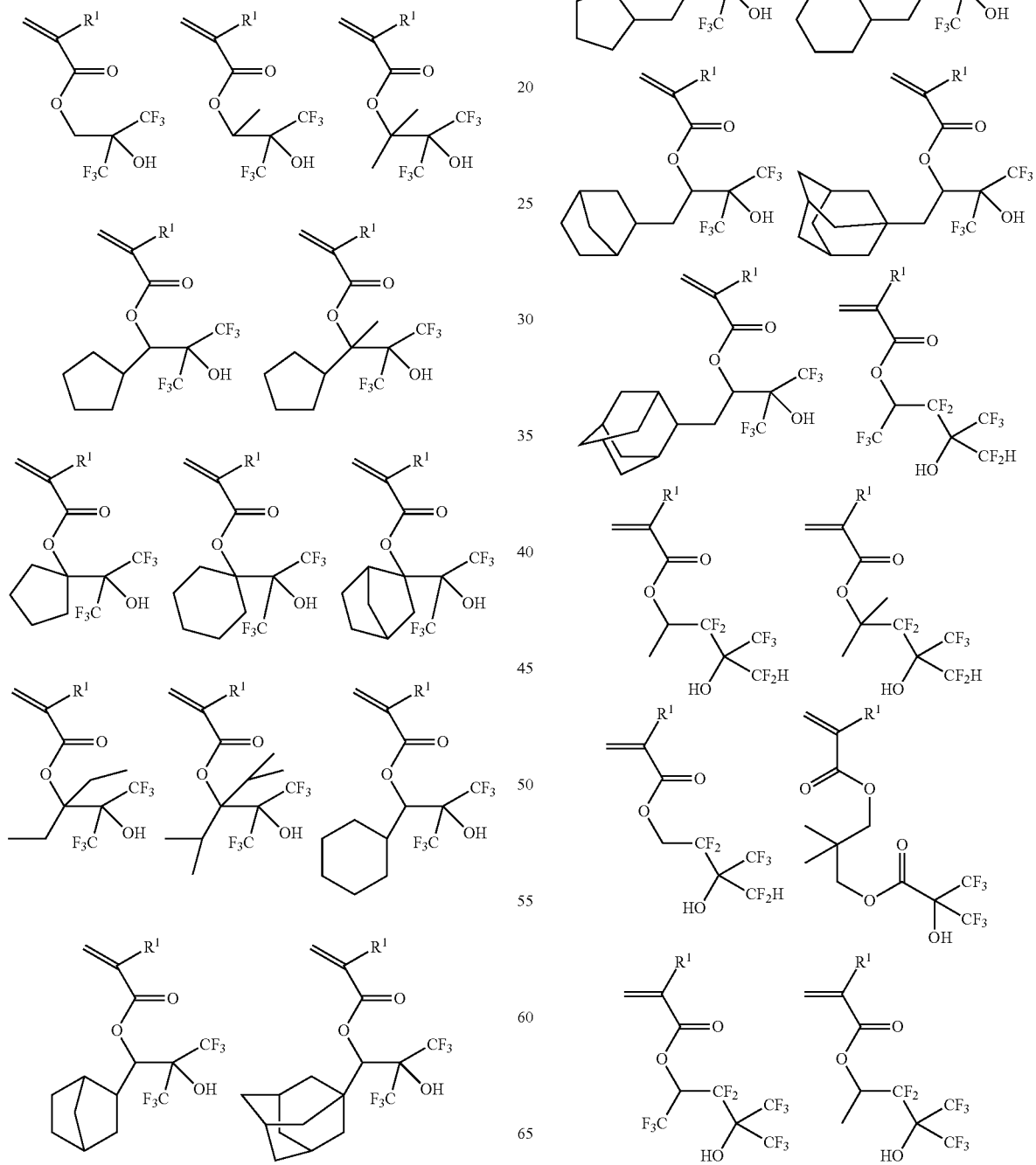

-continued

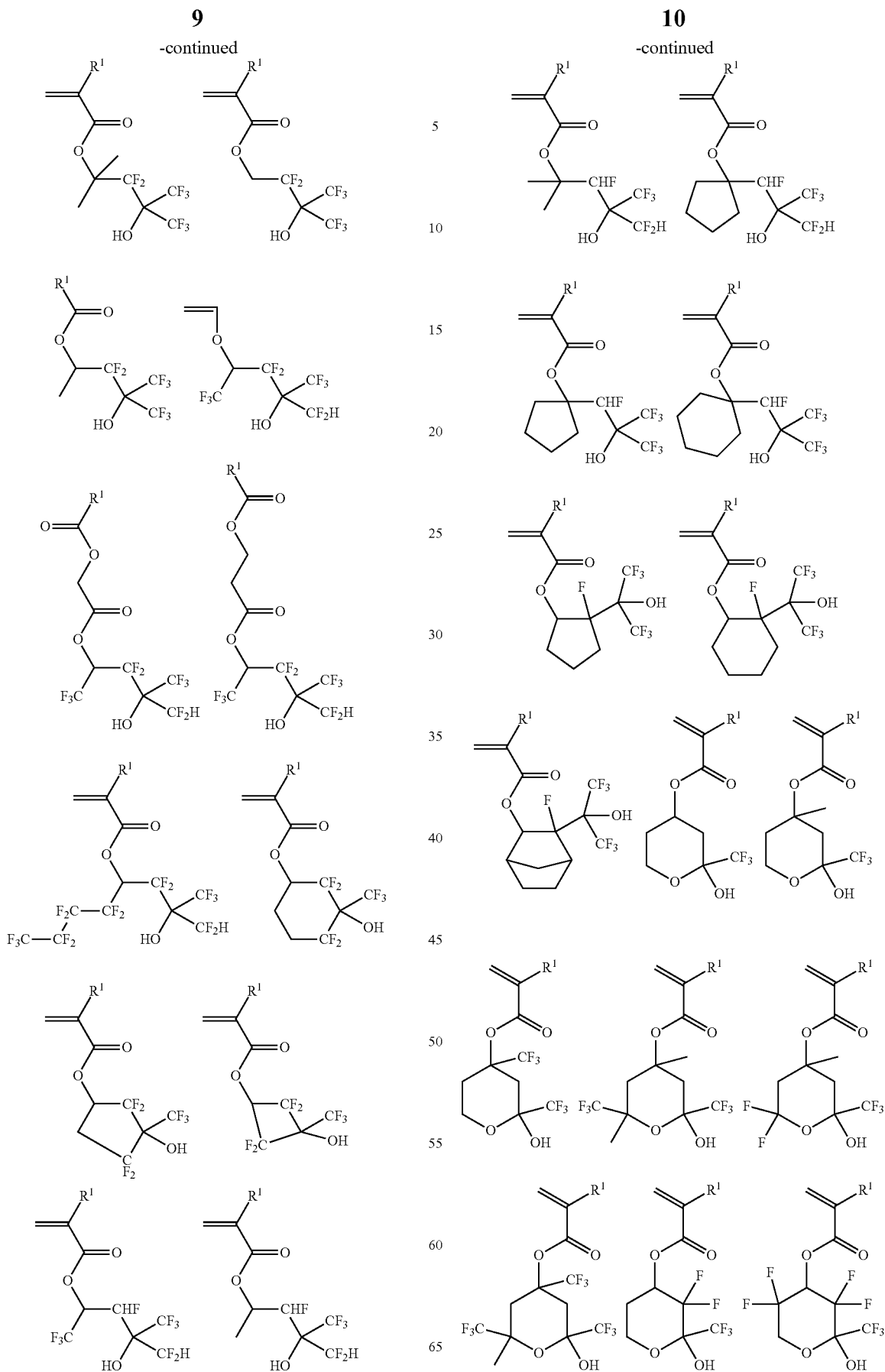

-continued
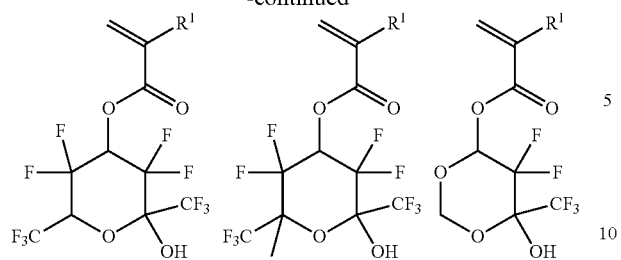
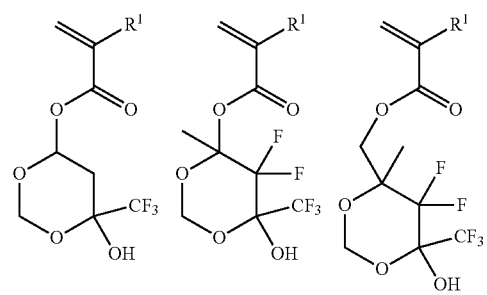
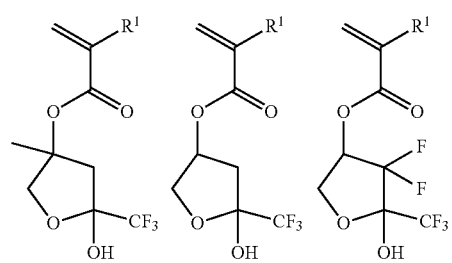
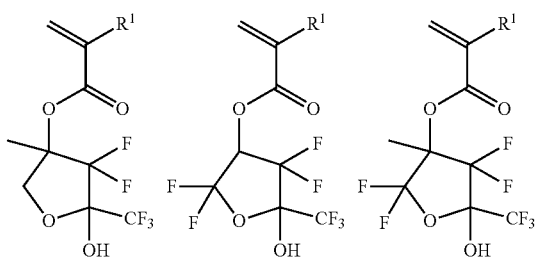
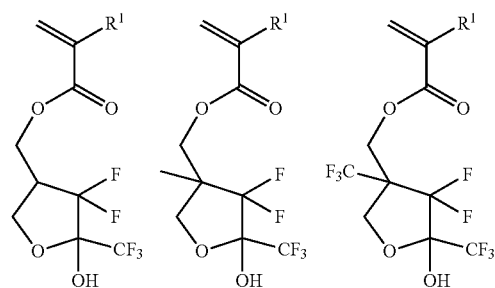
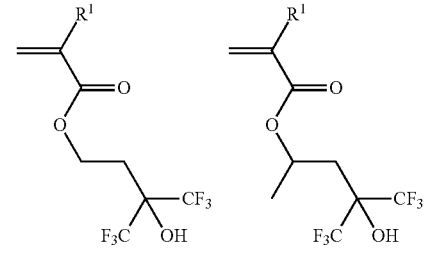
-continued
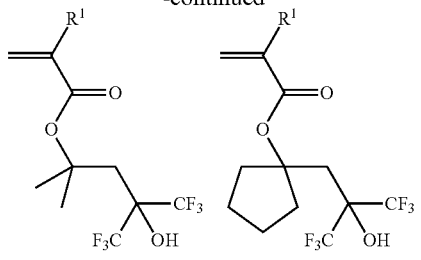
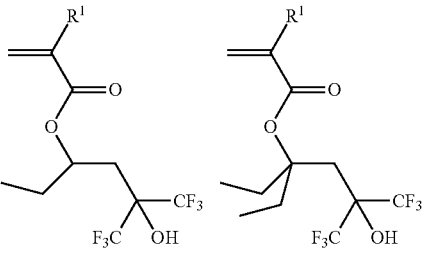
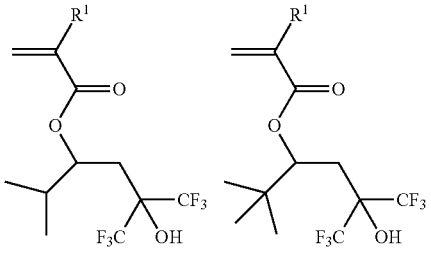
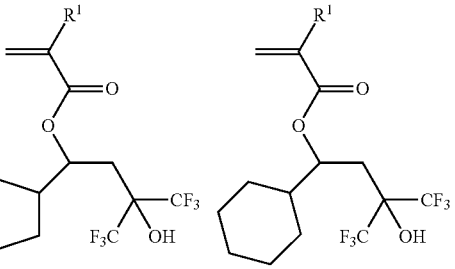
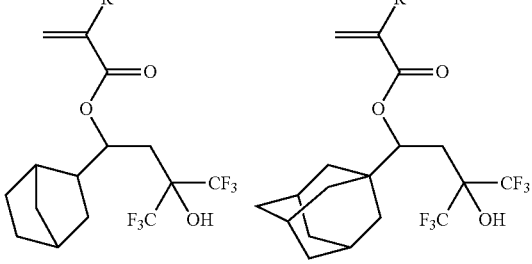
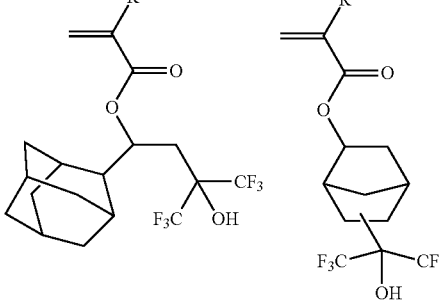

13
-continued
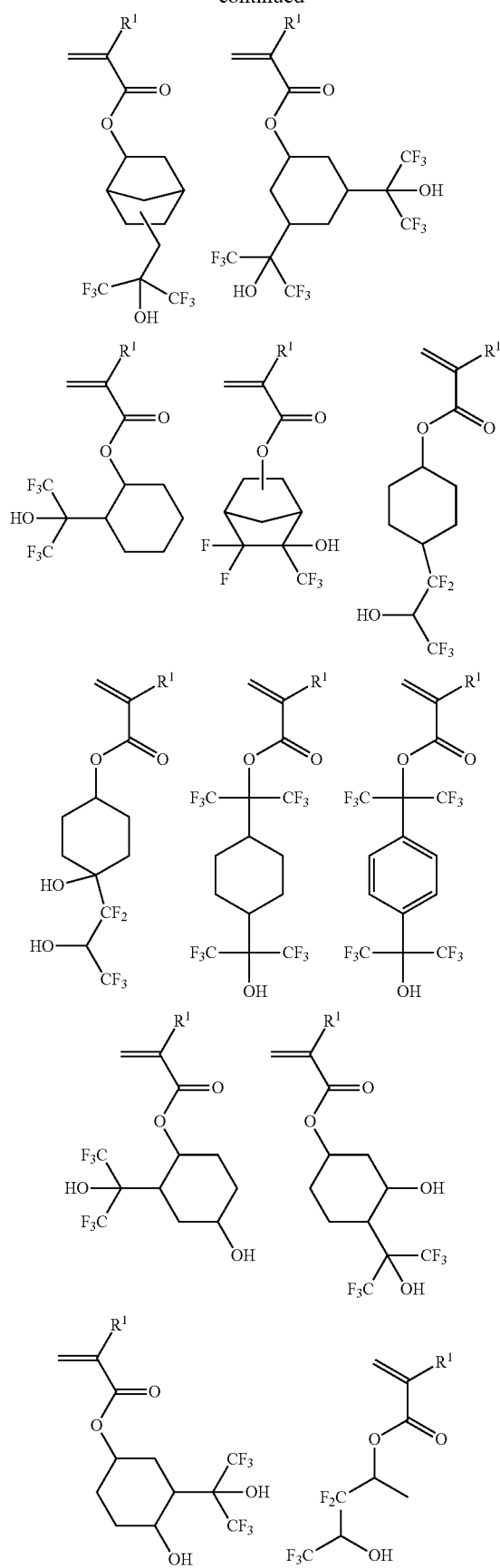
14
-continued
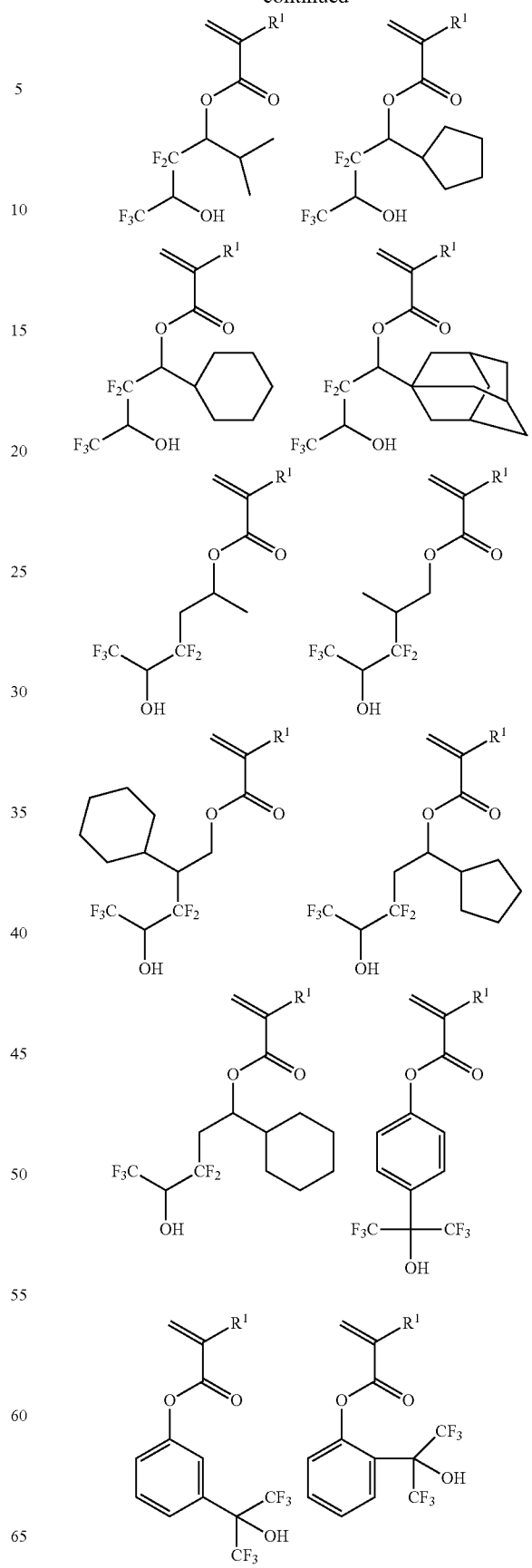

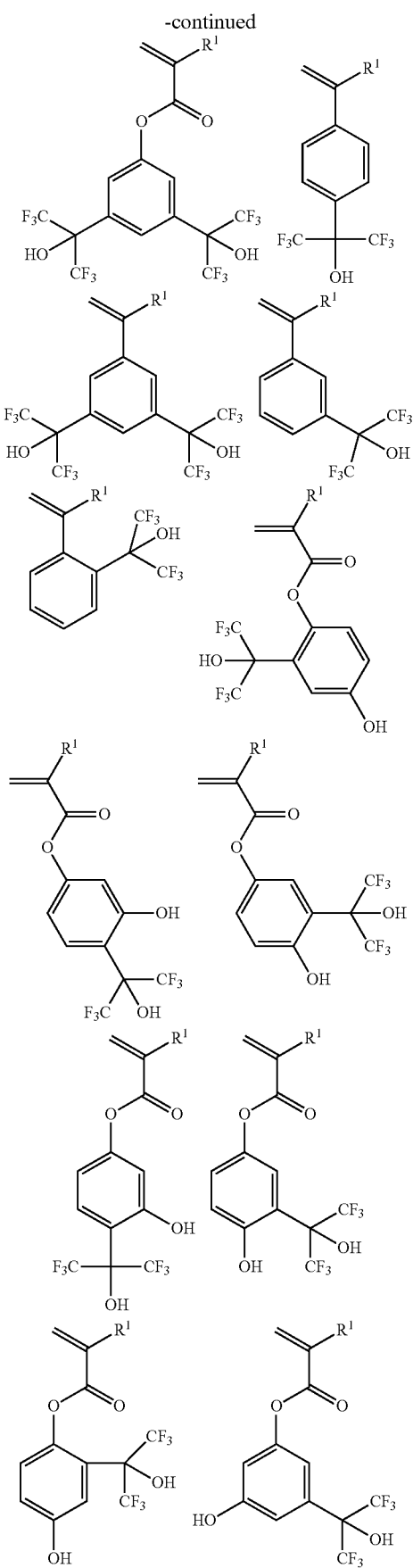
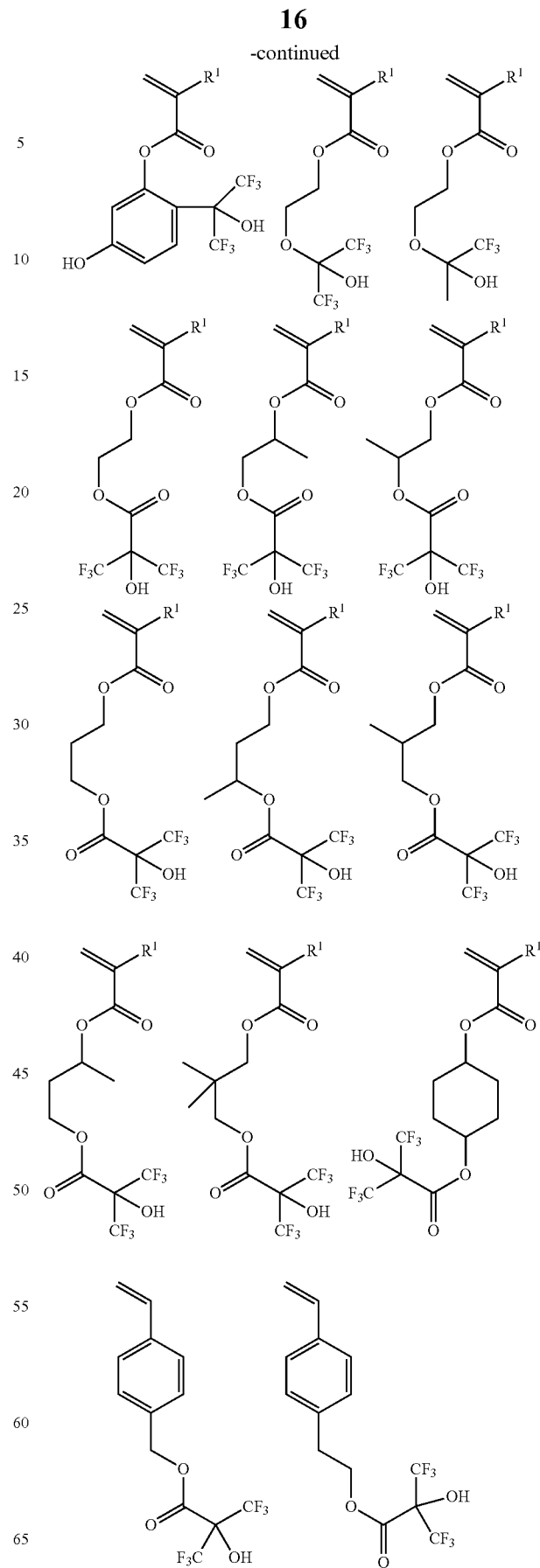

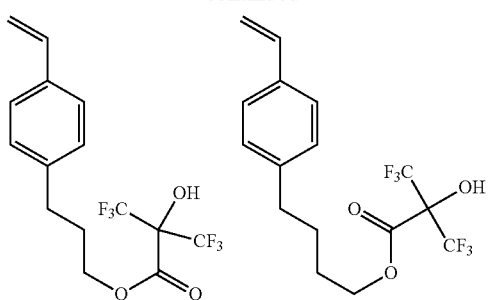
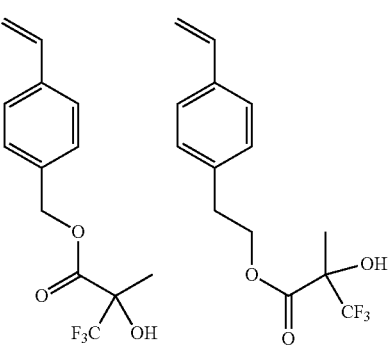
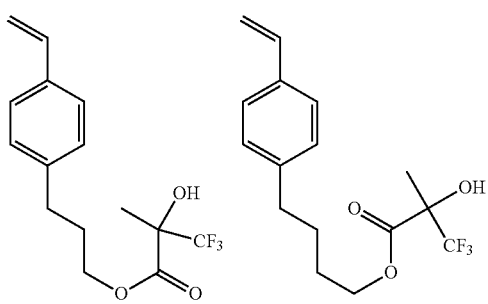
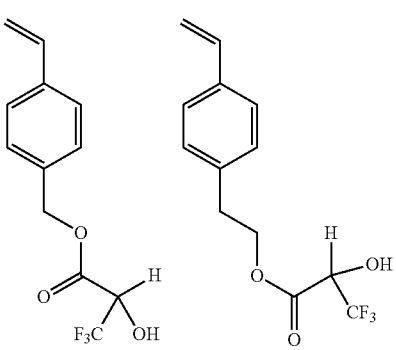
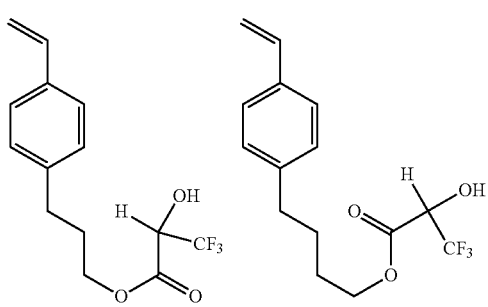
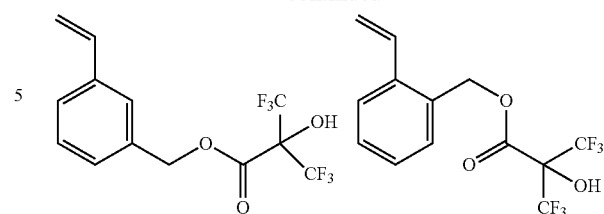
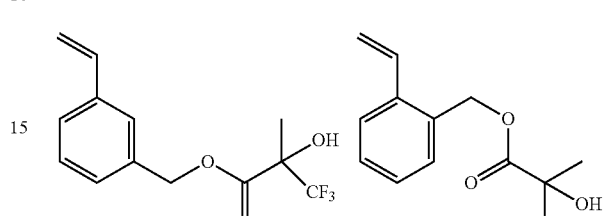
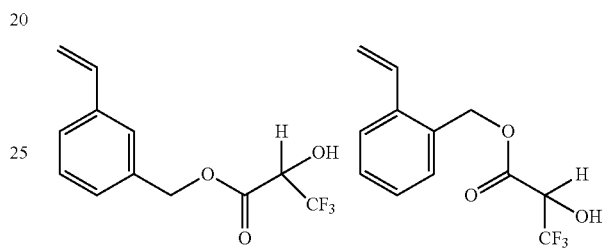
Examples of the monomer from which recurring unit (a2) is derived are given below, but not limited thereto. Notably, $R^4$ is as defined above.
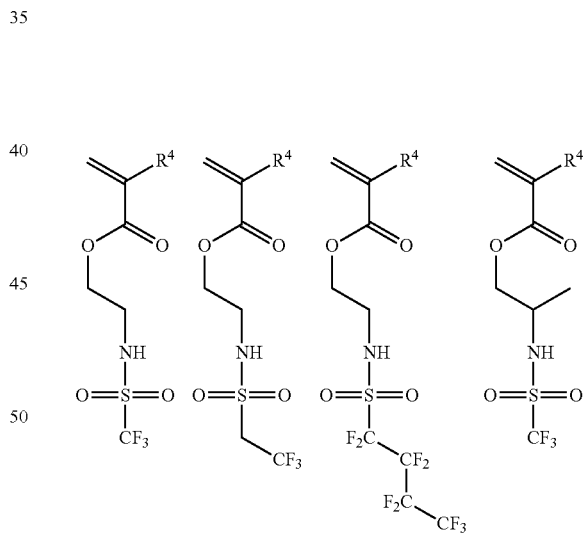
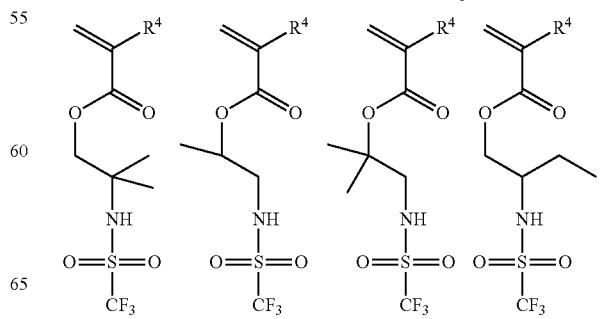

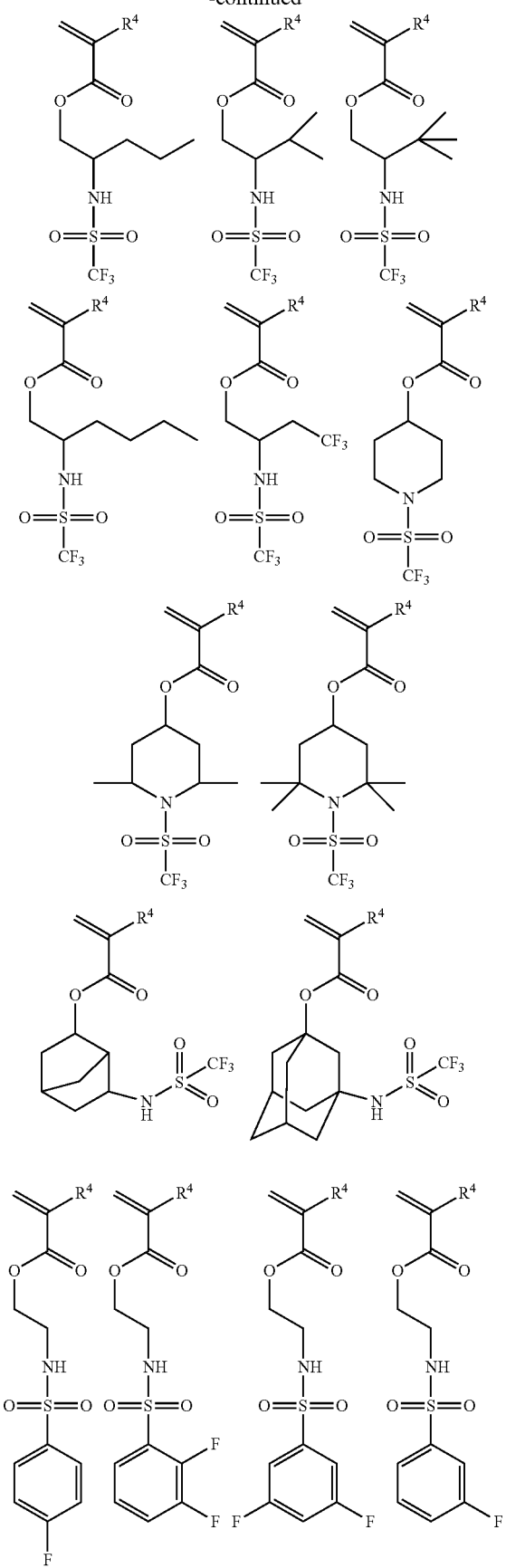
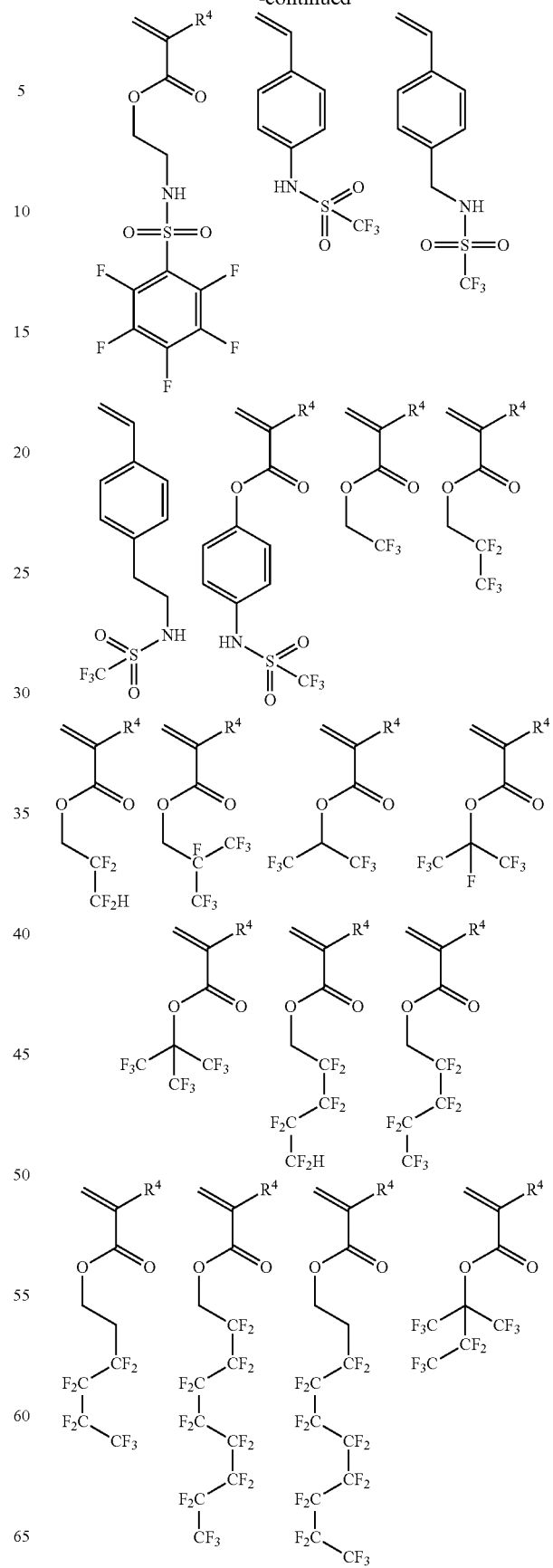

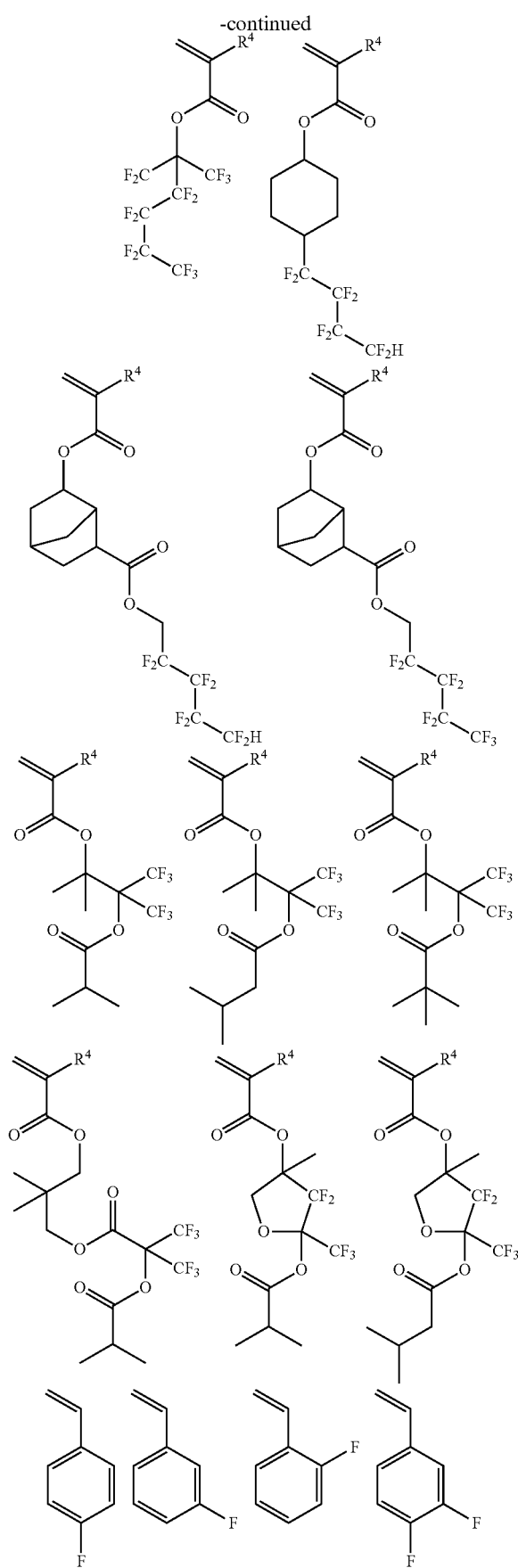
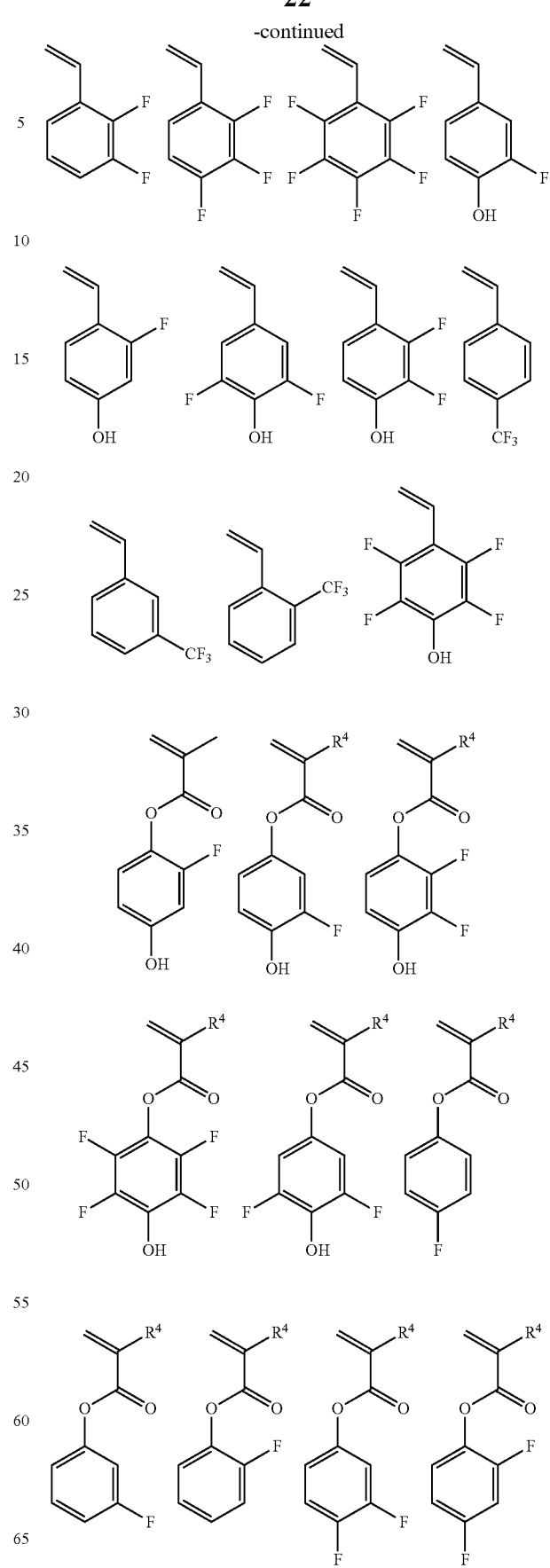

-continued
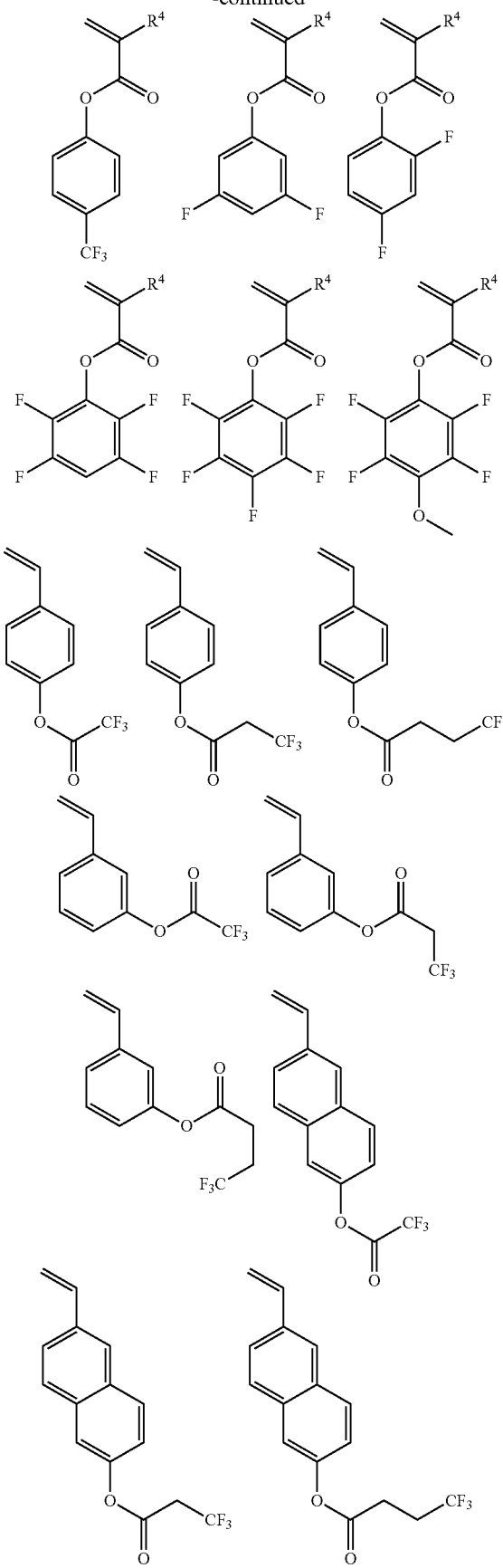
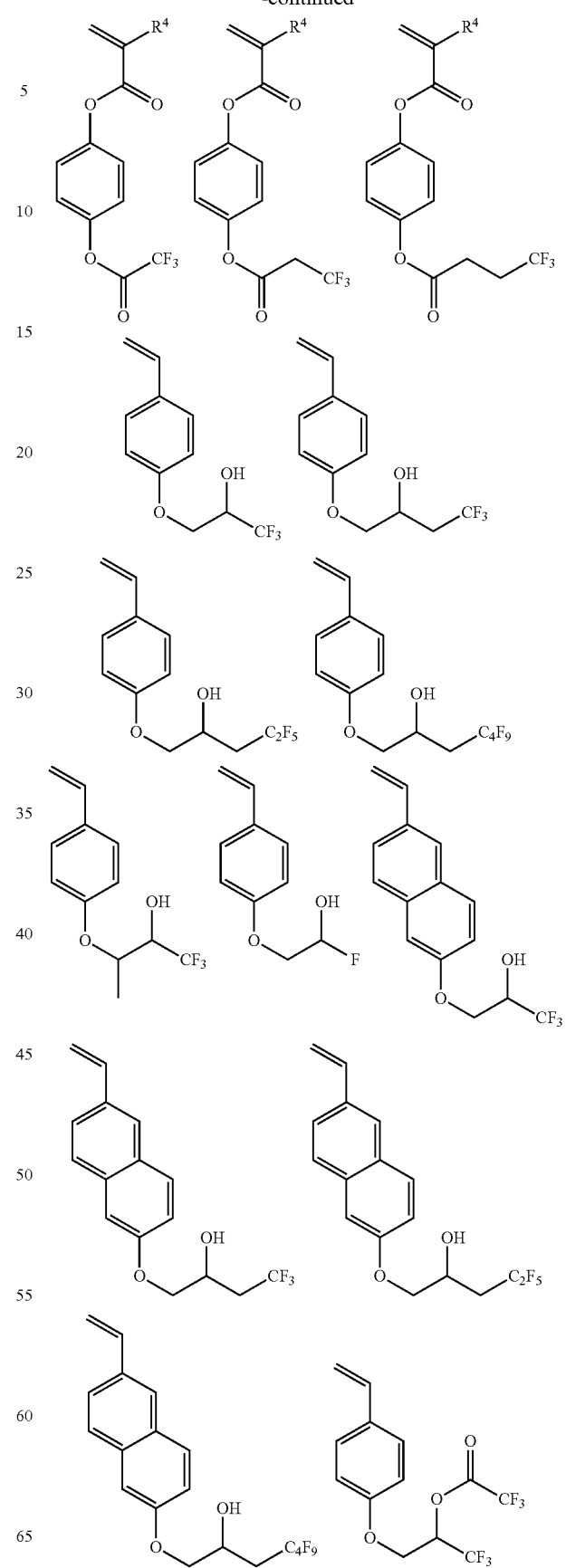

25
-continued
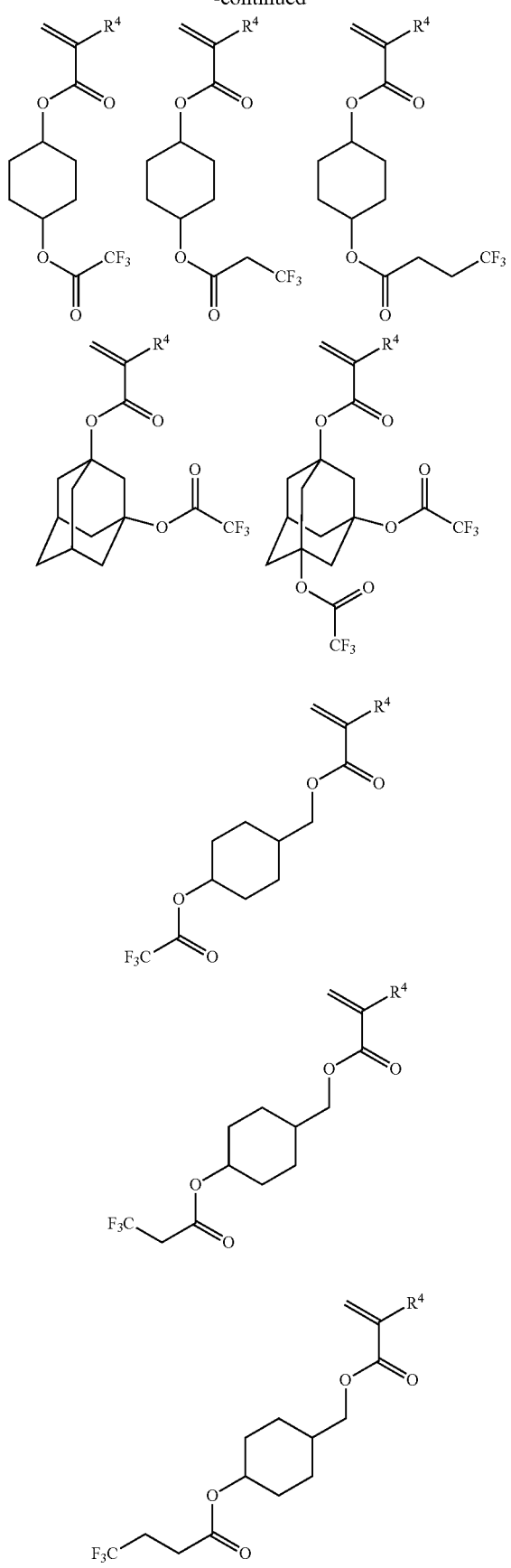
26
-continued
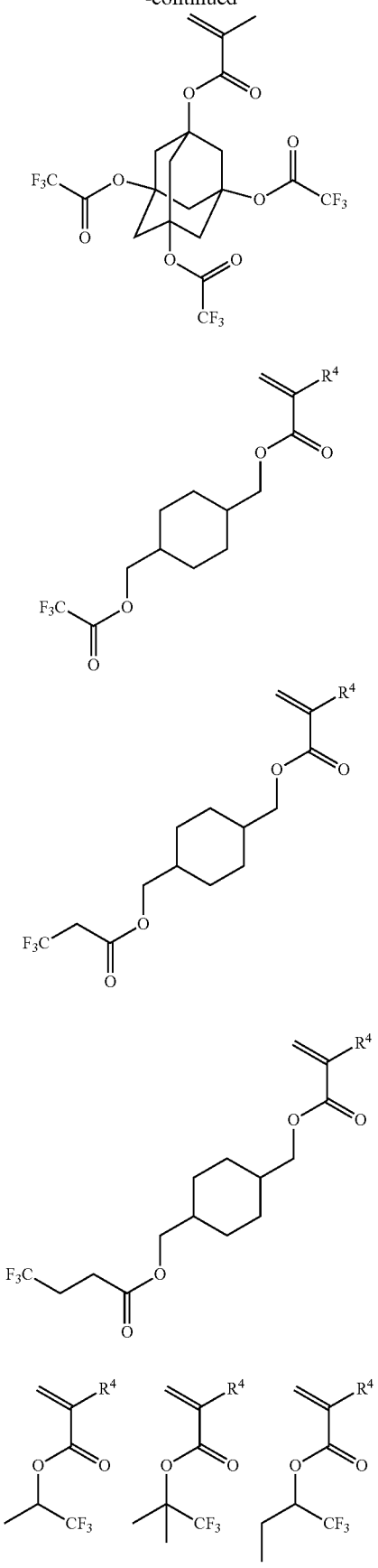

27
-continued
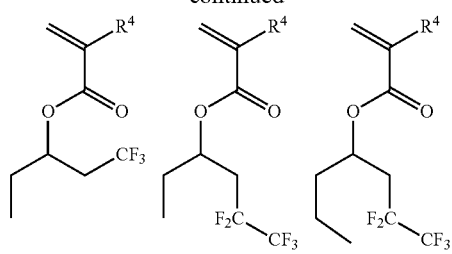
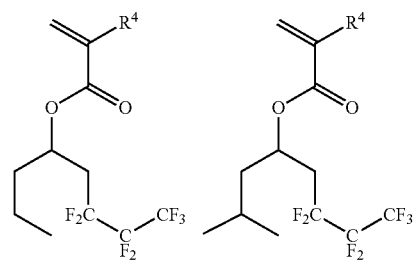
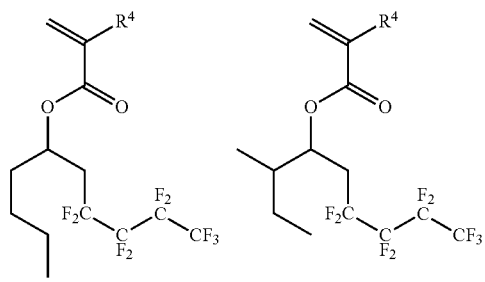
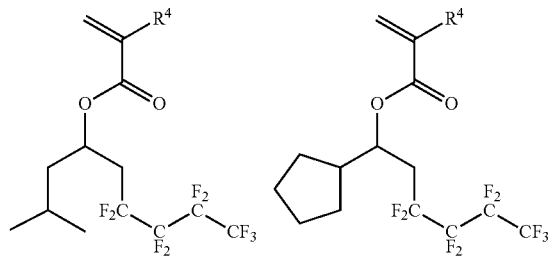
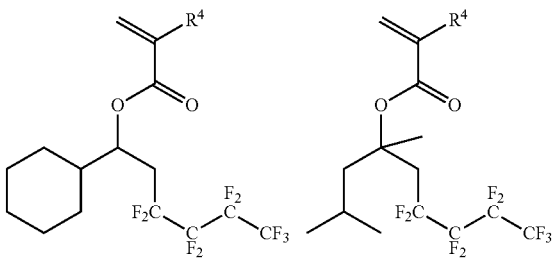
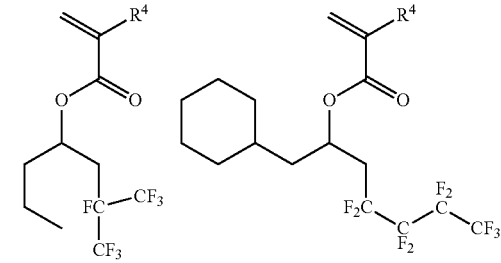
28
-continued
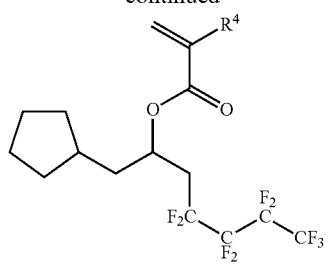
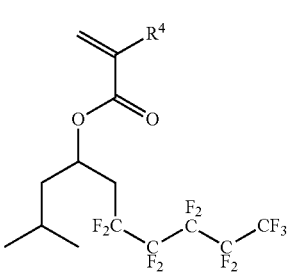
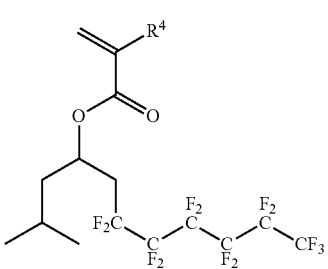
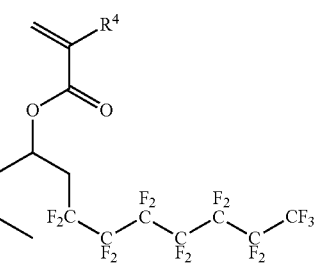
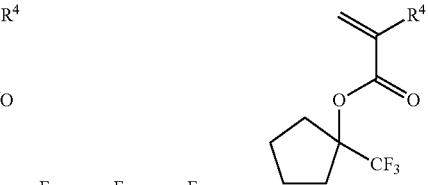
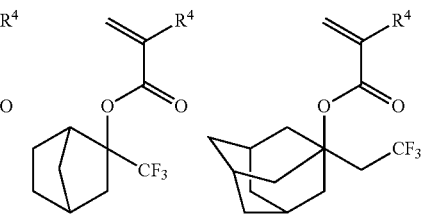

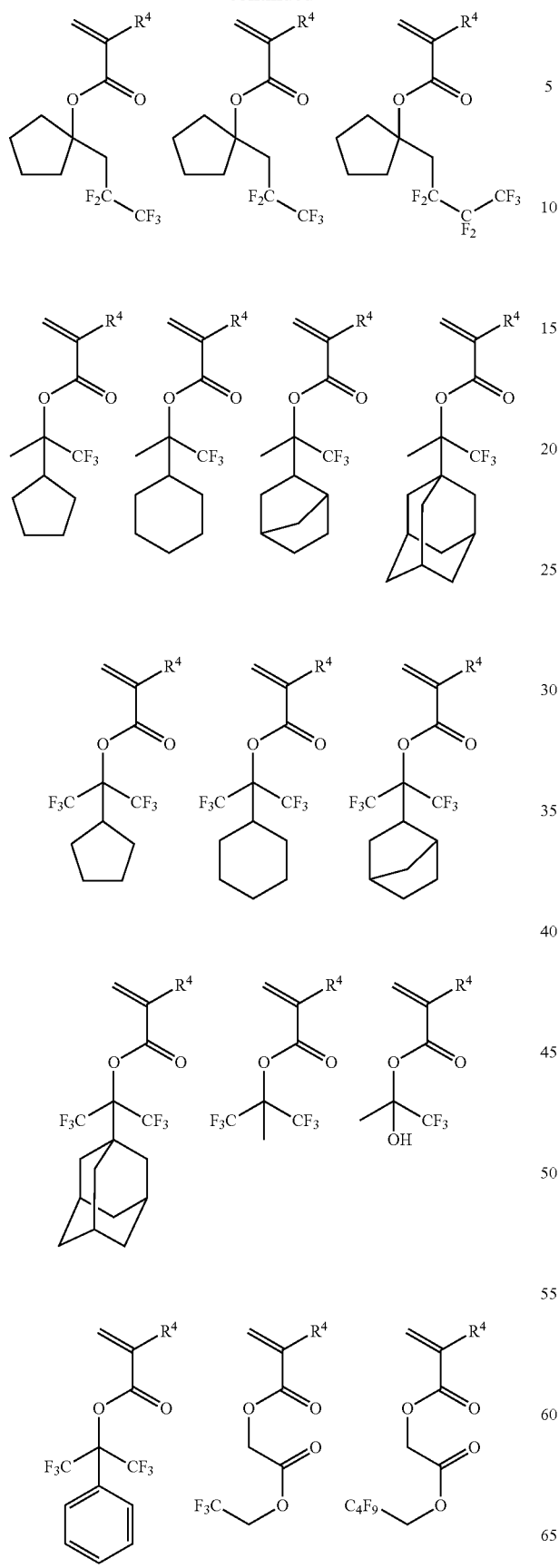

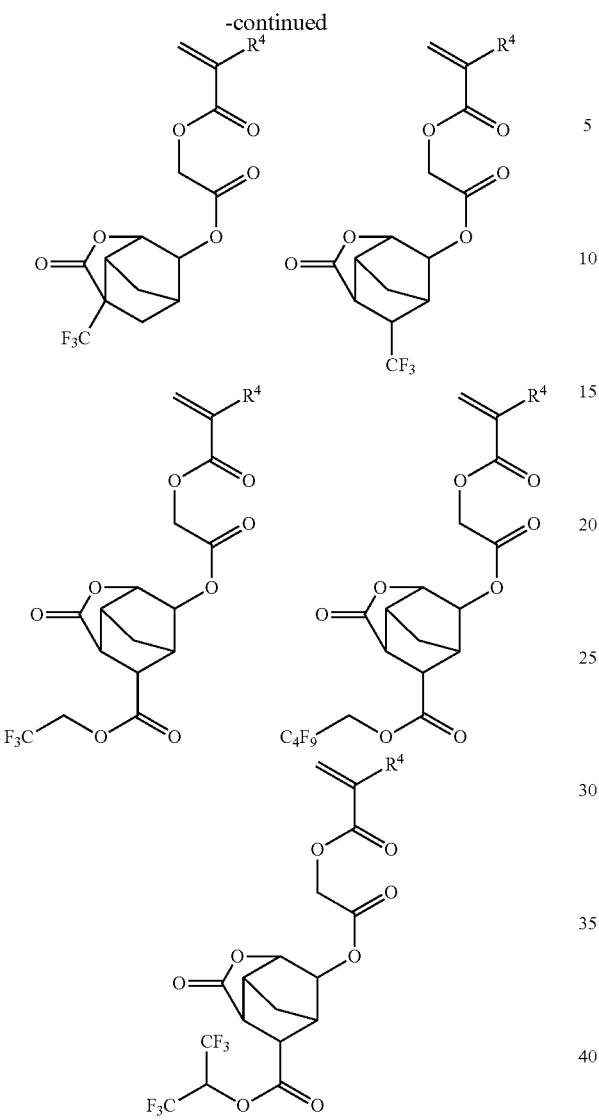

Since the fluorine-containing polymer is added to the resist composition, it is desirable to enhance polymer transparency to EUV radiation for thereby reducing outgassing from within the resist film. In this context, recurring units which are rich in hydrocarbon which is less absorptive of EUV radiation, specifically recurring units containing an aromatic group may be incorporated in the fluorine-containing polymer. These recurring units are units derived from methacrylate, vinyl ether, styrene, vinylnaphthalene, stilbene, styrylnaphthalene, dinaphthylethylene, acenaphthylene, indene, benzofuran and benzothiophene derivatives, as represented by the following formulae (3) to (6), which are referred to as recurring units (b1) to (b4), respectively.

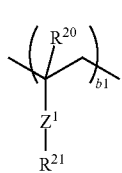
(3)

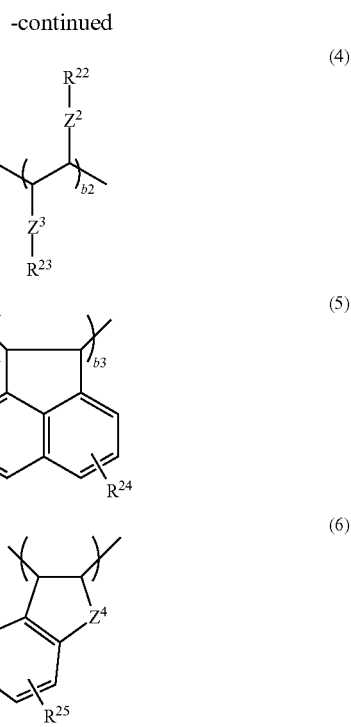

Herein $R^{20}$ is hydrogen or methyl. $Z^1$ is a single bond, —C(=O)—O— or —O—. $Z^2$ and $Z^3$ are each independently phenylene or naphthylene. $Z^4$ is methylene, —O— or —S—. $R^{21}$ is a $C_6$-$C_{20}$ aryl group or $C_2$-$C_{20}$ alkenyl group. $R^{22}$, $R^{23}$, $R^{24}$ and $R^{25}$ are each independently hydrogen, hydroxyl, cyano, nitro, amino, halogen, straight, branched or cyclic $C_1$-$C_{10}$ alkyl group, straight, branched or cyclic $C_2$-$C_6$ alkenyl group, $C_6$-$C_{10}$ aryl group, straight, branched or cyclic $C_1$-$C_{10}$ alkoxy group, or straight, branched or cyclic $C_2$-$C_{10}$ acyloxy group. The subscripts b1 to b4 are numbers satisfying 0≤b1<1.0, 0≤b2<1.0, 0≤b3 25<1.0, 0≤b4<1.0, and 0≤b1+b2+b3+b4<1.0.

Examples of the monomer from which recurring unit (b1) is derived are given below, but not limited thereto. Notably, $R^{20}$ is as defined above.

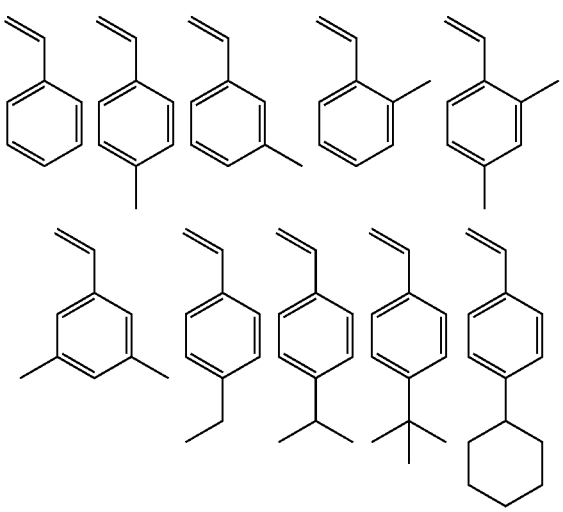

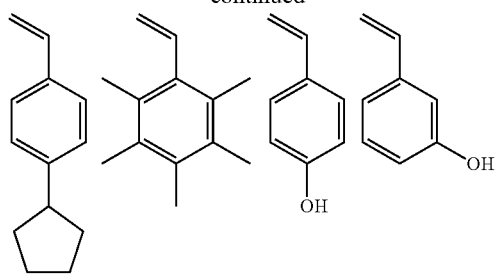
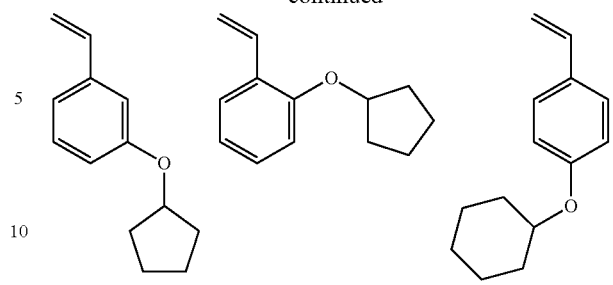
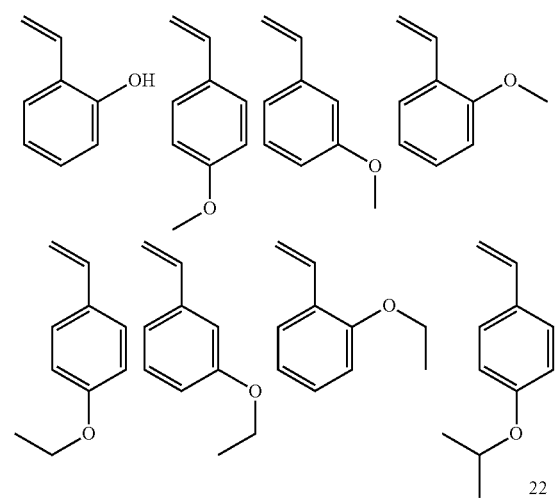
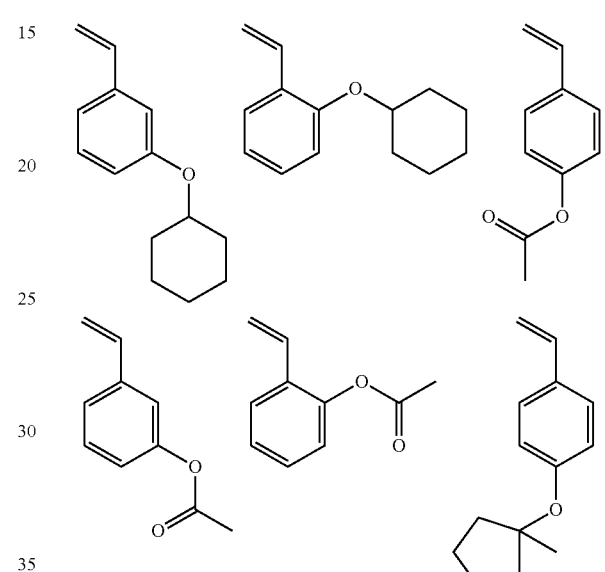
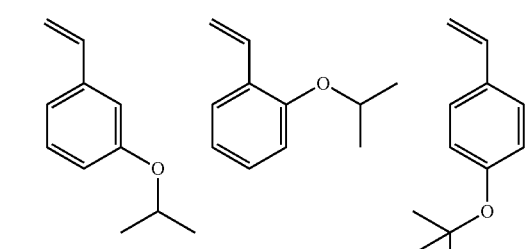
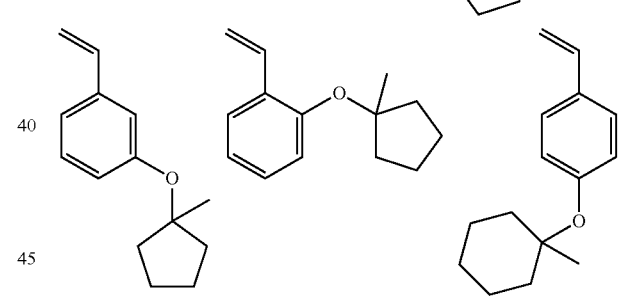
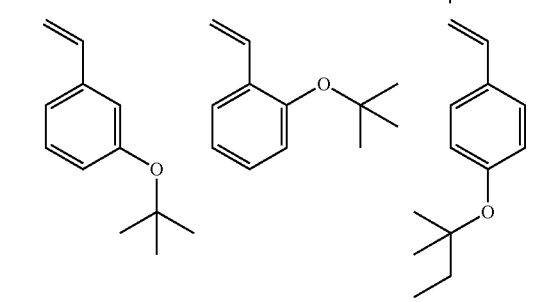
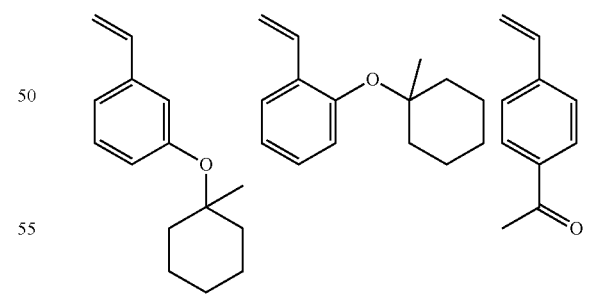
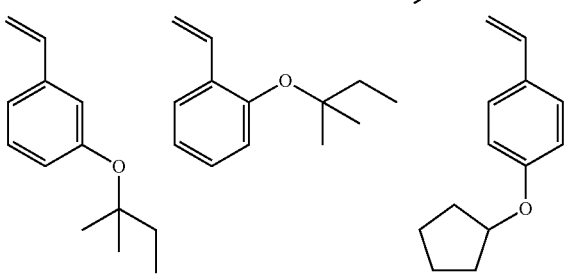
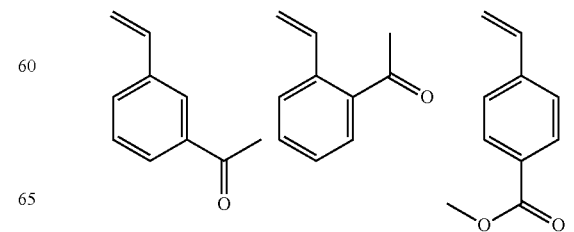

35
-continued
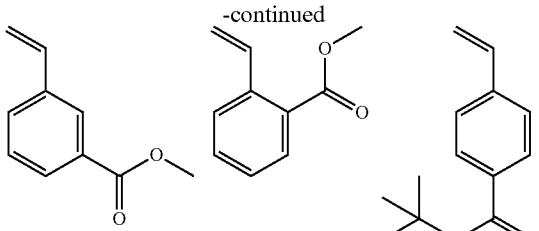
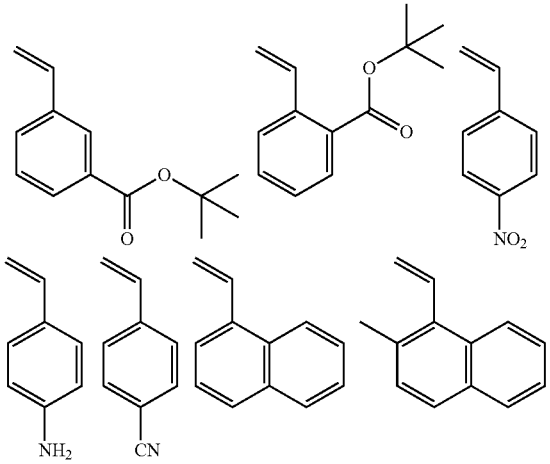
36
-continued
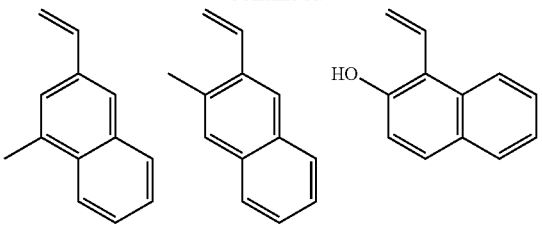

37
-continued
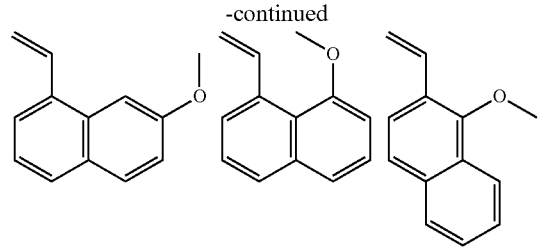
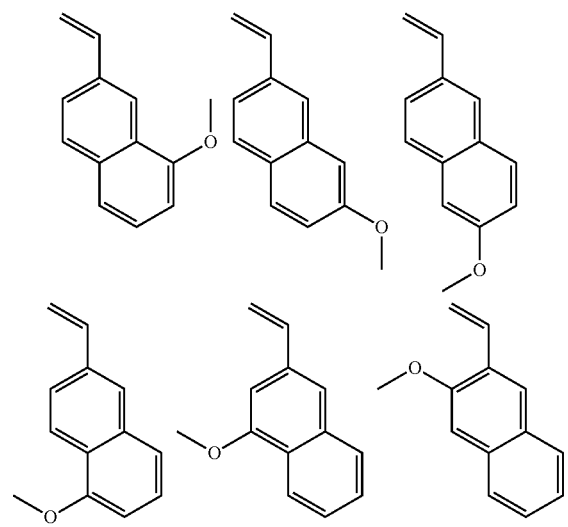
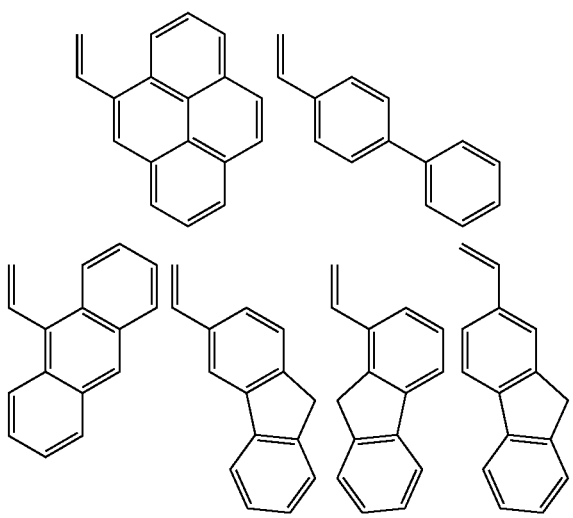
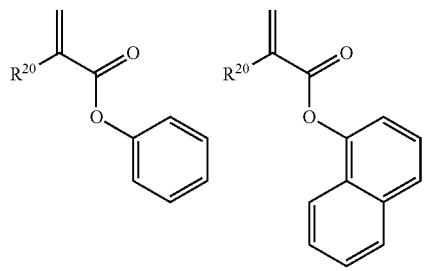
38
-continued
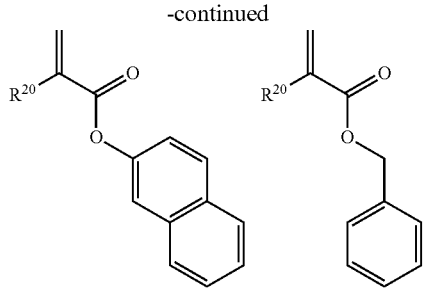
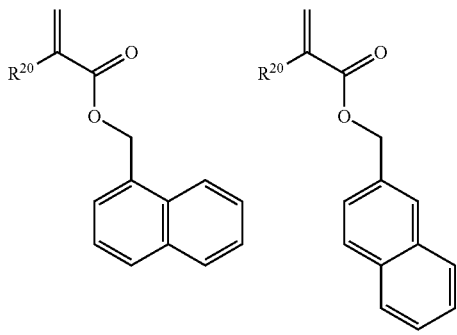
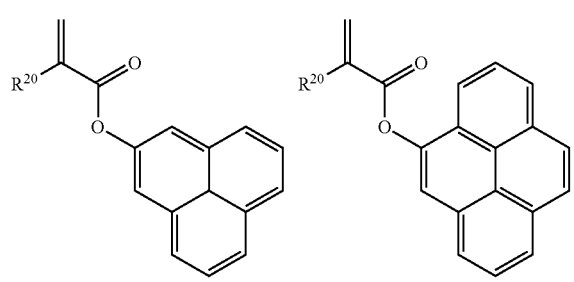
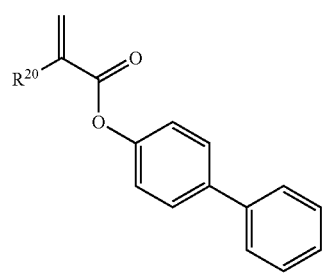
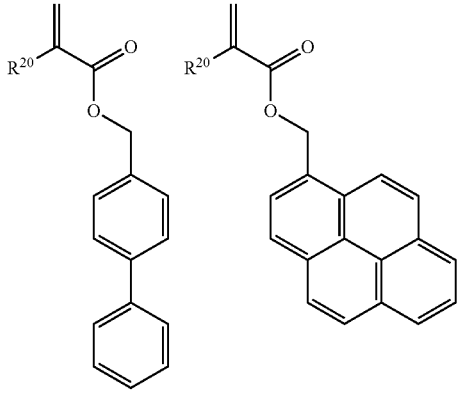

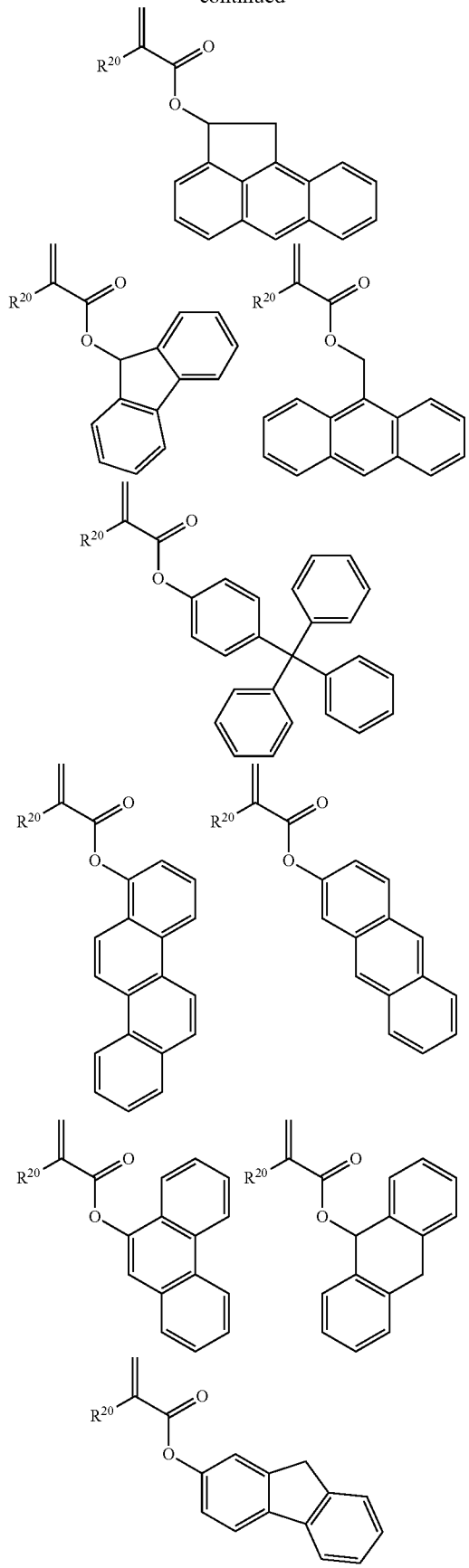
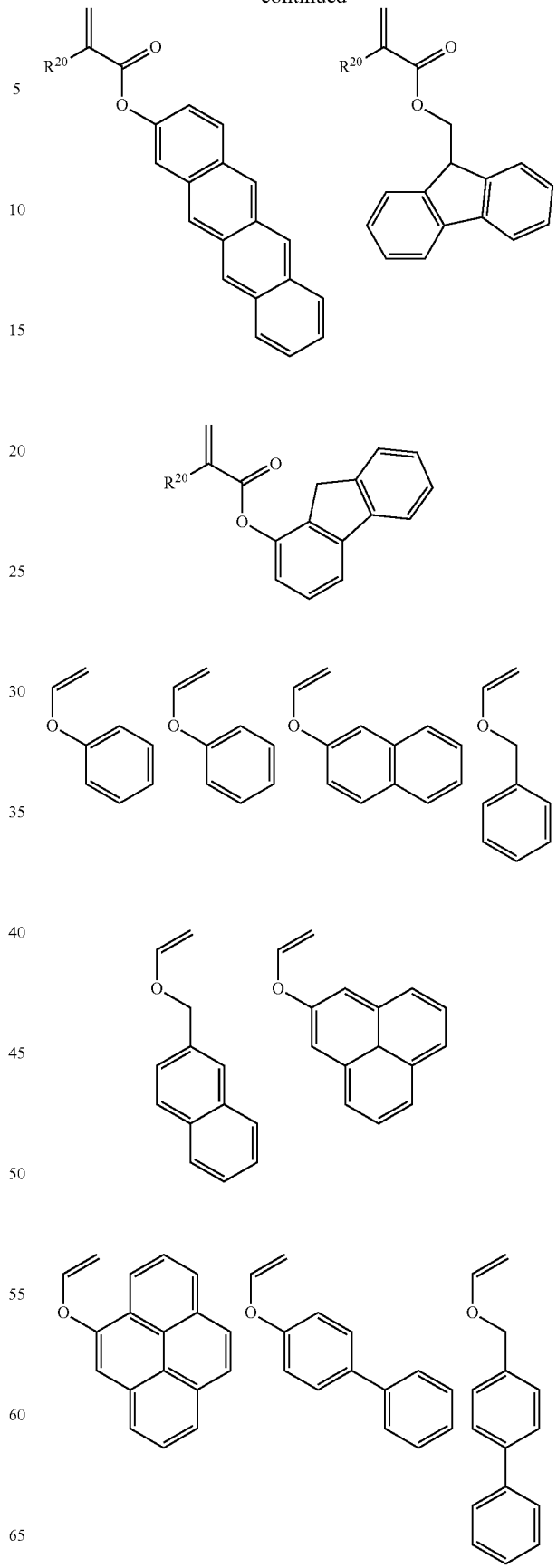

-continued
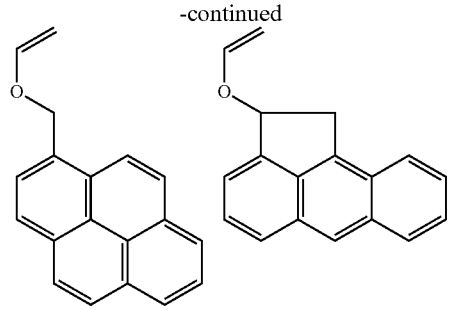
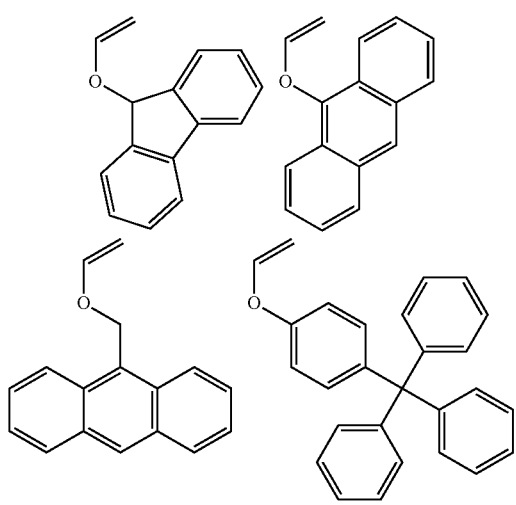
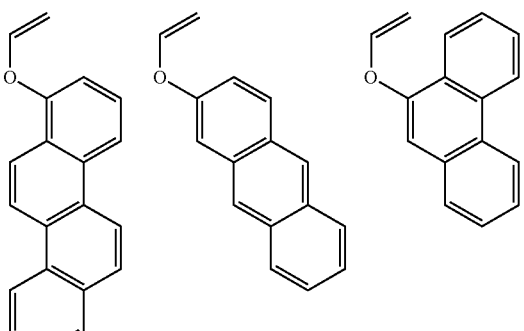
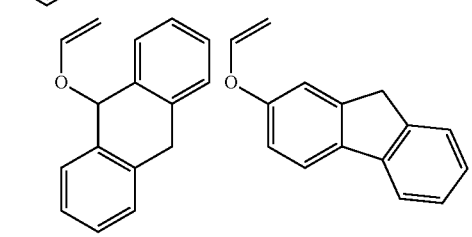
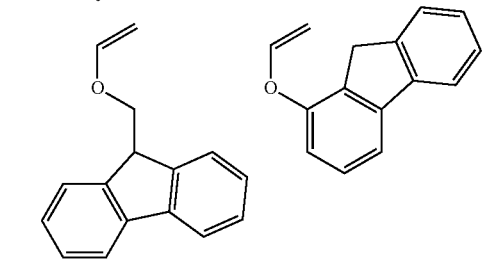
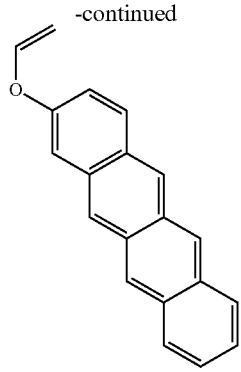
Examples of the monomer from which recurring unit (b2) is derived are given below, but not limited thereto.
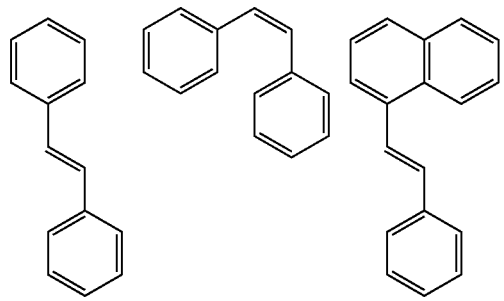
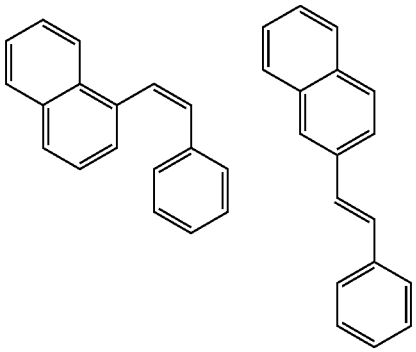
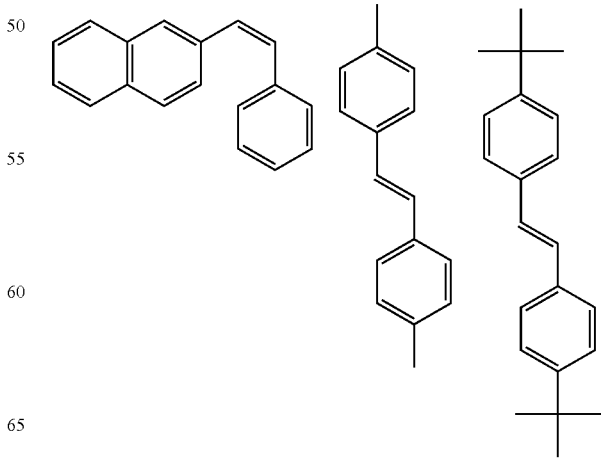

-continued
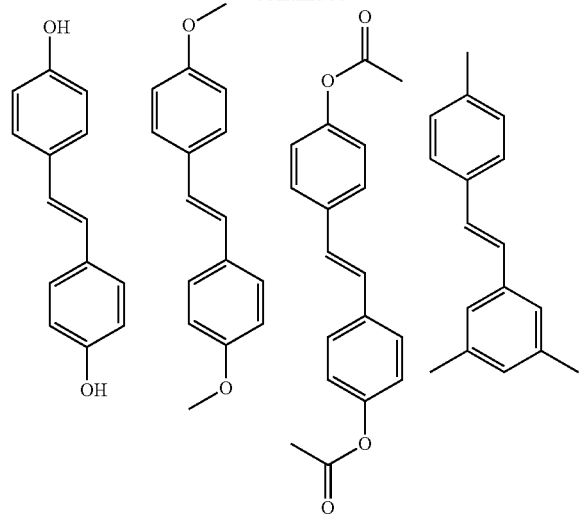
Examples of the monomer from which recurring unit (b3) is derived are given below, but not limited thereto.
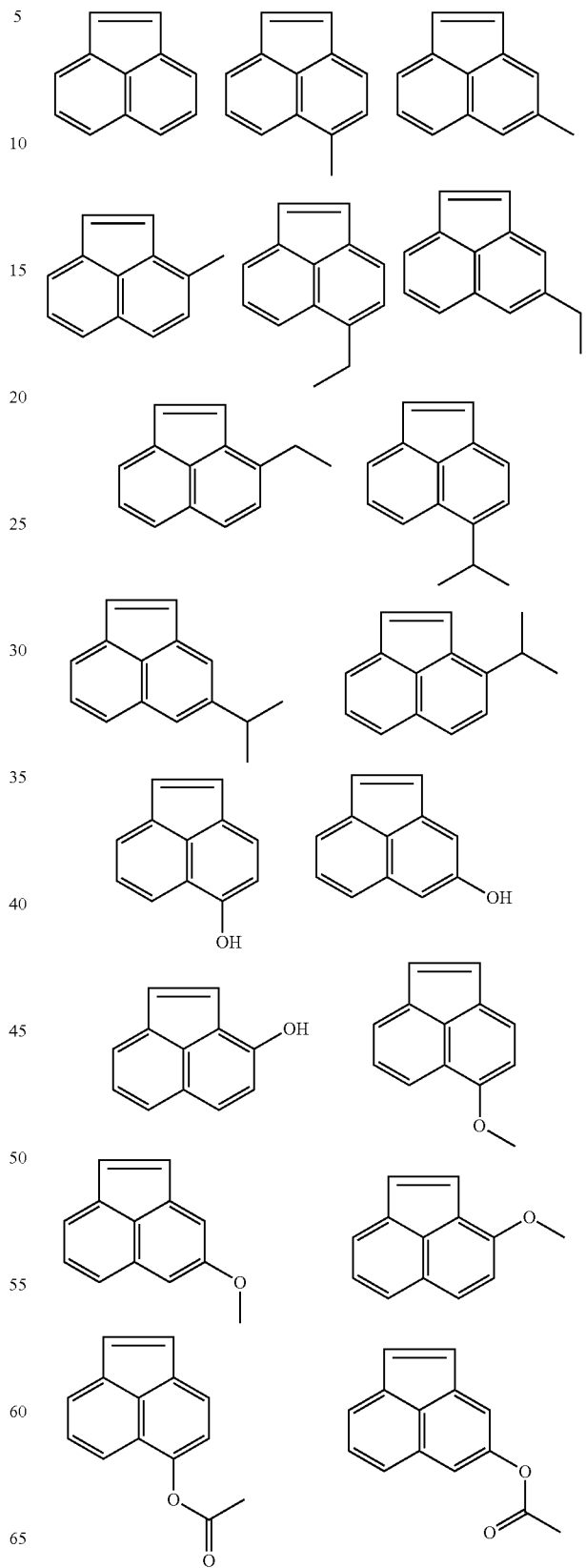

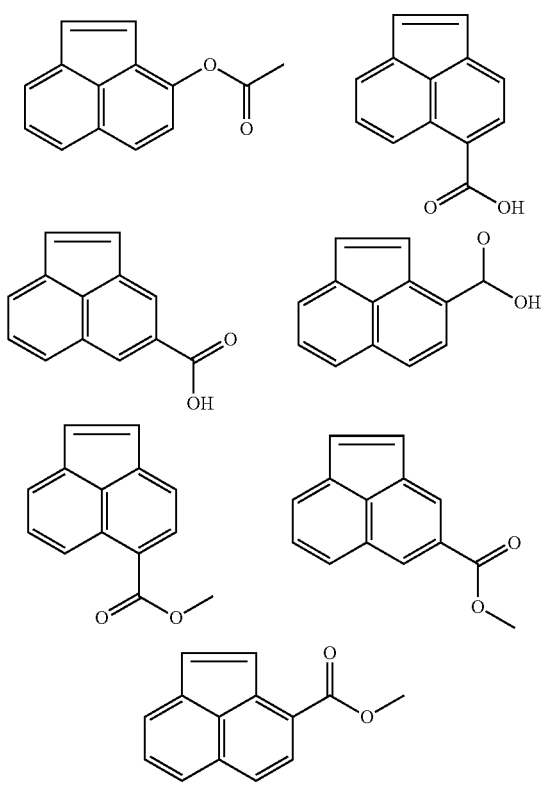
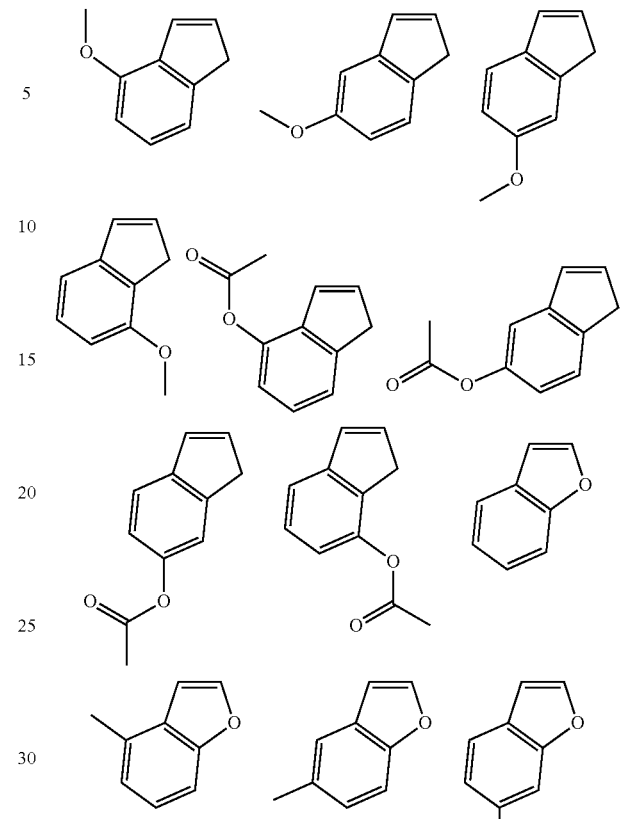
Examples of the monomer from which recurring unit (b4) is derived are given below, but not limited thereto.
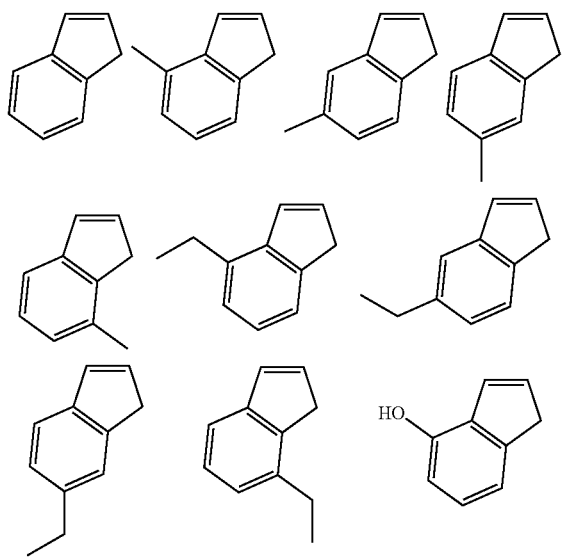
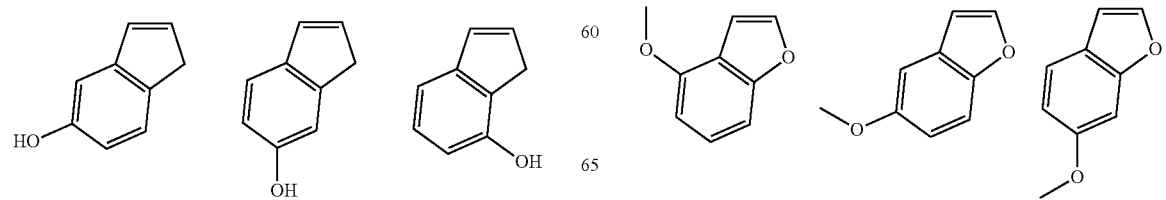

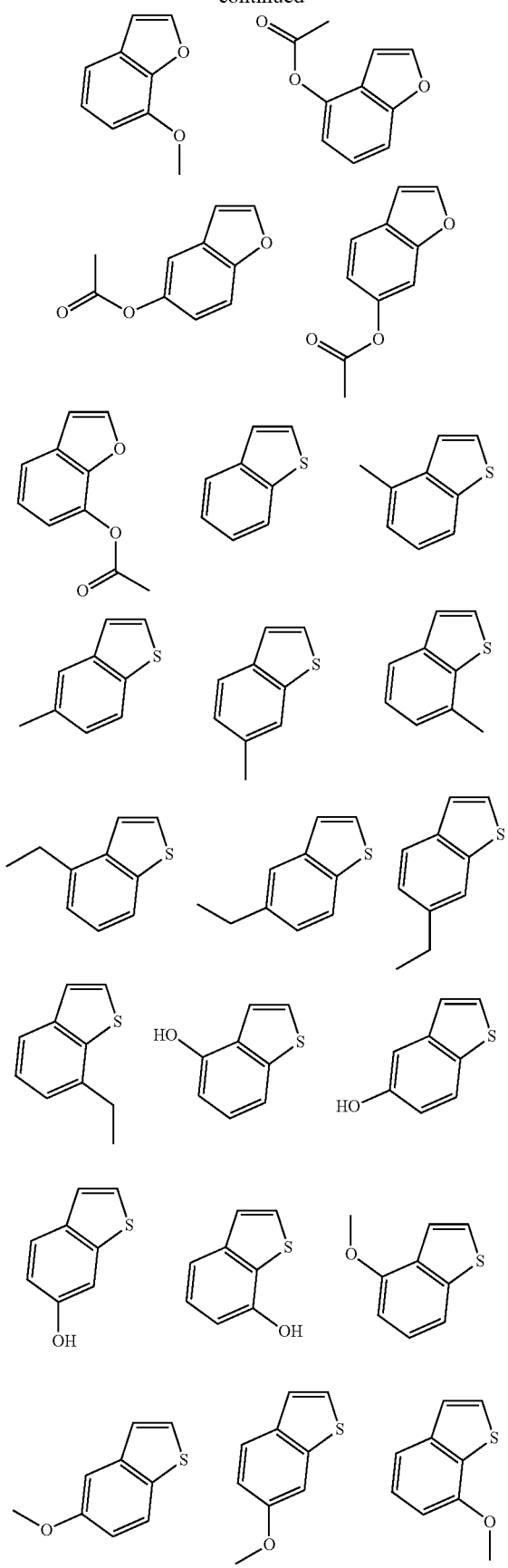
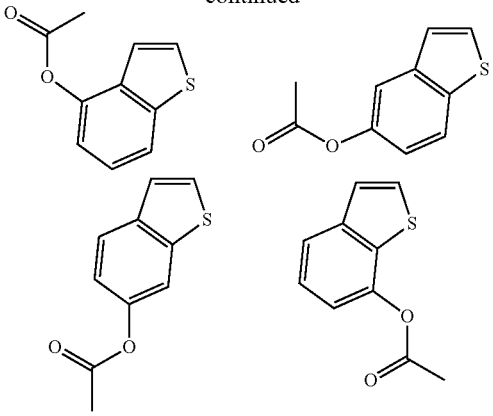

For the purpose of improving alkaline solubility, the fluorine-containing polymer may further comprise recurring units (c1) having a carboxyl or sulfo group as described in JP-A 2008-065304.

In the (co)polymer, recurring units (a1) and (a2), recurring units (b1) to (b4), and recurring units (c1) may be incorporated in the following range:

preferably $0 \leq a1 \leq 1.0$, $0 \leq a2 \leq 1.0$, $0 < a1+a2 \leq 1.0$, $0 \leq b1 \leq 0.9$, $0 \leq b2 \leq 0.9$, $0 \leq b3 \leq 0.9$, $0 \leq b4 \leq 0.9$, $0 \leq b1+b2+b3+b4 \leq 0.9$, and $0 \leq c1 \leq 0.6$;

more preferably $0 \leq a1 \leq 1.0$, $0 \leq a2 \leq 1.0$, $0.2 \leq a1+a2 \leq 1.0$, $0 \leq b1 \leq 0.8$, $0 \leq b2 \leq 0.8$, $0 \leq b3 \leq 0.8$, $0 \leq b4 \leq 0.8$, $0 \leq b1+b2+b3+b4 \leq 0.8$, and $0 \leq c1 \leq 0.5$; even more preferably $0 \leq a1 \leq 1.0$, $0 \leq a2 \leq 1.0$, $0.3 \leq a1+a2 \leq 1.0$, $0 \leq b1 \leq 0.7$, $0 \leq b2 \leq 0.7$, $0 \leq b3 \leq 0.7$, $0 \leq b4 \leq 0.7$, $0 \leq b1+b2+b3+b4 \leq 0.7$, and $0 \leq c1 \leq 0.4$.

The fluorine-containing polymer has a weight average molecular weight (Mw) of preferably 1,000 to 50,000, more preferably 2,000 to 10,000. As long as Mw is equal to or more than 1,000, the risk that the resist pattern as developed experiences a film thickness loss as a result of mixing with resist base resin is avoided. As long as Mw is equal to or less than 50,000, the polymer is fully soluble in a resist solvent and alkaline developer. Throughout the disclosure, Mw is as measured by gel permeation chromatography (GPC) versus polystyrene standards using tetrahydrofuran solvent.

To the resist composition, the fluorine-containing polymer is preferably added in an amount of 0.1 to 15 parts by weight, more preferably 0.2 to 12 parts by weight per 100 parts by weight of the base resin. As long as the fluorine-containing polymer is added in the range, the resist film after spin coating is covered on its surface with the fluorine-containing polymer, for rendering the resist film surface fully water repellent.

The fluorine-containing polymer is generally prepared by radical polymerization using a radical polymerization initiator or ionic (anionic) polymerization using a catalyst such as alkyl lithium. Either polymerization may be performed by its standard procedure.

Examples of the radical polymerization initiator used herein include, but are not limited to, azo compounds such as 2,2'-azobis(4-methoxy-2,4-dimethylvaleronitrile), 2,2'-azobis(2,4-dimethylvaeronitrleronitrile), 2,2'-azobisisobutyronitrile, 2,2'-azobis(2,4,4-trimethylpentane), peroxides such as t-butyl peroxypivalate, lauroyl peroxide, benzoyl peroxide, and t-butyl peroxylaurate, water-soluble initiators in the form of persulfates such as potassium persulfate, and redox initiators based on a combination of a peroxide such as potassium persulfate or hydrogen peroxide with a reducing agent such as sodium sulfite. Although an amount of the initiator used may vary with its type and polymerization conditions, it is preferably used in an amount of 0.001 to 5%, more preferably 0.01 to 2% by weight based on the total weight of monomers to be polymerized.

The polymerization reaction may be performed in a solvent. A solvent which does not retard polymerization reaction is preferable. Typical solvents include esters such as ethyl acetate and n-butyl acetate; ketones such as acetone, methyl ethyl ketone and methyl isobutyl ketone: aliphatic and aromatic hydrocarbons such as toluene, xylene and cyclohexane; alcohols such as isopropyl alcohol and ethylene glycol monomethyl ether; and ether solvents such as diethyl ether, dioxane and tetrahydrofuran, which may be used alone or in admixture. Any well-known molecular weight regulator such as dodecylmercaptan may be used in combination.

For the polymerization reaction, the temperature may be set appropriate depending on the type of the initiator and the boiling point of the solvent. Most often, the temperature is preferably in the range of 20 to 200° C., more preferably 50 to 140° C. The reactor used for polymerization reaction is not particularly limited.

At the end of reaction, the desired polymer may be recovered by removing the solvent by any well-known procedure such as re-precipitation or distillation.

B. Base Resin

The base resin (B) used in the resist composition is not particularly limited as long as it is adapted to increase its solubility in alkaline developer under the action of acid. Preferably the base resin is defined as comprising recurring units having the formula (7) and/or recurring units having the formula (8), which are referred to as recurring units (d1) and (d2), respectively.

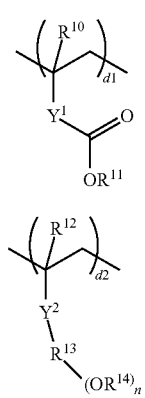

Herein $R^{10}$ and $R^{12}$ are each independently hydrogen or methyl. $R^{11}$ and $R^{14}$ each are an acid labile group. $Y^1$ is a single bond, phenylene, naphthylene or —C(=O)—O—$R^{15}$—, wherein $R^{15}$ is a straight, branched or cyclic $C_1$-$C_{10}$ alkylene group which may contain an ether moiety, ester moiety, lactone ring or hydroxyl moiety, a phenylene group or naphthylene group. $Y^2$ is a single bond, phenylene, naphthylene, —C(=O)—O—$R^{16}$—, —C(=O)—NH—$R^{16}$—, —O—$R^{16}$— or —S—$R^{16}$—, wherein $R^6$ is a straight, branched or cyclic $C_1$-$C_{10}$ alkylene group which may contain an ether moiety, ester moiety, lactone ring or hydroxyl moiety. $R^{13}$ is a single bond, a straight, branched or cyclic $C_1$-$C_{15}$ divalent to pentavalent aliphatic hydrocarbon group which may contain an ether or ester moiety, or a phenylene group, d1 and d2 are numbers satisfying $0 \le d1 < 1.0$, $0 \le d2 < 1.0$, and $0 < d1+d2 \le 1.0$, and n is an integer of 1 to 4.

The recurring unit (d1) is a unit having a carboxyl group in which the hydrogen atom is substituted by an acid labile group. Examples of the monomer from which recurring units (d1) are derived are shown below, but not limited thereto. Notably, $R^{10}$ and $R^{11}$ are as defined above.

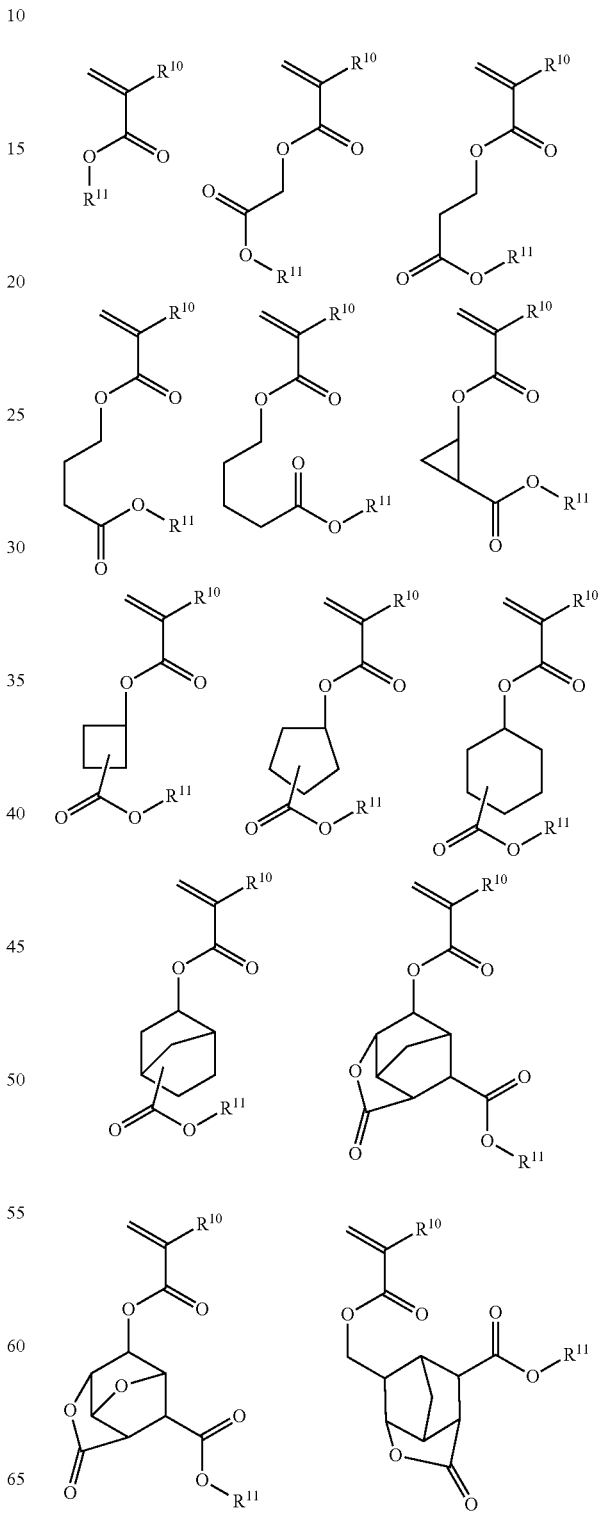

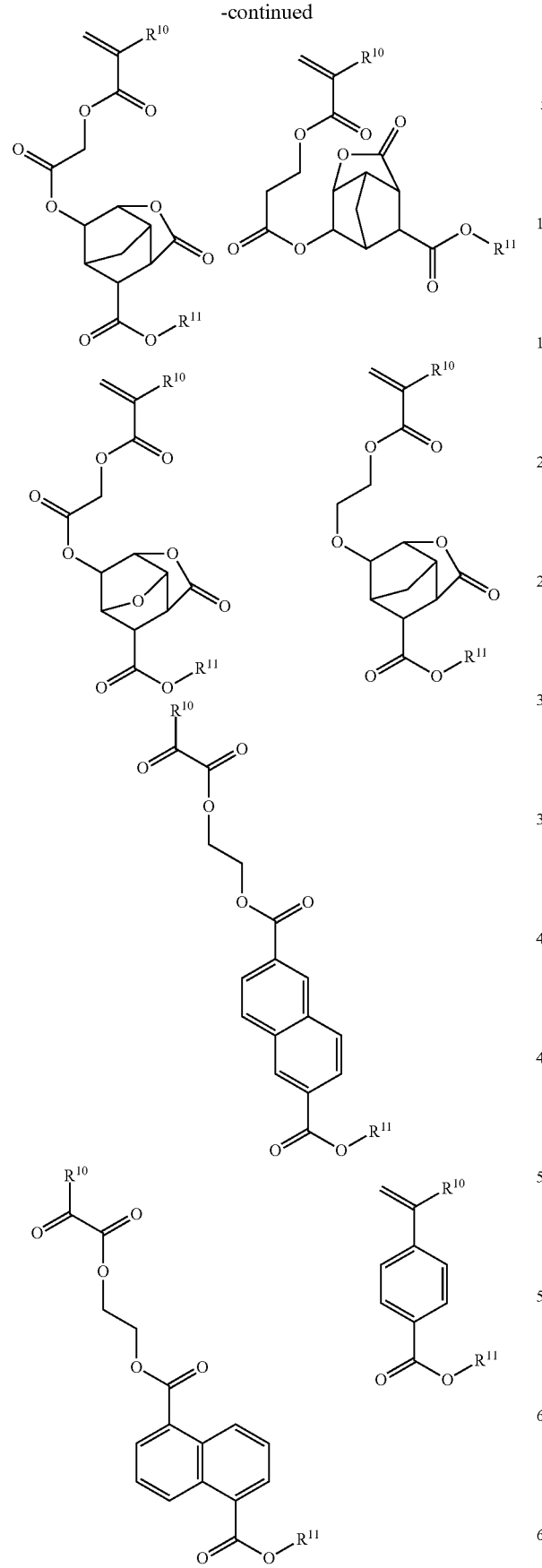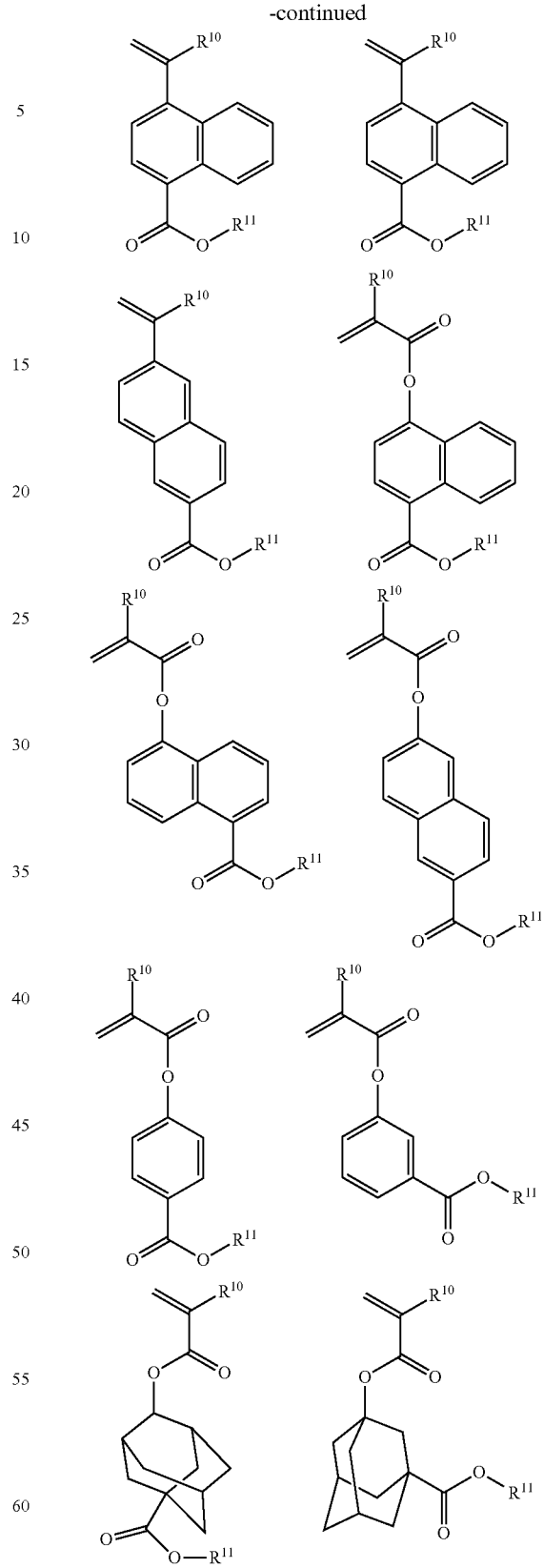
The recurring unit (d2) is a unit having a hydroxyl or phenolic hydroxyl group in which the hydrogen atom is substituted by an acid labile group. Examples of the monomer from which recurring units (d2) are derived are shown below, but not limited thereto. Notably, $R^{12}$ and $R^{13}$ are as defined above.

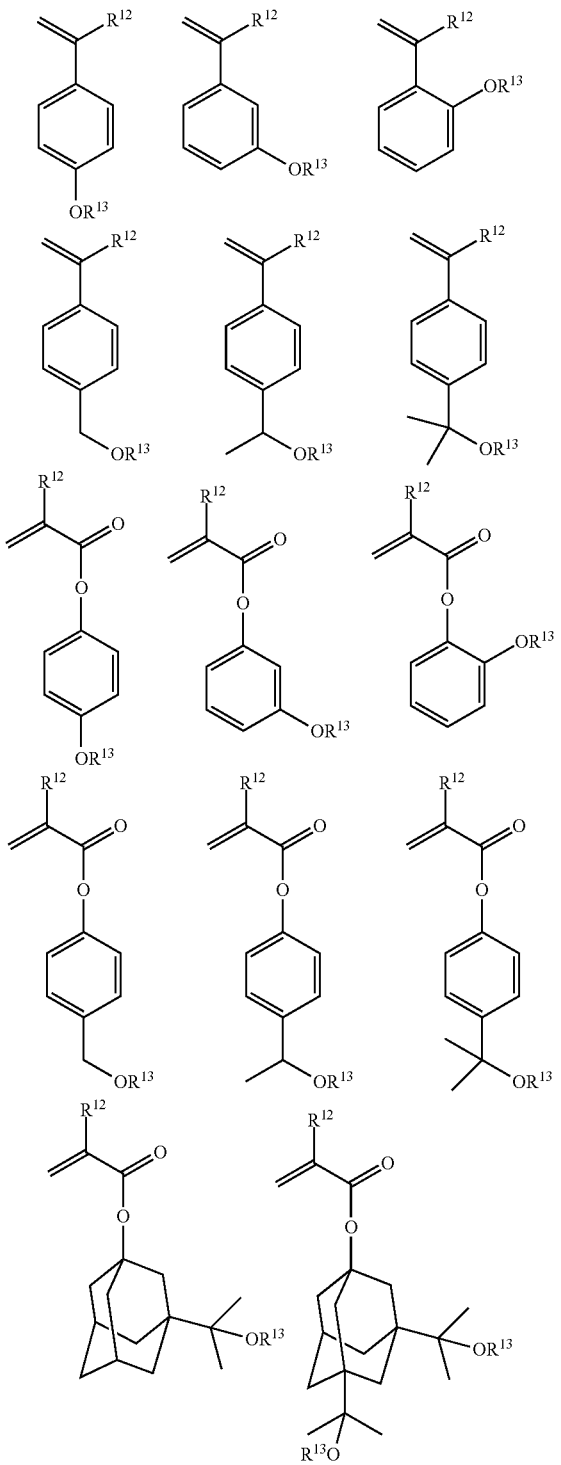

The acid labile groups represented by $R^{11}$ and $R^{14}$ in the recurring units (d1) and (d2) may be selected from a variety of such groups. The acid labile groups may be the same or different and preferably include groups of the following formulae (A-1) to (A-3).

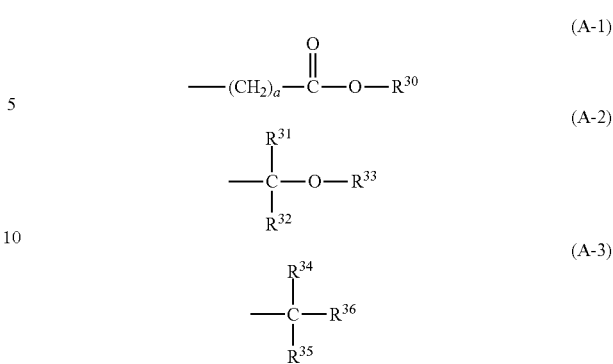

In formula (A-1), $R^{38}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (A-3), and "a" is an integer of 0 to 6.

Exemplary tertiary alkyl groups are t-butyl, t-pentyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-t-butylsilyl. Exemplary oxoalkyl groups are 3-oxocyclohexyl, 4-methyl-2-oxooxan-4-yl, and 5-methyl-2-oxooxolan-5-yl.

In formula (A-2), $R^{31}$ and $R^{32}$ are each independently hydrogen or a straight, branched or cyclic alkyl group of 1 to 18 carbon atoms, preferably 1 to 10 carbon atoms. Exemplary alkyl groups include methyl, ethyl, propyl, isopropyl, n-butyl, s-butyl, t-butyl, cyclopentyl, cyclohexyl, 2-ethylhexyl, and n-octyl. $R^{33}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of such alkyl groups in which some hydrogen atoms are replaced by hydroxyl, alkoxy, oxo, amino, alkylamino or the like. Illustrative examples of the substituted alkyl groups are shown below.

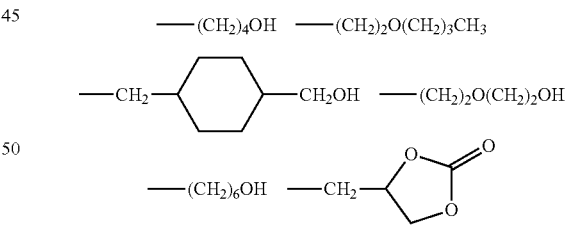

A pair of $R^{31}$ and $R^{32}$, $R^{31}$ and $R^{33}$, or $R^{32}$ and $R^{33}$ may bond together to form a ring with the carbon atom to which they are attached. Ring-forming participants of $R^{31}$, $R^{32}$ and $R^{33}$ represent a straight or branched alkylene group of 1 to 18 carbon atoms, preferably 1 to 10 carbon atoms while the ring preferably has 3 to 10 carbon atoms, more preferably 4 to 10 carbon atoms.

Examples of the acid labile groups of formula (A-1) include t-butoxycarbonyl, t-butoxycarbonylmethyl, t-pentyloxycarbonyl, t-pentyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl- 2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Also included are substituent groups having the formulae (A-1)-1 to (A-1)-10.

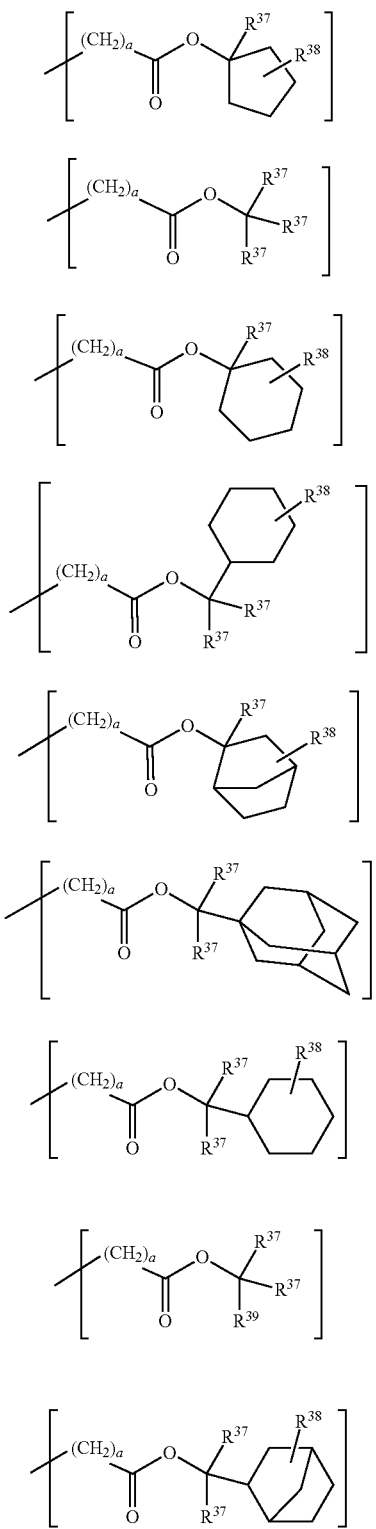

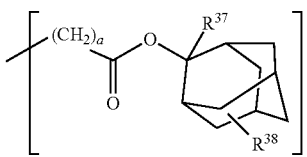

Herein $R^{37}$ is each independently a straight, branched or cyclic $C_1$-$C_{10}$ alkyl group or $C_6$-$C_{20}$ aryl group, $R^{38}$ is hydrogen or a straight, branched or cyclic $C_1$-$C_{10}$ alkyl group, $R^{39}$ is each independently a straight, branched or cyclic $C_2$-$C_{10}$ alkyl group or $C_6$-$C_{20}$ aryl group, and "a" is an integer of 0 to 6.

Of the acid labile groups of formula (A-2), the straight and branched ones are exemplified by groups having the following formulae (A-2)-1 to (A-2)-69.

$$—CH_2—O—CH_3 \qquad (A\text{-}2)\text{-}1$$

$$—CH_2—O—CH_2—CH_3 \qquad (A\text{-}2)\text{-}2$$

$$—CH_2—O—(CH_2)_2—CH_3 \qquad (A\text{-}2)\text{-}3$$

$$—CH_2—O—(CH_2)_3—CH_3 \qquad (A\text{-}2)\text{-}4$$

$$\begin{array}{c} \text{CH}_3 \\ | \\ —CH_2—O—CH—CH_3 \end{array} \qquad (A\text{-}2)\text{-}5$$

$$\begin{array}{c} \text{CH}_3 \\ | \\ —CH_2—O—C—CH_3 \\ | \\ \text{CH}_3 \end{array} \qquad (A\text{-}2)\text{-}6$$

$$\begin{array}{c} \text{CH}_3 \\ | \\ —CH—O—CH_3 \end{array} \qquad (A\text{-}2)\text{-}7$$

$$\begin{array}{c} \text{CH}_3 \\ | \\ \text{CH}_2 \\ | \\ —CH—O—CH_3 \end{array} \qquad (A\text{-}2)\text{-}8$$

$$\begin{array}{c} \text{CH}_3 \\ | \\ (\text{CH}_2)_2 \\ | \\ —CH—O—CH_3 \end{array} \qquad (A\text{-}2)\text{-}9$$

$$\begin{array}{c} \text{CH}_3 \\ | \\ —CH—O—CH_2—CH_3 \end{array} \qquad (A\text{-}2)\text{-}10$$

$$\begin{array}{c} \text{CH}_3 \\ | \\ \text{CH}_2 \\ | \\ —CH—O—CH_2—CH_3 \end{array} \qquad (A\text{-}2)\text{-}11$$

$$\begin{array}{c} \text{CH}_3 \\ | \\ (\text{CH}_2)_2 \\ | \\ —CH—O—CH_2—CH_3 \end{array} \qquad (A\text{-}2)\text{-}12$$

$$\begin{array}{c} \text{CH}_3 \\ | \\ —CH—O—(CH_2)_2—CH_3 \end{array} \qquad (A\text{-}2)\text{-}13$$

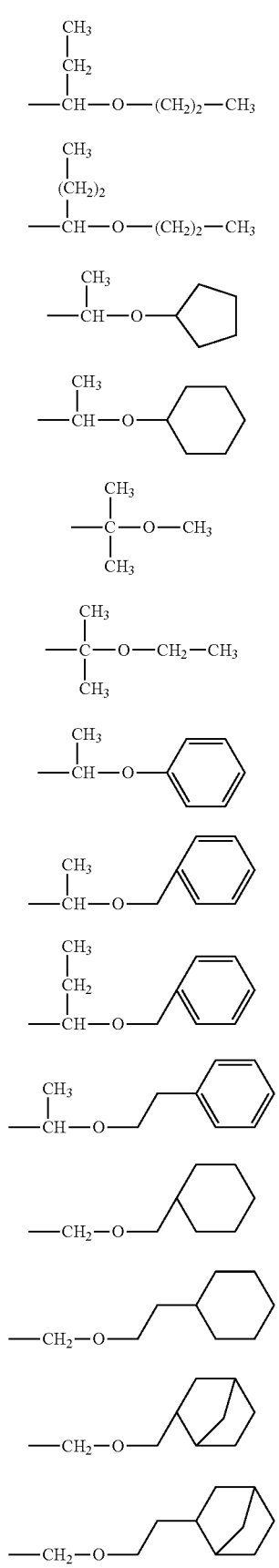
(A-2)-14
(A-2)-15
(A-2)-16
(A-2)-17
(A-2)-18
(A-2)-19
(A-2)-20
(A-2)-21
(A-2)-22
(A-2)-23
(A-2)-24
(A-2)-25
(A-2)-26
(A-2)-27
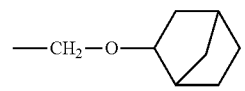
(A-2)-28
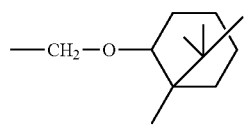
(A-2)-29
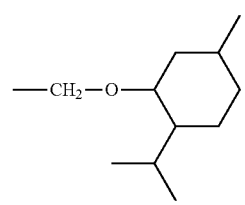
(A-2)-30
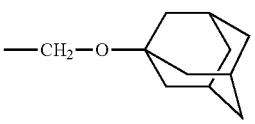
(A-2)-31
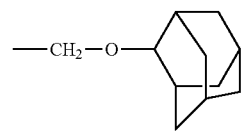
(A-2)-32
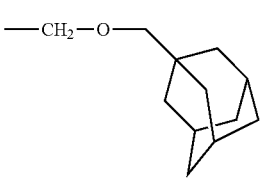
(A-2)-33
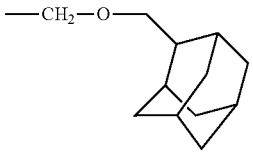
(A-2)-34
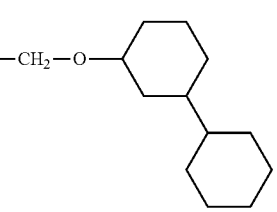
(A-2)-35
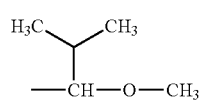
(A-2)-36
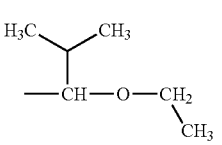
(A-2)-37

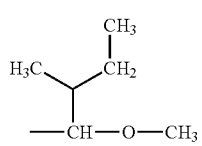 (A-2)-38
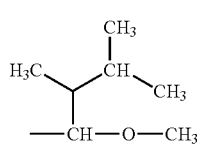 (A-2)-39
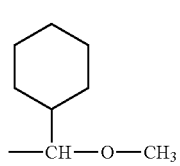 (A-2)-40
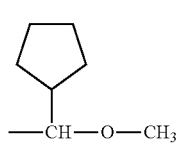 (A-2)-41
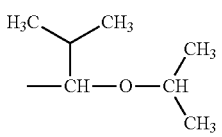 (A-2)-42
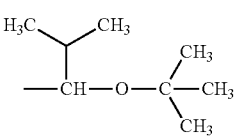 (A-2)-43
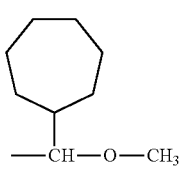 (A-2)-44
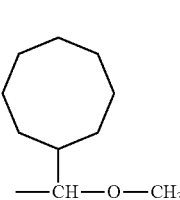 (A-2)-45
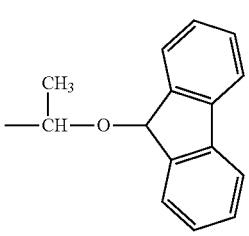 (A-2)-46
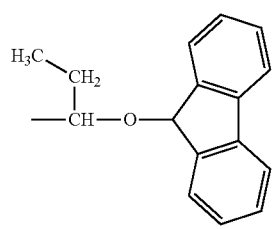 (A-2)-47
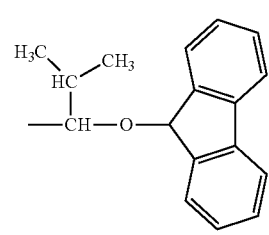 (A-2)-48
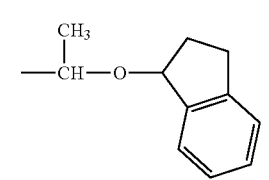 (A-2)-49
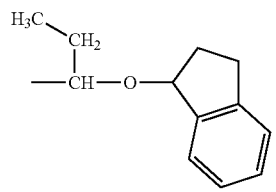 (A-2)-50
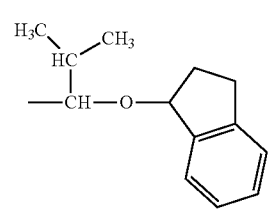 (A-2)-51
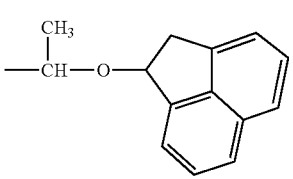 (A-2)-52
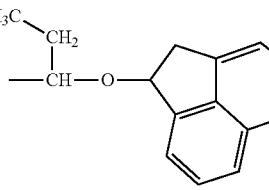 (A-2)-53
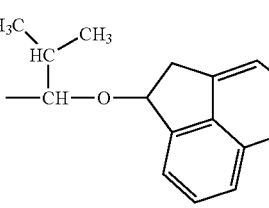 (A-2)-54

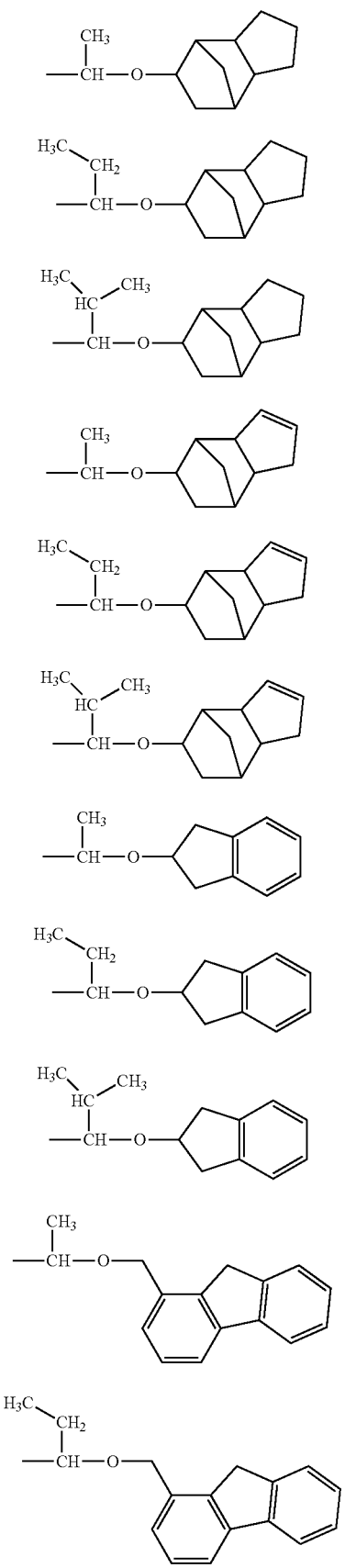

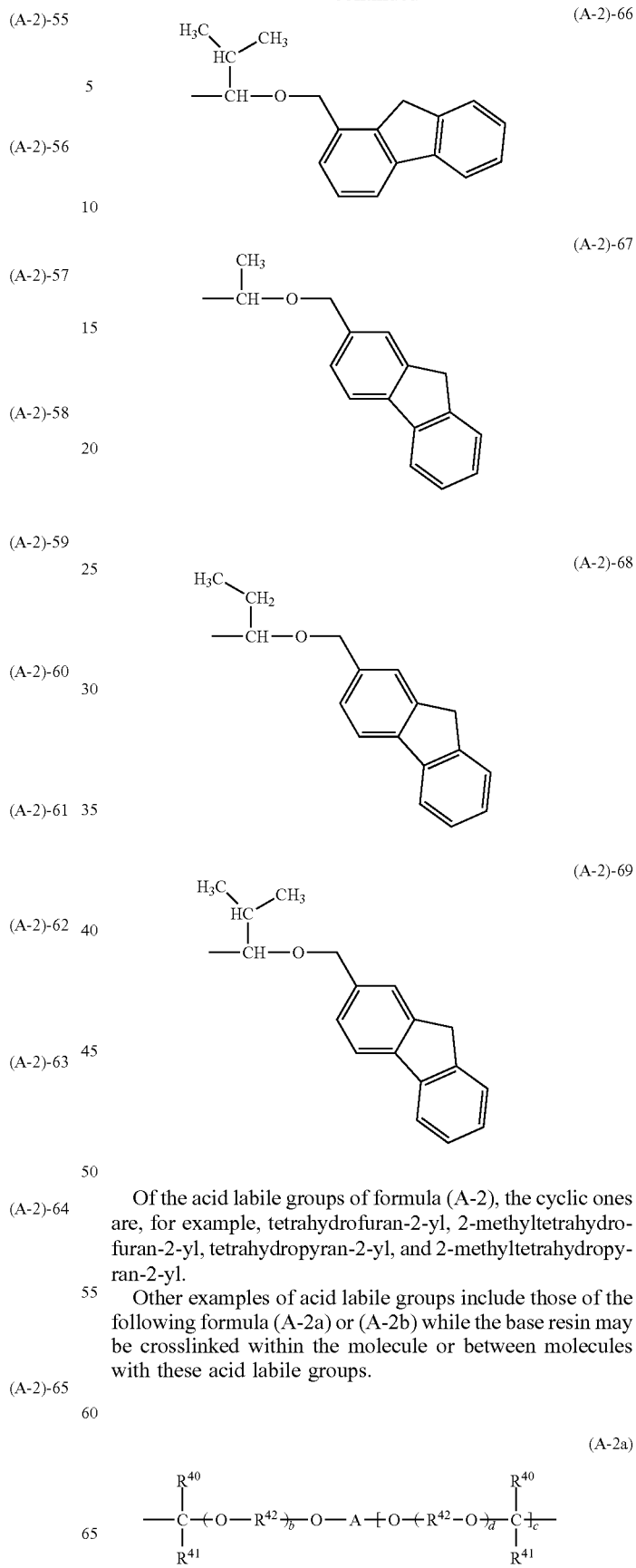

Of the acid labile groups of formula (A-2), the cyclic ones are, for example, tetrahydrofuran-2-yl, 2-methyltetrahydrofuran-2-yl, tetrahydropyran-2-yl, and 2-methyltetrahydropyran-2-yl.

Other examples of acid labile groups include those of the following formula (A-2a) or (A-2b) while the base resin may be crosslinked within the molecule or between molecules with these acid labile groups.

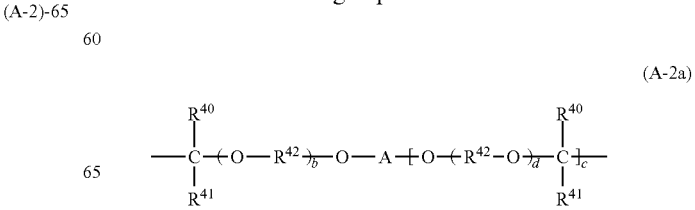

-continued (A-2b)

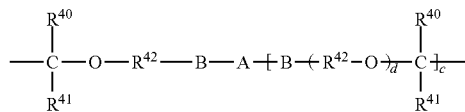

Herein $R^{40}$ and $R^{41}$ are each independently hydrogen or a straight, branched or cyclic $C_1$-$C_8$ alkyl group, or $R^{40}$ and $R^{41}$, taken together, may form a ring with the carbon atom to which they are attached, and $R^{40}$ and $R^{41}$ represent a straight or branched $C_1$-$C_8$ alkylene group when they form a ring. $R^{42}$ is independently a straight, branched or cyclic $C_1$-$C_{10}$ alkylene group. Each of b and d is an integer of 0 to 10, preferably 0 to 5, and c is an integer of 1 to 7, preferably 1 to 3.

"A" is a (c+1)-valent aliphatic or alicyclic saturated hydrocarbon group, aromatic hydrocarbon group or heterocyclic group having 1 to 50 carbon atoms, which may be separated by a heteroatom or in which one or more carbon-bonded hydrogen atoms may be substituted by hydroxyl, carboxyl, acyl or fluorine. Preferably, "A" is selected from straight, branched or cyclic alkylene, alkyltriyl and alkyltetrayl groups, and $C_6$-$C_{30}$ arylene groups. "B" is —CO—O—, —NHCO—O— or —NHCONH—.

The crosslinking acetal groups of formulae (A-2a) and (A-2b) are exemplified by the following formulae (A-2)-70 through (A-2)-77.

(A-2)-70

$$—\underset{|}{\overset{CH_3}{CH}}—O—CH_2CH_2—O—\underset{|}{\overset{CH_3}{CH}}—$$

(A-2)-71

$$—\underset{|}{\overset{CH_3}{CH}}—O—\bigcirc—O—\underset{|}{\overset{CH_3}{CH}}—$$

(A-2)-72

$$—\underset{|}{\overset{CH_3}{CH}}—O—CH_2CH_2CH_2CH_2—O—\underset{|}{\overset{CH_3}{CH}}—$$

(A-2)-73

$$—\underset{|}{\overset{CH_3}{CH}}—O—CH_2CH_2OCH_2CH_2OCH_2CH_2—O—\underset{|}{\overset{CH_3}{CH}}—$$

(A-2)-74

$$—\underset{|}{\overset{CH_3}{CH}}—O—CH_2CH_2O\text{—}\bigcirc\text{—}OCH_2CH_2—O—\underset{|}{\overset{CH_3}{CH}}—$$

(A-2)-75

$$—\underset{|}{\overset{CH_3}{CH}}—O—CH_2CH_2O\text{—}\bigcirc_O\text{—}OCH_2CH_2—O—\underset{|}{\overset{CH_3}{CH}}—$$

-continued (A-2)-76

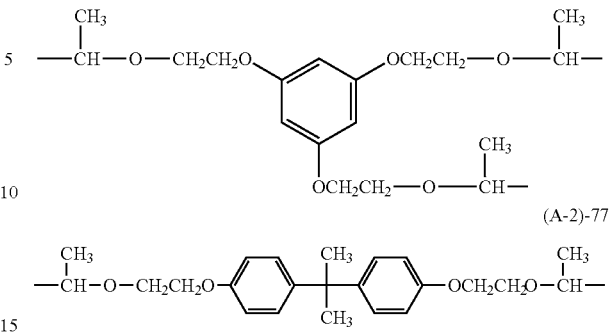

(A-2)-77

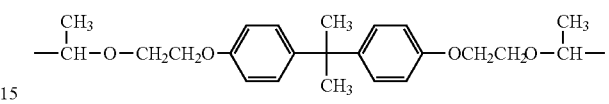

In formula (A-3), $R^{34}$, $R^{35}$ and $R^{36}$ are each independently a monovalent hydrocarbon group, typically a straight, branched or cyclic $C_1$-$C_{20}$ alkyl or $C_2$-$C_{20}$ alkenyl group, which may contain a heteroatom such as oxygen, sulfur, nitrogen or fluorine. A pair of $R^{34}$ and $R^{35}$, $R^{34}$ and $R^{36}$, or $R^{35}$ and $R^{36}$ may bond together to form a $C_3$-$C_{20}$ aliphatic ring with the carbon atom to which they are attached.

Exemplary tertiary alkyl groups of formula (A-3) include t-butyl, triethylcarbyl, 1-ethylnorbornyl, 1-methylcyclohexyl, 1-ethylcyclopentyl, 2-(2-methyl) adamantyl, 2-(2-ethyl) adamantyl, and t-pentyl.

Other exemplary tertiary alkyl groups include those of the following formulae (A-3)-1 to (A-3)-18.

(A-3)-1

(A-3)-2

(A-3)-3

(A-3)-4

(A-3)-5

(A-3)-6

(A-3)-7 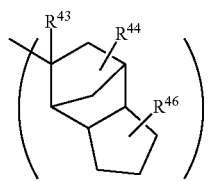

(A-3)-8 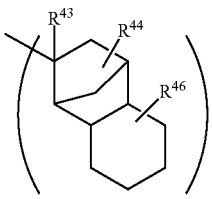

(A-3)-9 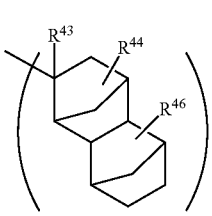

(A-3)-10 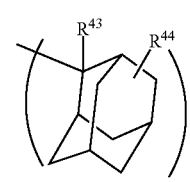

(A-3)-11 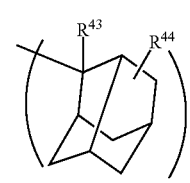

(A-3)-12 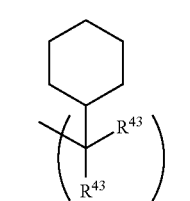

(A-3)-13 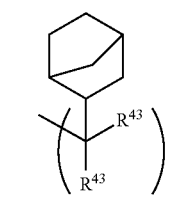

(A-3)-14 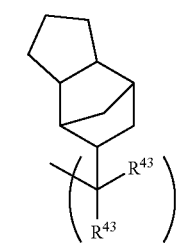

(A-3)-15 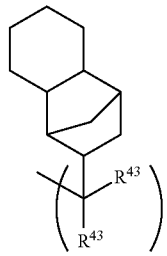

(A-3)-16 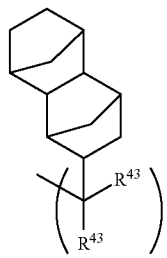

(A-3)-17 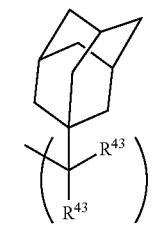

(A-3)-18 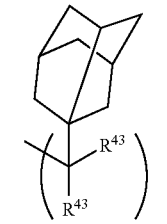

Herein $R^{43}$ is each independently a straight, branched or cyclic $C_1$-$C_8$ alkyl group or $C_6$-$C_{20}$ aryl group, typically phenyl. $R^{44}$ and $R^{46}$ each are hydrogen or a straight, branched or cyclic $C_1$-$C_{20}$ alkyl group. $R^{45}$ is a $C_6$-$C_{20}$ aryl group, typically phenyl.

The base resin may be crosslinked within the molecule or between molecules with an acid labile group having the following formula (A-3)-19 or (A-3)-20.

(A-3)-19 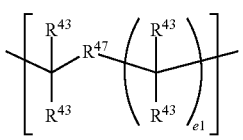

(A-3)-20 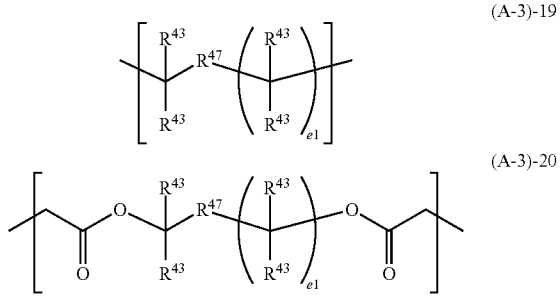

Herein $R^{43}$ is as defined above, $R^{47}$ is a straight, branched or cyclic $C_1$-$C_{20}$ alkylene group or $C_6$-$C_{20}$ arylene group, typically phenylene, which may contain a heteroatom such as oxygen, sulfur or nitrogen, and e1 is an integer of 1 to 3.

Of recurring units having acid labile groups of formula (A-3), recurring units of (meth)acrylate having an exo-form structure represented by the formula (A-3)-21 are preferred.

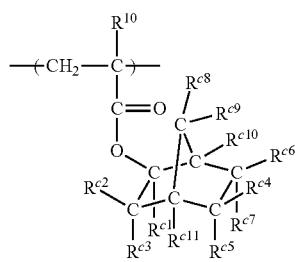

(A-3)-21

Herein, $R^{10}$ is as defined above; $R^{c1}$ is a straight, branched or cyclic $C_1$-$C_8$ alkyl group or an optionally substituted $C_6$-$C_{20}$ aryl group; $R^{c2}$ to $R^{c7}$, $R^{c10}$ and $R^{c11}$ are each independently hydrogen or a $C_1$-$C_{15}$ monovalent hydrocarbon group which may contain a heteroatom; and $R^{c8}$ and $R^{c9}$ are hydrogen. Alternatively, a pair of $R^{c2}$ and $R^{c3}$, $R^{c4}$ and $R^{c6}$, $R^{c4}$ and $R^{c7}$, $R^{c5}$ and $R^{c7}$, $R^{c5}$ and $R^{c11}$, $R^{c6}$ and $R^{c10}$, $R^{c8}$ and $R^{c9}$, or $R^{9}$ and $R^{10}$, taken together, may form a ring with the carbon atom to which they are attached, and in that event, the ring-forming participants represent a $C_1$-$C_{15}$ divalent hydrocarbon group which may contain a heteroatom. Also, a pair of $R^{c2}$ and $R^{c11}$, $R^{c8}$ and $R^{c11}$, or $R^{c4}$ and $R^{c6}$ which are attached to vicinal carbon atoms may bond together directly to form a double bond. $R^{c14}$ is hydrogen or a straight, branched or cyclic $C_1$-$C_{15}$ alkyl group. The formula also represents an enantiomer.

The monomers from which recurring units having formula (A-3)-21 are derived are described in U.S. Pat. No. 6,448,420 (JP-A 2000-327633). Illustrative non-limiting examples of suitable monomers are given below.

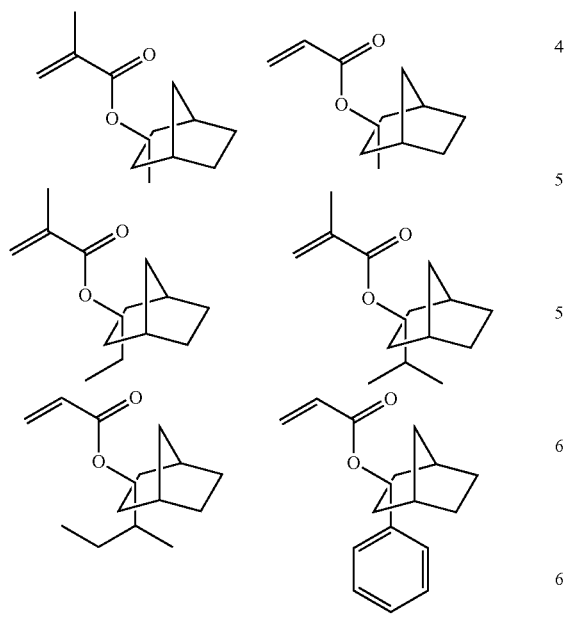

-continued

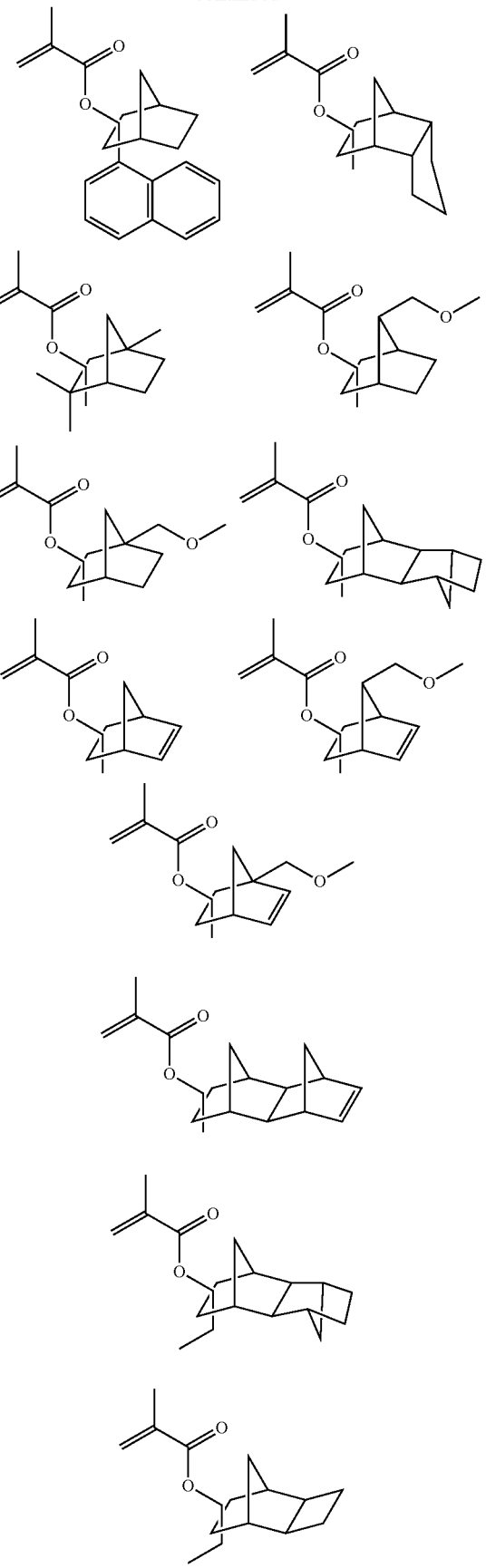

-continued

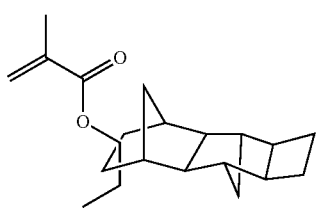

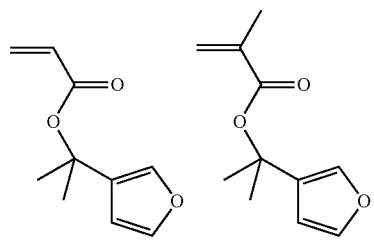

Also included in the recurring units having an acid labile group of formula (A-3) are units of (meth)acrylate having a furandiyl, tetrahydrofurandiyl or oxanorbornanediyl group as represented by the following formula (A-3)-22.

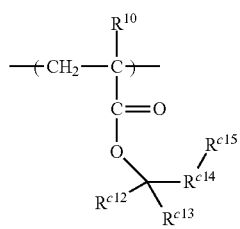
(A-3)-22

Herein, $R^{10}$ is as defined above. $R^{c12}$ and $R^{c13}$ are each independently a straight, branched or cyclic $C_1$-$C_{10}$ monovalent hydrocarbon group, or $R^{c12}$ and $R^{c13}$, taken together, may form an aliphatic hydrocarbon ring with the carbon atom to which they are attached. $R^{c14}$ is a divalent group selected from furandiyl, tetrahydrofurandiyl and oxanorbornanediyl. $R^{c15}$ is hydrogen or a straight, branched or cyclic $C_1$-$C_{10}$ monovalent hydrocarbon group which may contain a heteroatom.

Examples of the monomer from which the recurring units having formula (A-3)-22 are derived are shown below, but not limited thereto.

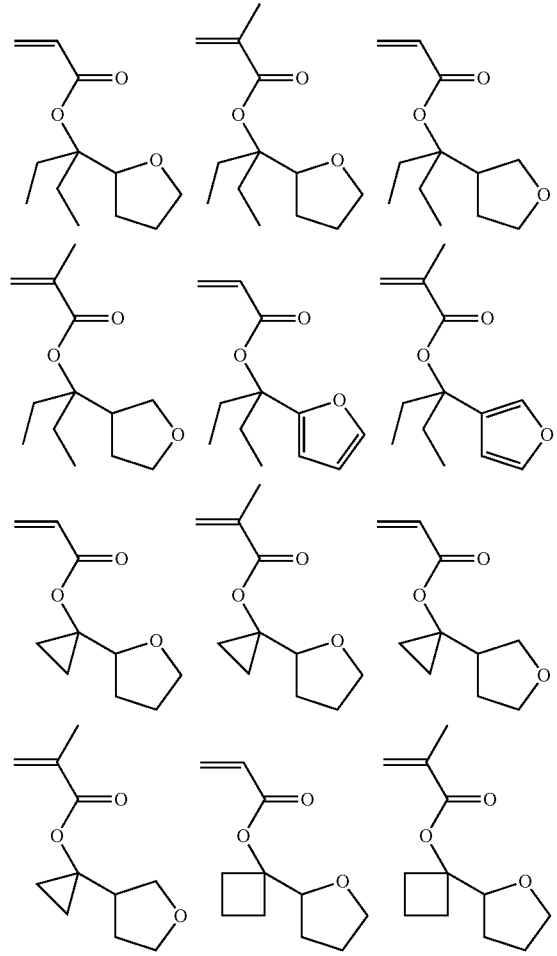

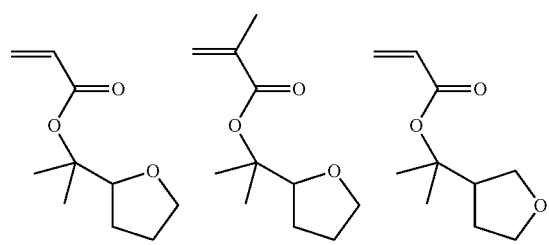

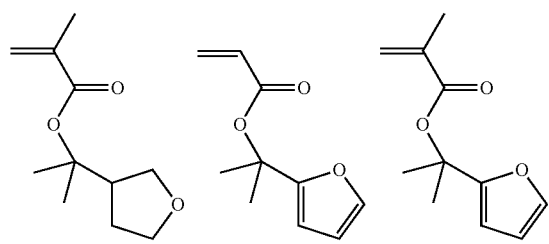

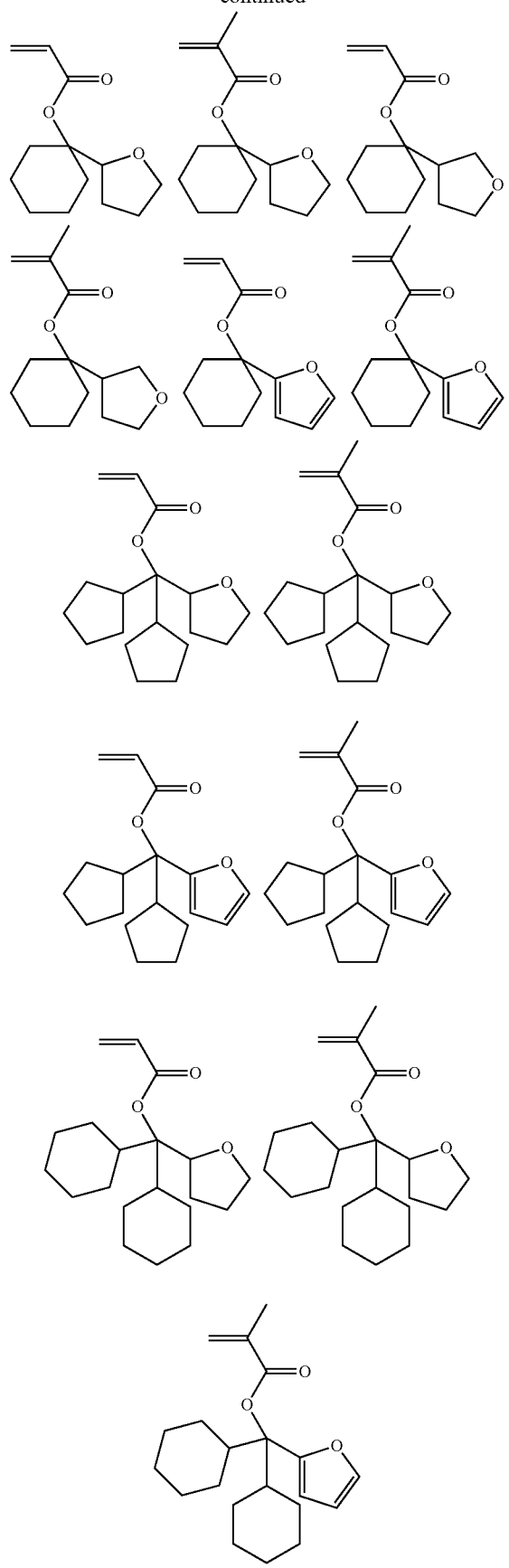
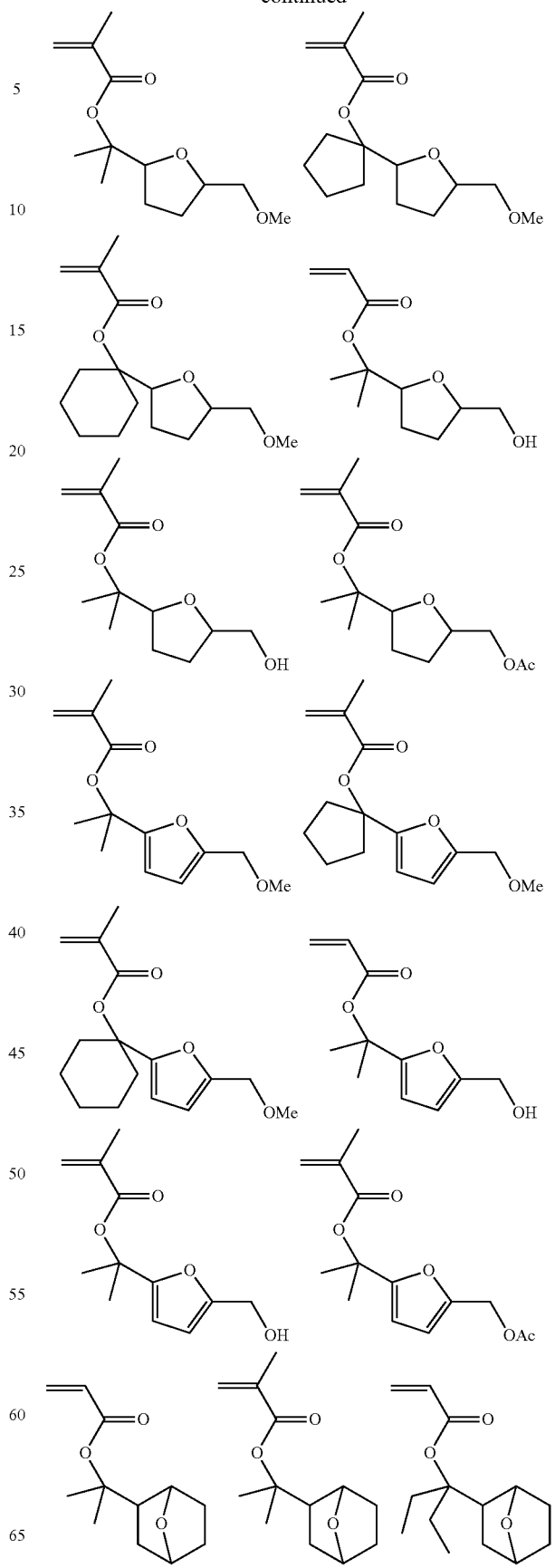

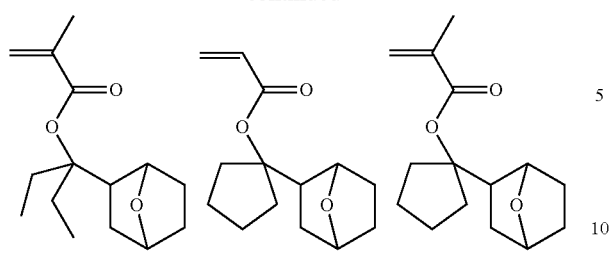
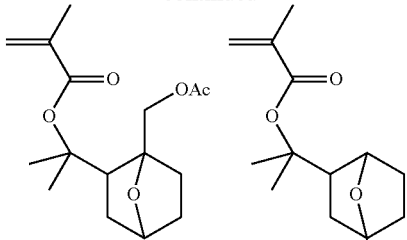
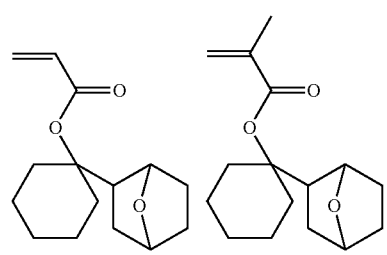
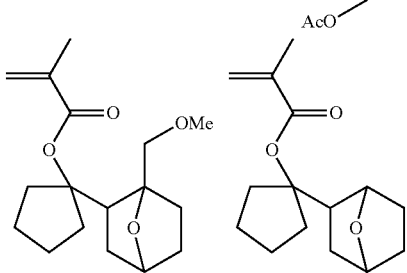
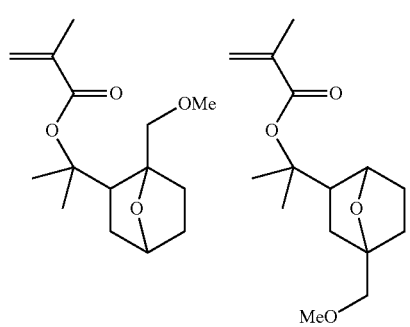
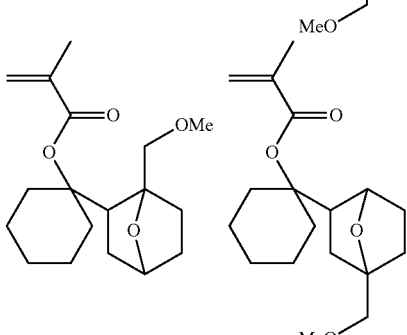
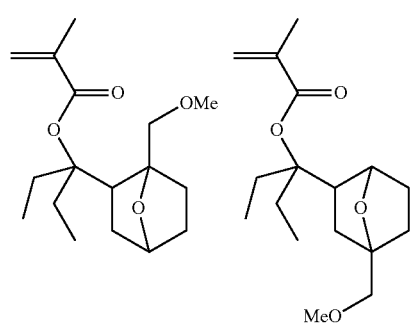
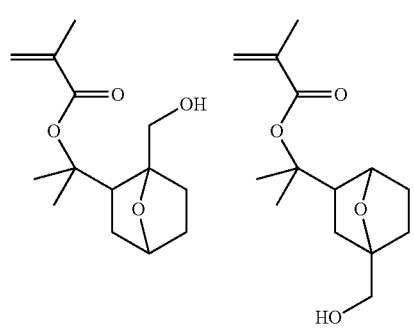
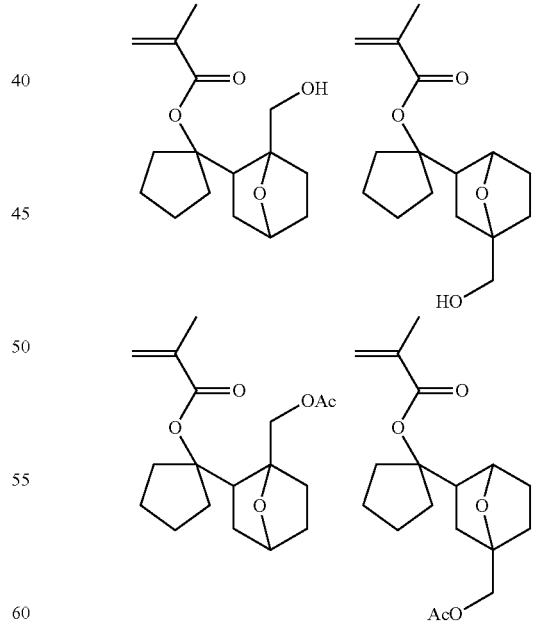
Another example of the acid labile group having formula (A-3) is a group having the following formula (A-3)-23. When an acid labile group of formula (A-3)-23 is contained, it is preferred that the base resin include recurring units (d1) substituted with this acid labile group.

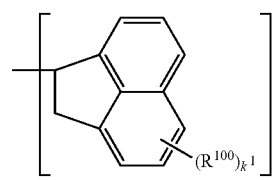

(A-3)-23

Herein $R^{100}$ is hydrogen, halogen, cyano, $C_1$-$C_4$ alkyl, $C_1$-$C_4$ alkoxy, $C_2$-$C_5$ acyl, $C_2$-$C_5$ alkoxycarbonyl, or $C_6$-$C_{10}$ aryl group, and $k^1$ is an integer of 1 to 4.

Examples of the monomer from which the recurring units having formula (A-3)-23 are derived are shown below, but not limited thereto.

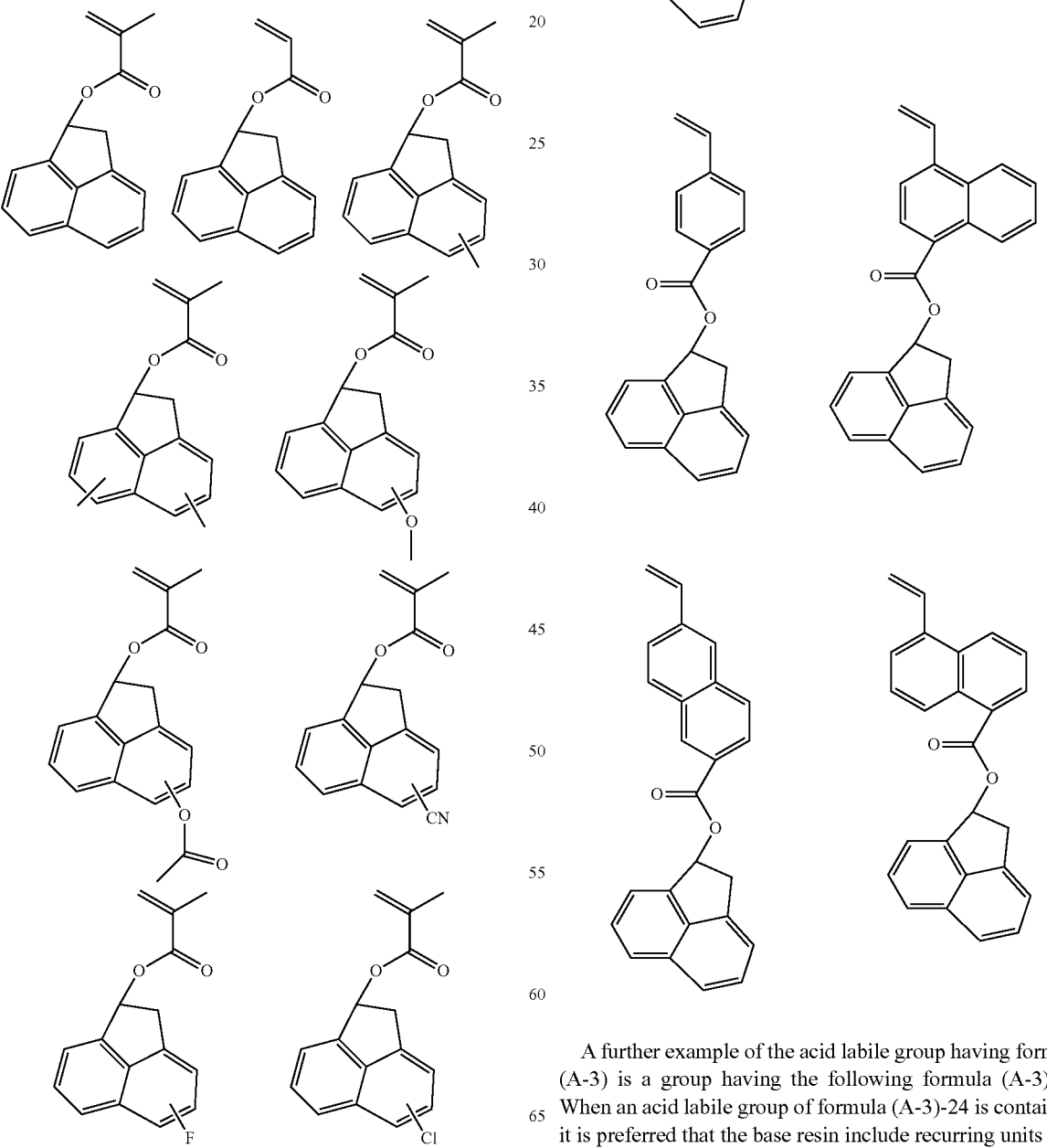

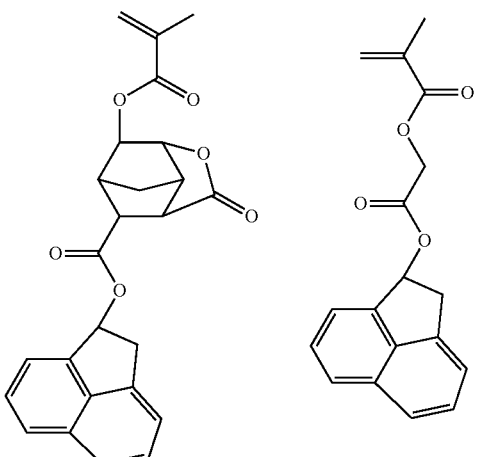

A further example of the acid labile group having formula (A-3) is a group having the following formula (A-3)-24. When an acid labile group of formula (A-3)-24 is contained, it is preferred that the base resin include recurring units (d1) substituted with this acid labile group.

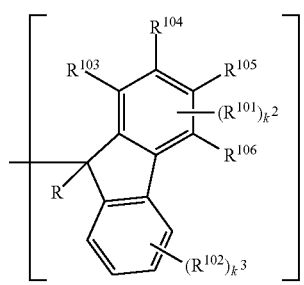
(A-3)-24

Herein $R^{101}$ and $R^{102}$ are each independently hydrogen, halogen, cyano, hydroxyl, $C_1$-$C_4$ alkyl, $C_1$-$C_4$ alkoxy, $C_2$-$C_5$ acyl, $C_2$-$C_5$ alkoxycarbonyl, or $C_6$-$C_{10}$ aryl group. R is hydrogen, or a straight, branched or cyclic $C_1$-$C_{12}$ alkyl, $C_2$-$C_{12}$ alkenyl, $C_2$-$C_{12}$ alkynyl or $C_6$-$C_{10}$ aryl group, which may contain an oxygen or sulfur atom. $R^{103}$, $R^{104}$, $R^{105}$ and $R^{106}$ are hydrogen, or a pair of $R^{103}$ and $R^{104}$, $R^{104}$ and $R^{105}$, or $R^{105}$ and $R^{106}$ may bond together to form a benzene ring. Each of $k^2$ and $k^3$ is independently an integer of 1 to 4.

Examples of the monomer from which the recurring units having formula (A-3)-24 are derived are shown below, but not limited thereto.

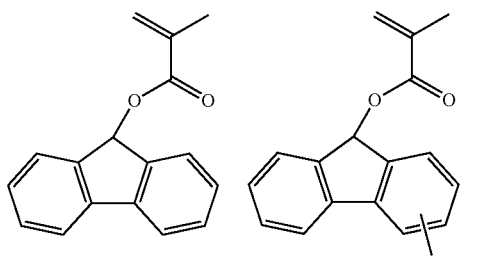

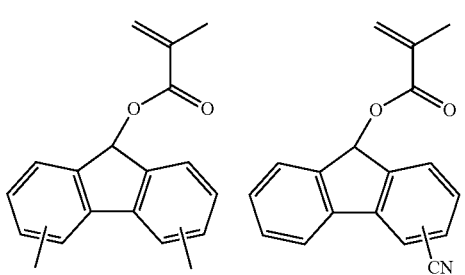

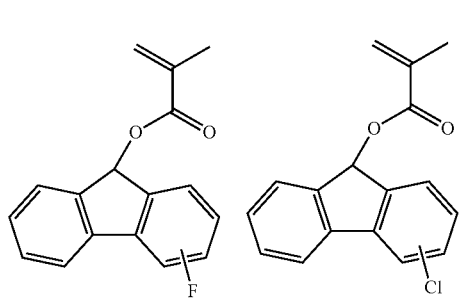

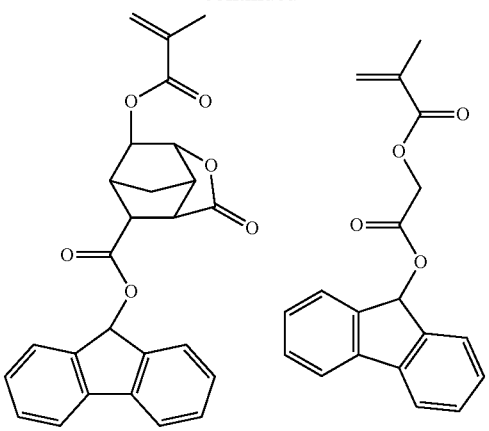

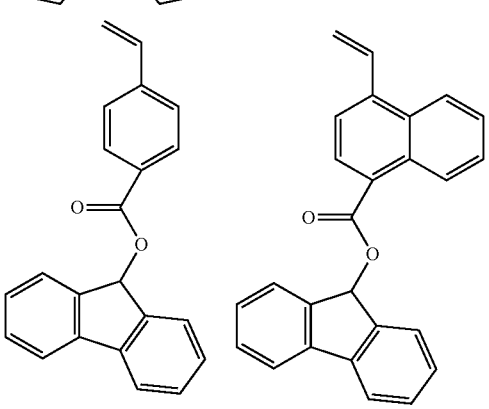

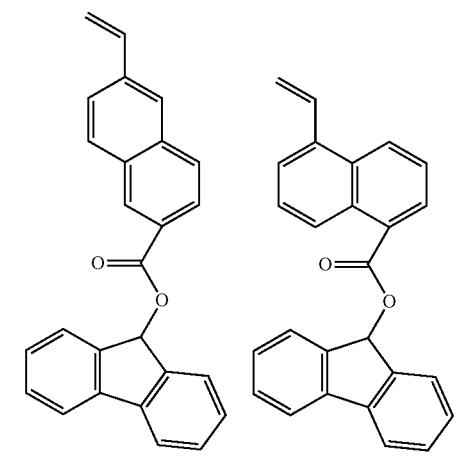

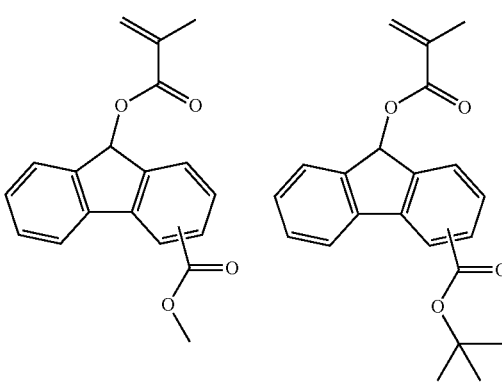

-continued
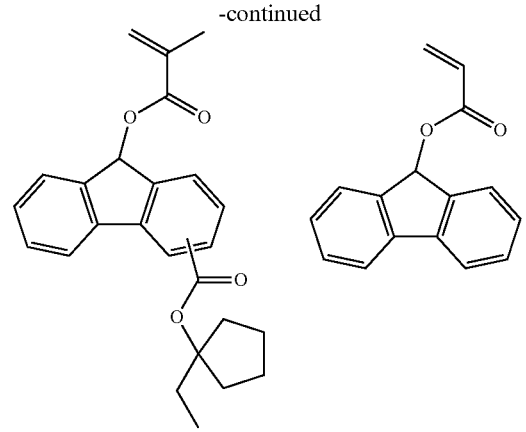
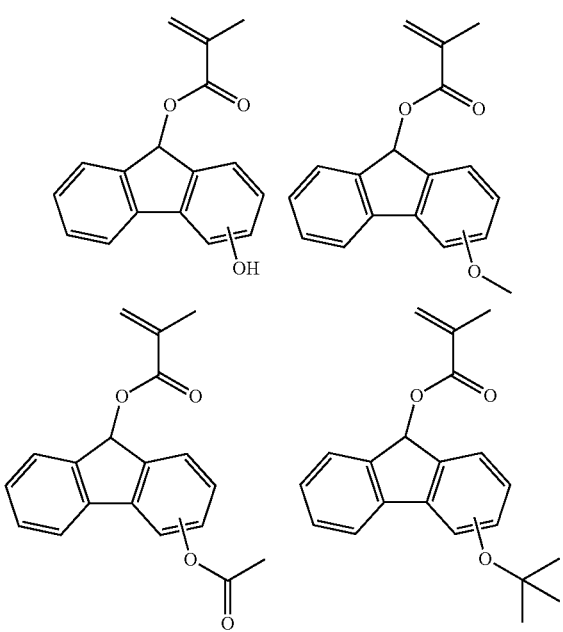
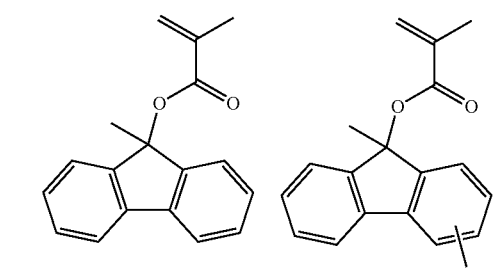
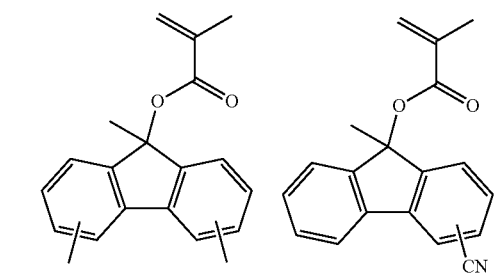
-continued
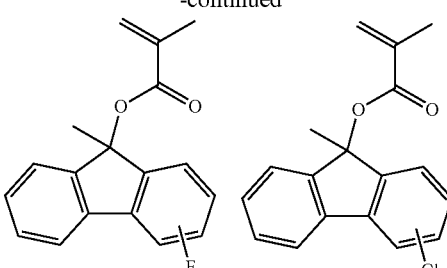
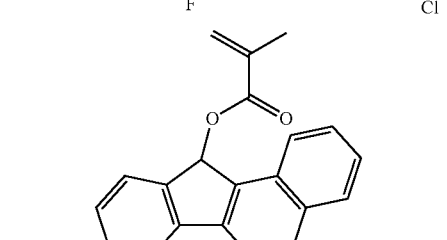
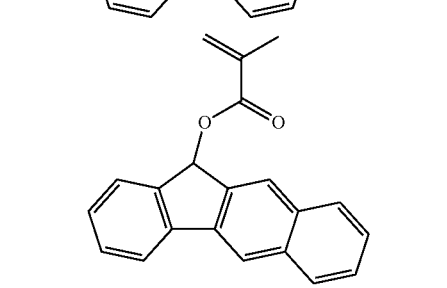
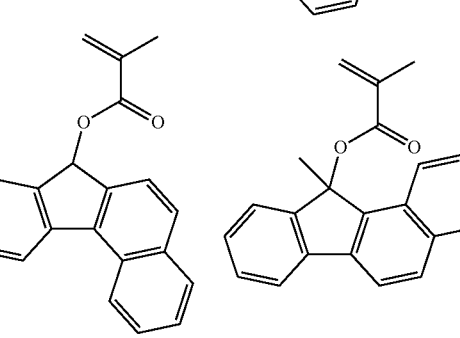
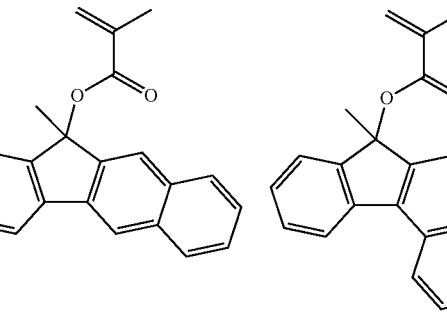
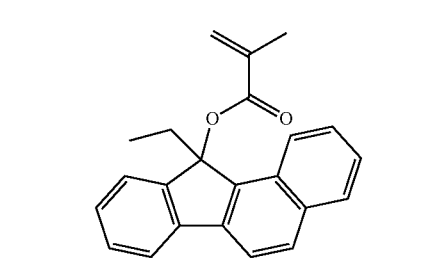

81
-continued
82
-continued
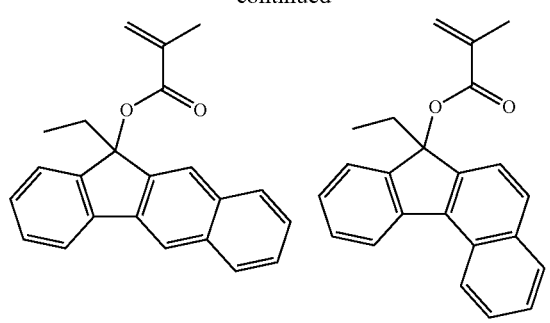
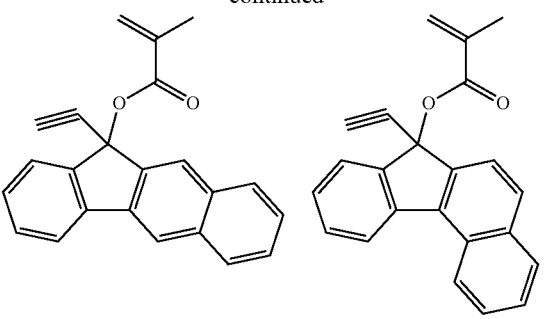
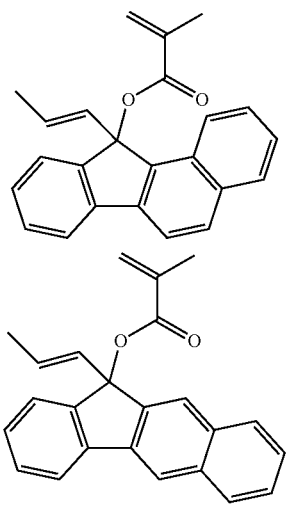
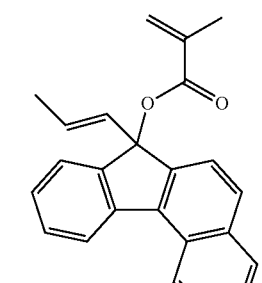
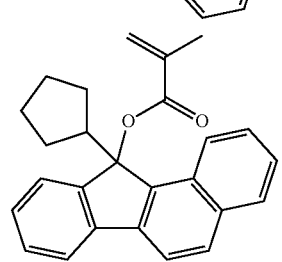
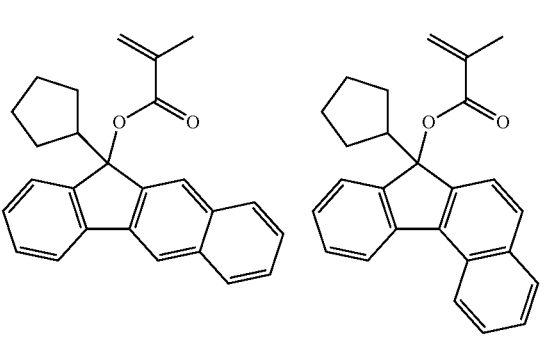

-continued
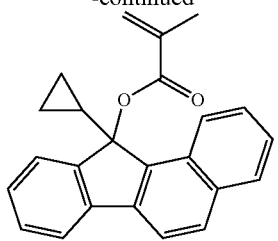
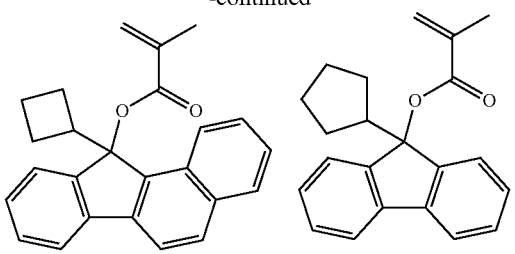
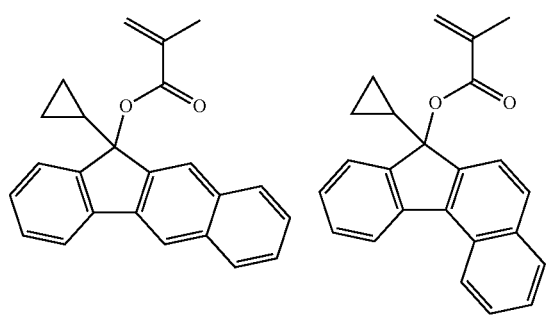
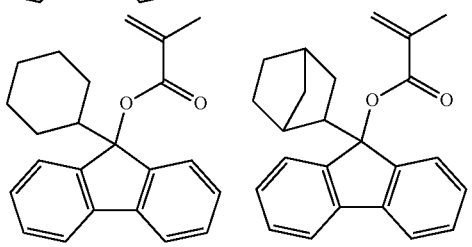
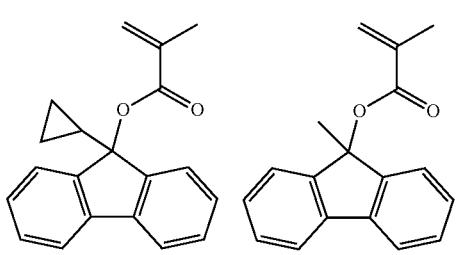
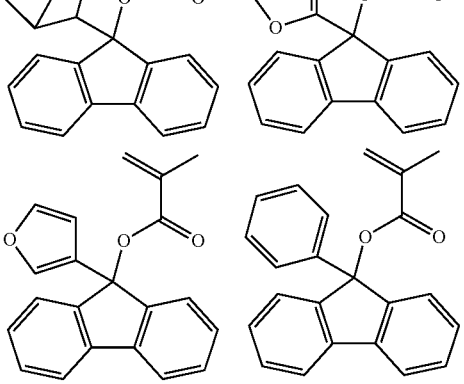
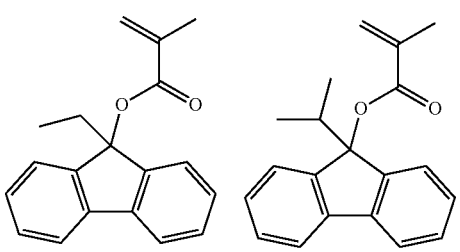
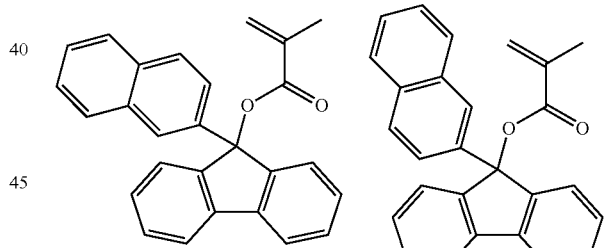
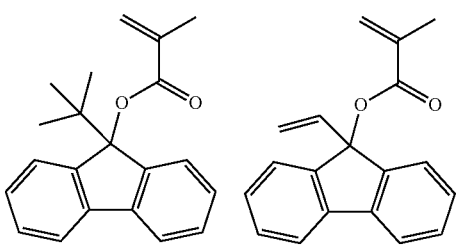
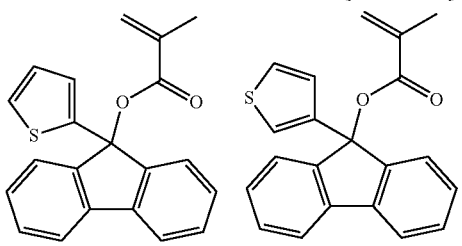
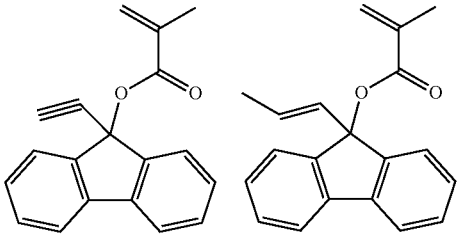
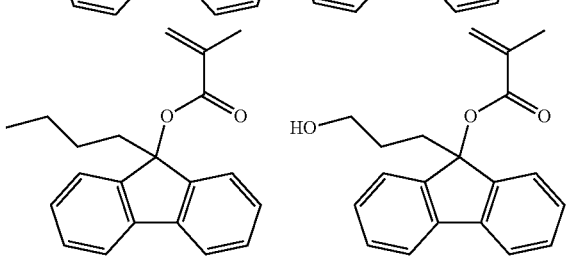

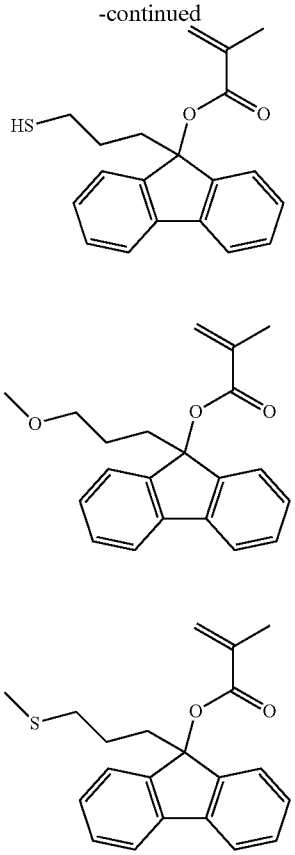

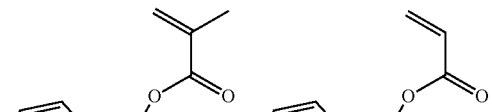
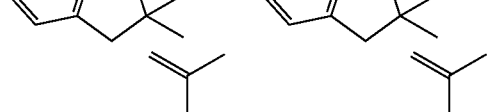
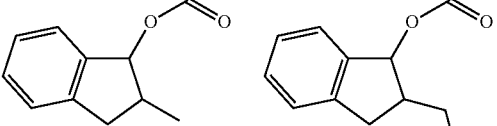
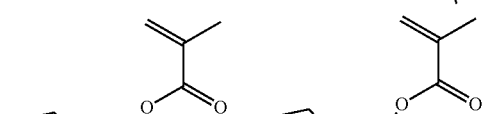
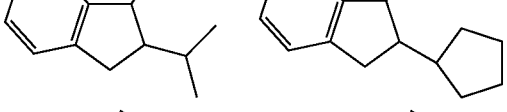
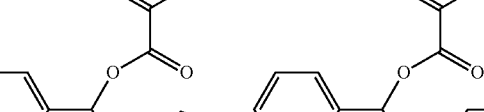

A still further example of the acid labile group having formula (A-3) is a group having the following formula (A-3)-25. When an acid labile group of formula (A-3)-25 is contained, it is preferred that the base resin include recurring units (d1) substituted with this acid labile group.

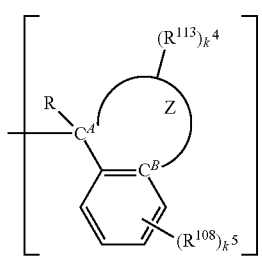

(A-3)-25

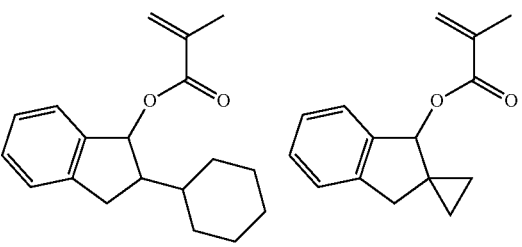

Herein R is as defined above. $R^{107}$ is each independently hydrogen or a straight, branched or cyclic $C_1$-$C_6$ alkyl group, and in case $k^4 \geq 2$, groups $R^{107}$ may bond together to form a $C_2$-$C_8$ ring. The circle Z represents a divalent group linking carbon atoms $C^A$ and $C^B$, specifically ethylene, propylene, butylene or pentylene group, with the proviso that $R^{107}$ is not hydrogen when Z is ethylene or propylene. $R^{108}$ is each independently hydrogen, hydroxyl, nitro, halogen, cyano, $C_1$-$C_4$ alkyl, $C_1$-$C_4$ alkoxy, $C_2$-$C_5$ acyl, $C_2$-$C_5$ alkoxycarbonyl, or $C_6$-$C_{10}$ aryl group. Each of $k^4$ and $k^5$ is independently an integer of 1 to 4.

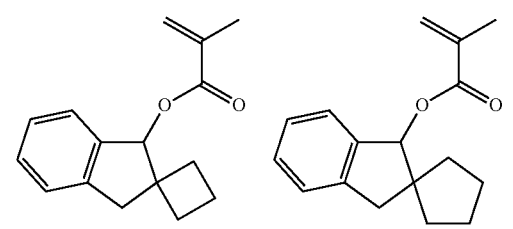

Examples of the monomer from which the recurring units having formula (A-3)-25 are derived are shown below, but not limited thereto.

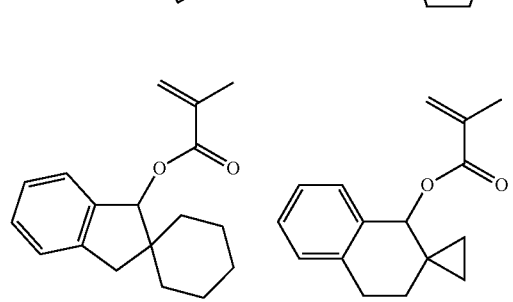

-continued
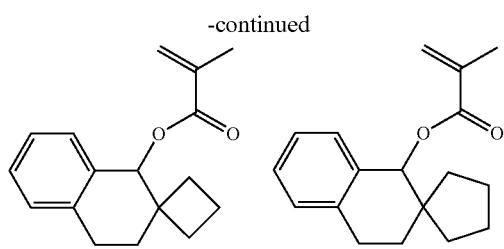
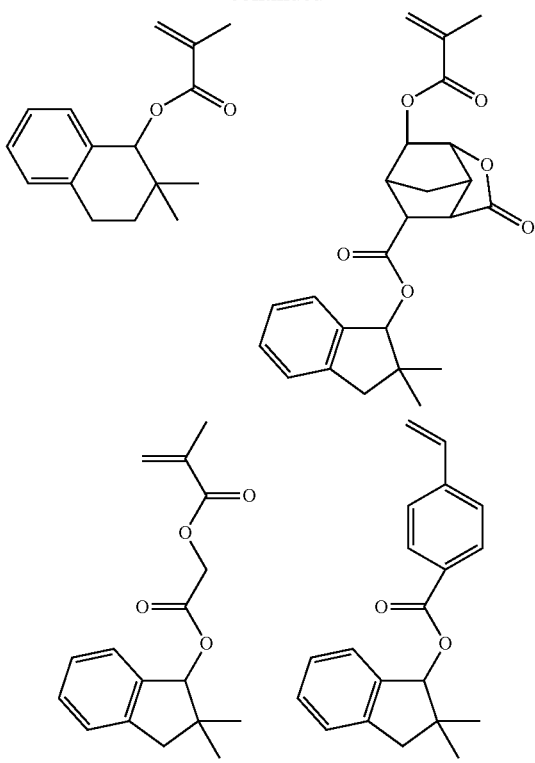
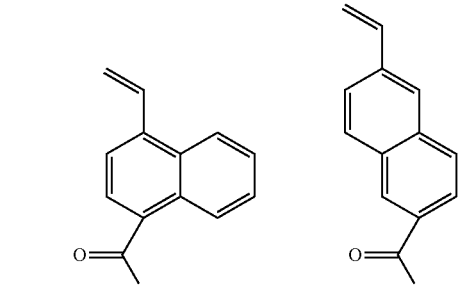
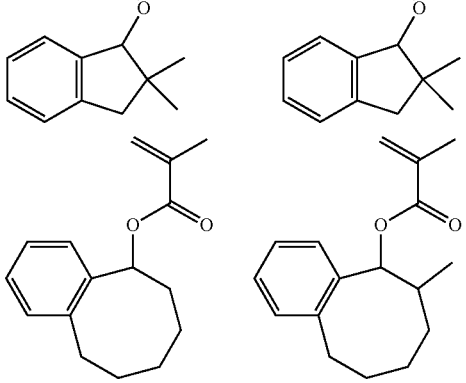
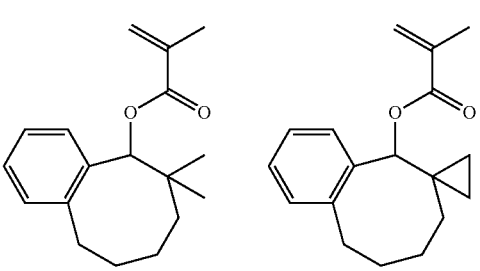

89
-continued
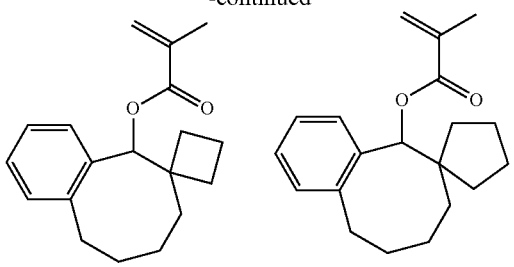
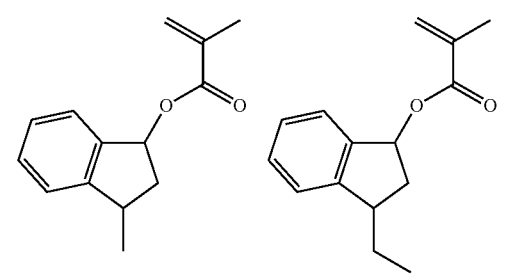
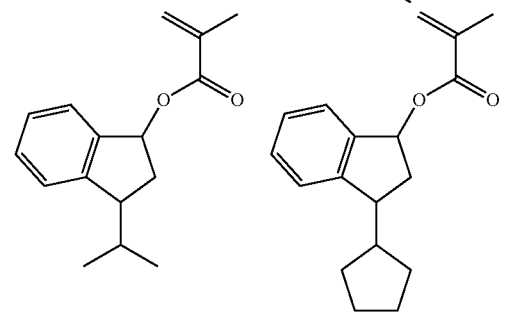
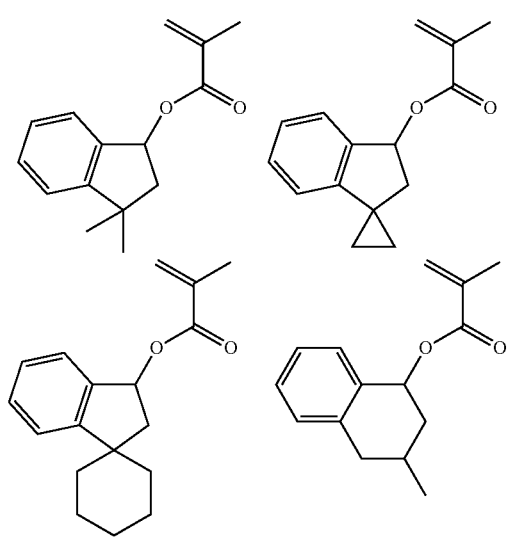
90
-continued
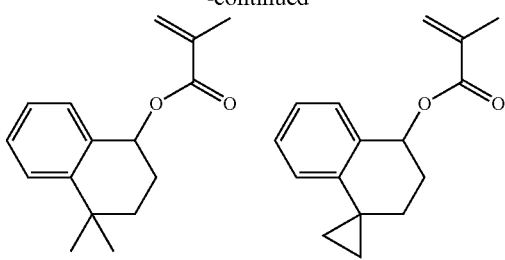
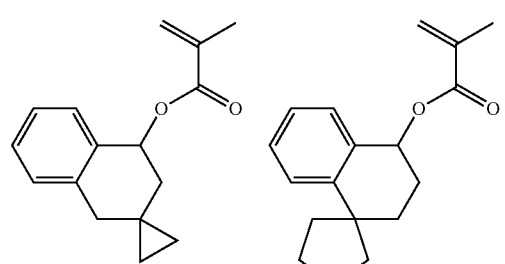
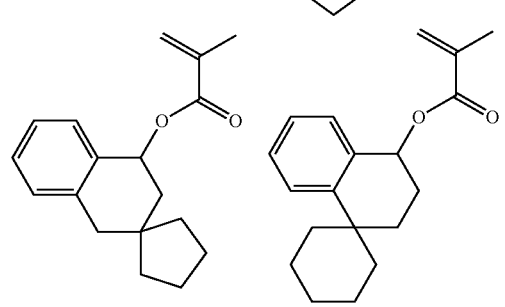
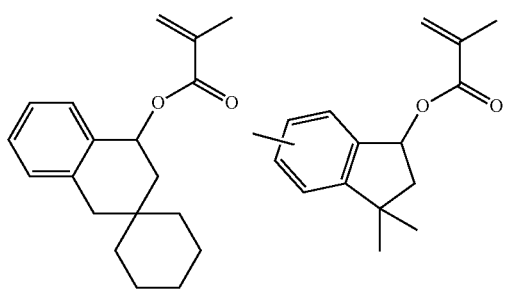
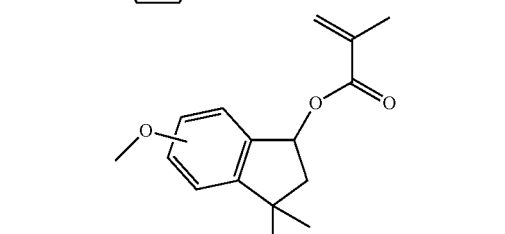
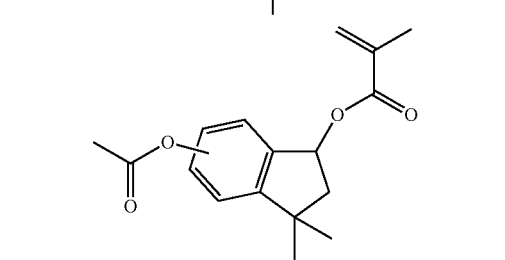

-continued
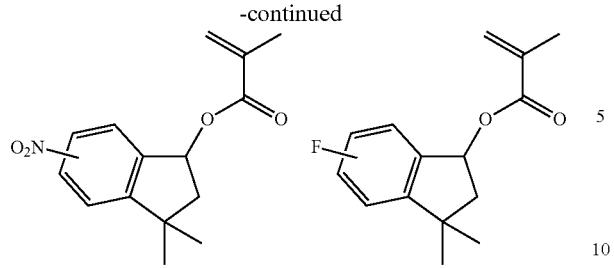
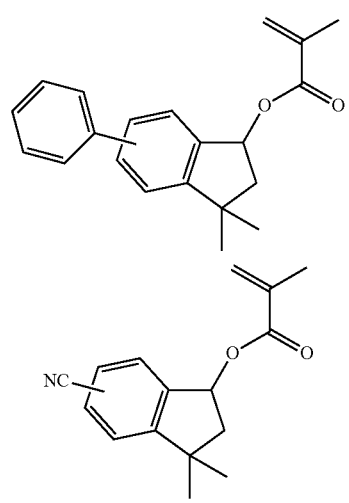
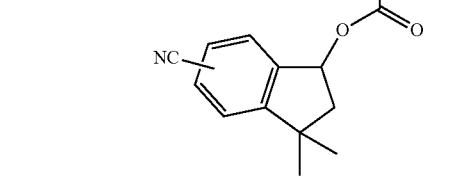
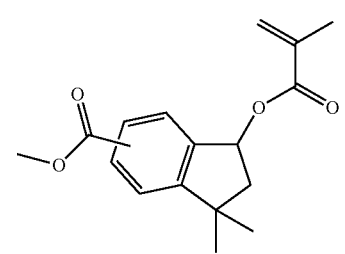
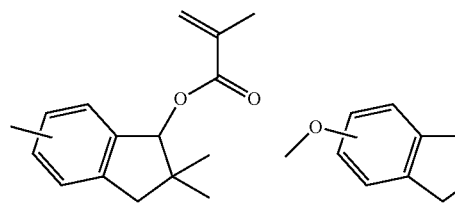
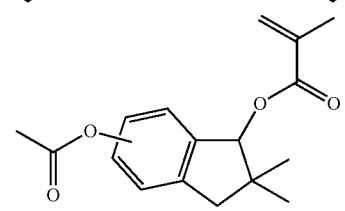
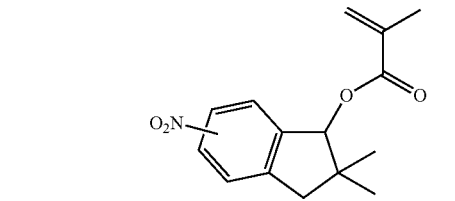
-continued
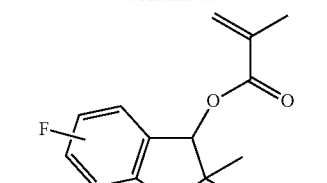
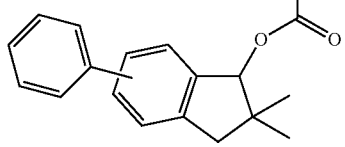
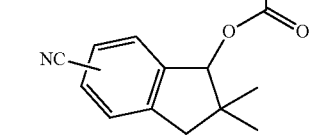
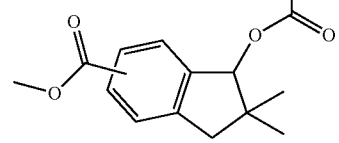
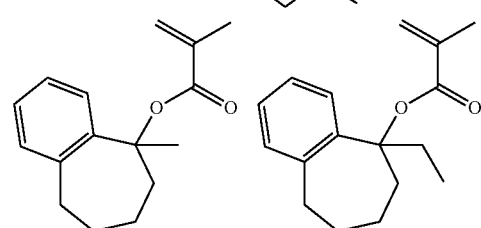
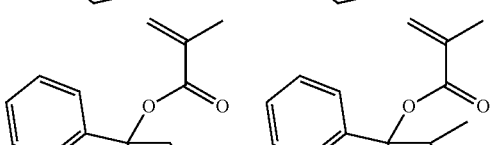
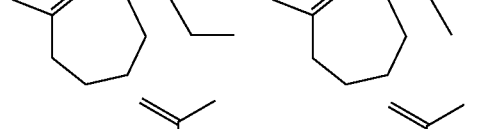
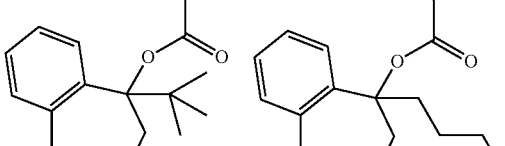
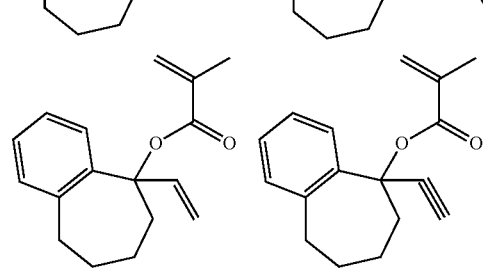

93
-continued
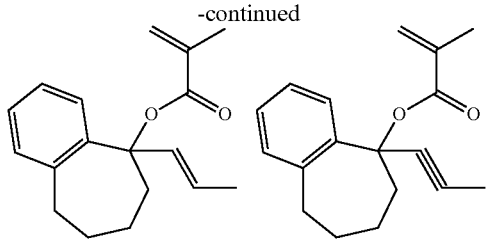
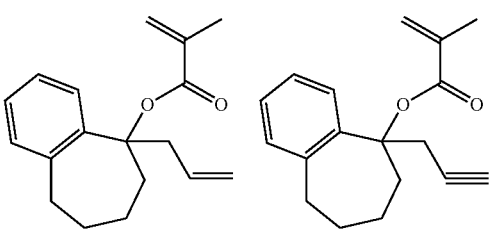
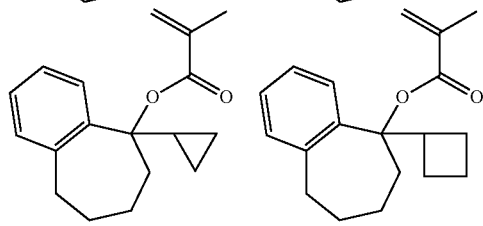
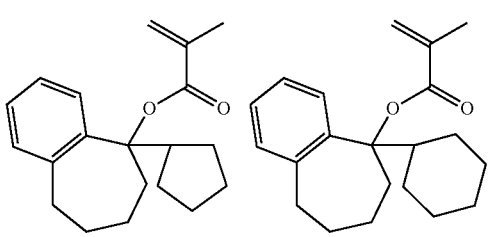
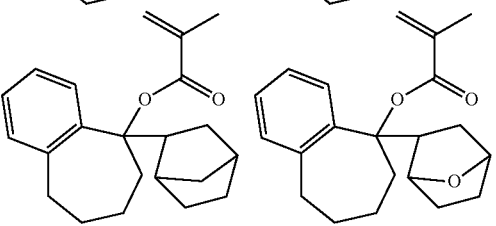
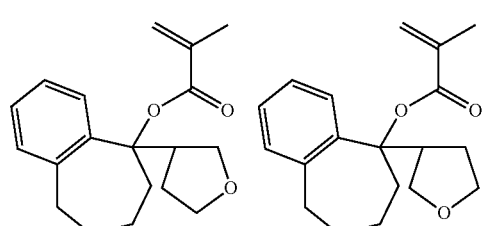
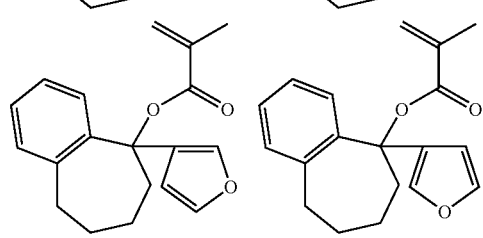
94
-continued
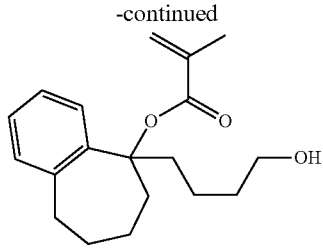
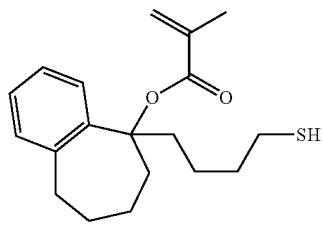
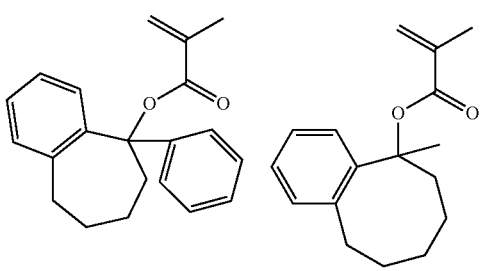
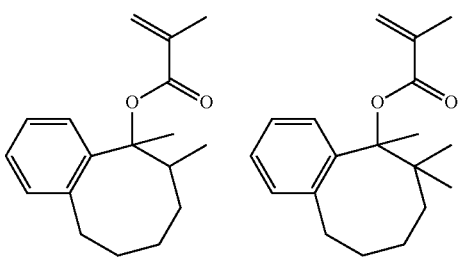
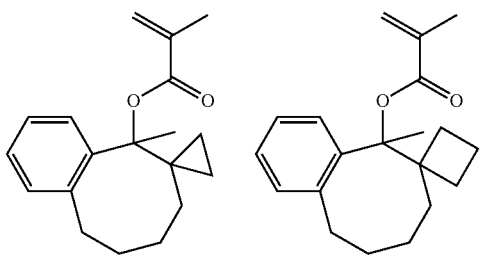
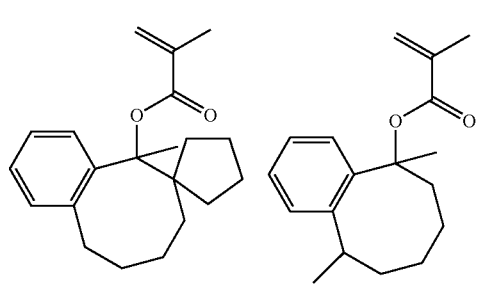

95
-continued
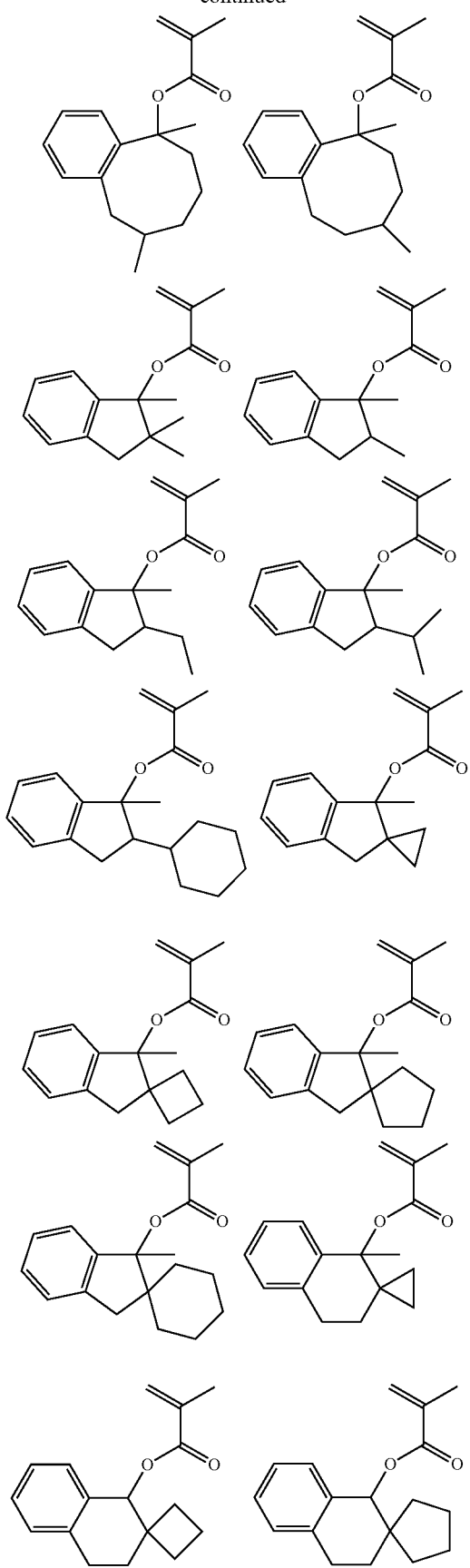
96
-continued
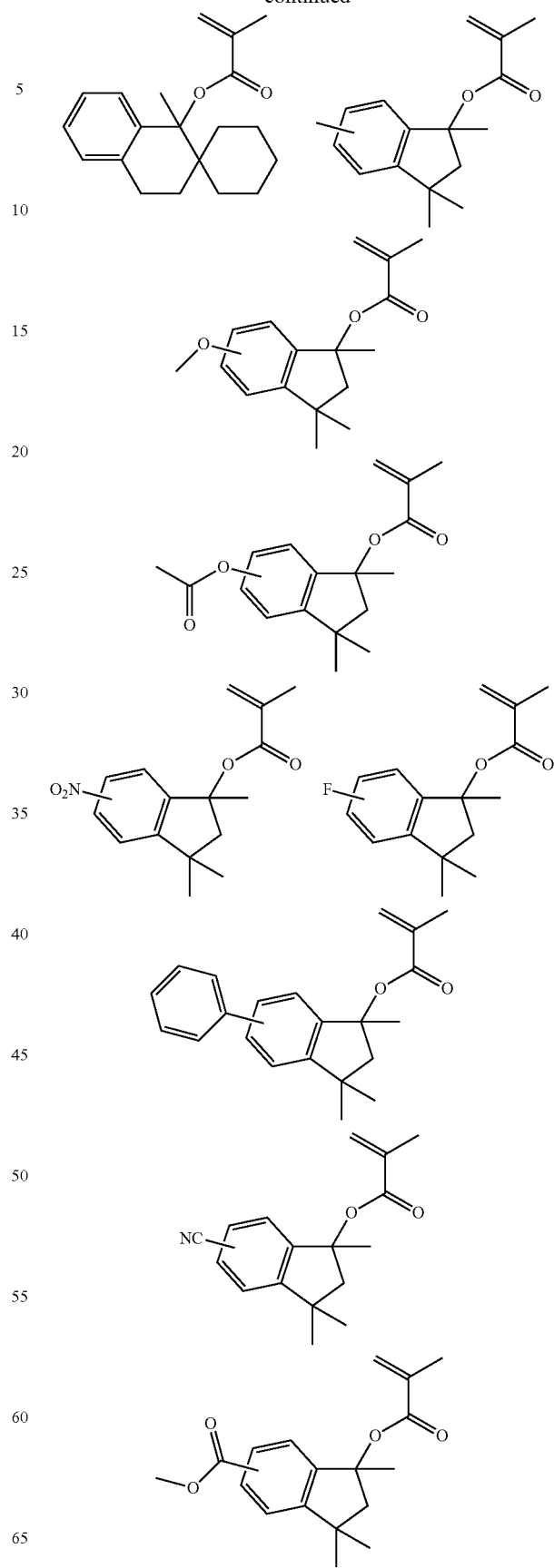

-continued

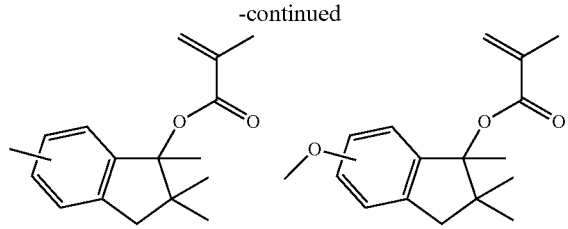

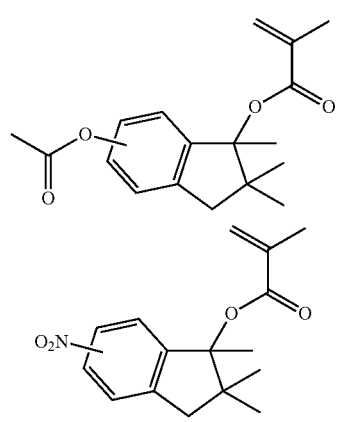

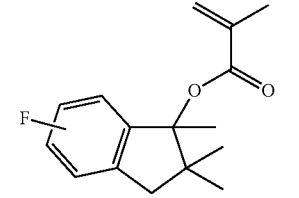

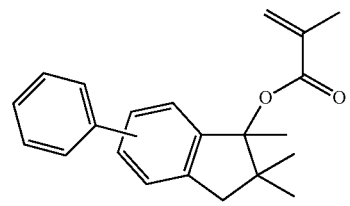

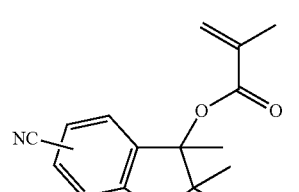

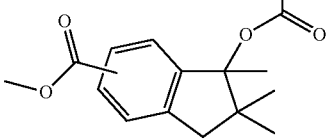

A still further example of the acid labile group having formula (A-3) is a group having the following formula (A-3)-26. When an acid labile group of formula (A-3)-26 is contained, it is preferred that the base resin include recurring units (d1) substituted with this acid labile group.

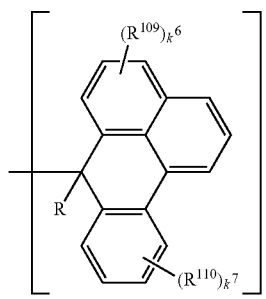

(A-3)-26

Herein R is as defined above. $R^{109}$ and $R^{110}$ are each independently hydrogen, hydroxyl, nitro, halogen, cyano, $C_1$-$C_4$ alkyl, $C_1$-$C_4$ alkoxy, $C_2$-$C_5$ acyl, $C_2$-$C_5$ alkoxycarbonyl, or $C_6$-$C_{10}$ aryl group. Each of $k^6$ and $k^7$ is independently an integer of 1 to 4.

Examples of the monomer from which the recurring units having formula (A-3)-26 are derived are shown below, but not limited thereto.

99
-continued
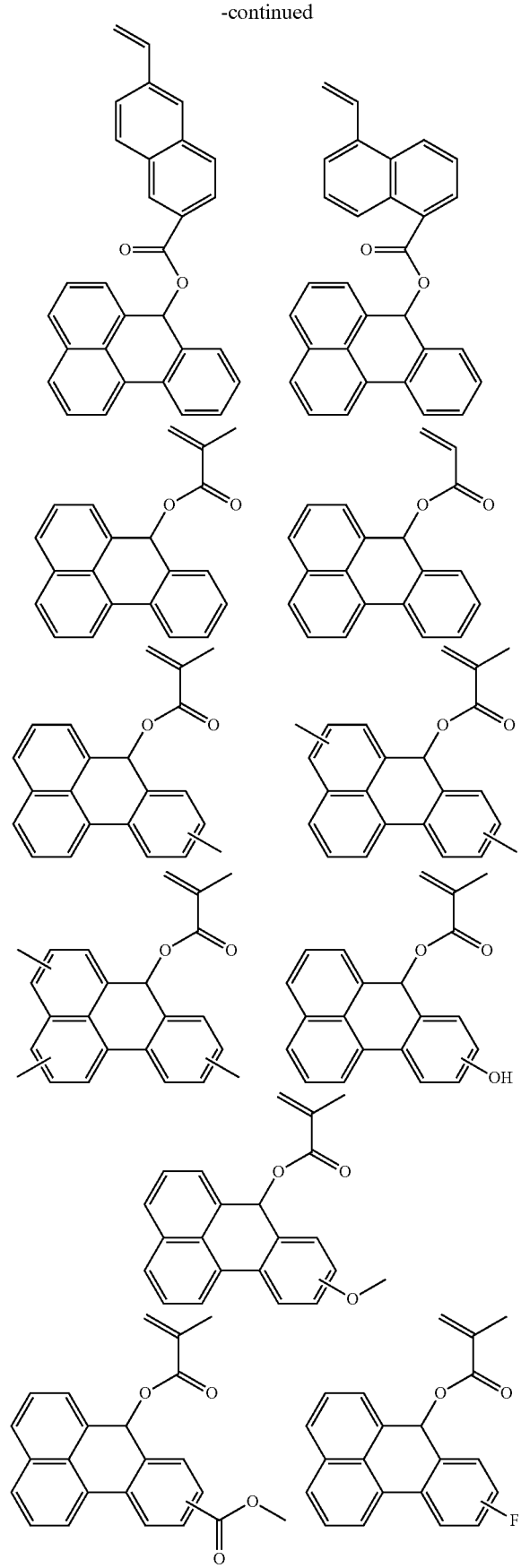
100
-continued
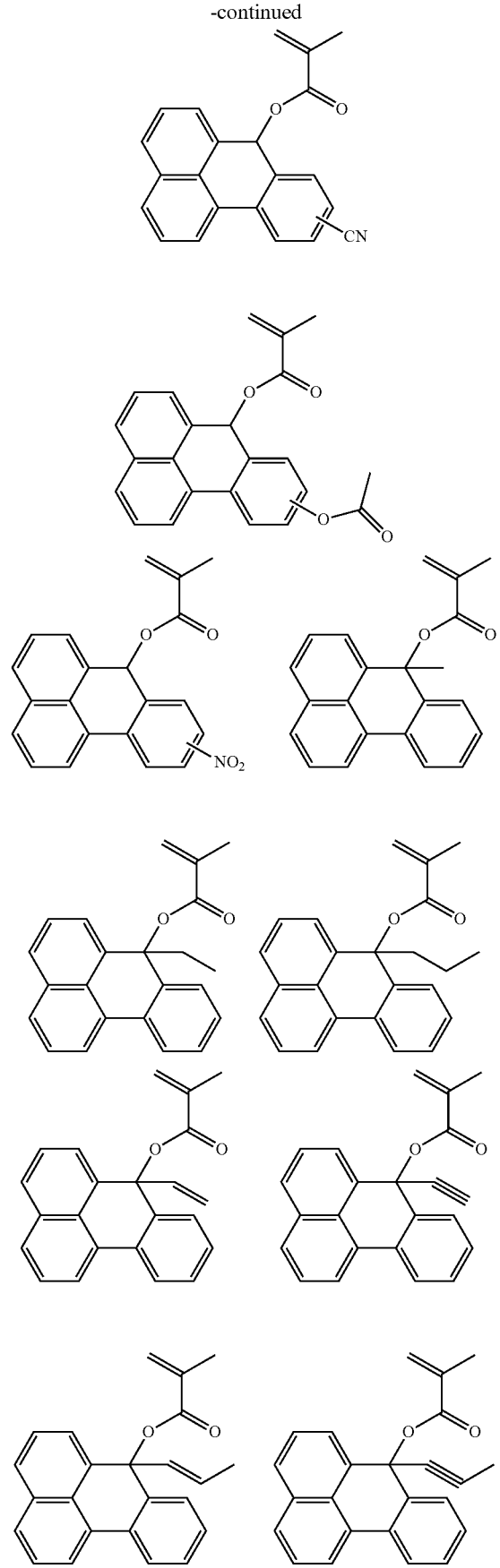

101
-continued
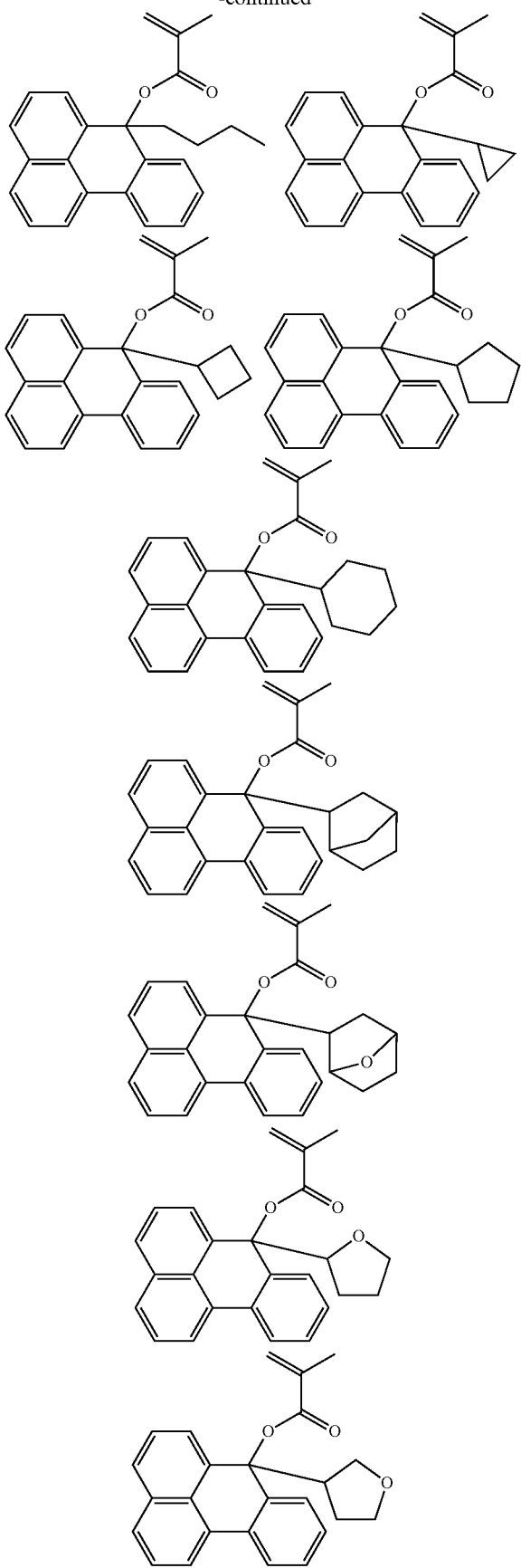
102
-continued
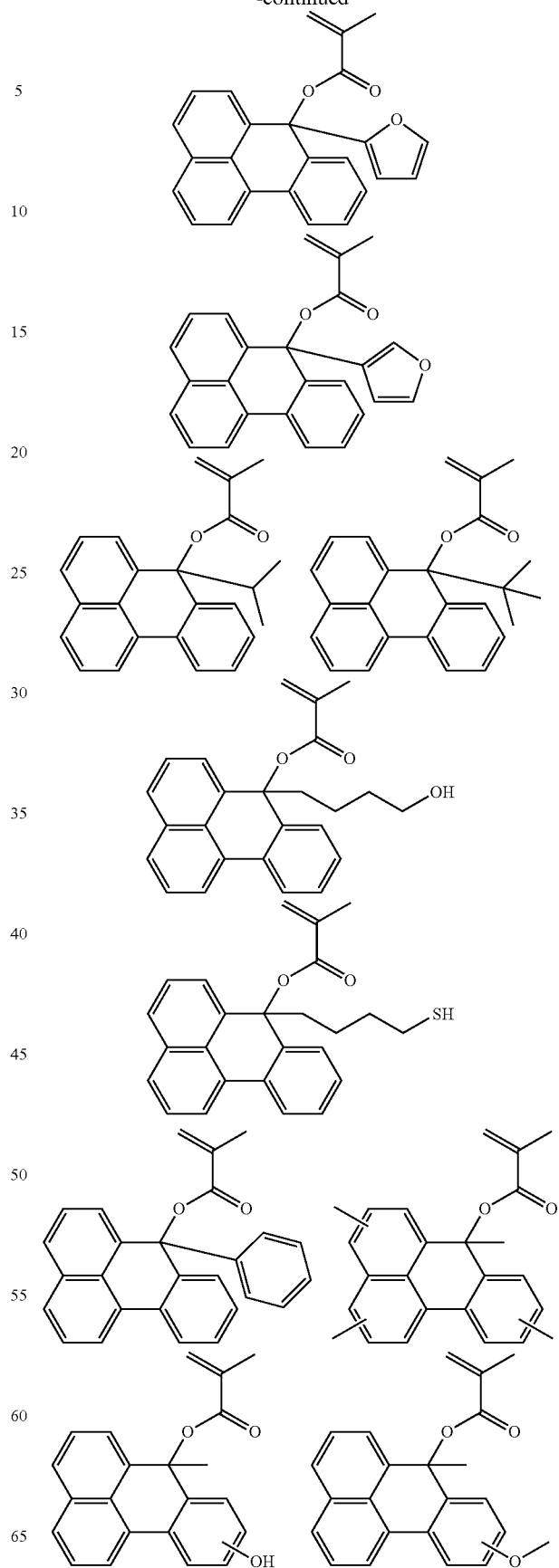

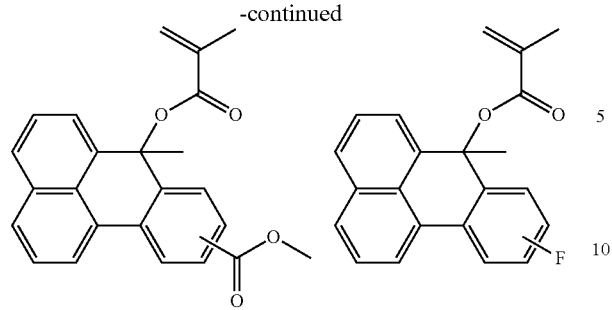

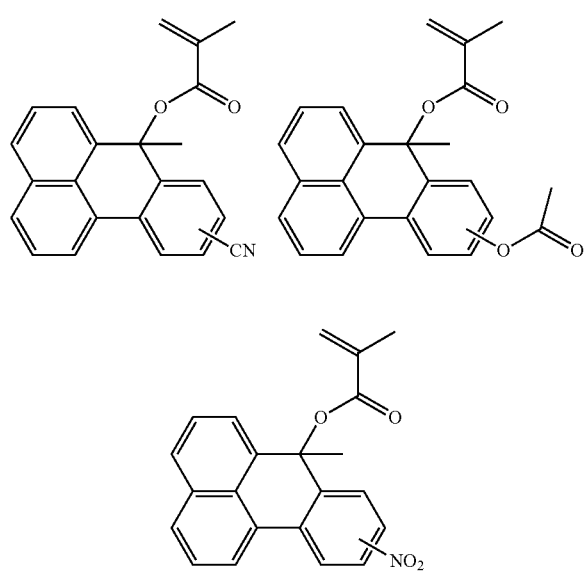

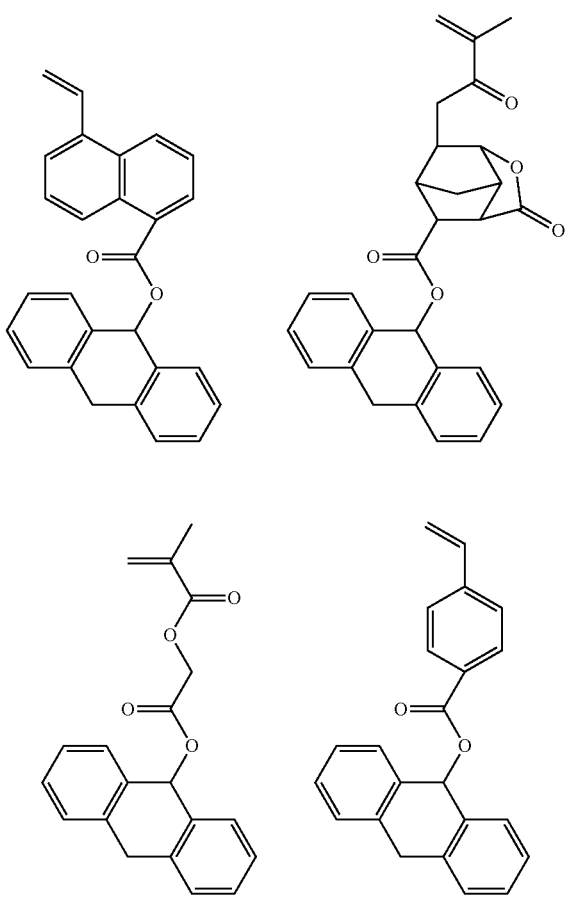

A still further example of the acid labile group having formula (A-3) is a group having the following formula (A-3)-27. When an acid labile group of formula (A-3)-27 is contained, it is preferred that the base resin include recurring units (d1) substituted with this acid labile group.

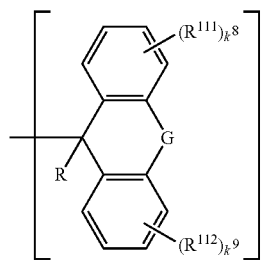

(A-3)-27

Herein R is as defined above. $R^{111}$ and $R^{112}$ are each independently hydrogen, hydroxyl, halogen, cyano, $C_1$-$C_4$ alkyl, $C_1$-$C_4$ alkoxy, $C_2$-$C_5$ acyl, $C_2$-$C_5$ alkoxycarbonyl, or $C_6$-$C_{10}$ aryl group. Each of $k^8$ and $k^9$ is independently an integer of 1 to 4. G is methylene, ethylene, vinylene or —$CH_2$—S—.

Examples of the monomer from which the recurring units having formula (A-3)-27 are derived are shown below, but not limited thereto.

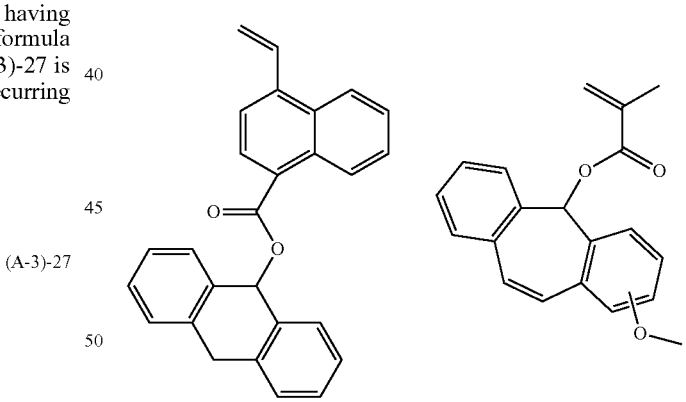

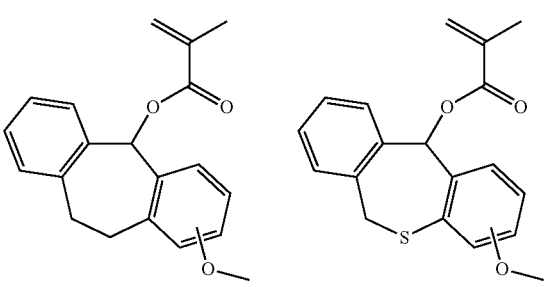

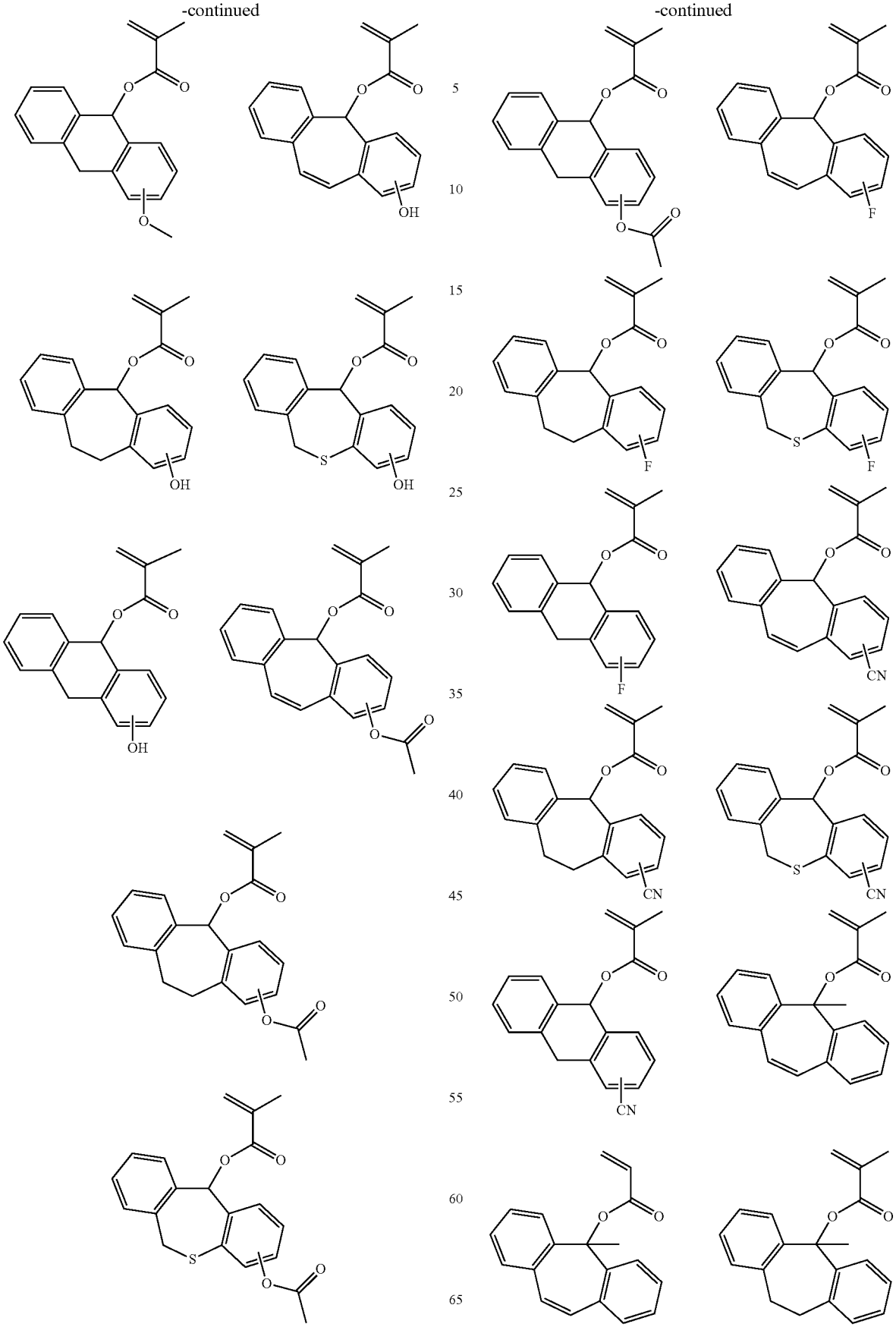

107
-continued
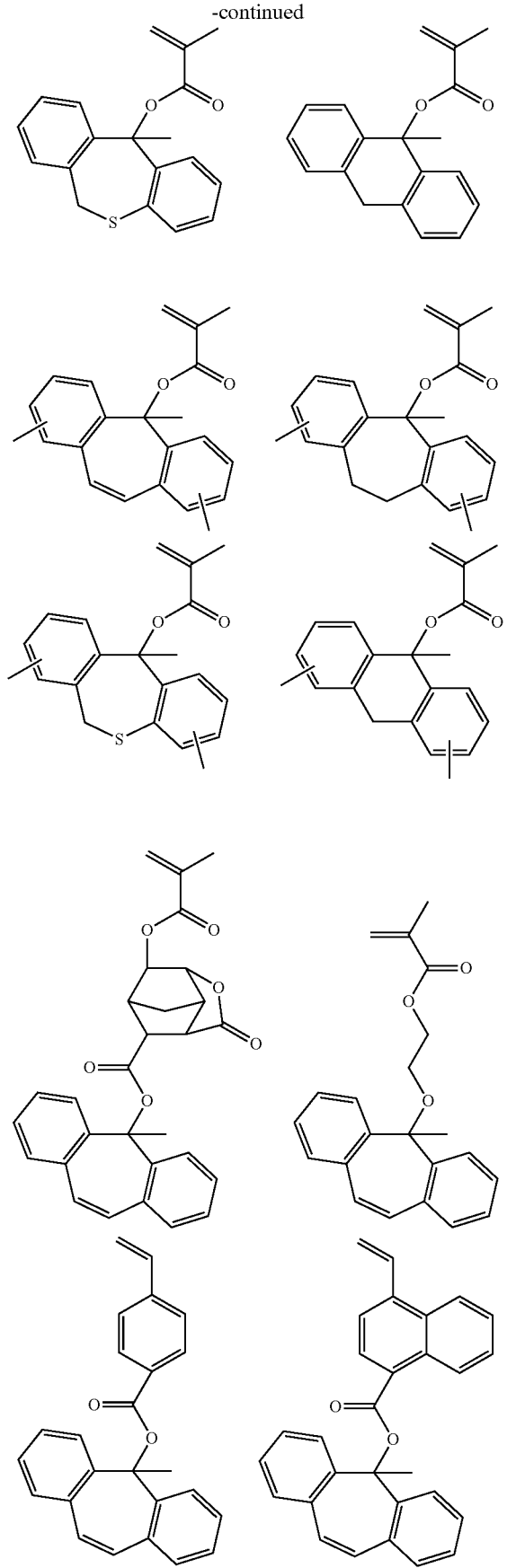
108
-continued
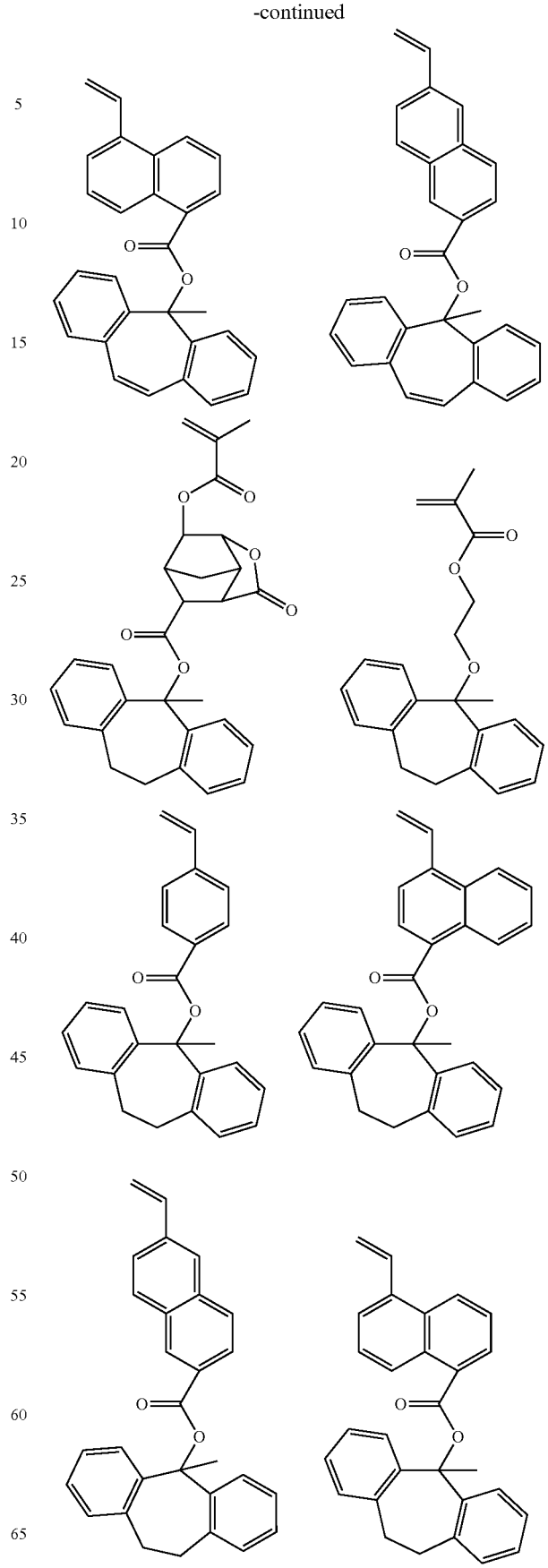

-continued
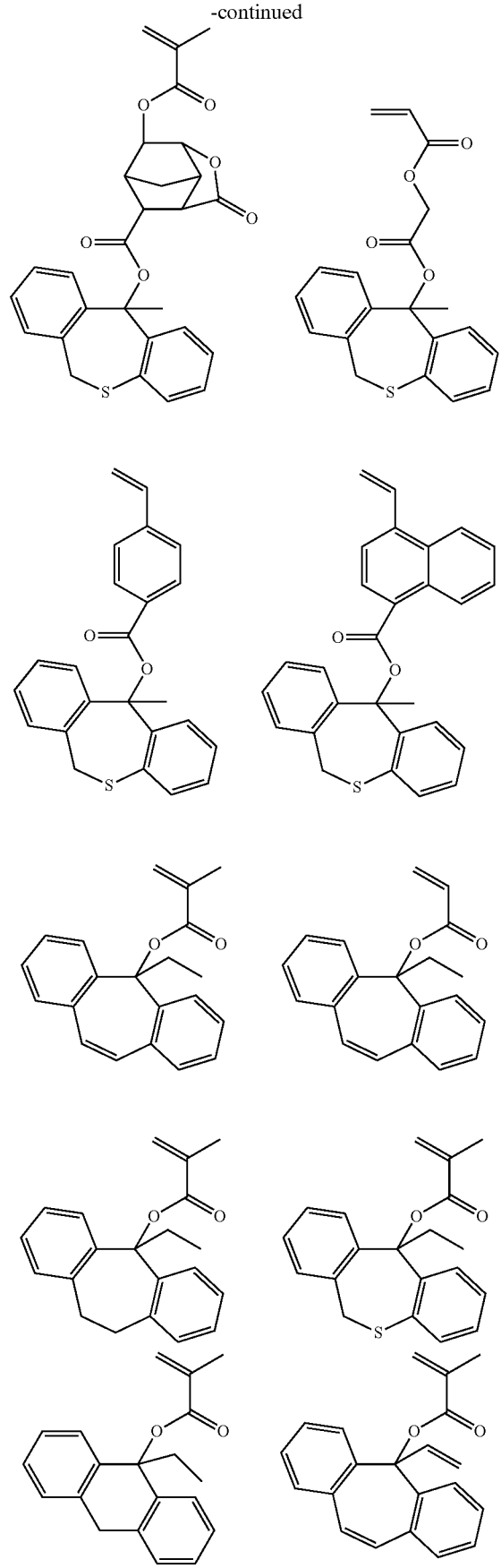
-continued
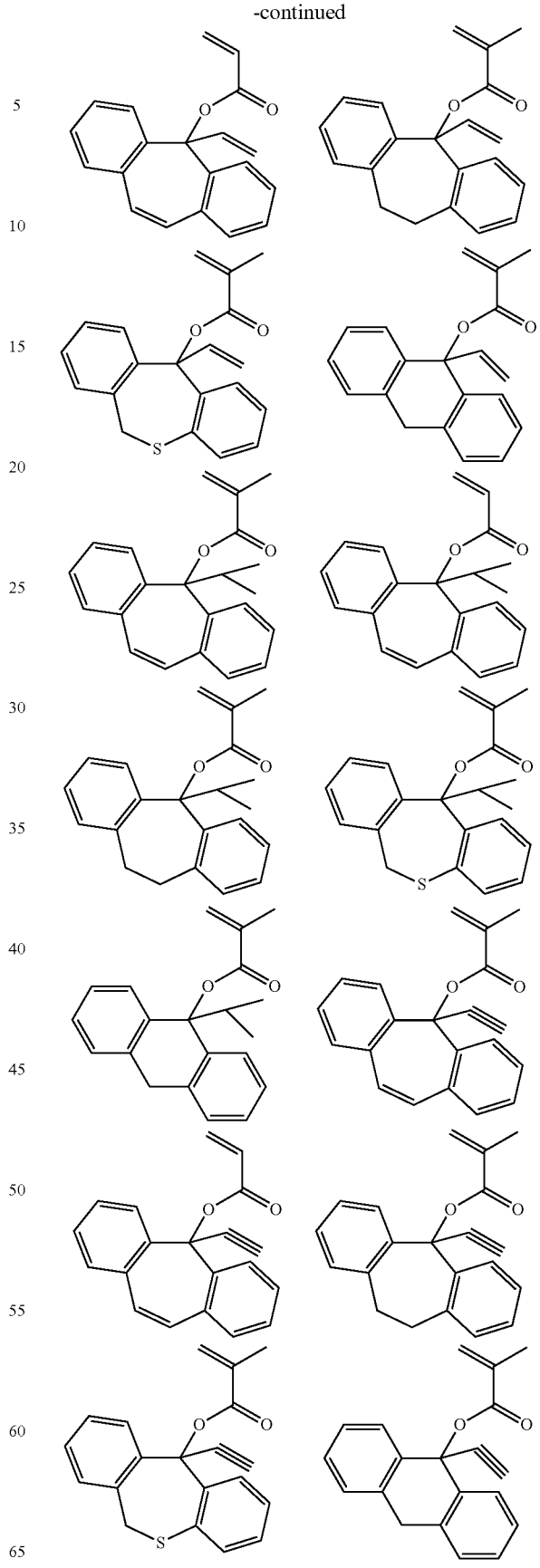

A still further example of the acid labile group having formula (A-3) is a group having the following formula (A-3)-28. When an acid labile group of formula (A-3)-28 is contained, it is preferred that the base resin include recurring units (d1) substituted with this acid labile group.

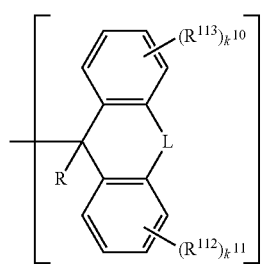

(A-3)-28

Herein R is as defined above. $R^{113}$ and $R^{114}$ are each independently hydrogen, hydroxyl, halogen, cyano, $C_1$-$C_4$ alkyl, $C_1$-$C_4$ alkoxy, $C_2$-$C_5$ acyl, $C_2$-$C_5$ alkoxycarbonyl, or $C_6$-$C_{10}$ aryl group. Each of $k^{10}$ and $k^{11}$ is independently an integer of 1 to 4. L is carbonyl, ether, sulfide, —S(=O)— or —S(=O)$_2$—.

Examples of the monomer from which the recurring units having formula (A-3)-28 are derived are shown below, but not limited thereto.

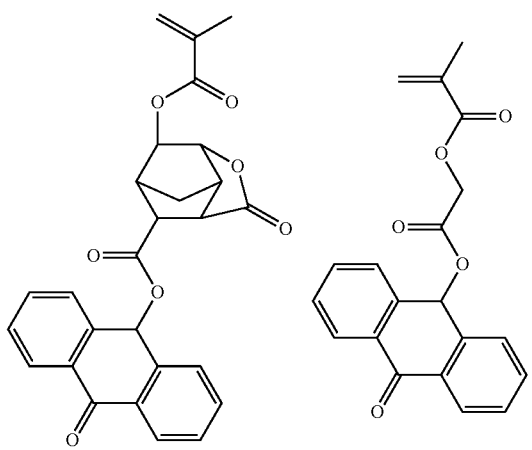

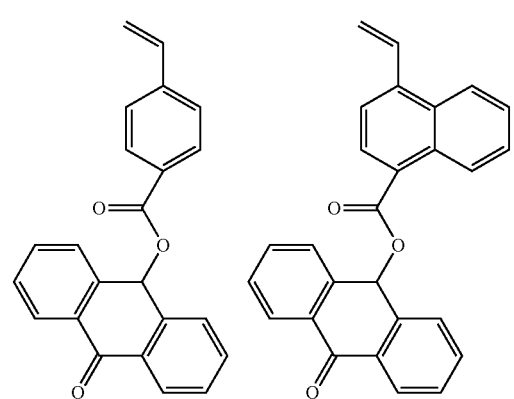

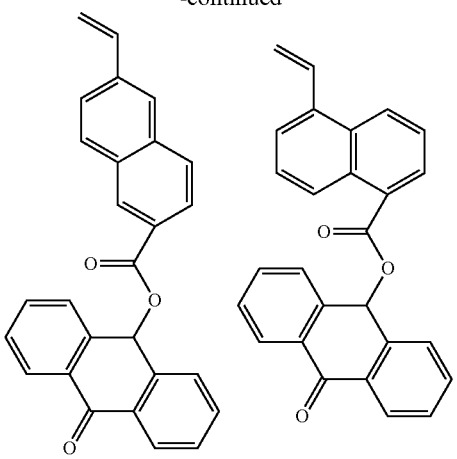

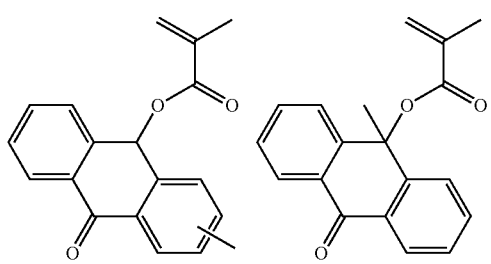

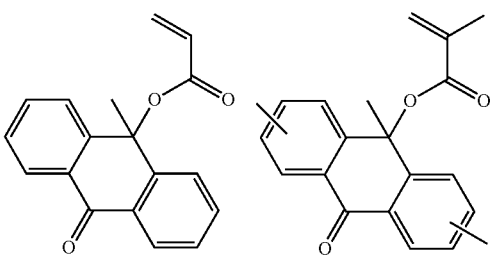

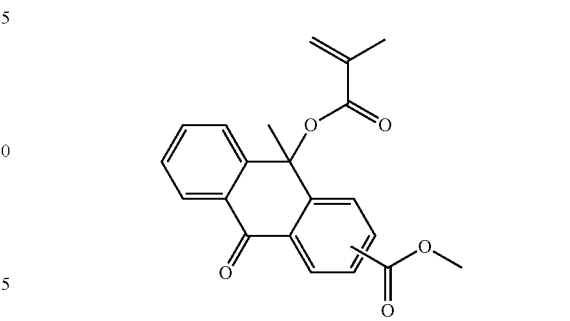

113
-continued
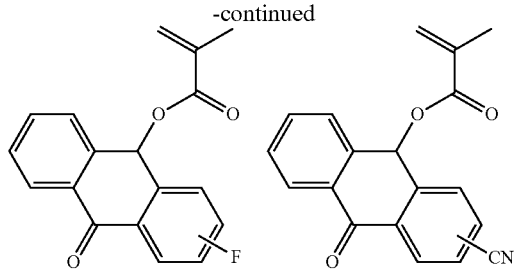
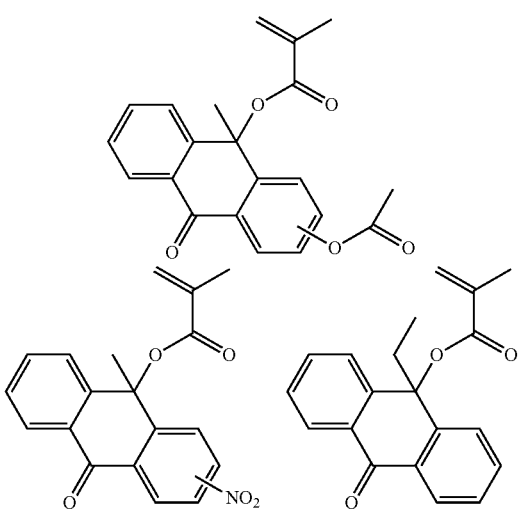
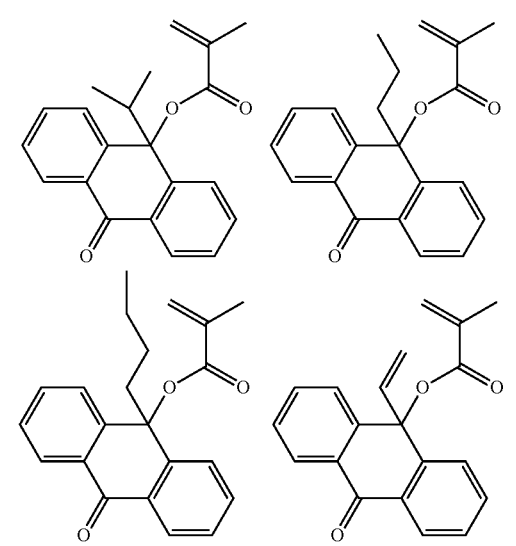
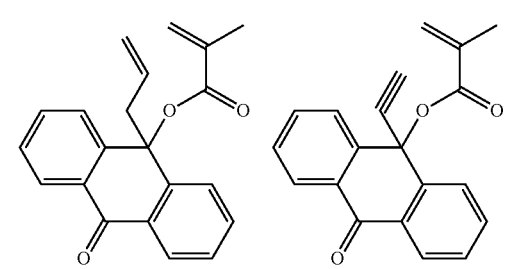
114
-continued
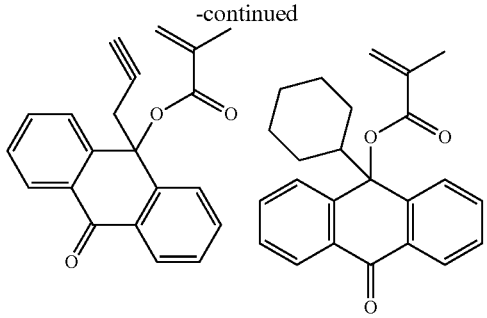
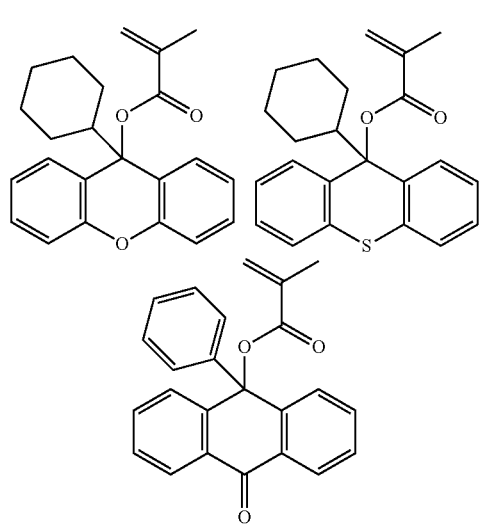
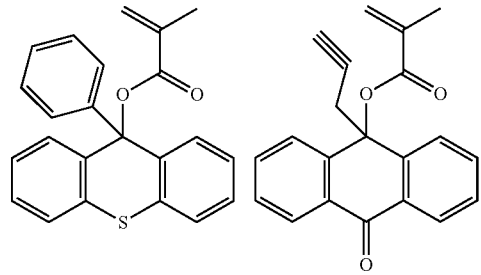

115
-continued
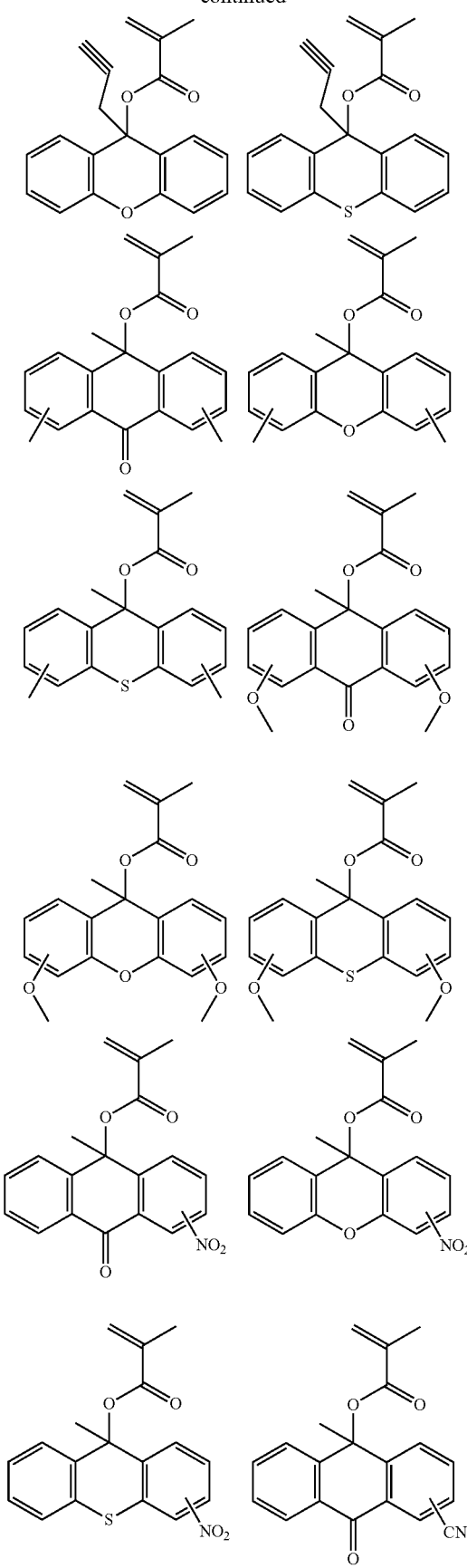
116
-continued
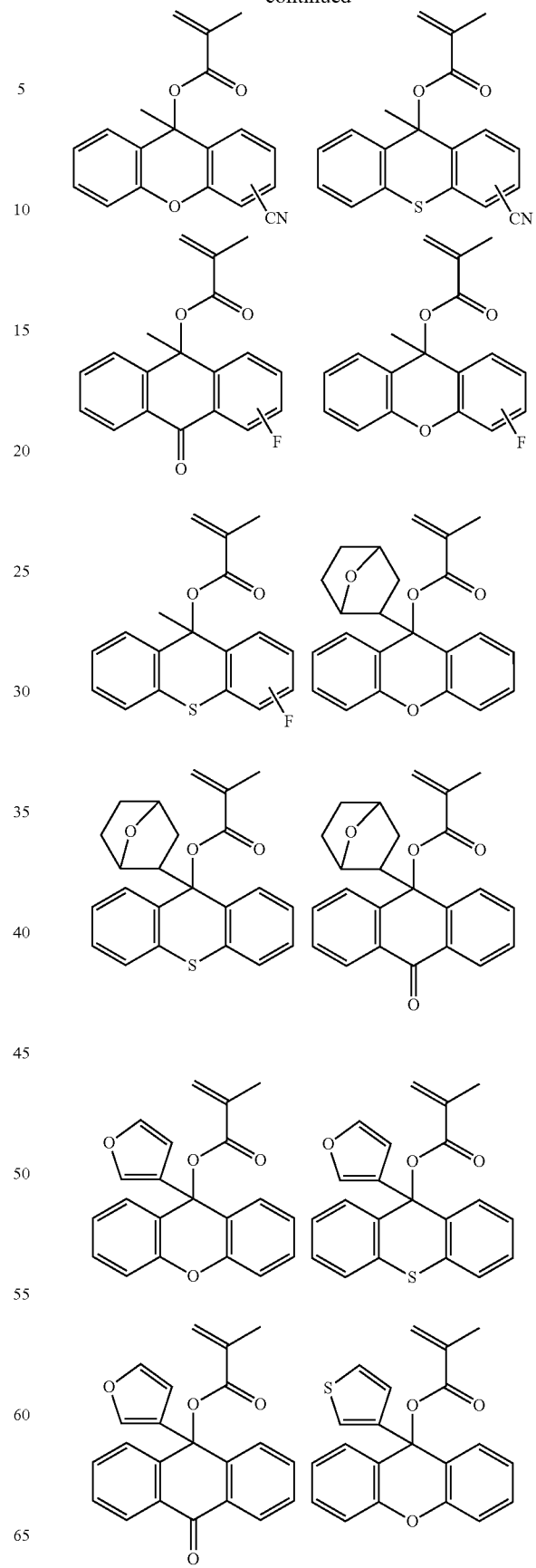

117
-continued
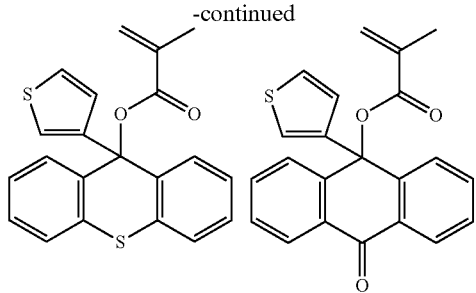
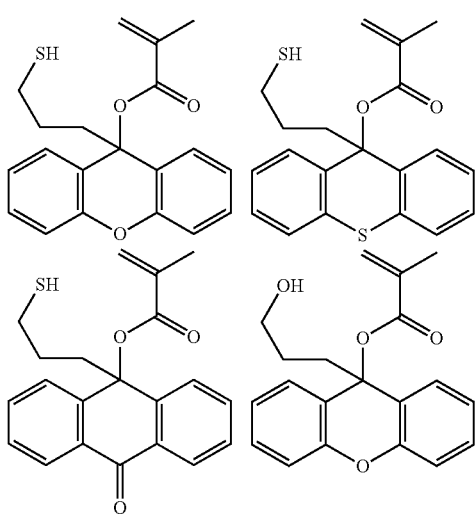
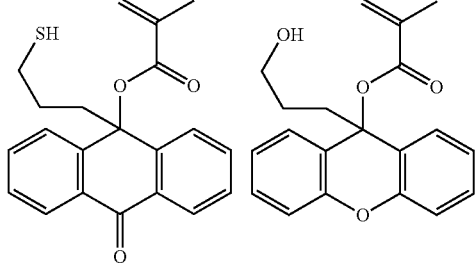
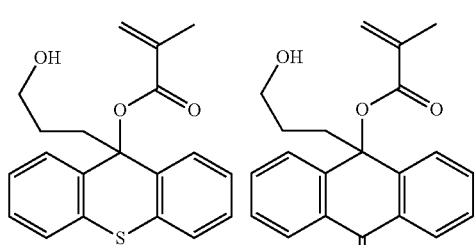
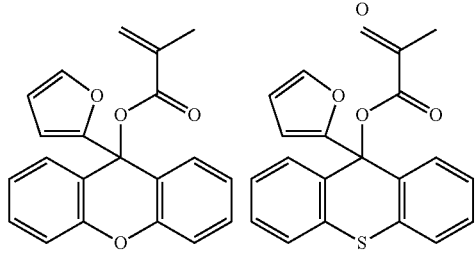
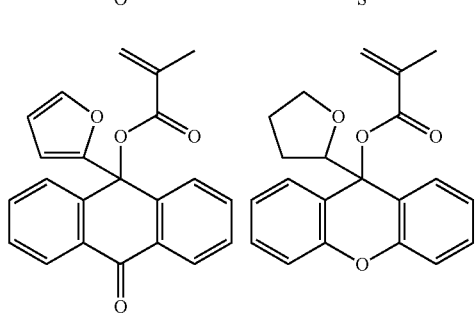
118
-continued
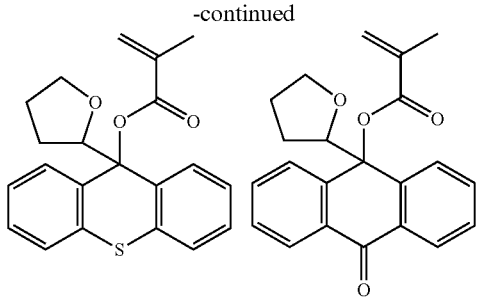
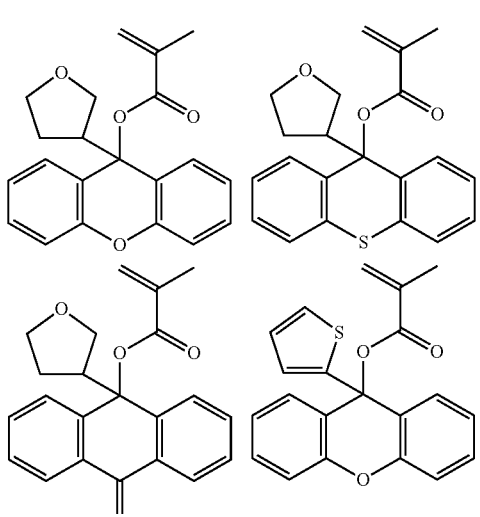
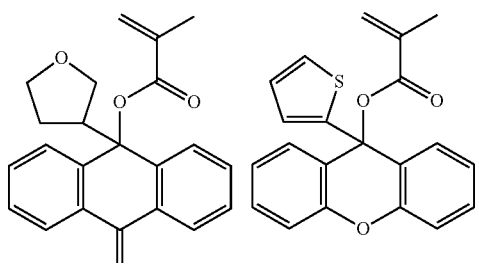
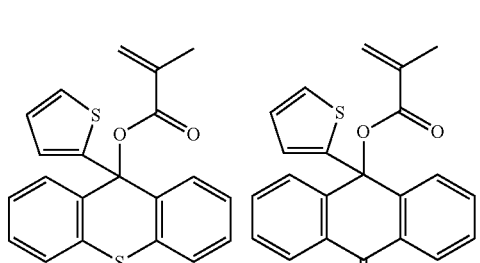
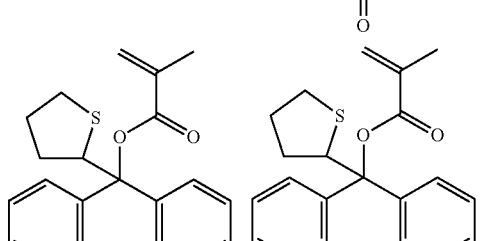
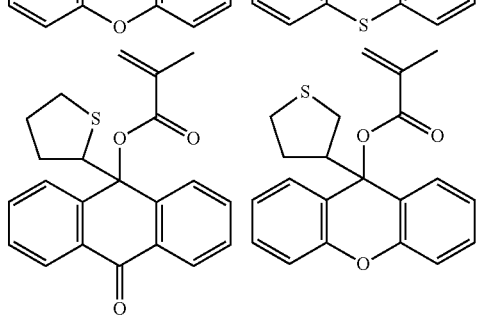

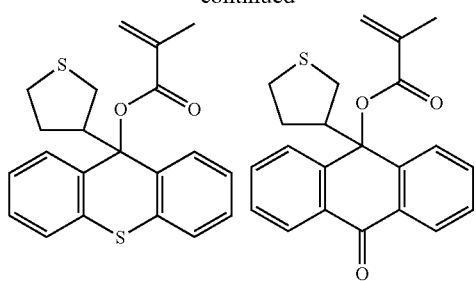
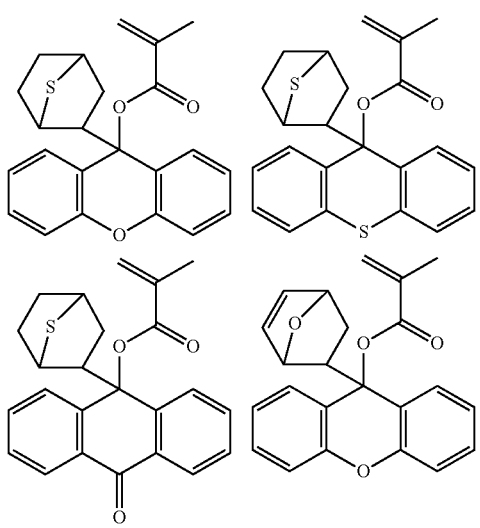
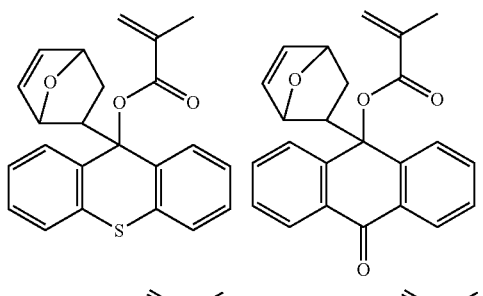
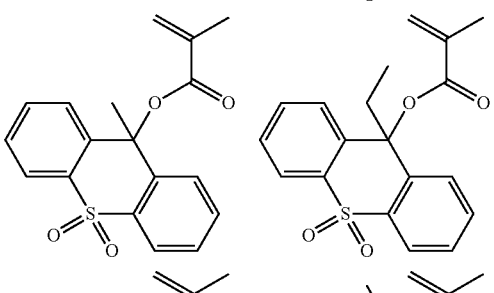
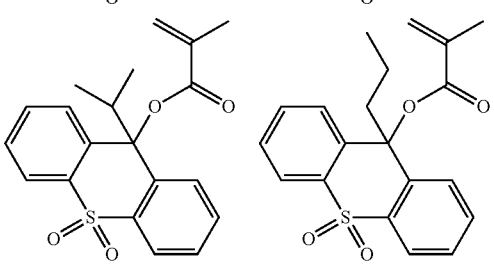
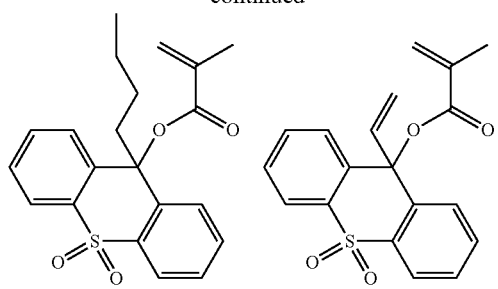
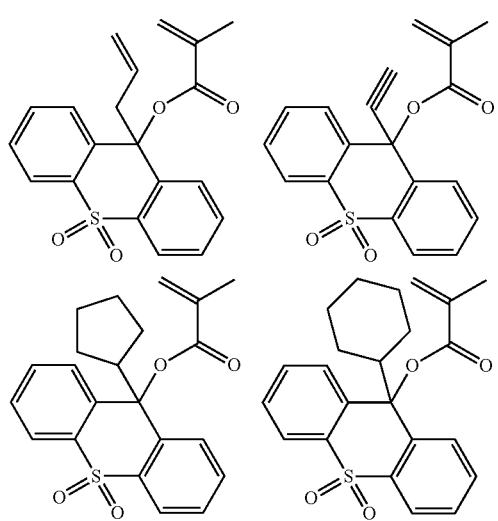
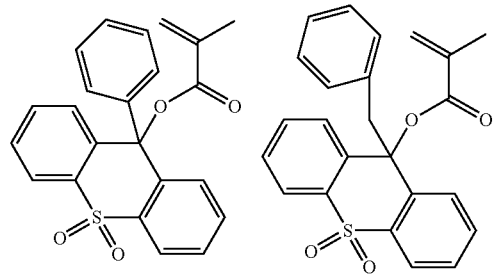
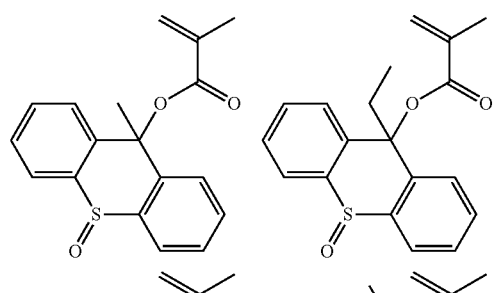
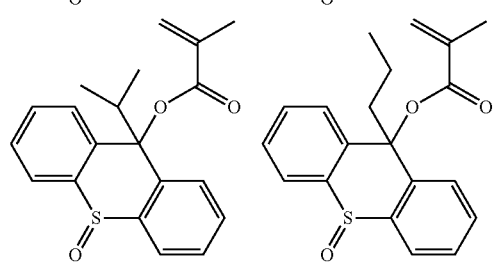

121
-continued

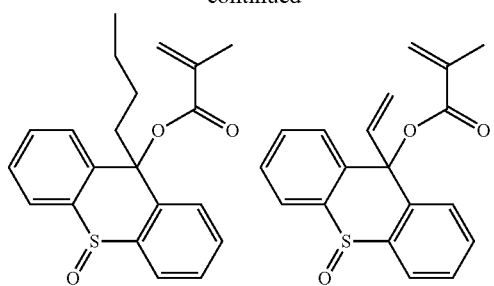

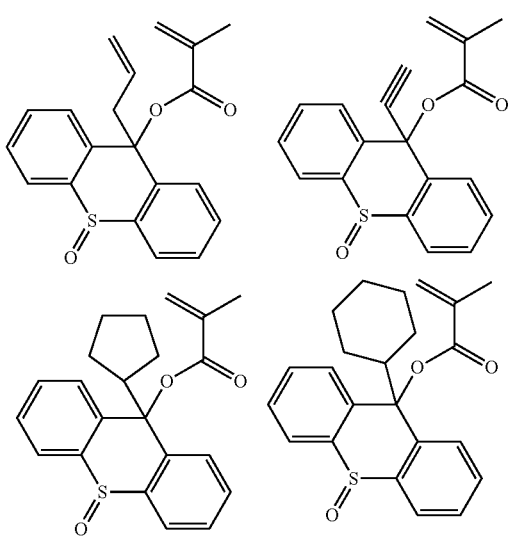

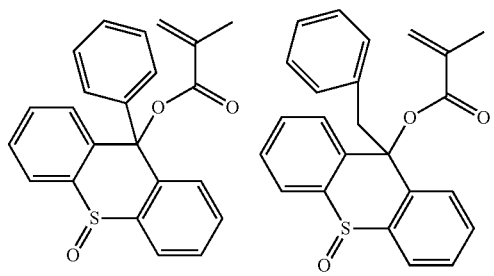

The base resin may further comprise recurring units (e) having an adhesive group which is selected from among hydroxyl, carboxyl, lactone ring, carbonate, thiocarbonate, carbonyl, cyclic acetal, ether, ester, sulfonic acid ester, cyano, amide, and —O—C(=O)-J- wherein J is —S— or —NH—. Examples of the monomer from which recurring units (e) are derived are given below, but not limited thereto.

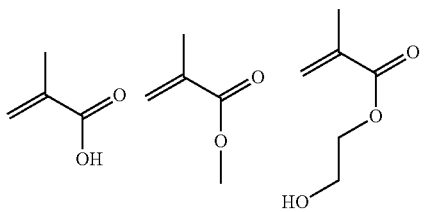

122
-continued

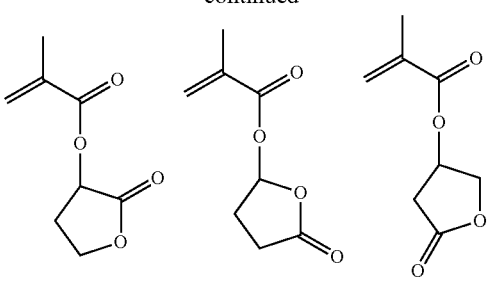

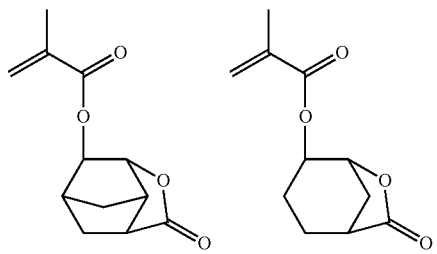

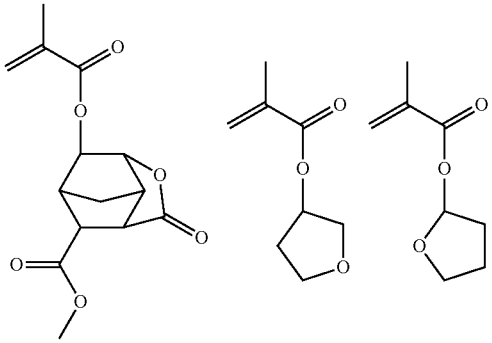

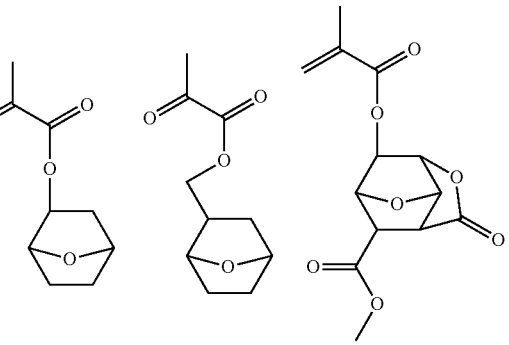

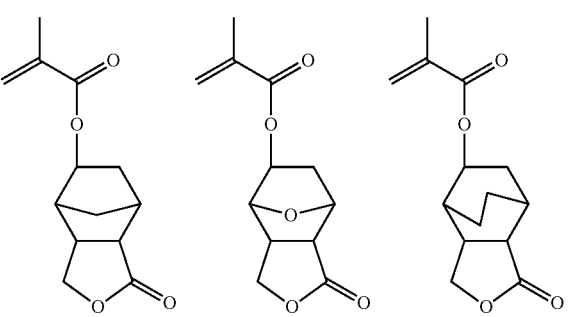

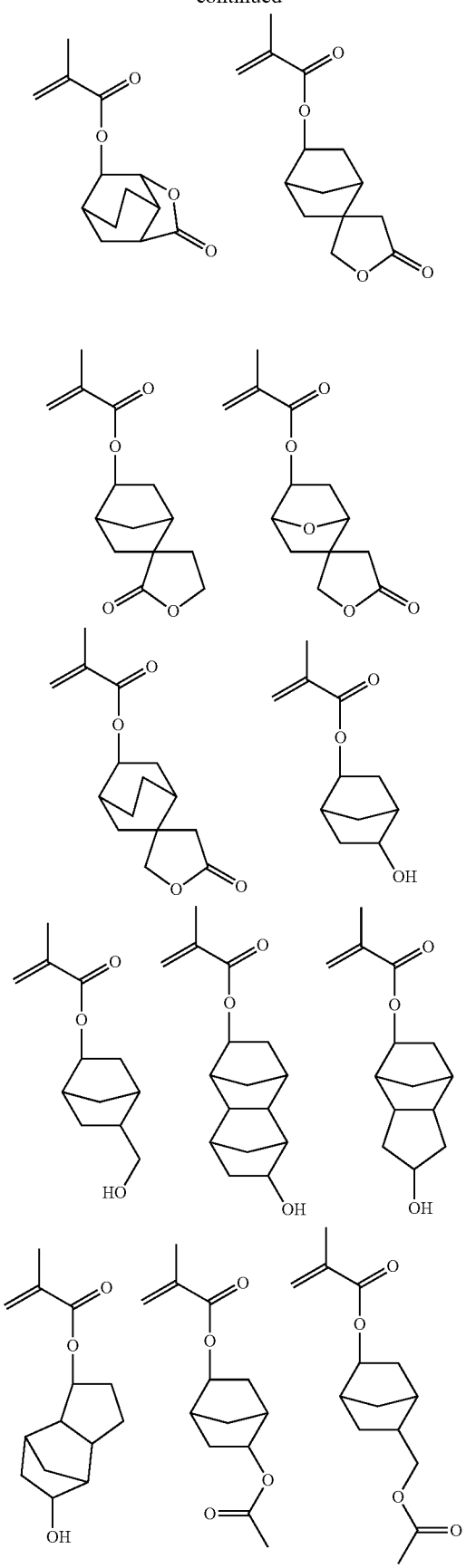
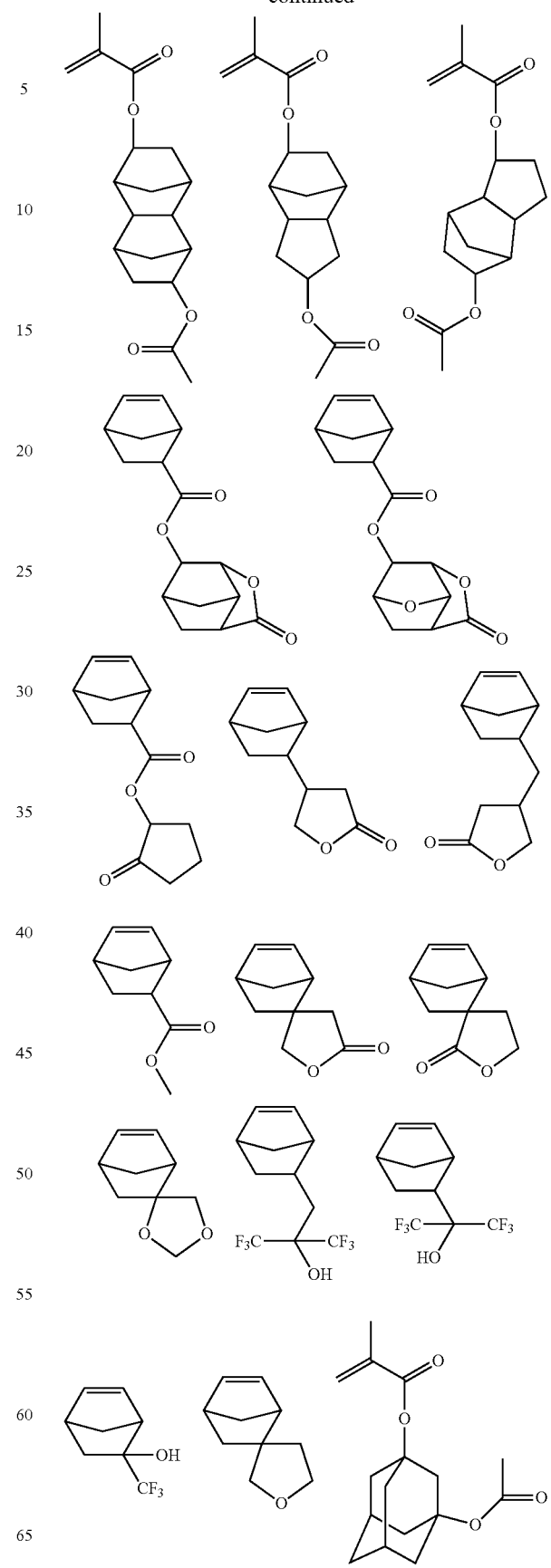

125
-continued
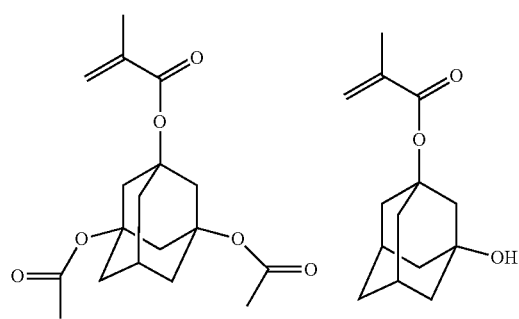
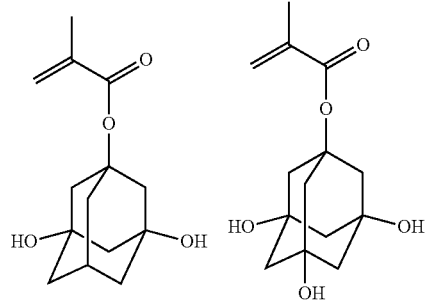
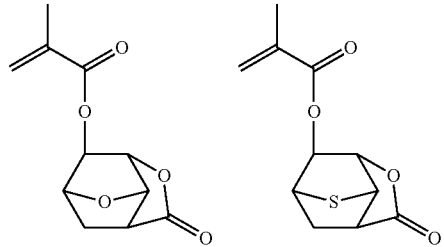
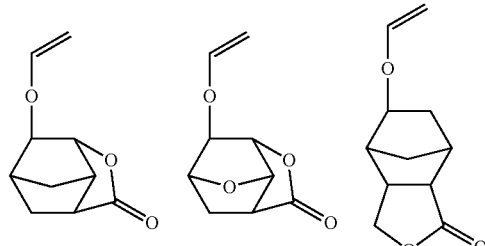
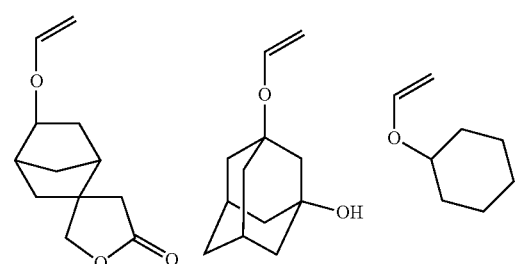
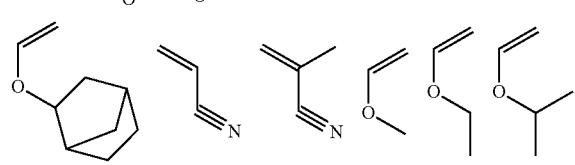
126
-continued
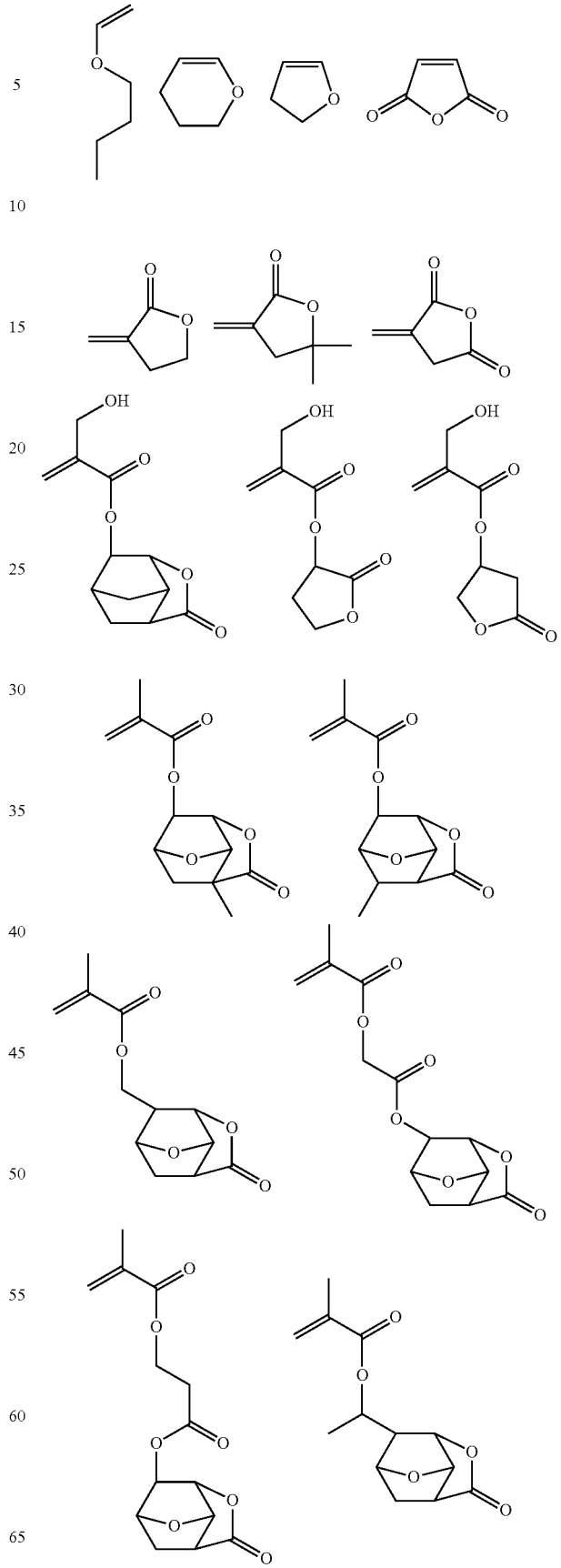

127
128
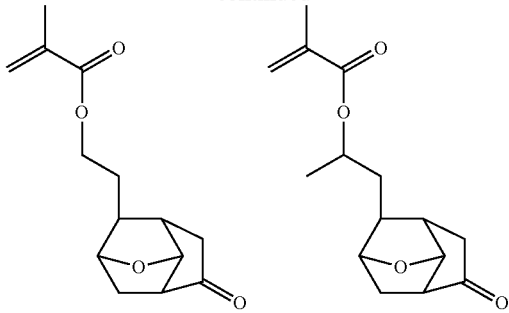
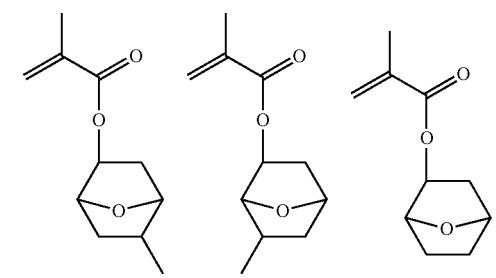
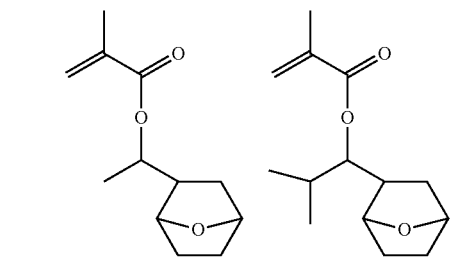
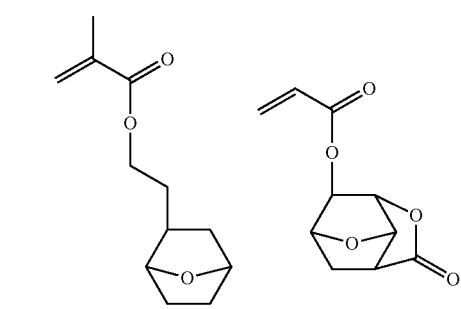
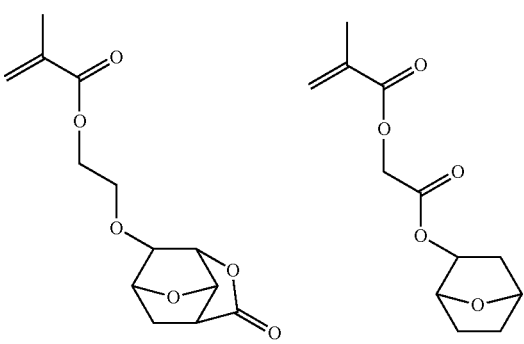
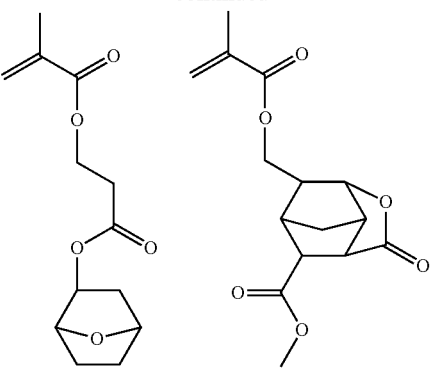
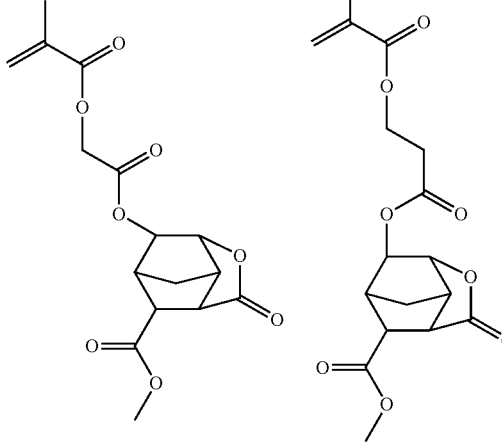
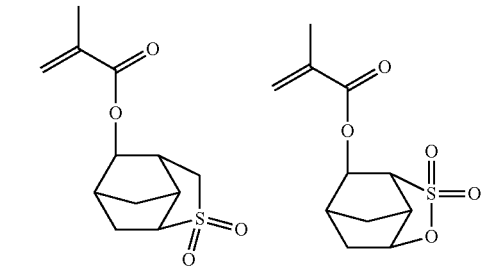
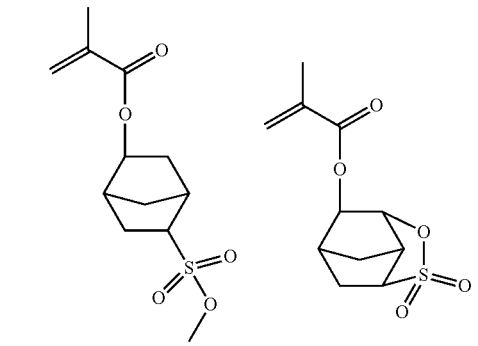

129
-continued
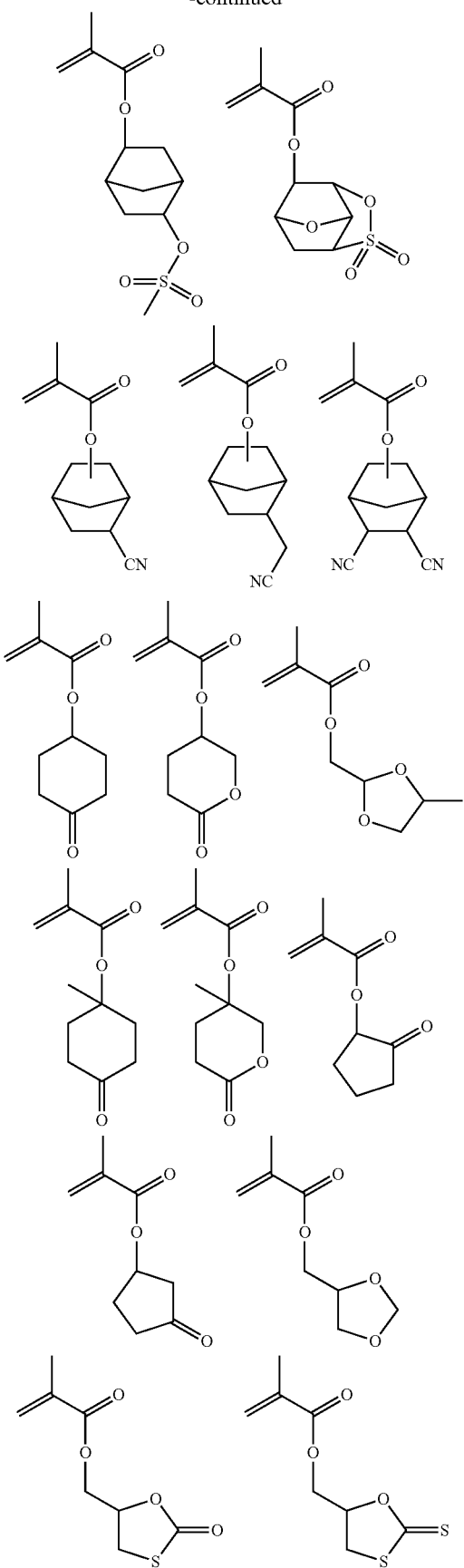
130
-continued
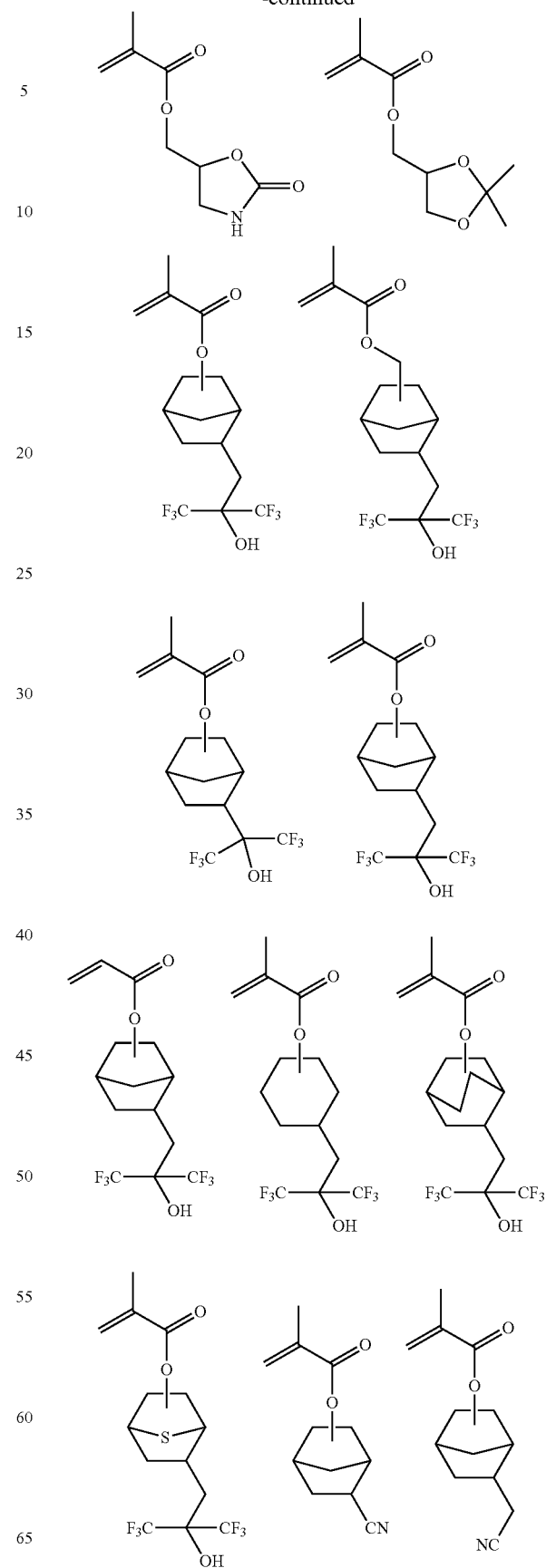

131
-continued
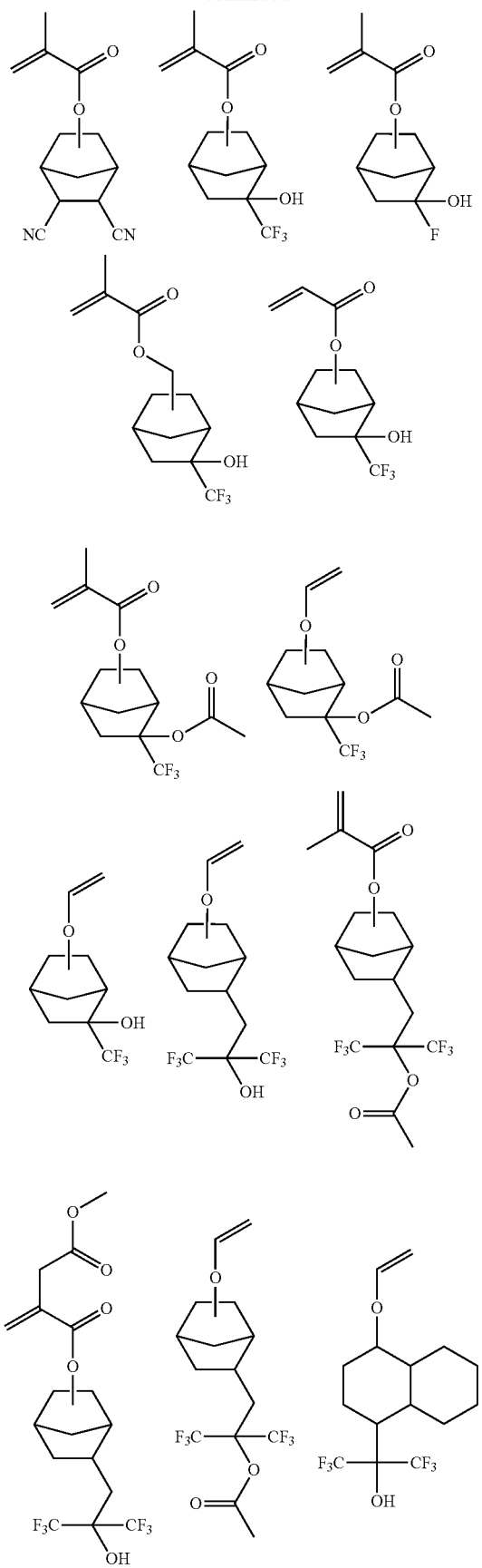
132
-continued
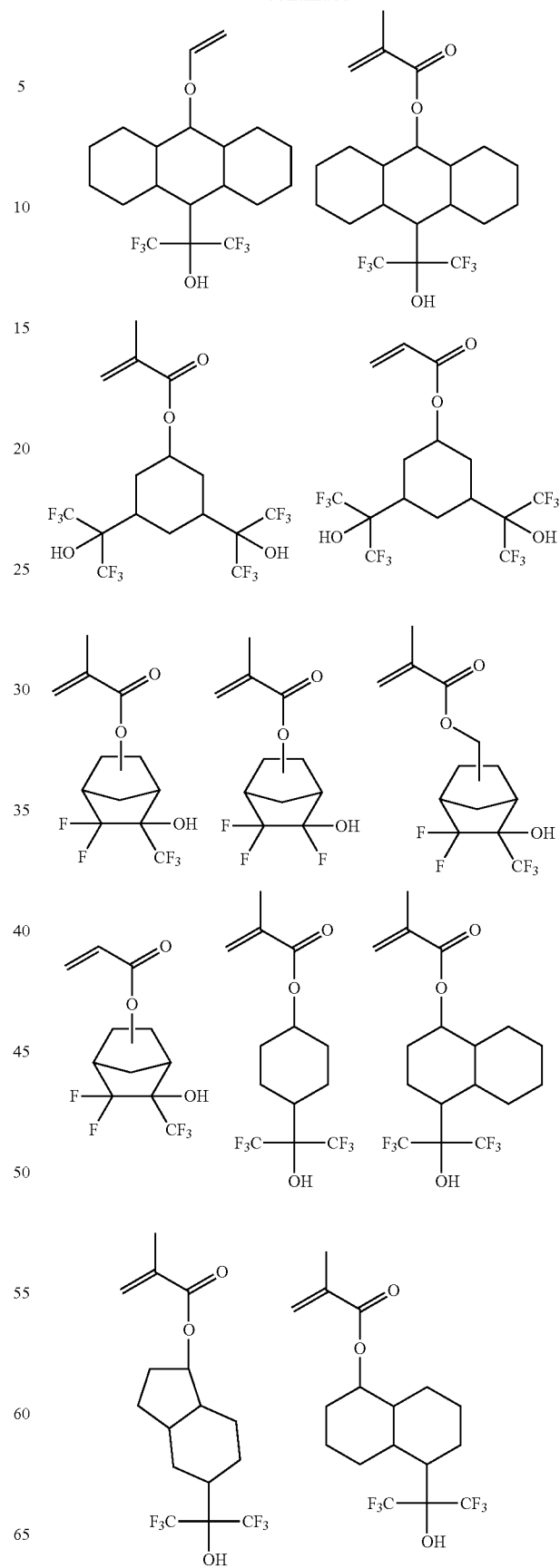

133
-continued
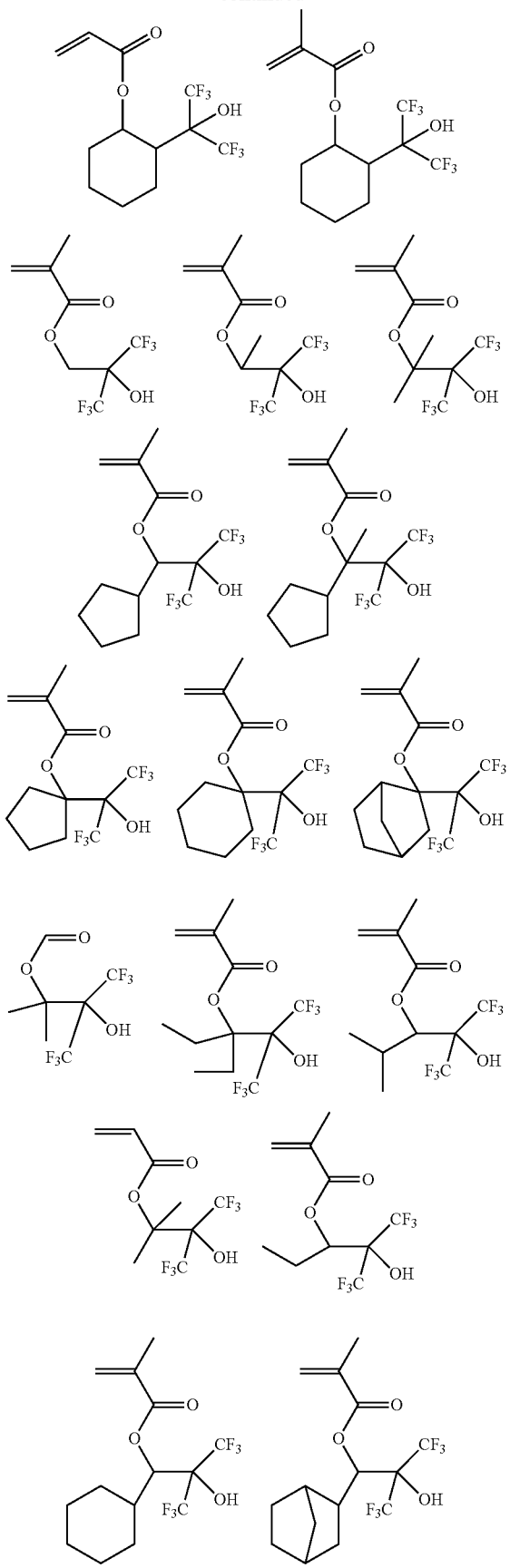
134
-continued
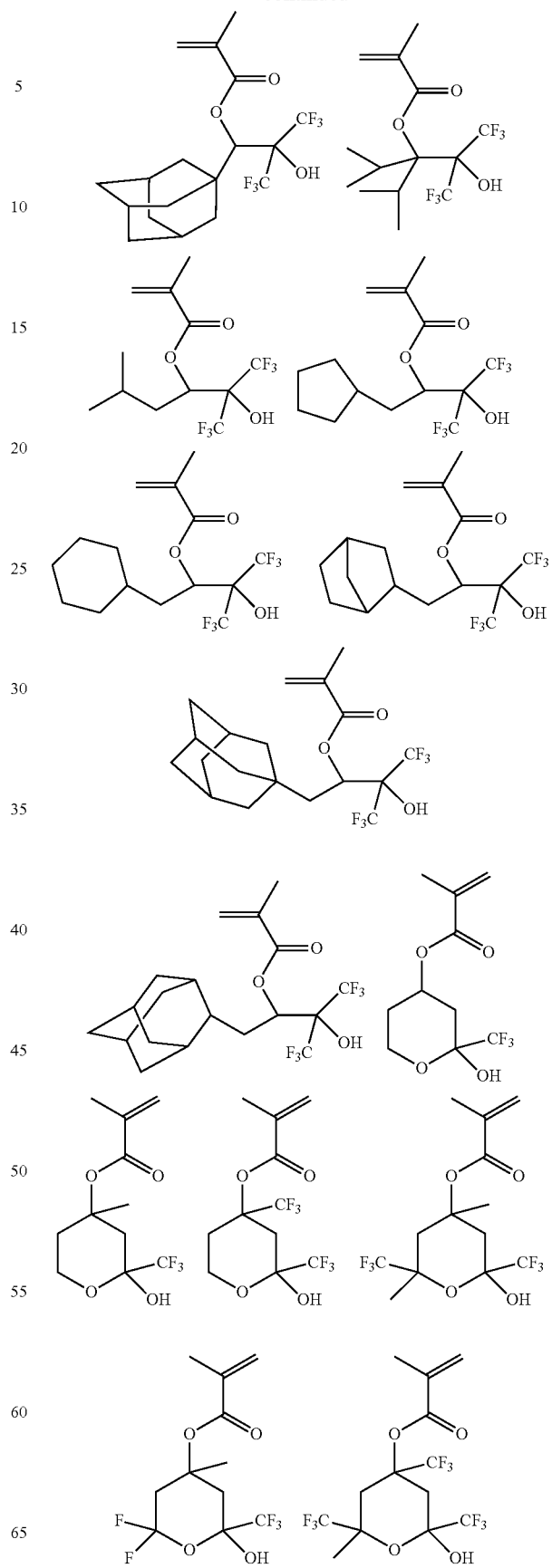

135
-continued
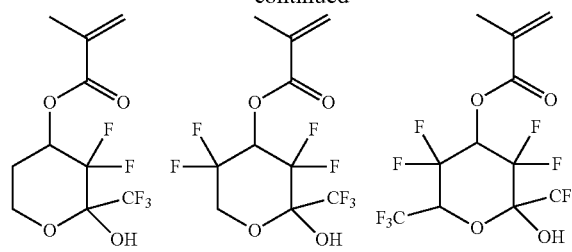
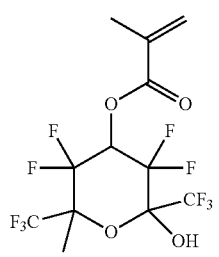
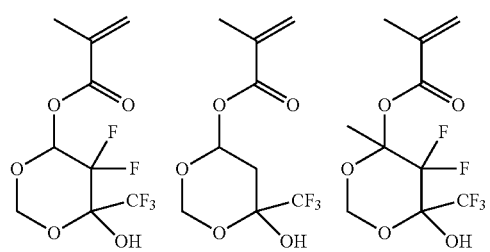
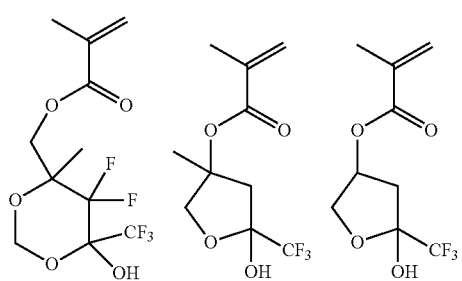
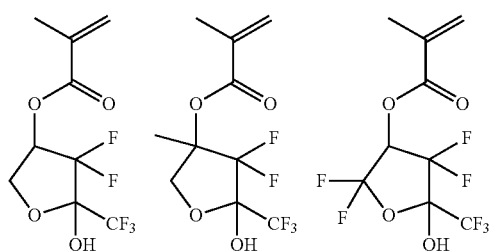
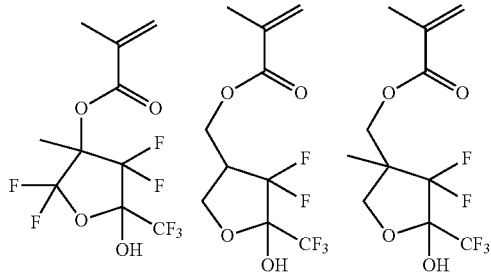
136
-continued
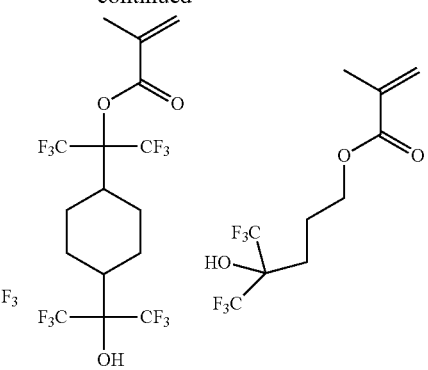
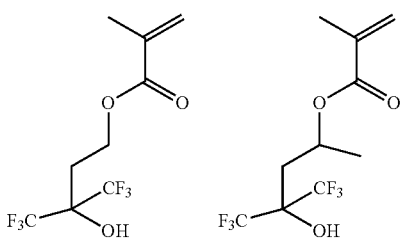
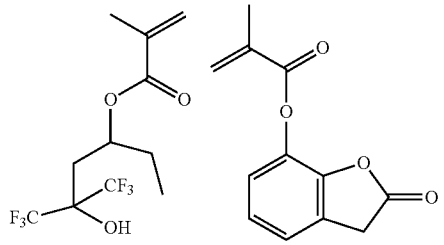
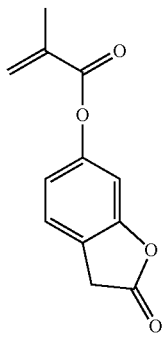
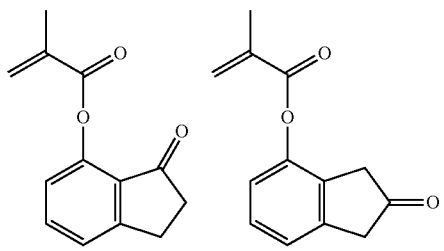

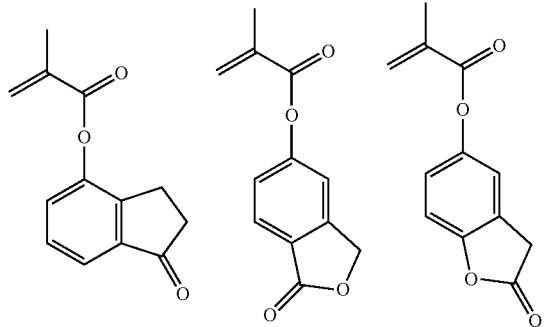
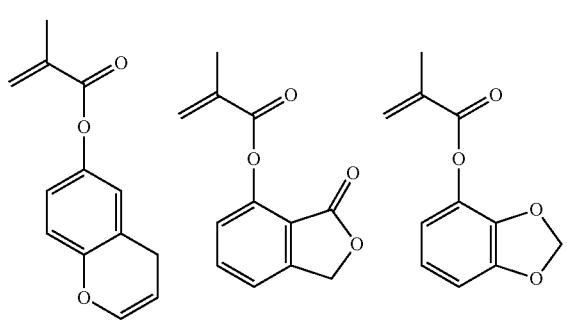
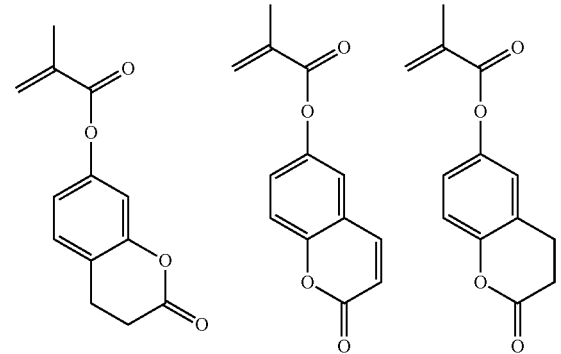
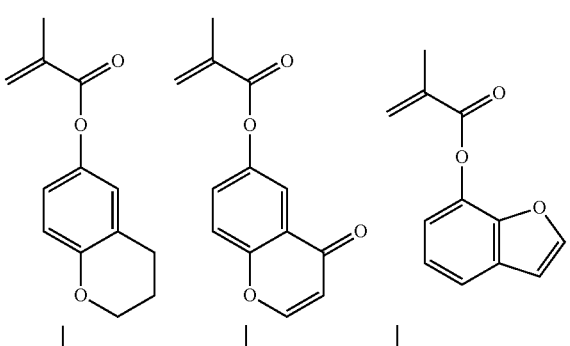
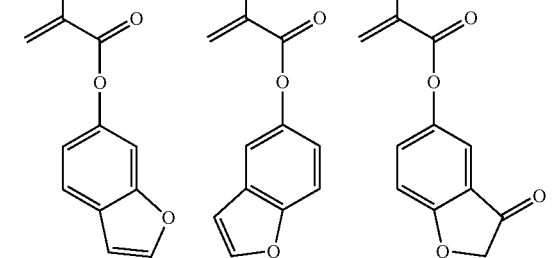
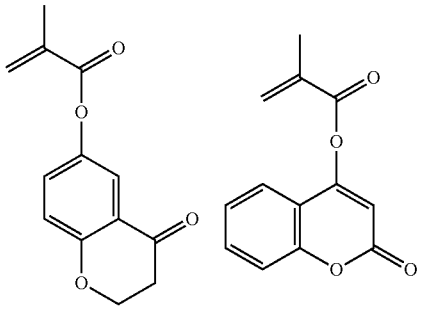
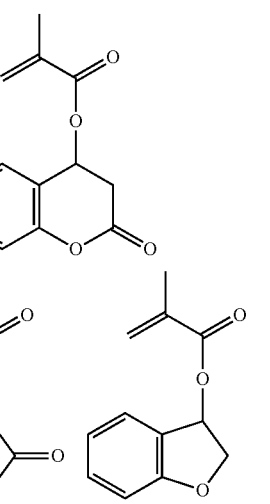
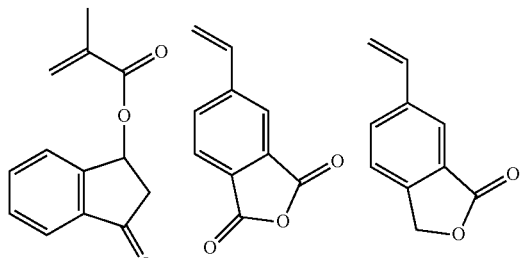
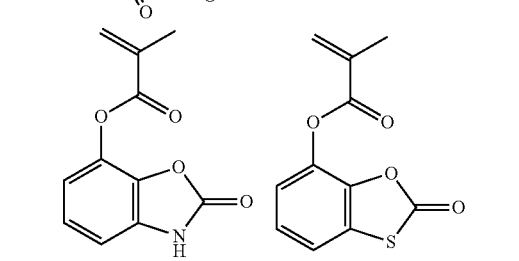
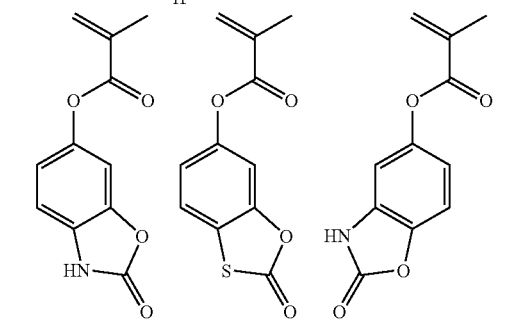

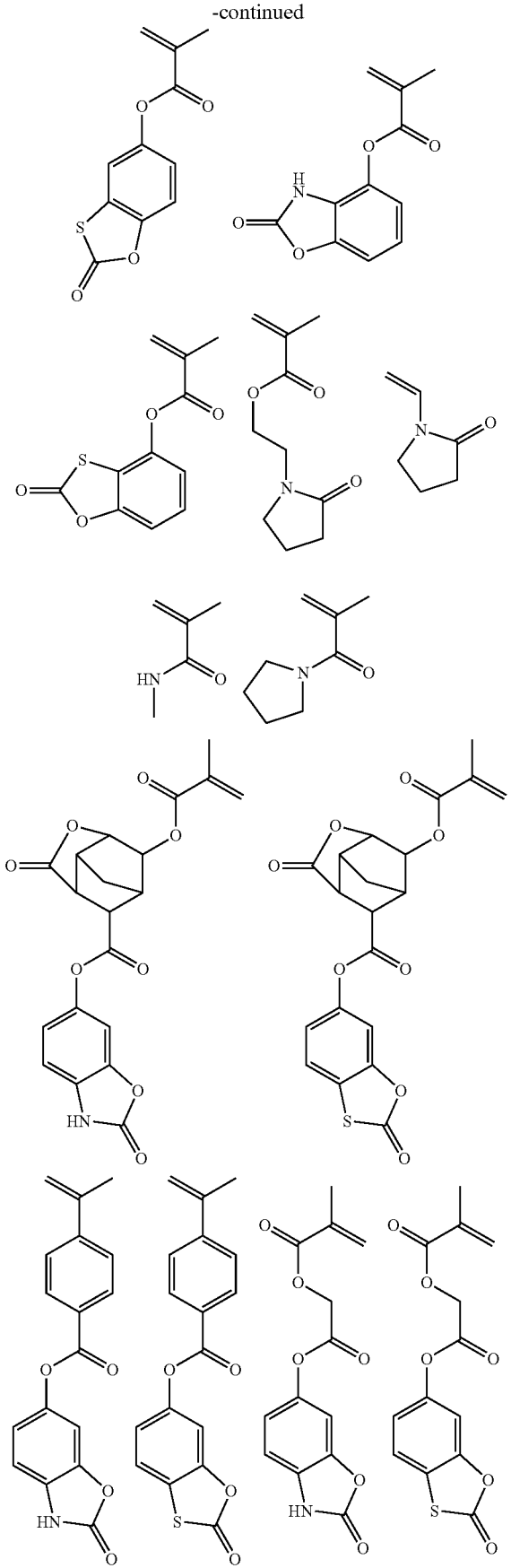
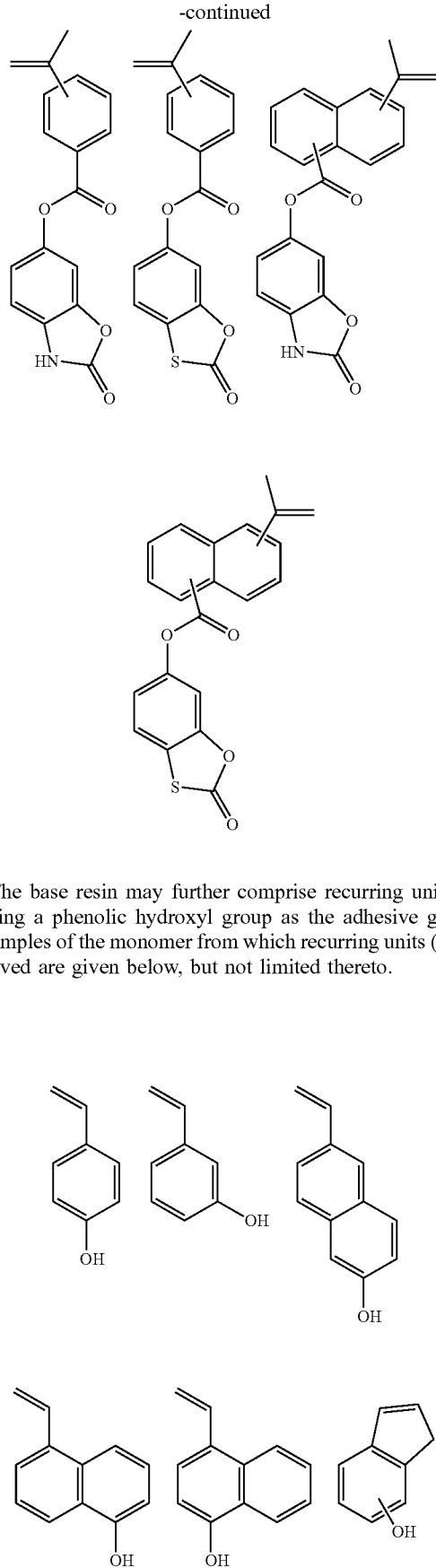
The base resin may further comprise recurring units (f) having a phenolic hydroxyl group as the adhesive group. Examples of the monomer from which recurring units (f) are derived are given below, but not limited thereto.

141
-continued
142
-continued
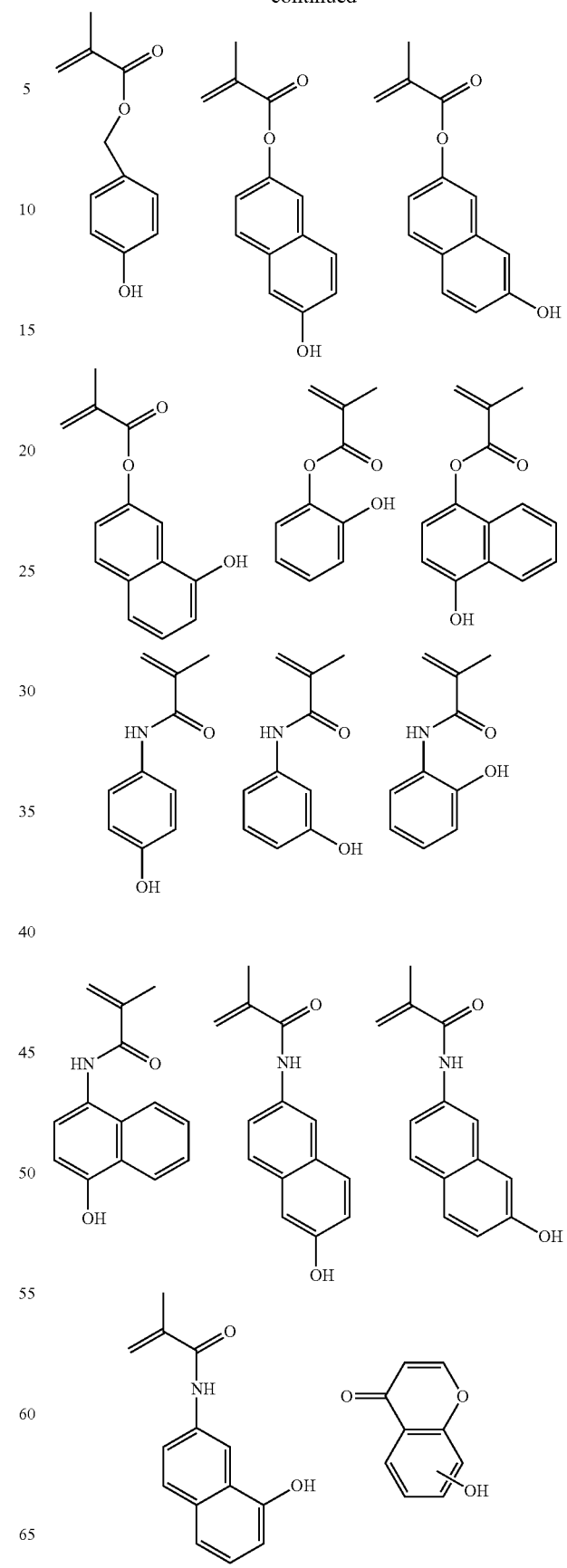

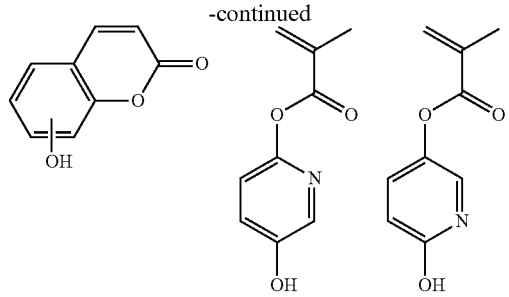
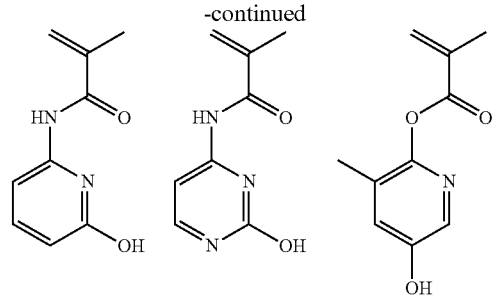
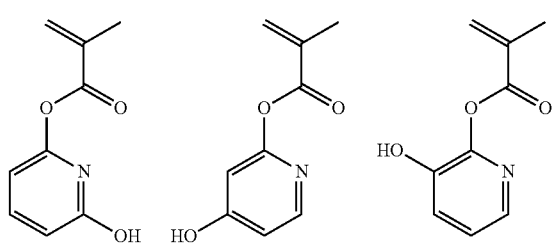
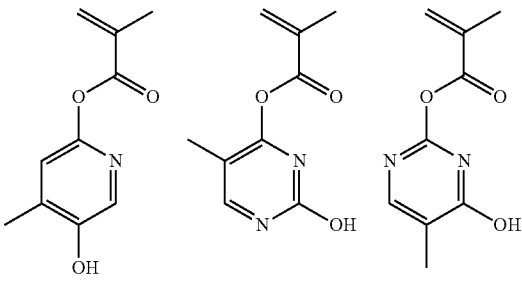
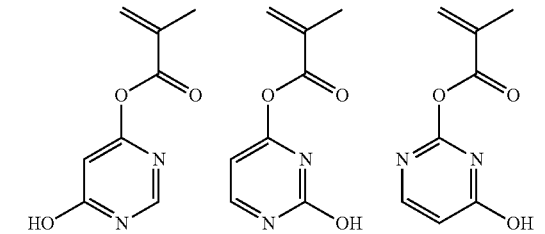
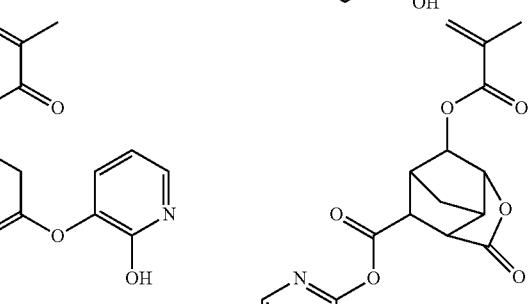
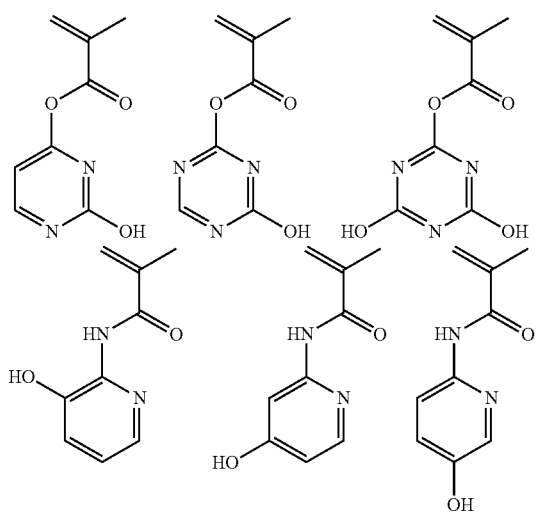
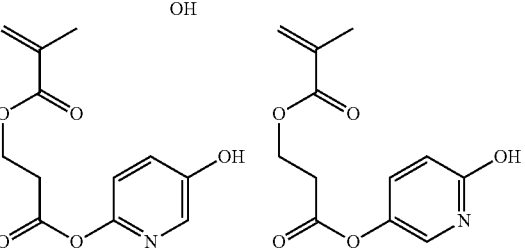

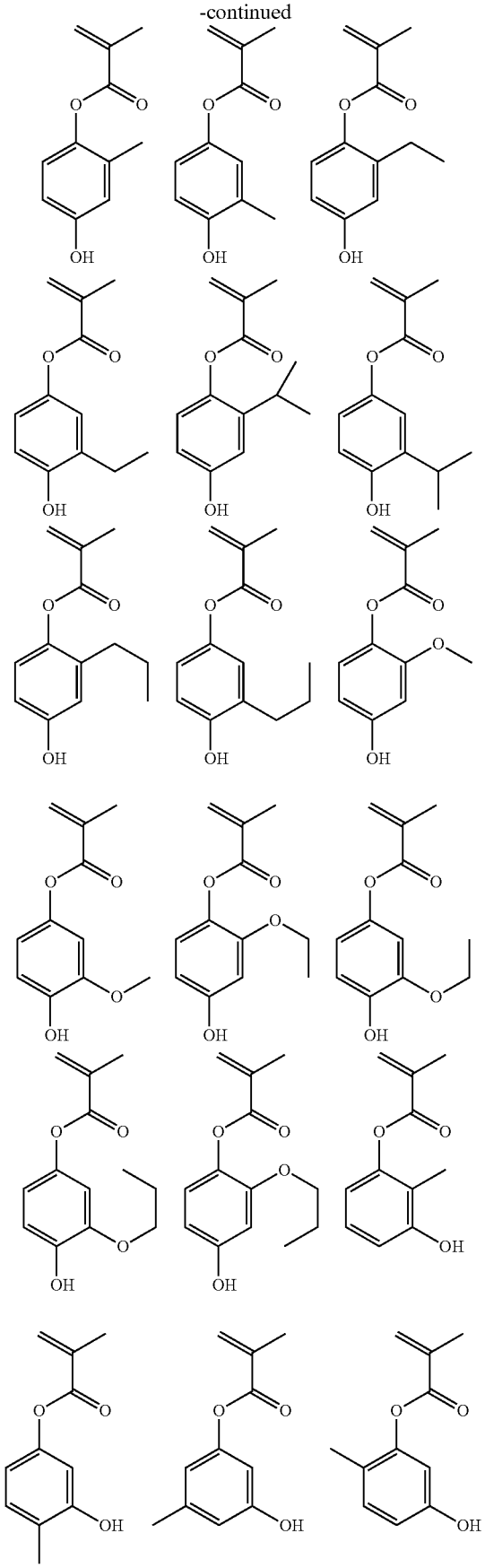
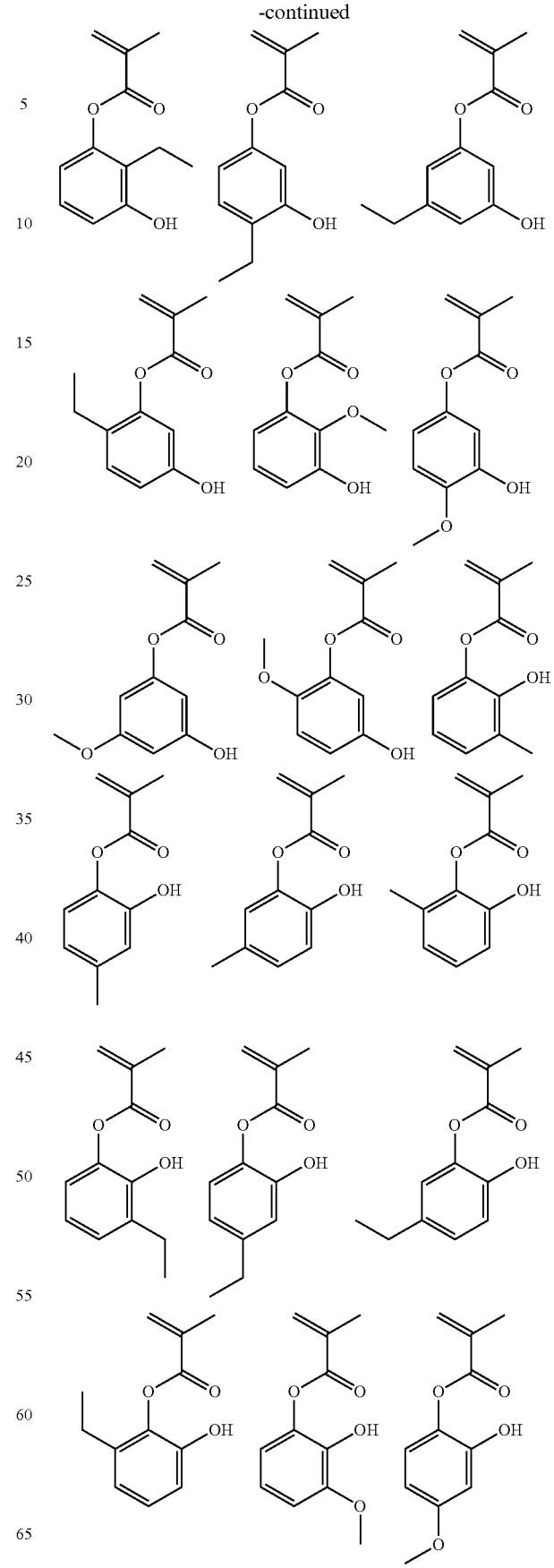

-continued
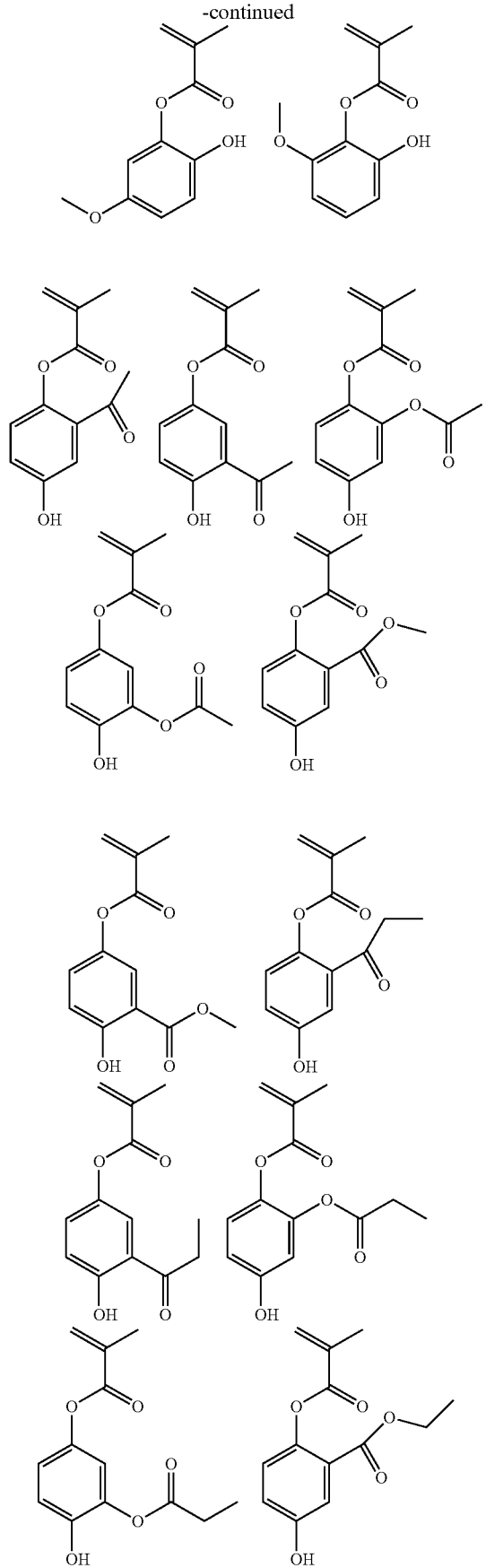
-continued
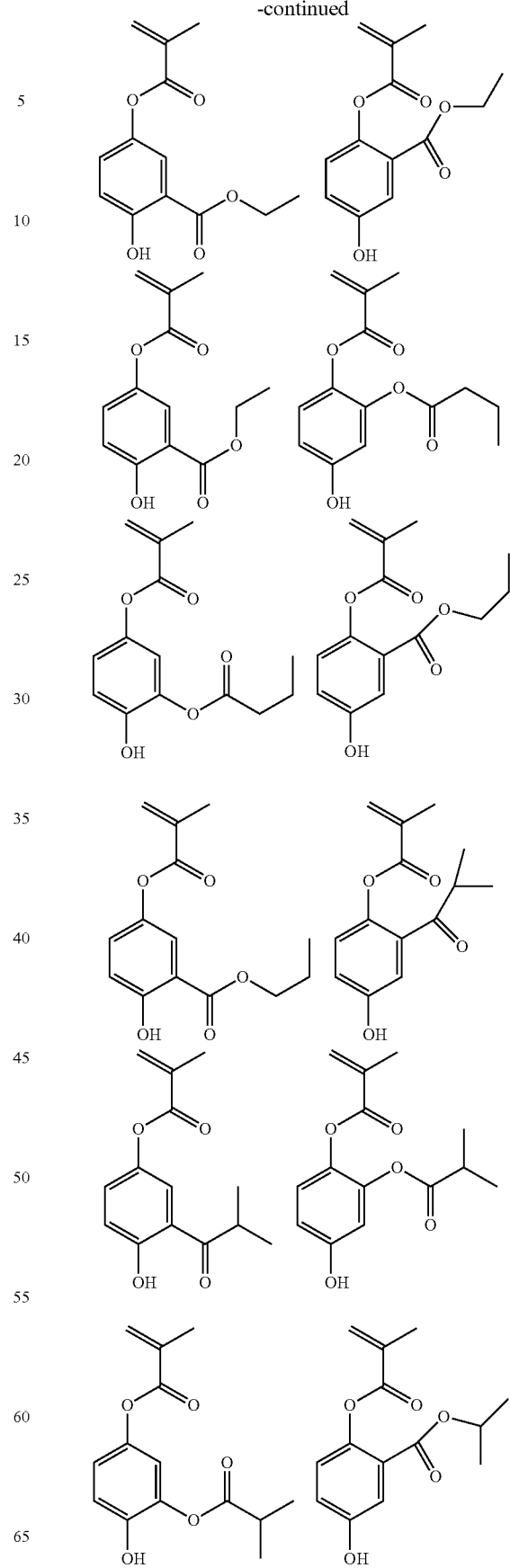

149
-continued
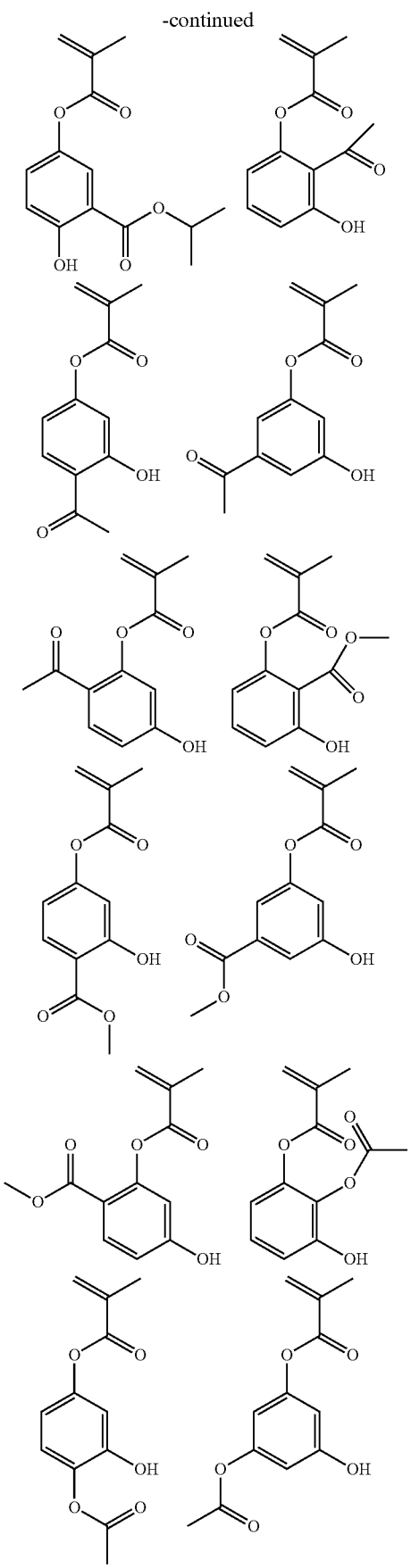
150
-continued
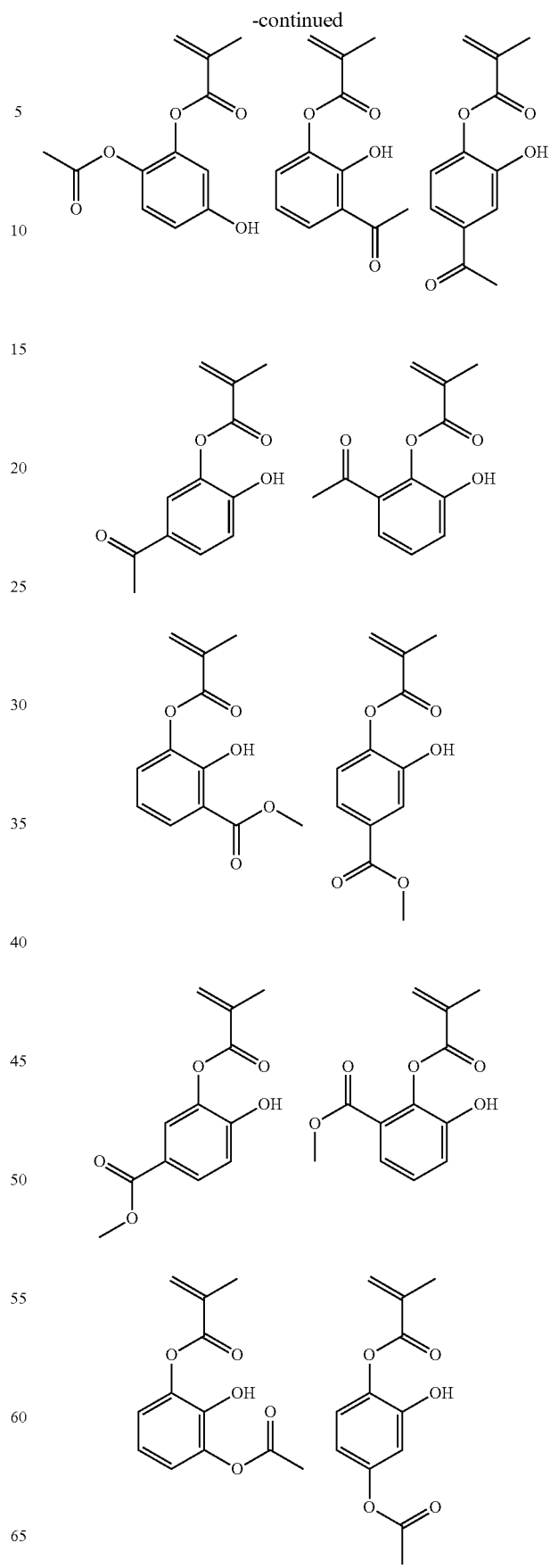

-continued
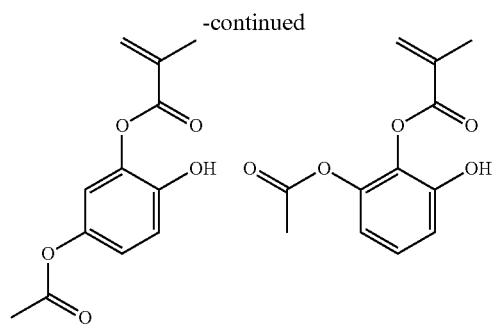
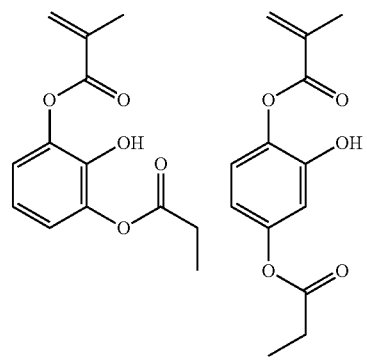
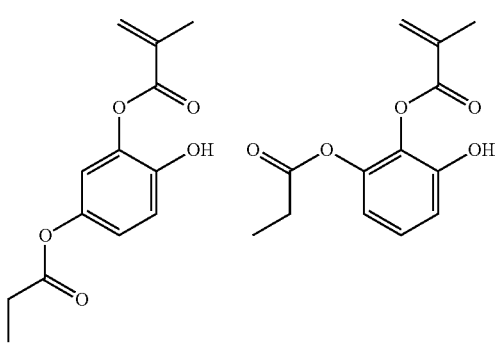
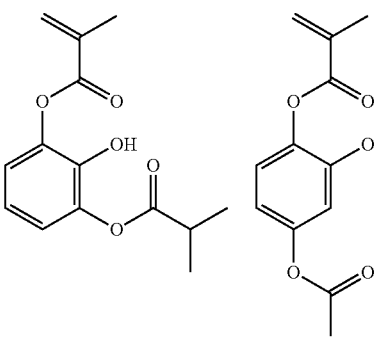
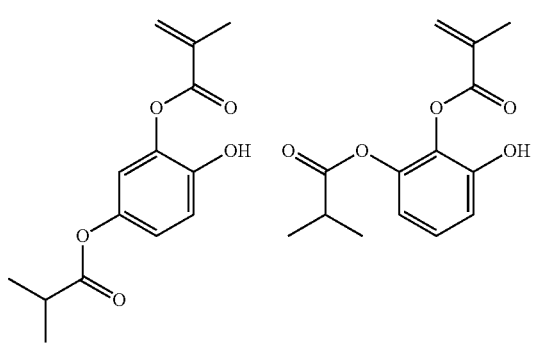
-continued
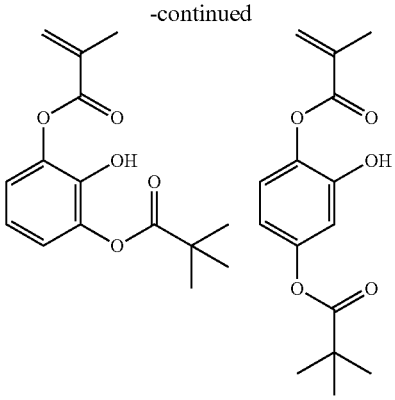
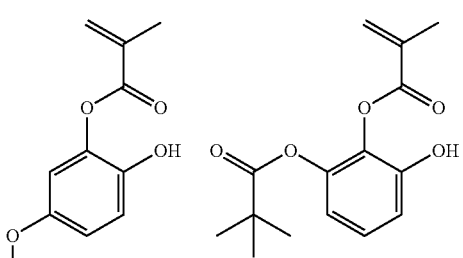
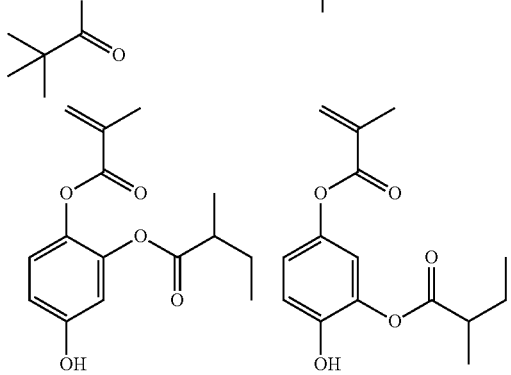
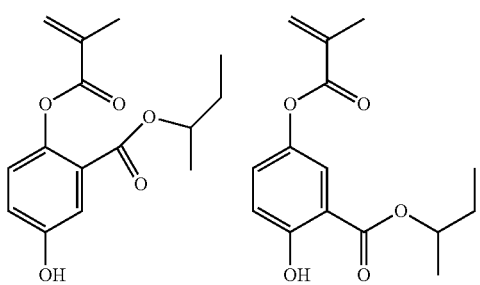
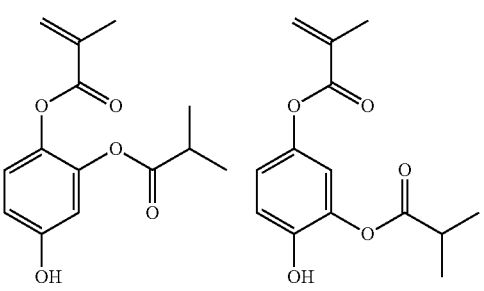

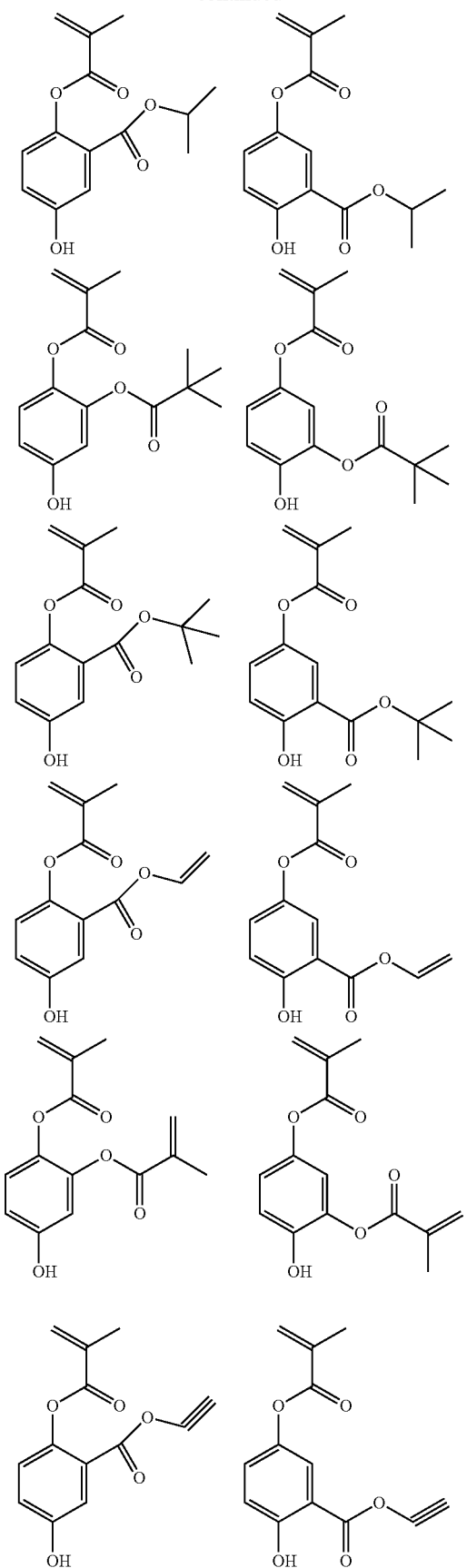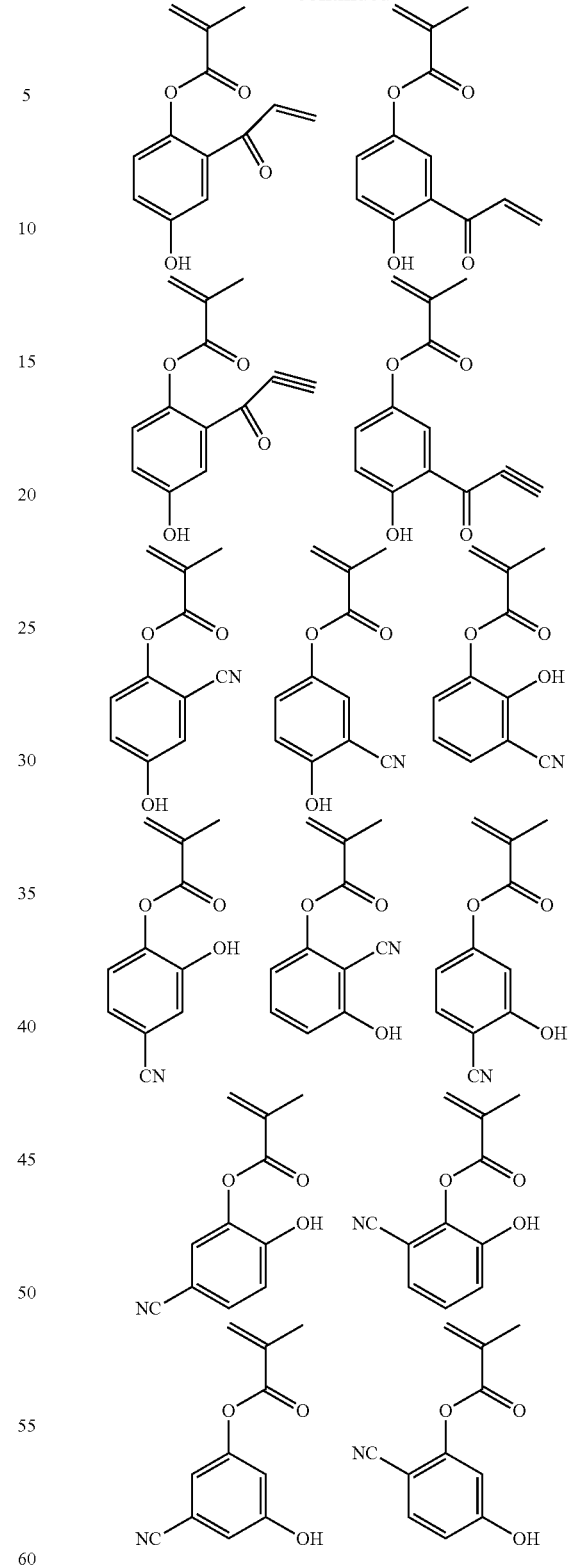
When a monomer corresponding to unit (f) is copolymerized, the hydroxyl group may be replaced by an acetal group susceptible to deprotection with acid, typically ethoxyethoxy, prior to polymerization, and the polymerization be followed by deprotection with weak acid and water. Alternatively, the hydroxyl group may be replaced by an acetyl, formyl, pivaloyl or similar group prior to polymerization, and the polymerization be followed by to alkaline hydrolysis.

The base resin may have further copolymerized therein recurring units having a sulfonium salt, represented by the formulae (9) to (11), referred to as recurring units (g1) to (g3), respectively. While the recurring units (g1) to (g3) function as an acid generator, a resist composition comprising a base resin having recurring units (g1) to (g3) incorporated in its main chain is advantageous in that a pattern after development has a reduced edge roughness (LWR).

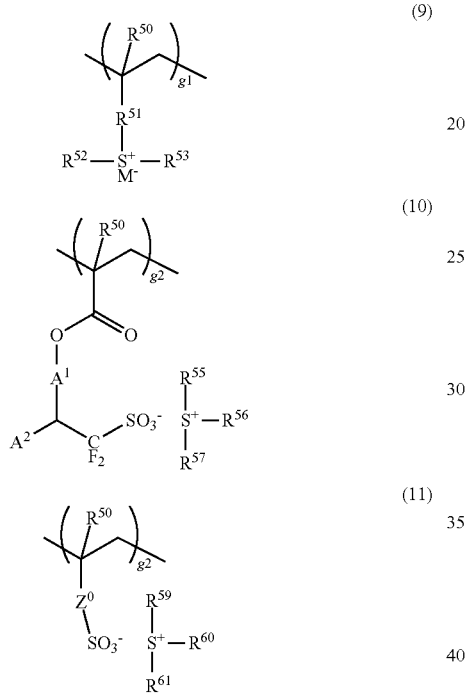

Herein $R^{50}$, $R^{54}$ and $R^{58}$ are each independently hydrogen or methyl. $R^{51}$ is a single bond, phenylene, —O—$R^{63}$—, or —C(=O)—Y—$R^{63}$— wherein Y is —O— or —NH— and $R^{63}$ is a straight, branched or cyclic $C_1$-$C_6$ alkylene group, $C_2$-$C_6$ alkenylene group or phenylene group, which may contain a carbonyl (—CO—), ester (—COO—), ether (—O—) or hydroxyl moiety. $R^{52}$, $R^{53}$, $R^{55}$, $R^{56}$, $R^{57}$, $R^{59}$, $R^{60}$, and $R^{61}$ are each independently a straight, branched or cyclic $C_1$-$C_{12}$ alkyl group, $C_6$-$C_{12}$ aryl group or $C_7$-$C_{20}$ aralkyl group, which may contain a carbonyl, ester or ether moiety. $A^1$ is a single bond, -$A^0$-C(=O)—O—, -$A^0$-O— or -$A^0$-O—C(=O)— wherein $A^0$ is a straight, branched or cyclic $C_1$-$C_{12}$ alkylene group, $C_6$-$C_{12}$ arylene group or $C_2$-$C_{12}$ alkenylene group, which may contain a carbonyl, ester or ether moiety. $A^2$ is hydrogen or trifluoromethyl. $Z^0$ is a single bond, methylene, ethylene, phenylene, fluorinated phenylene, —O—$R^{62}$—, or —C(=O)—$Z^{10}$—$R^{62}$— wherein $Z^{01}$ is —O— or —NH— and $R^{62}$ is a straight, branched or cyclic $C_1$-$C_6$ alkylene, alkenylene or phenylene group which may contain a carbonyl, ester, ether or hydroxyl moiety. $M^-$ is a non-nucleophilic counter ion, and g1, g2 and g3 are numbers in the range: $0 \leq g1 \leq 0.3$, $0 \leq g2 \leq 0.3$, $0 \leq g3 \leq 0.3$, and $0 \leq g1+g2+g3 \leq 0.3$.

Examples of the monomer from which recurring units (g1) are derived are given below, but not limited thereto.

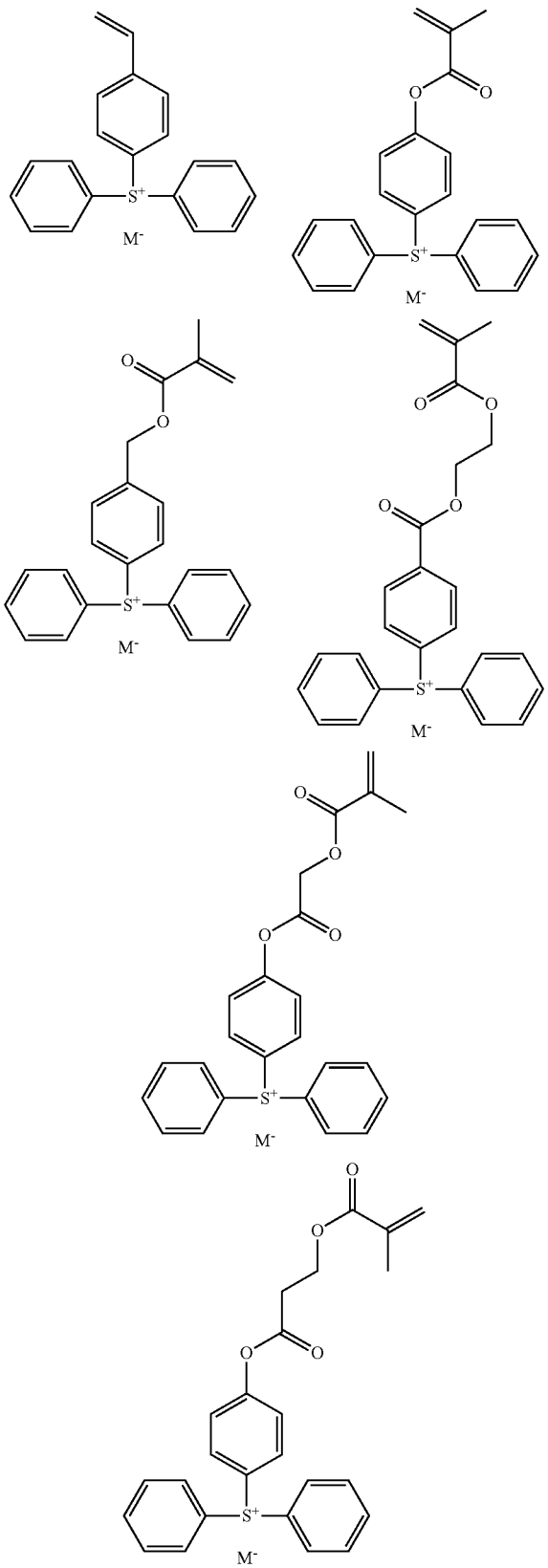

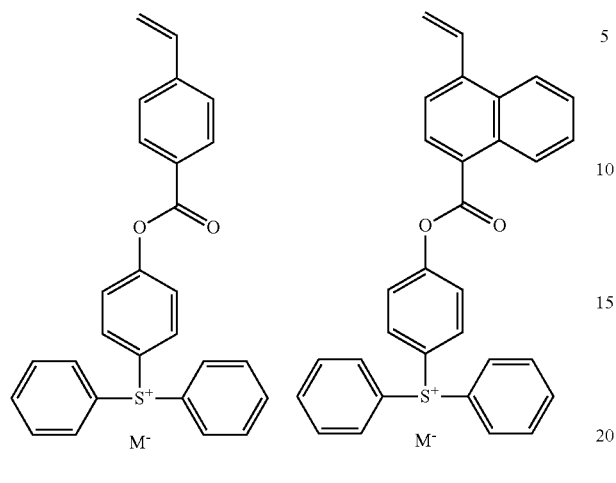
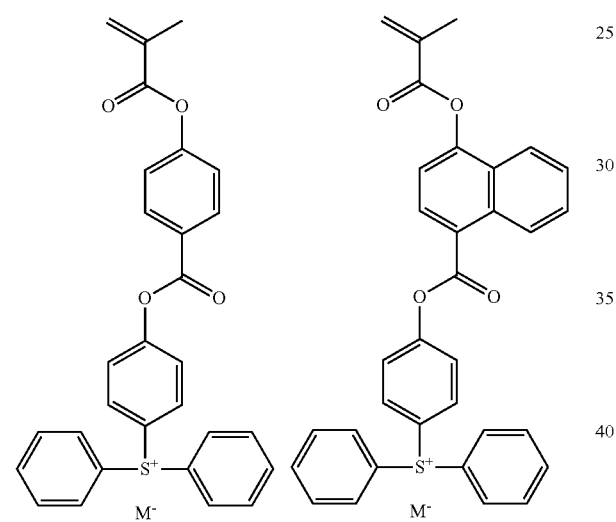
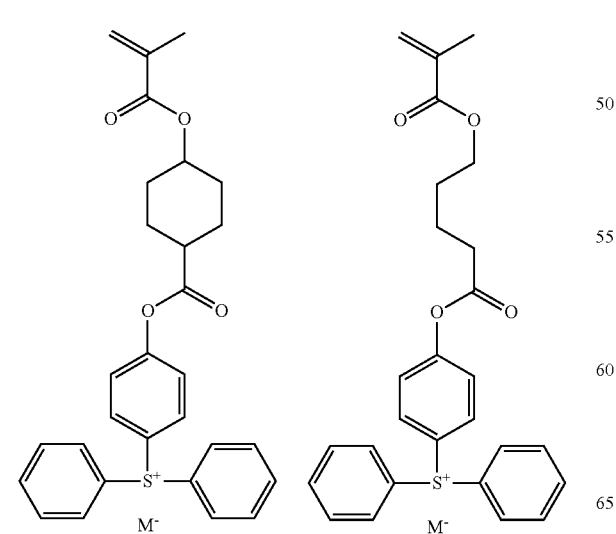
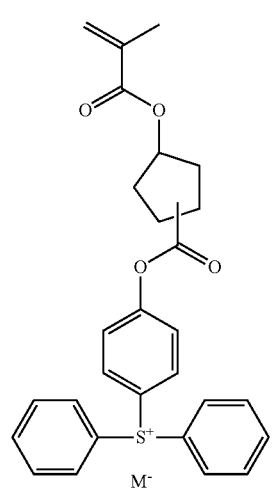
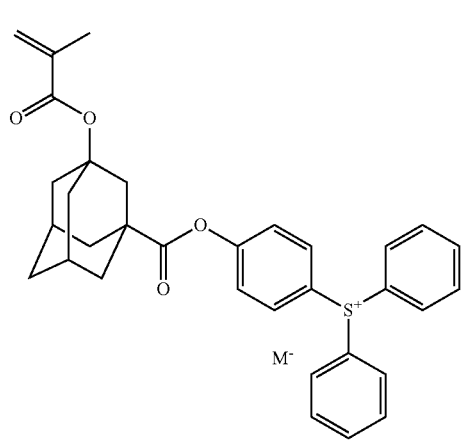
Examples of the monomer from which recurring units (g2) are derived are given below, but not limited thereto.
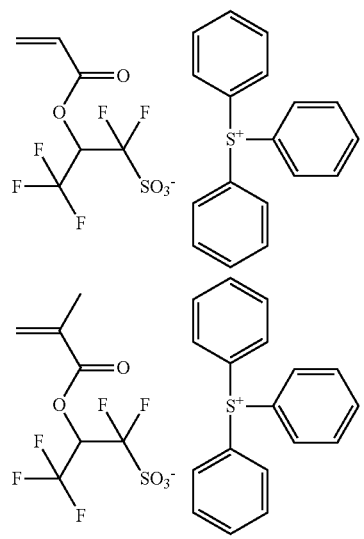

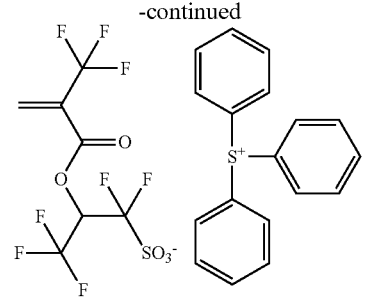
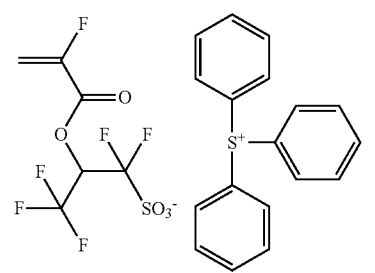
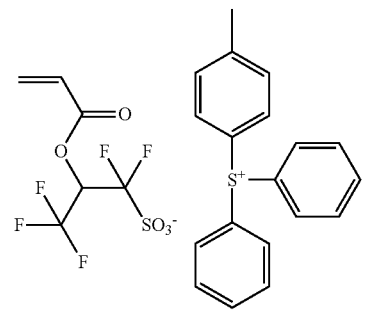
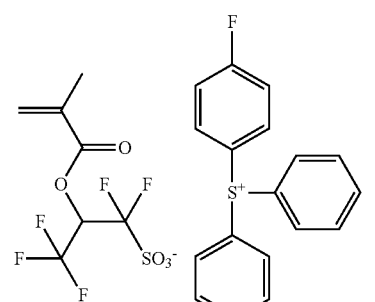
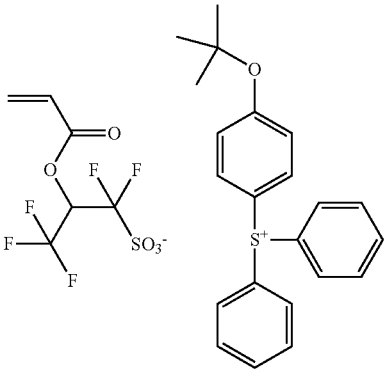
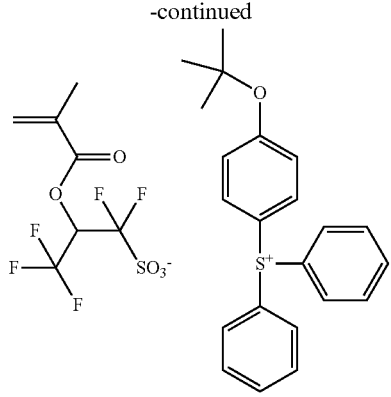
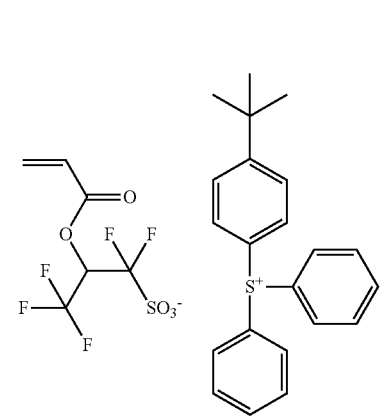
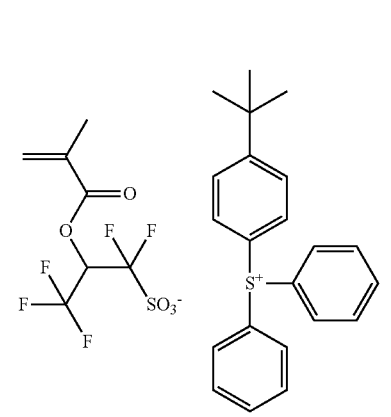
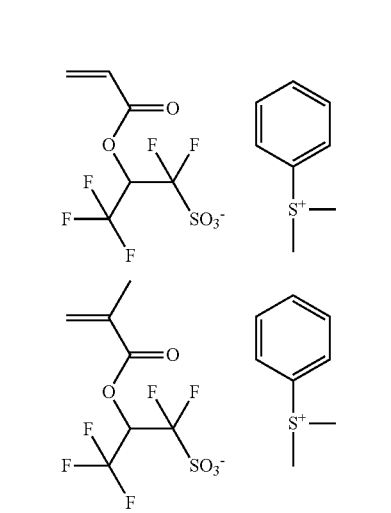

161
-continued
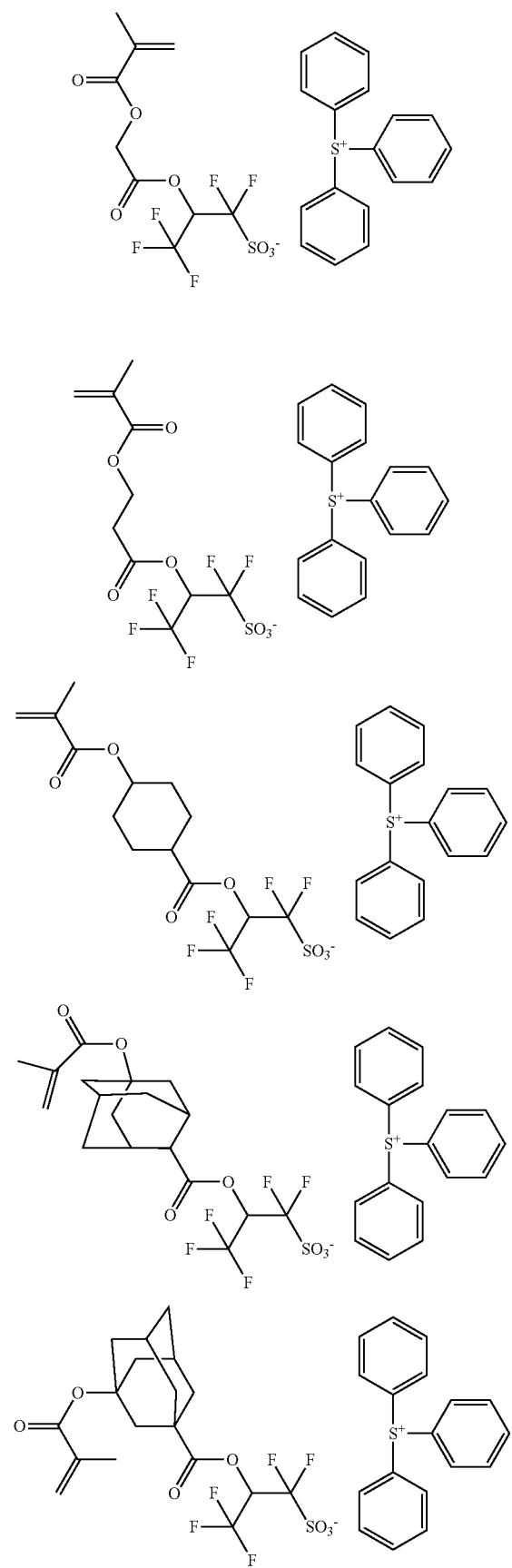
162
-continued
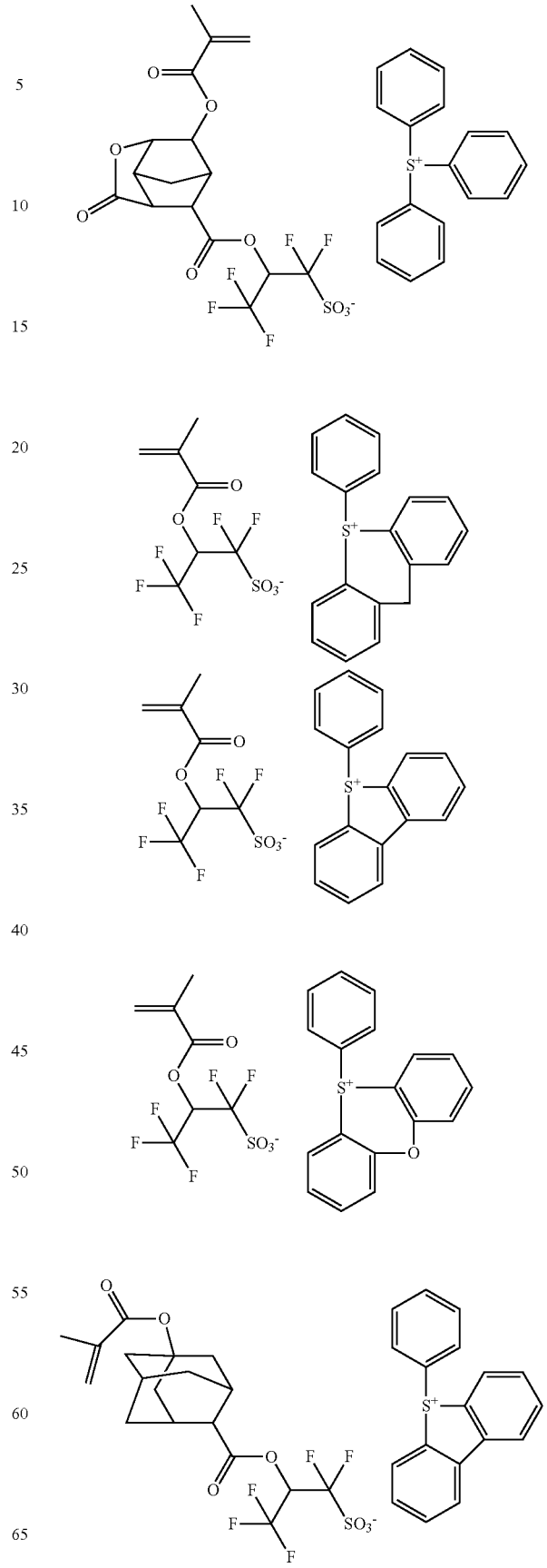

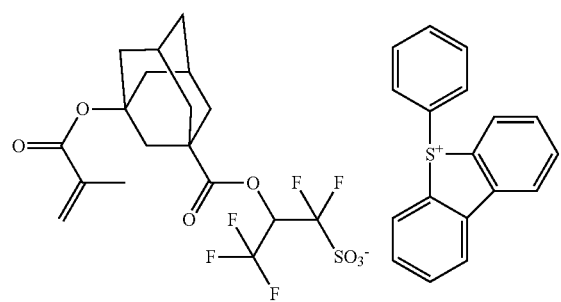
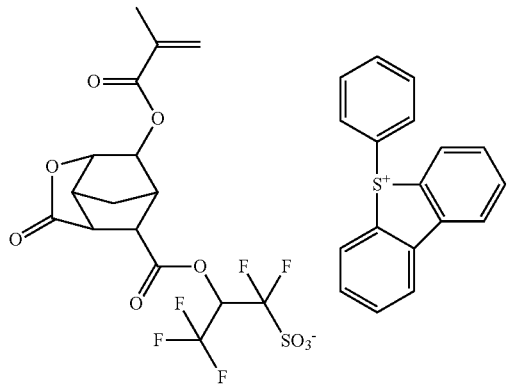
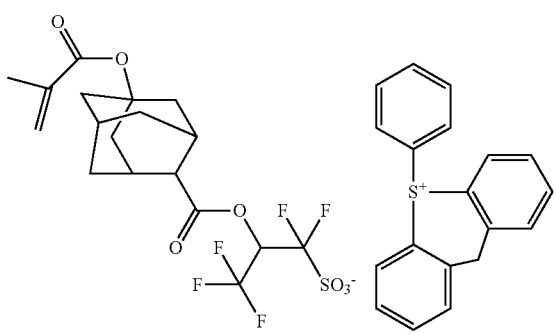
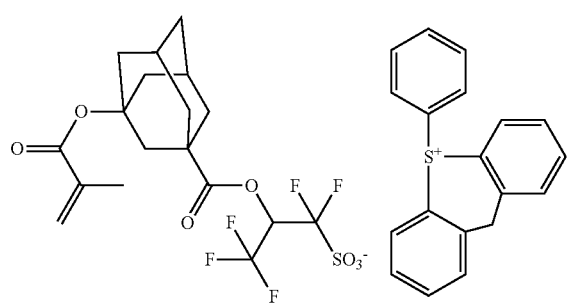
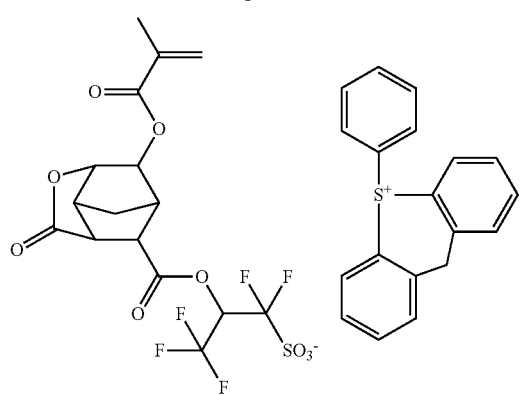
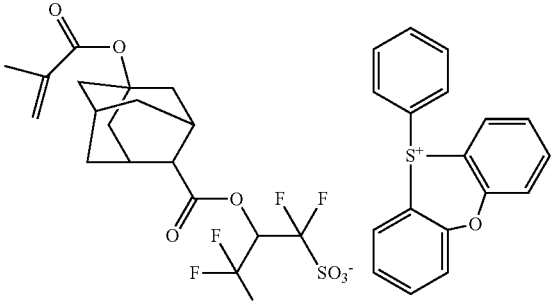
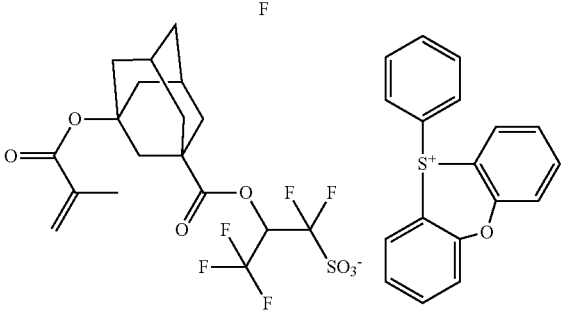
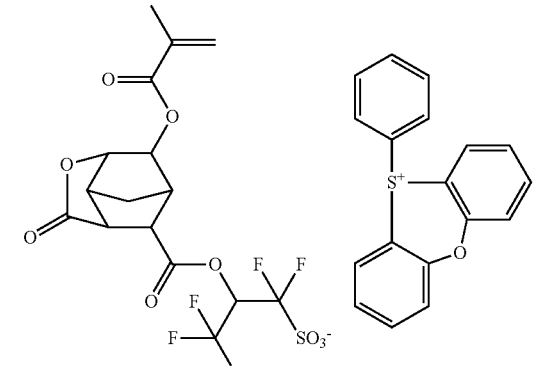
Examples of the monomer from which recurring units (g3) are derived are given below, but not limited thereto.
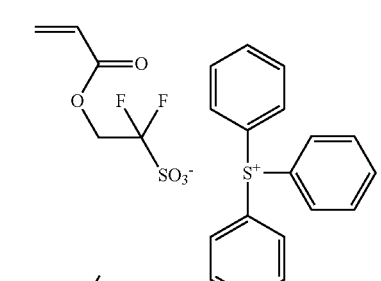
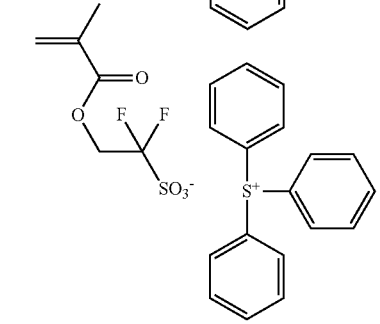

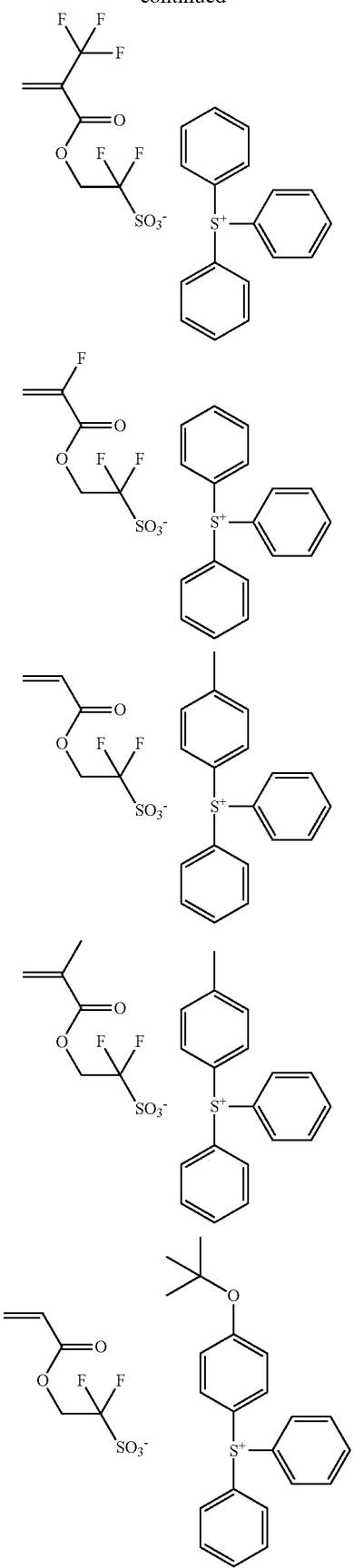
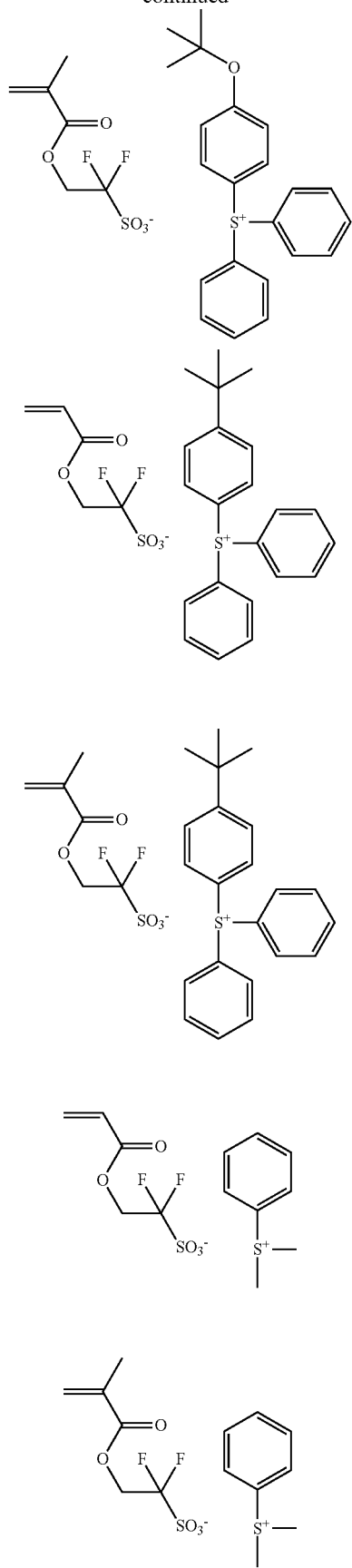

167
-continued
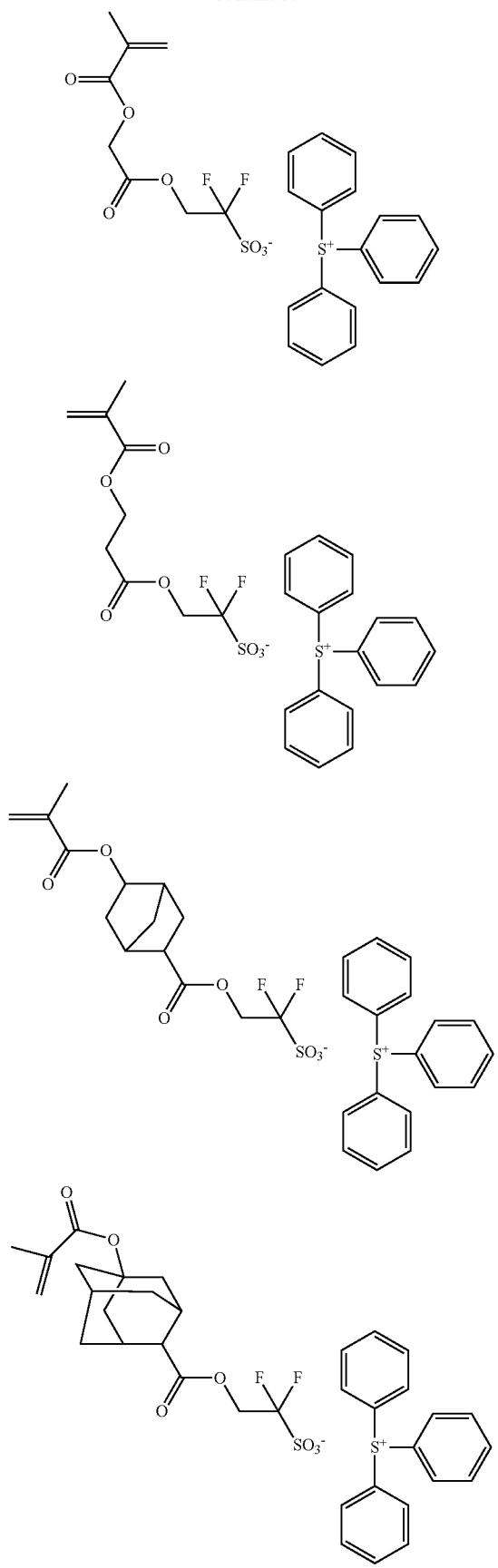
168
-continued
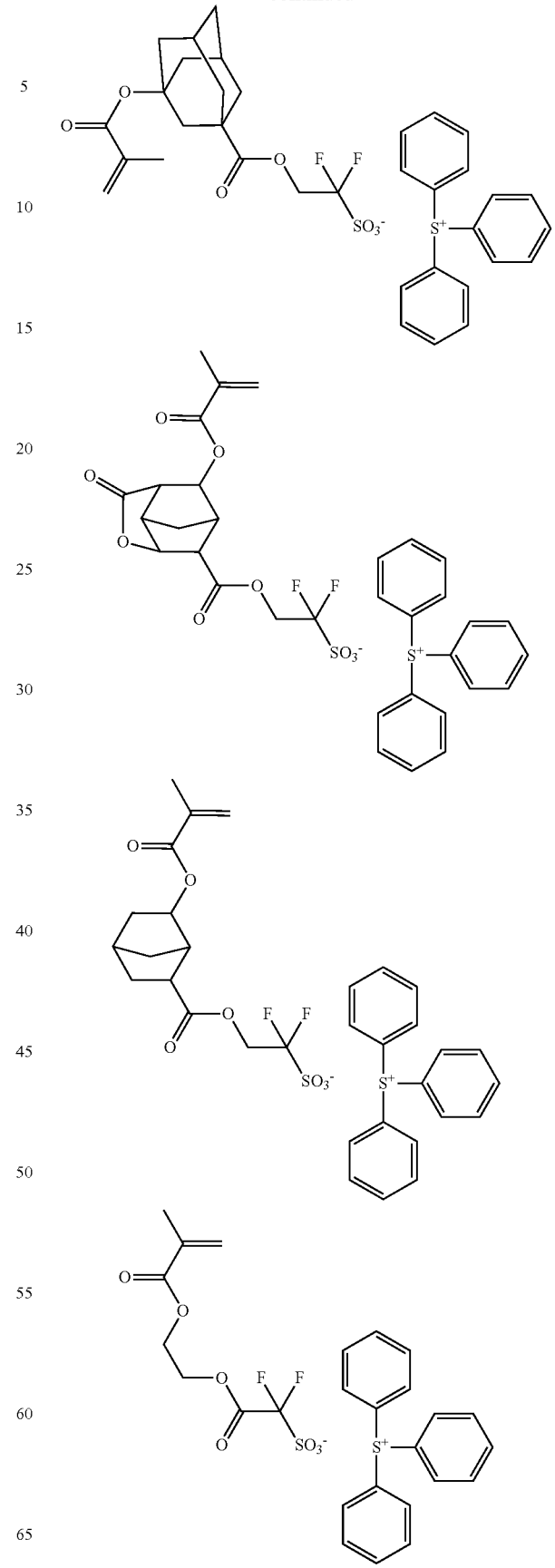

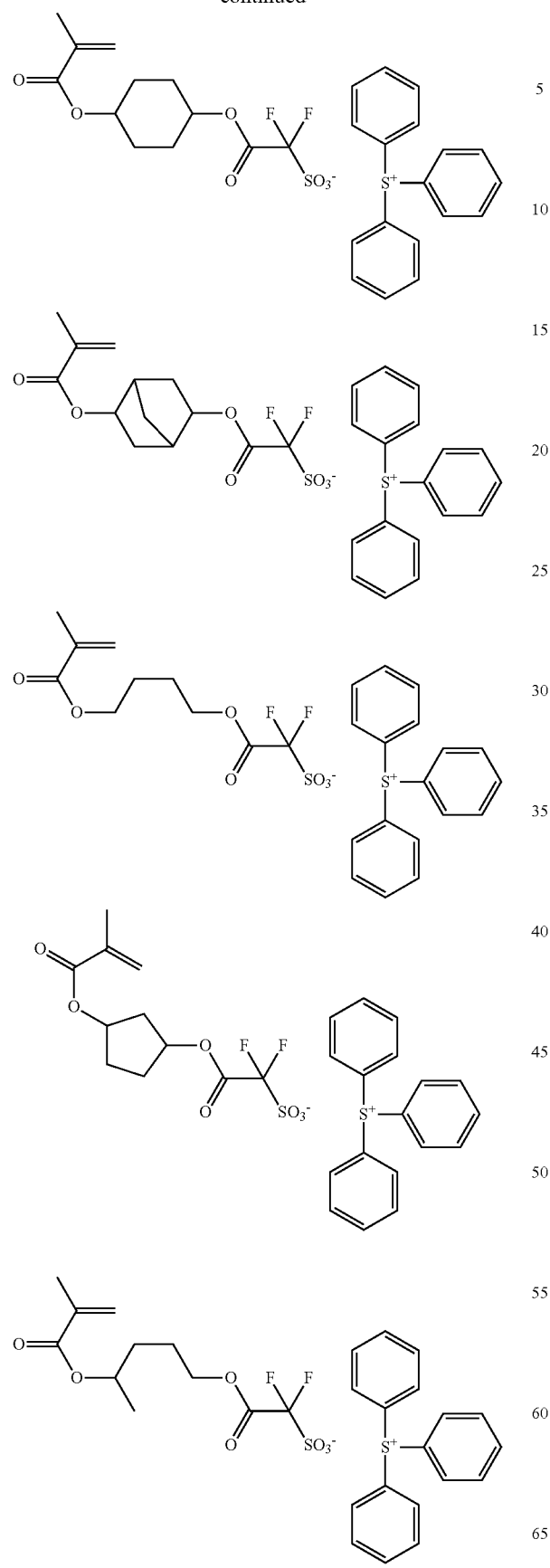
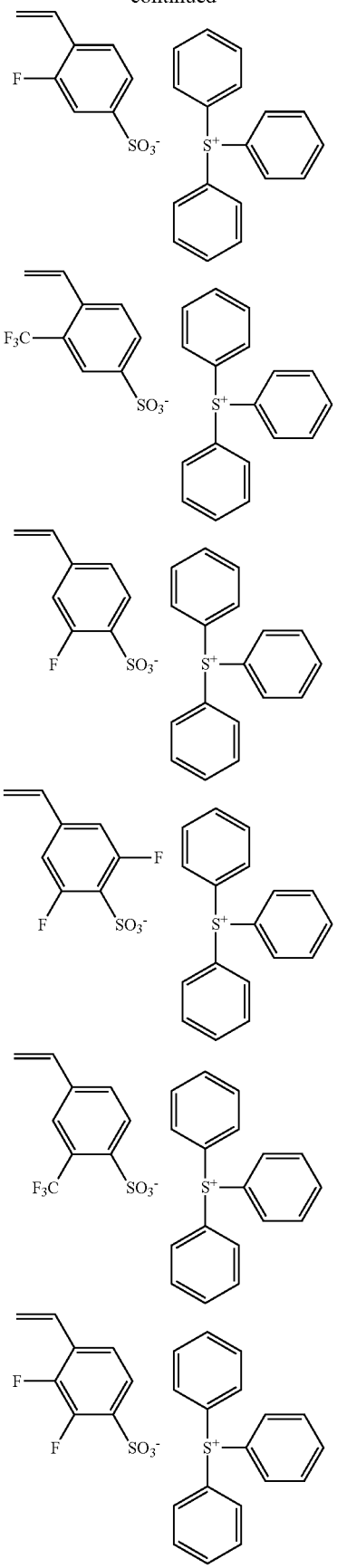

-continued

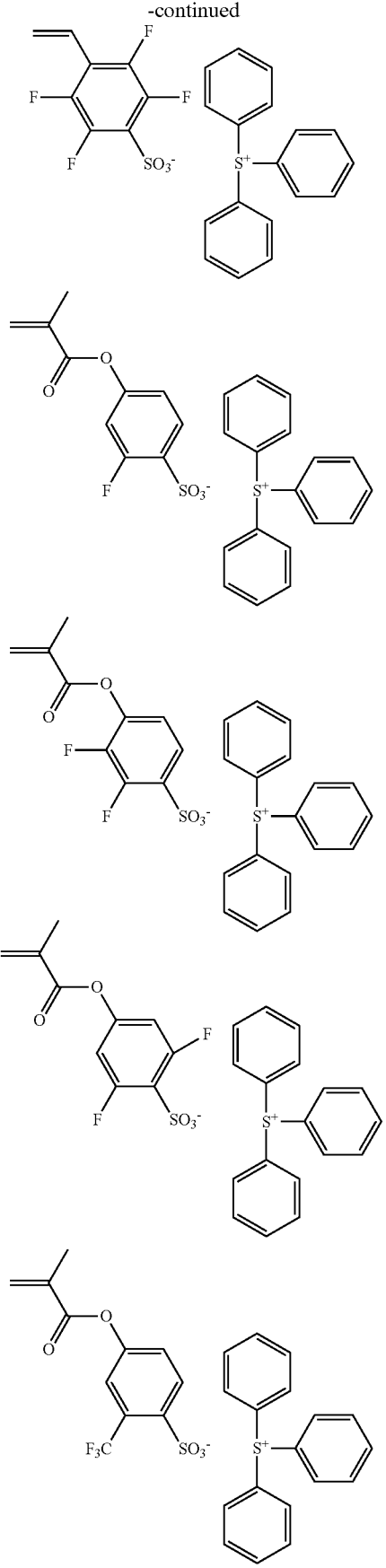

-continued

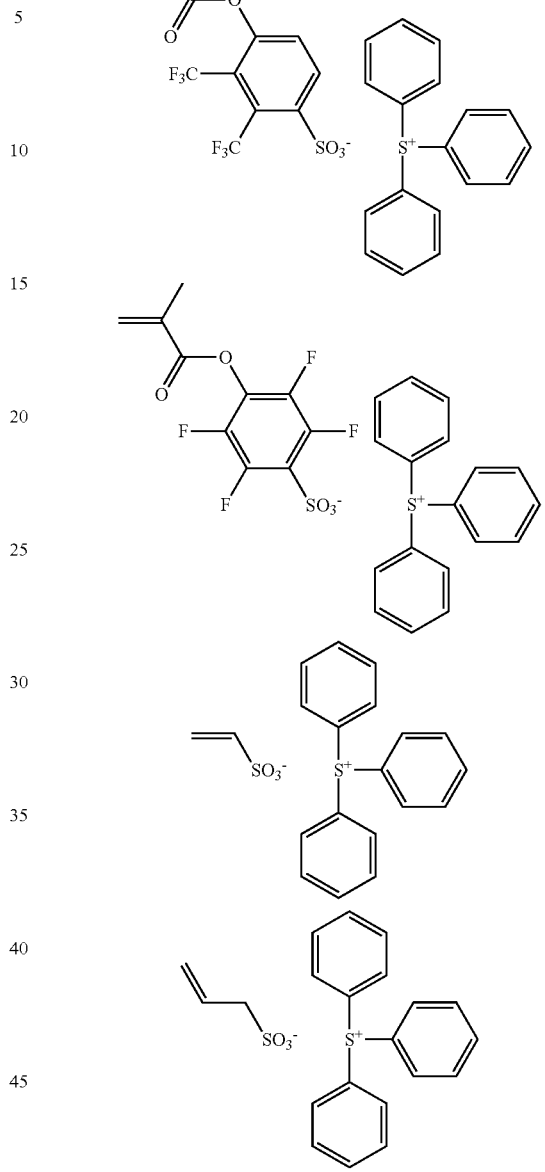

In the base resin, recurring units (d1), (d2), (e), (f), (g1), (g2) and (g3) are copolymerized in the following molar fraction: preferably 0≤d1<1.0, 0≤d2<1.0, 0.05≤d1+d2<1.0, 0≤e<1.0, 0≤f<1.0, 0≤g1≤0.3, 0≤g2≤0.3, 0≤g3≤0.3, and 0≤g1+g2+g3≤0.3; more preferably 0≤d1≤0.8, 0≤d2≤0.8, 0.05≤d1+d2≤0.8, 0≤e≤0.8, 0≤f≤0.8, 0≤g1≤0.25, 0≤g2≤0.25, 0≤g3≤0.25, and 0≤g1+g2+g3≤0.25.

The base resin may be synthesized by any desired methods, for example, by dissolving one or more monomers selected from the monomers to form recurring units (d1) and/or (d2) and optional recurring units (e), (f), (g1), (g2) and (g3) in an organic solvent, adding a radical polymerization initiator thereto, and effecting heat polymerization. The organic solvent and conditions for the polymerization reaction may be the same as described above for the polymerization of the fluorine-containing polymer.

The base resin should preferably have a weight average molecular weight (Mw) in the range of 1,000 to 500,000, and more preferably 2,000 to 30,000. When $Mw \geq 1,000$, the resist composition may be heat resistant. A resin with a Mw of up to 500,000 may not lose alkaline solubility or give rise to a footing phenomenon after pattern formation.

If a base resin has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the base resin should preferably have a narrow dispersity (Mw/Mn) of 1.0 to 2.0, especially 1.0 to 1.5, in order to provide a resist composition suitable for micropatterning to a small feature size.

The base resin is used to formulate a positive tone resist composition. In the resist composition, preferably 0.1 to 15 parts by weight of the fluorine-containing polymer is added per 100 parts by weight of the base resin.

C. Acid Generator

The acid generator (C) used herein preferably has the formula (12) or (13).

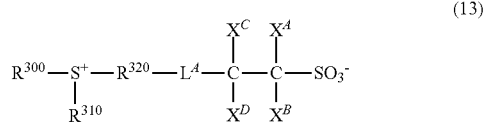

In formula (12), $R^{200}$, $R^{210}$ and $R^{220}$ are each independently a straight, branched or cyclic $C_1$-$C_{20}$ monovalent hydrocarbon group which may contain a heteroatom. Any two or more of $R^{200}$, $R^{210}$ and $R^{220}$ may bond together to form a ring with the sulfur atom to which they are attached.

In formula (12), $X^-$ is an anion of the following formula (12A), (12B), (12C) or (12D).

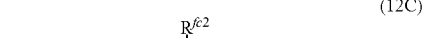

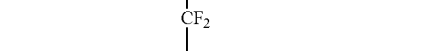

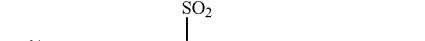

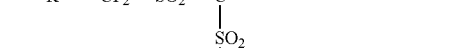

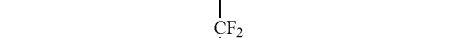

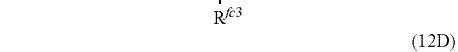

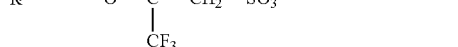

In formula (12A), $R^{fa}$ is fluorine or a straight, branched or cyclic $C_1$-$C_4$, monovalent hydrocarbon group which may contain a heteroatom.

Of the anions of formula (12A), an anion having the formula (12A') is preferred.

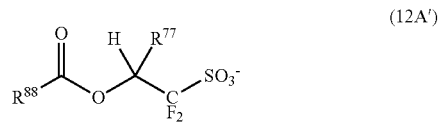

In formula (12A'), $R^{77}$ is hydrogen or trifluoromethyl, preferably trifluoromethyl. $R^8$ is a straight, branched or cyclic $C_1$-$C_{38}$ monovalent hydrocarbon group which may contain a heteroatom. As the heteroatom, oxygen, nitrogen, sulfur and halogen atoms are preferred, with oxygen being most preferred. Of the monovalent hydrocarbon groups represented by $R^{88}$, those groups of 6 to 30 carbon atoms are preferred from the aspect of achieving a high resolution in forming patterns of fine feature size. Suitable monovalent hydrocarbon groups include, but are not limited to, methyl, ethyl, propyl, isopropyl, butyl, isobutyl, s-butyl, t-butyl, pentyl, neopentyl, cyclopentyl, hexyl, cyclohexyl, 3-cyclohexenyl, heptyl, 2-ethylhexyl, nonyl, undecyl, tridecyl, pentadecyl, heptadecyl, 1-adamantyl, 2-adamantyl, 1-adamantylmethyl, norbornyl, norbornylmethyl, tricyclodecanyl, tetracyclododecanyl, tetracyclododecanylmethyl, dicyclohexylmethyl, eicosanyl, allyl, benzyl, diphenylmethyl, tetrahydrofuryl, methoxymethyl, ethoxymethyl, methylthiomethyl, acetamidomethyl, trifluoromethyl, (2-methoxyethoxy)methyl, acetoxymethyl, 2-carboxy-1-cyclohexyl, 2-oxopropyl, 4-oxo-1-adamantyl, and 3-oxocyclohexyl. In these groups, one or more hydrogen atoms may be substituted by a moiety containing a heteroatom such as oxygen, sulfur, nitrogen or halogen, or a moiety containing a heteroatom such as oxygen, sulfur or nitrogen may intervene between carbon atoms, so that the group may contain a hydroxyl, cyano, carbonyl, ether bond, ester bond, sulfonic acid ester bond, carbonate bond, lactone ring, sultone ring, carboxylic anhydride or haloalkyl moiety.

With respect to the synthesis of the sulfonium salt having an anion of formula (12A'), reference may be made to JP-A 2007-145797, JP-A 2008-106045, JP-A 2009-007327, and JP-A 2009-258695. Also useful are the sulfonium salts described in JP-A 2010-215608, JP-A 2012-041320, JP-A 2012-106986, and JP-A 2012-153644.

Examples of the sulfonium salt having an anion of formula (12A) are shown below, but not limited thereto.

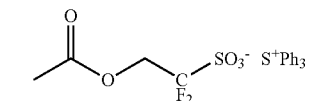

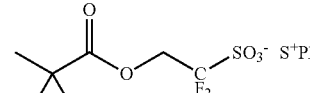

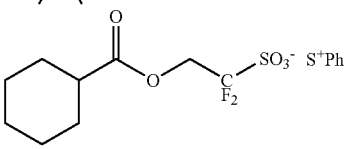

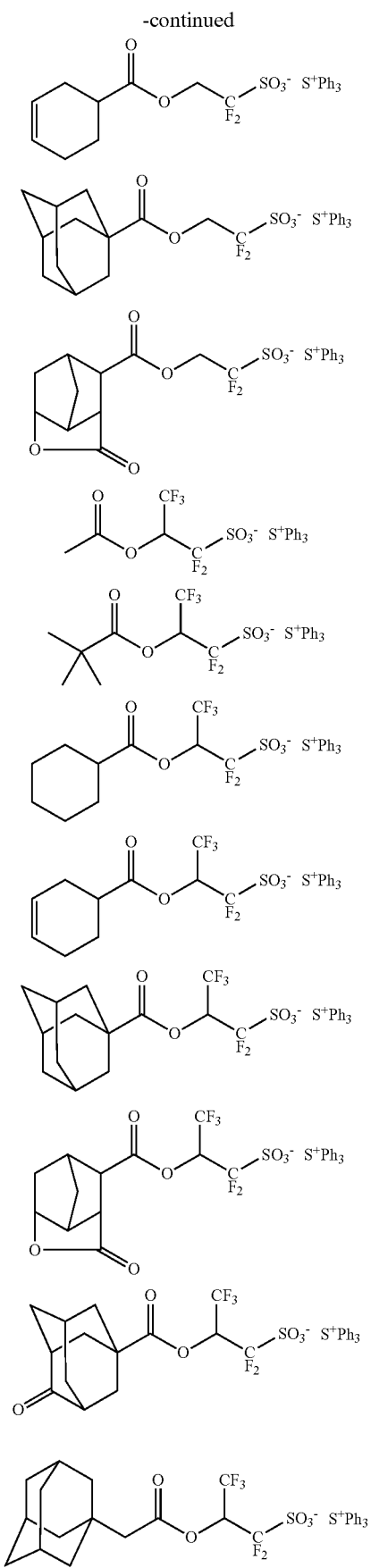
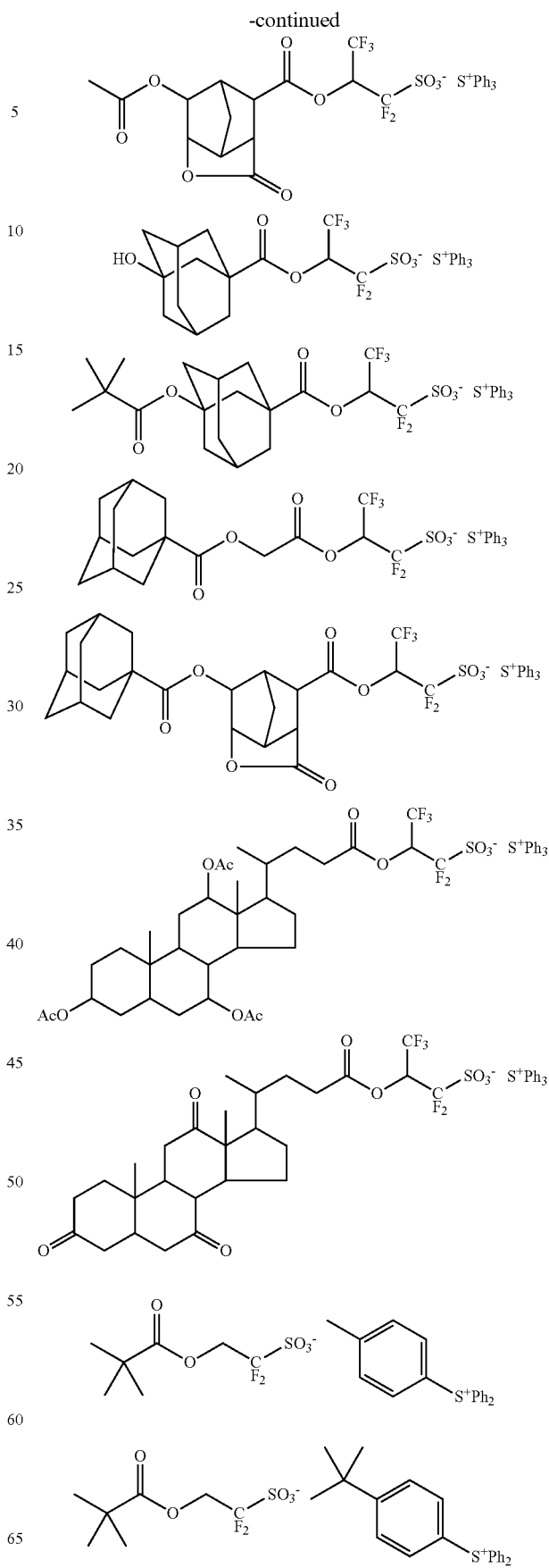

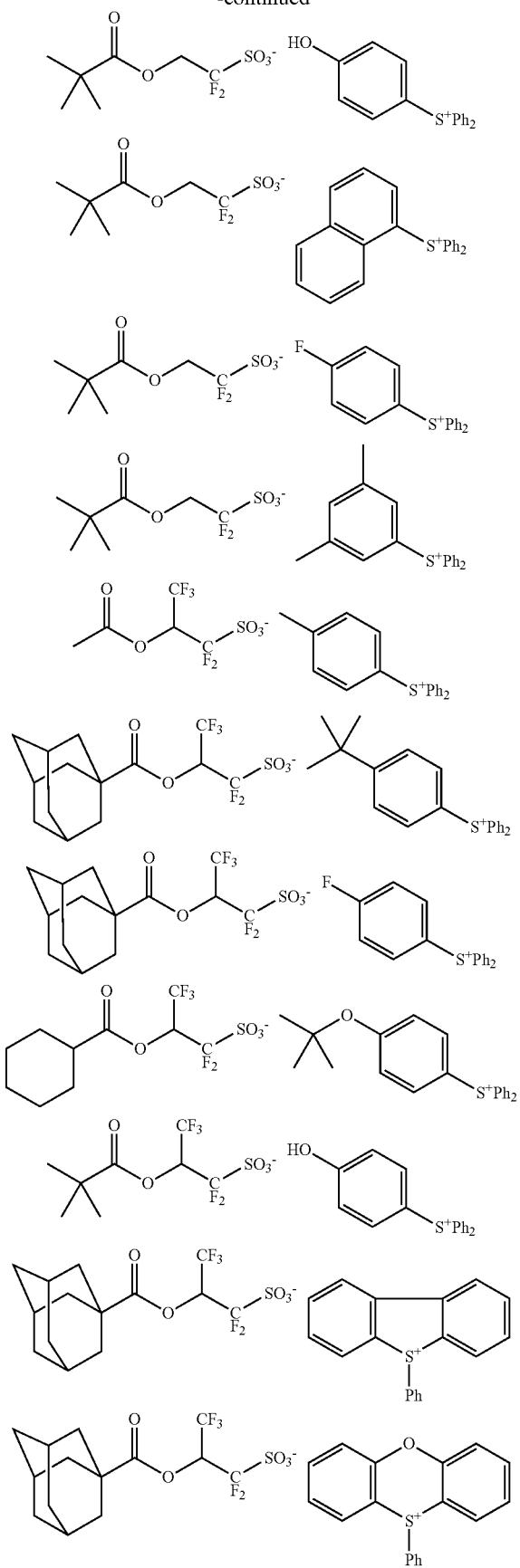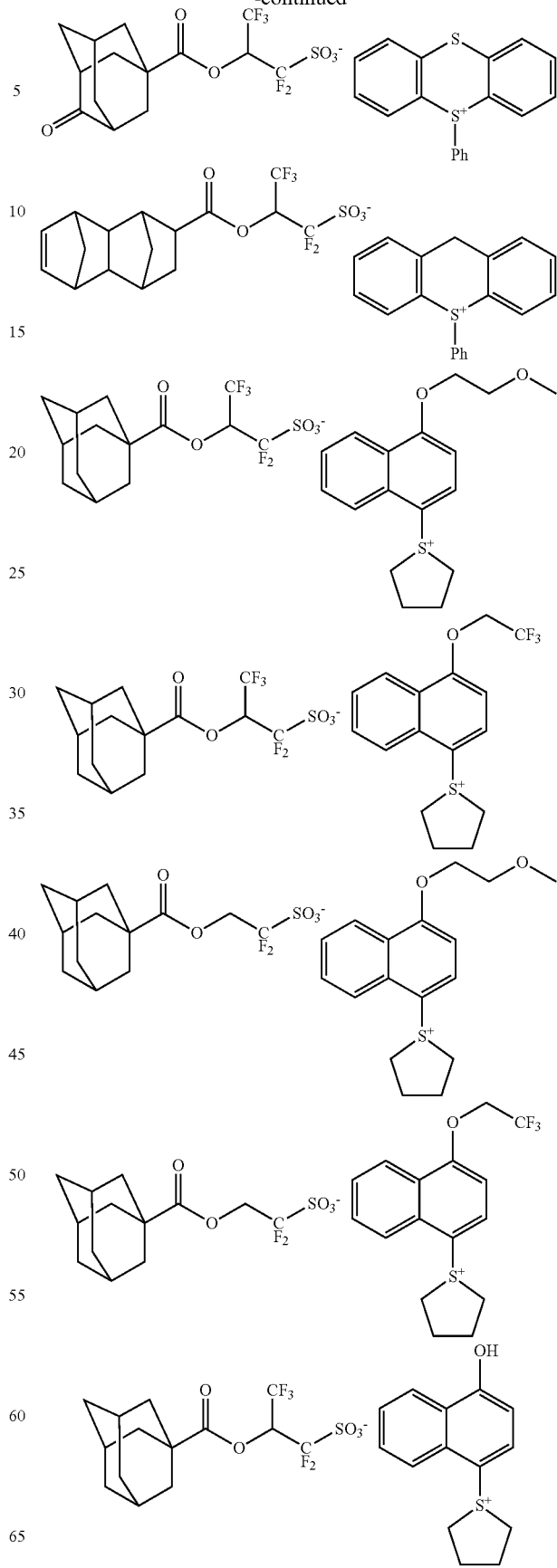

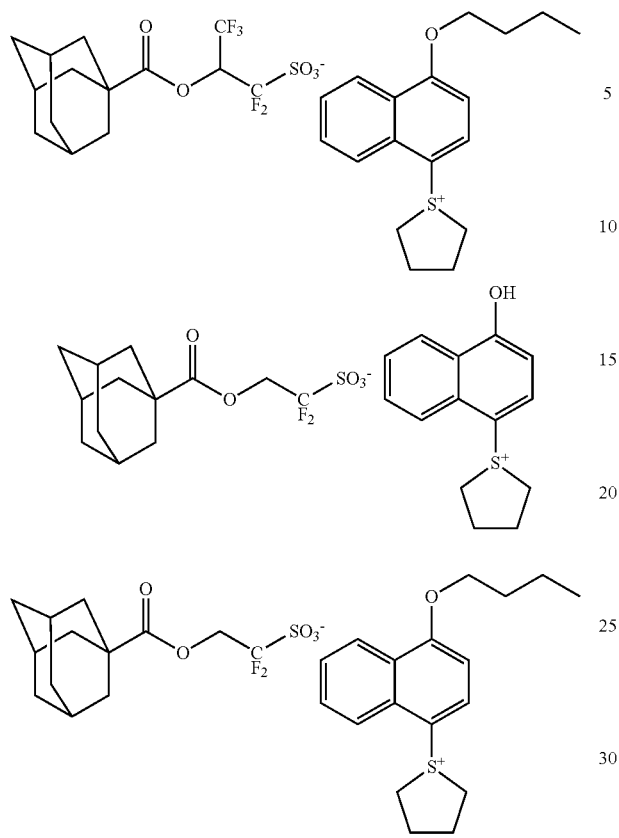
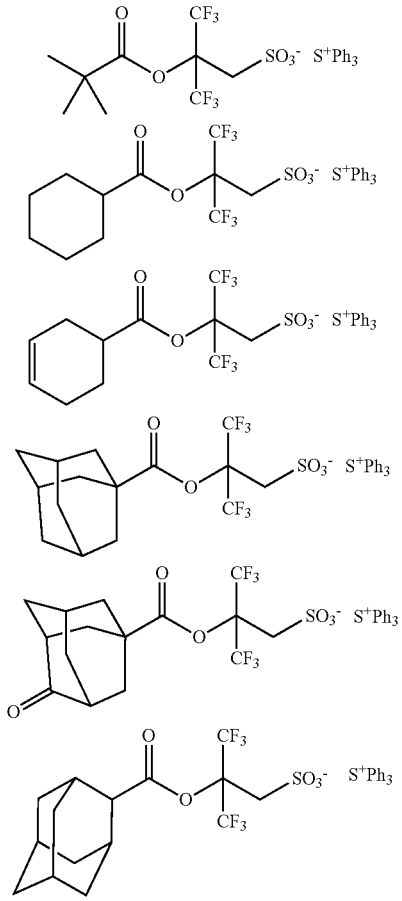

In formula (12B), $R^{fb1}$ and $R^{fb2}$ are each independently fluorine or a straight, branched or cyclic $C_1$-$C_4$, monovalent hydrocarbon group which may contain a heteroatom. Illustrative examples of the monovalent hydrocarbon group are as exemplified for $R^{88}$. Preferably $R^{fb1}$ and $R^{fb2}$ are fluorine or $C_1$-$C_4$ straight fluorinated alkyl groups. Also, $R^{fb1}$ and $R^{fb2}$ may bond together to form a ring with the linkage: —$CF_2$—$SO_2$—$N^-$—$SO_2$—$CF_2$— to which they are attached. It is preferred to form a ring structure via a fluorinated ethylene or fluorinated propylene group.

In formula (12C), $R^{fc1}$, $R^{fc2}$ and $R^{fc3}$ are each independently fluorine or a straight, branched or cyclic $C_1$-$C_{40}$ monovalent hydrocarbon group which may contain a heteroatom. Illustrative examples of the monovalent hydrocarbon group are as exemplified for $R^{88}$. Preferably $R^{fc1}$, $R^{fc2}$ and $R^{fc3}$ are fluorine or $C_1$-$C_4$ straight fluorinated alkyl groups. Also, $R^{fc1}$ and $R^{fc2}$ may bond together to form a ring with the linkage: —$CF_2$—$SO_2$—$C^-$—$SO_2$—$CF_2$— to which they are attached. It is preferred to form a ring structure via a fluorinated ethylene or fluorinated propylene group.

In formula (12D), $R^{fd}$ is a straight, branched or cyclic $C_1$-$C_{40}$ monovalent hydrocarbon group which may contain a heteroatom. Illustrative examples of the monovalent hydrocarbon group are as exemplified for $R^{88}$.

With respect to the synthesis of the sulfonium salt having an anion of formula (12D), reference may be made to JP-A 2010-215608 and JP-A 2014-133723.

Examples of the sulfonium salt having an anion of formula (12D) are shown below, but not limited thereto.

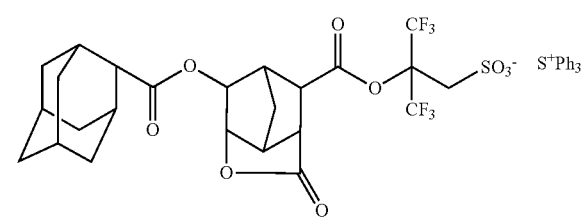

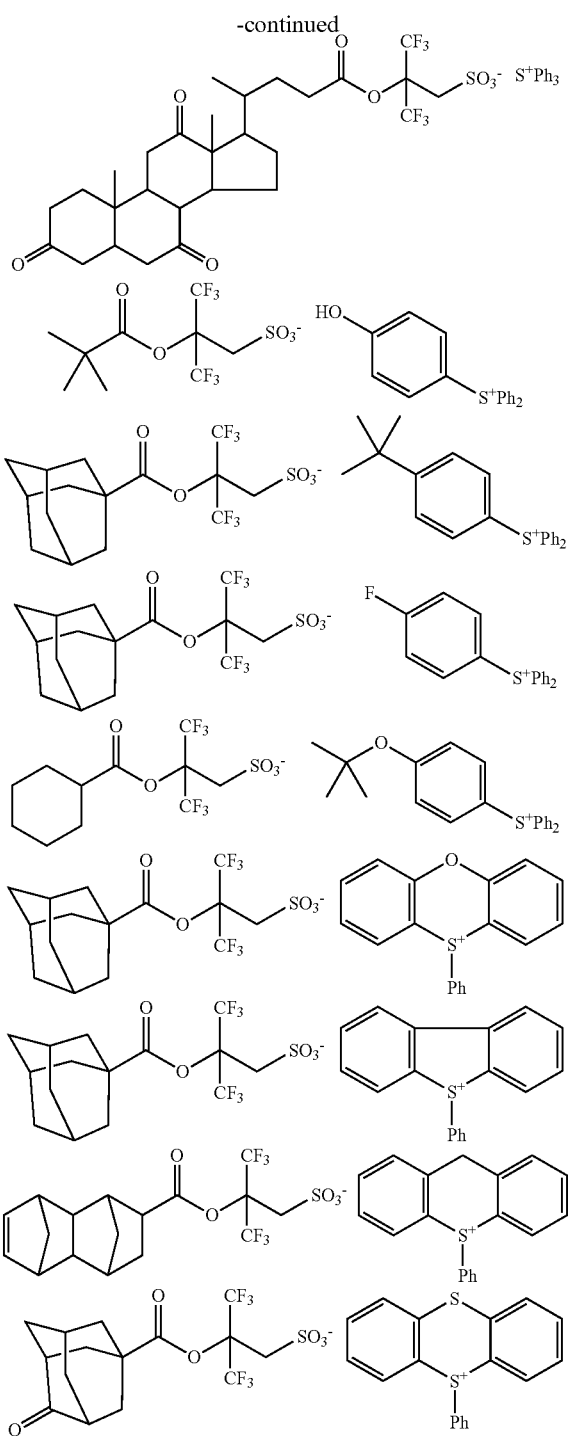

Notably, the compound having the anion of formula (12D) does not have fluorine at the α-position relative to the sulfo group, but two trifluoromethyl groups at the β-position. For this reason, it has a sufficient acidity to sever the acid labile groups in the base resin. Thus the compound is an effective PAG.

In formula (13), $R^{300}$ and $R^{310}$ are each independently a straight, branched or cyclic $C_1$-$C_{30}$ monovalent hydrocarbon group which may contain a heteroatom. $R^{320}$ is a straight, branched or cyclic $C_1$-$C_{30}$ divalent hydrocarbon group which may contain a heteroatom. Any two or more of $R^{300}$, $R^{310}$ and $R^{320}$ may bond together to form a ring with the sulfur atom to which they are attached. $L^A$ is a single bond, ether group, or a straight, branched or cyclic $C_1$-$C_{20}$ divalent hydrocarbon group which may contain a heteroatom. $X^A$, $X^B$, $X^C$ and $X^D$ are each independently hydrogen, fluorine or trifluoromethyl, with the proviso that at least one of $X^A$, $X^B$, $X^C$ and $X^D$ is fluorine or trifluoromethyl.

Examples of the monovalent hydrocarbon group are as exemplified above for R.

Suitable divalent hydrocarbon groups include straight alkane-diyl groups such as methylene, ethylene, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, and heptadecane-1,17-diyl; saturated cyclic divalent hydrocarbon groups such as cyclopentanediyl, cyclohexanediyl, norbornanediyl and adamantanediyl; and unsaturated cyclic divalent hydrocarbon groups such as phenylene and naphthylene. In these groups, one or more hydrogen atom may be replaced by an alkyl radical such as methyl, ethyl, propyl, n-butyl or t-butyl; one or more hydrogen atom may be replaced by a moiety containing a heteroatom such as oxygen, sulfur, nitrogen or halogen; or a moiety containing a heteroatom such as oxygen, sulfur or nitrogen may intervene between carbon atoms, so that the group may contain a hydroxyl, cyano, carbonyl, ether bond, ester bond, sulfonic acid ester bond, carbonate bond, lactone ring, sultone ring, carboxylic anhydride or haloalkyl moiety. Of the heteroatoms, oxygen is most preferred.

Of the PAGs having formula (13), one having formula (13') is preferred.

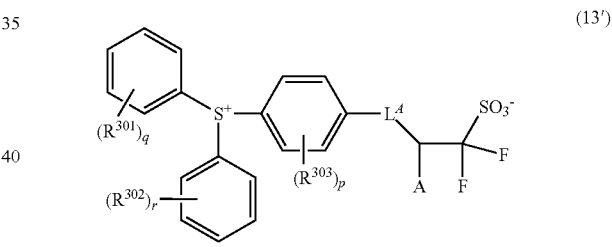

(13')

In formula (13'), $L^A$ is as defined above. A is hydrogen or trifluoromethyl, preferably trifluoromethyl. $R^{301}$, $R^{302}$ and $R^{303}$ are each independently hydrogen or a straight, branched or cyclic $C_1$-$C_{20}$ monovalent hydrocarbon group which may contain a heteroatom. Suitable monovalent hydrocarbon groups are as described above for $R^{88}$. The subscripts q and r are each independently an integer of 0 to 5, and p is an integer of 0 to 4.

Examples of the PAG having formula (13) are shown below, but not limited thereto. Notably, A is as defined above.

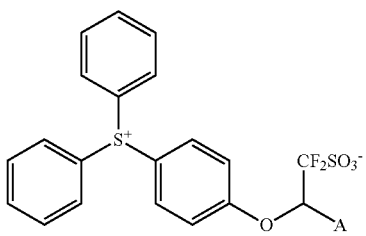

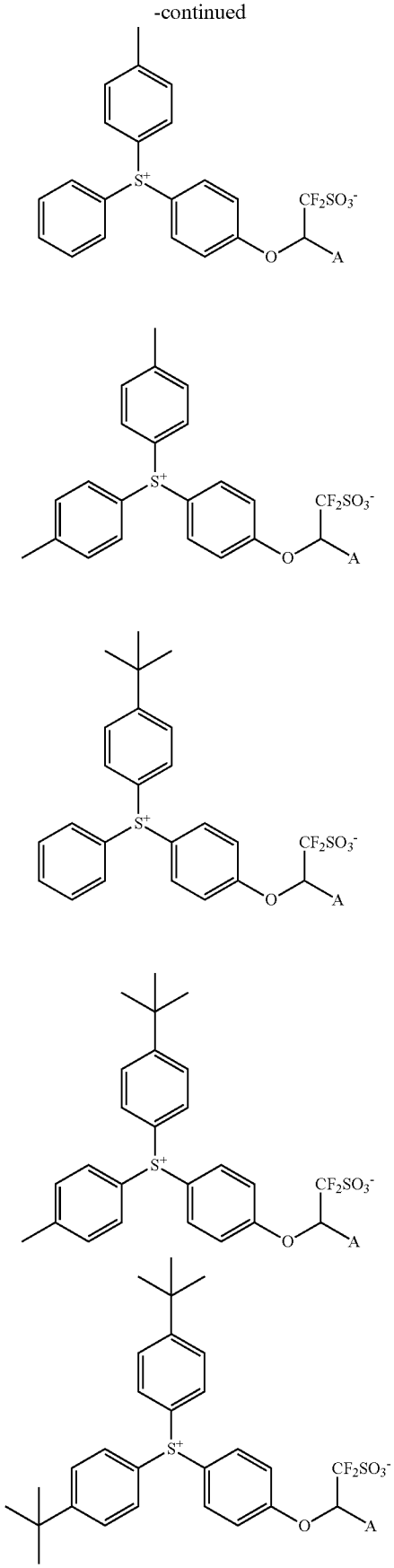
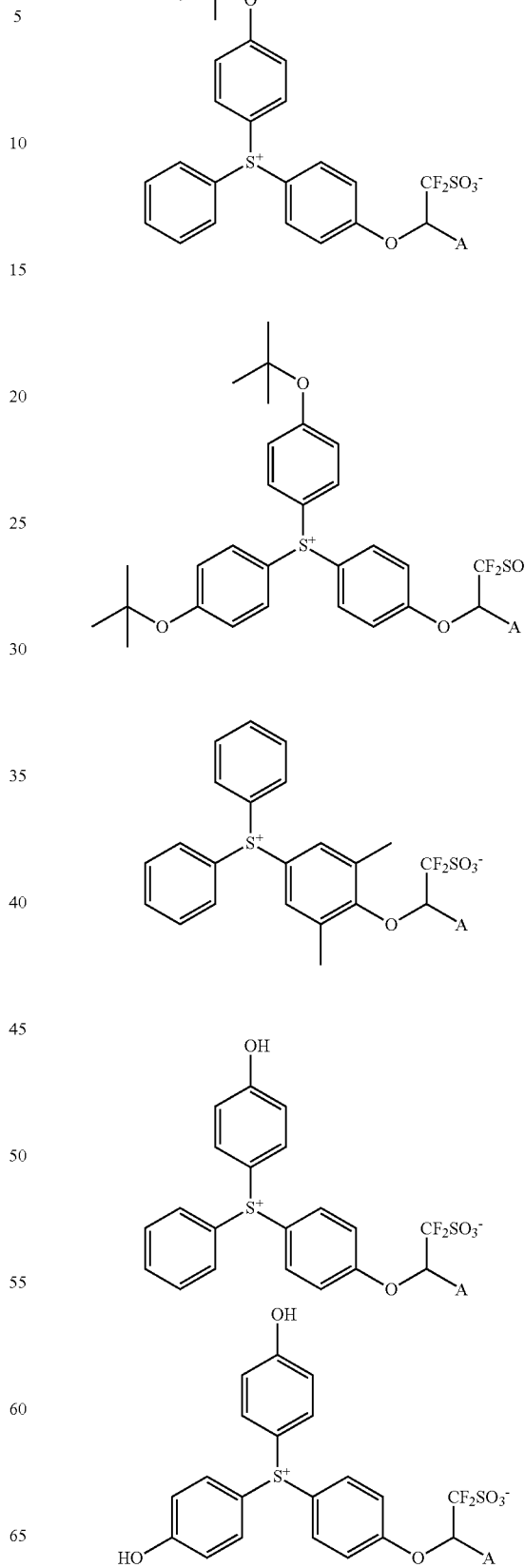

185
-continued
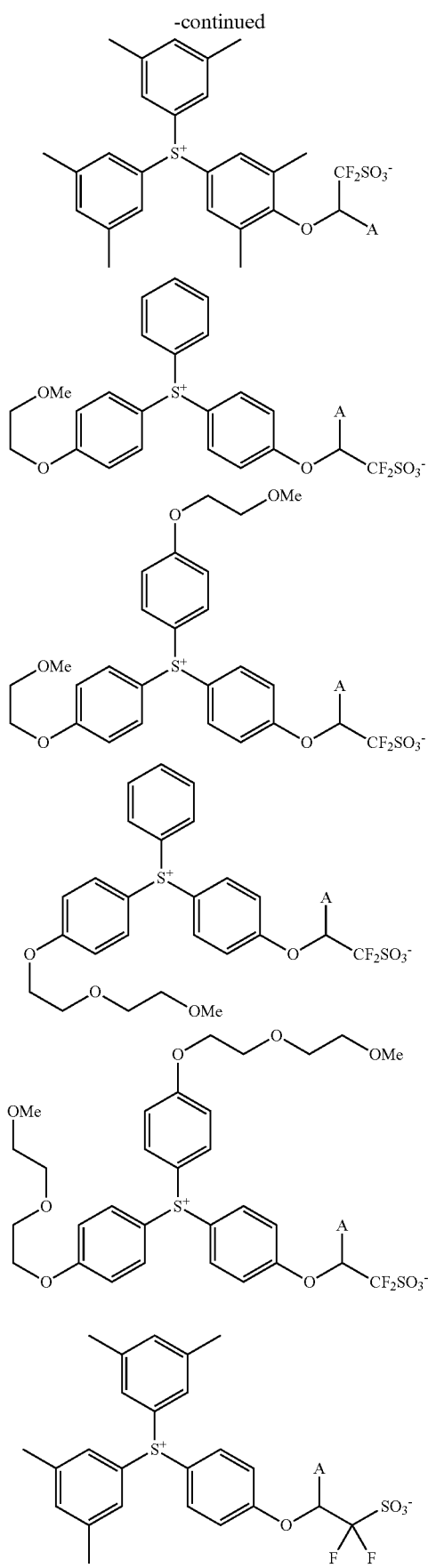
186
-continued
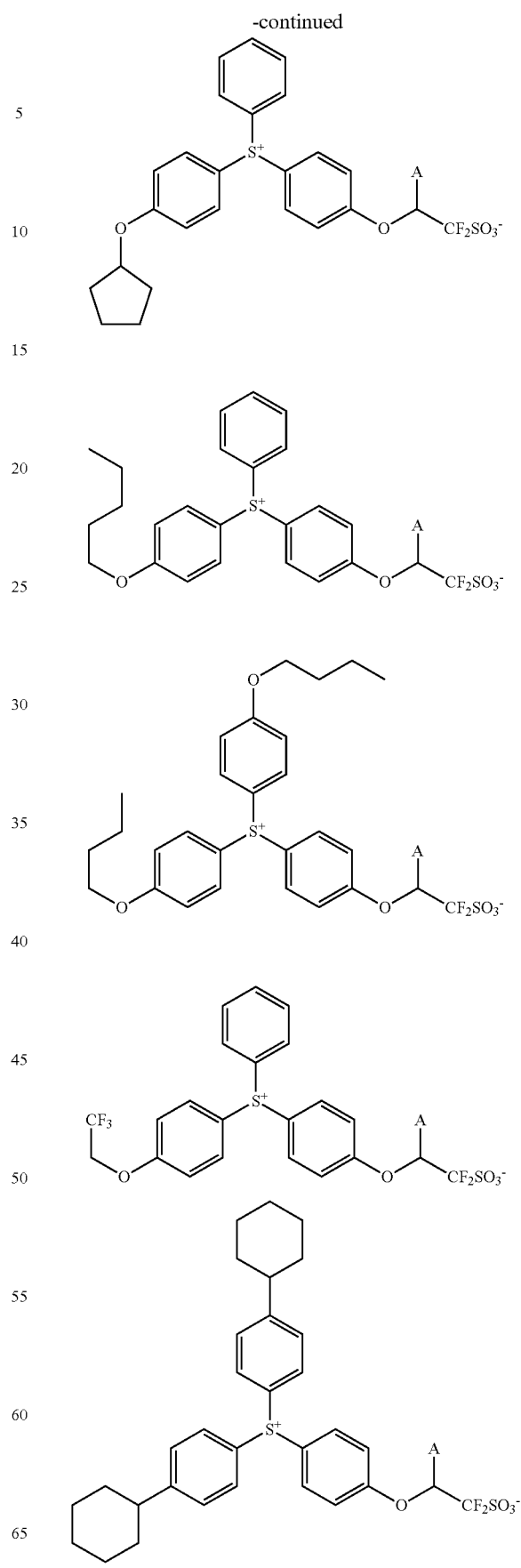

187
-continued
188
-continued
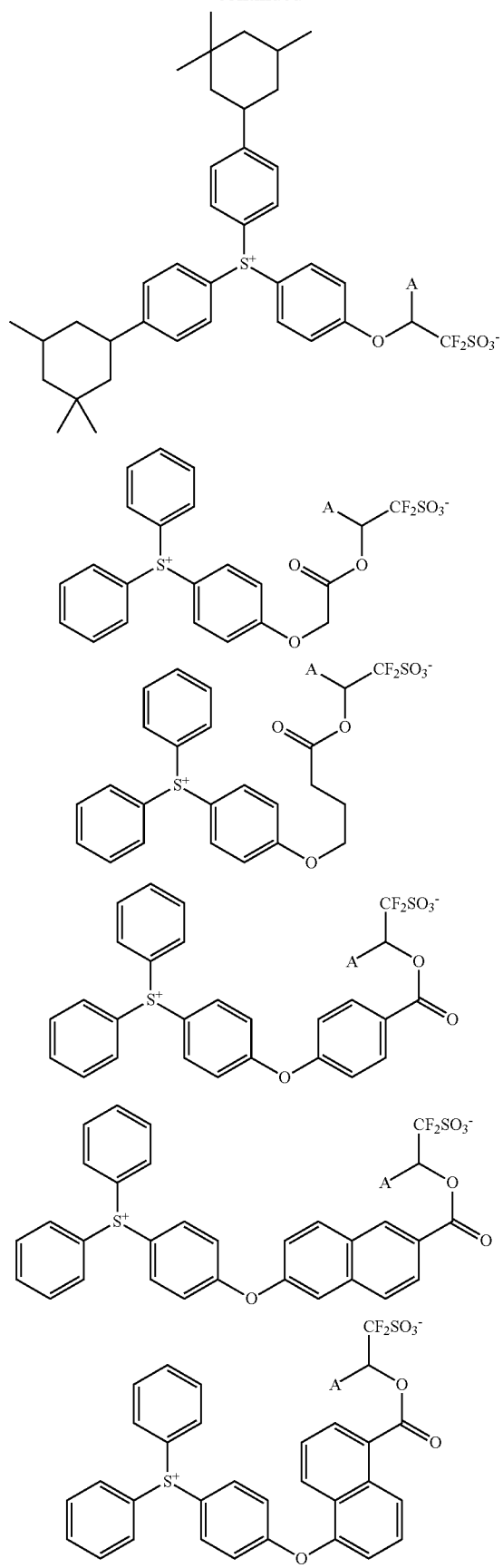
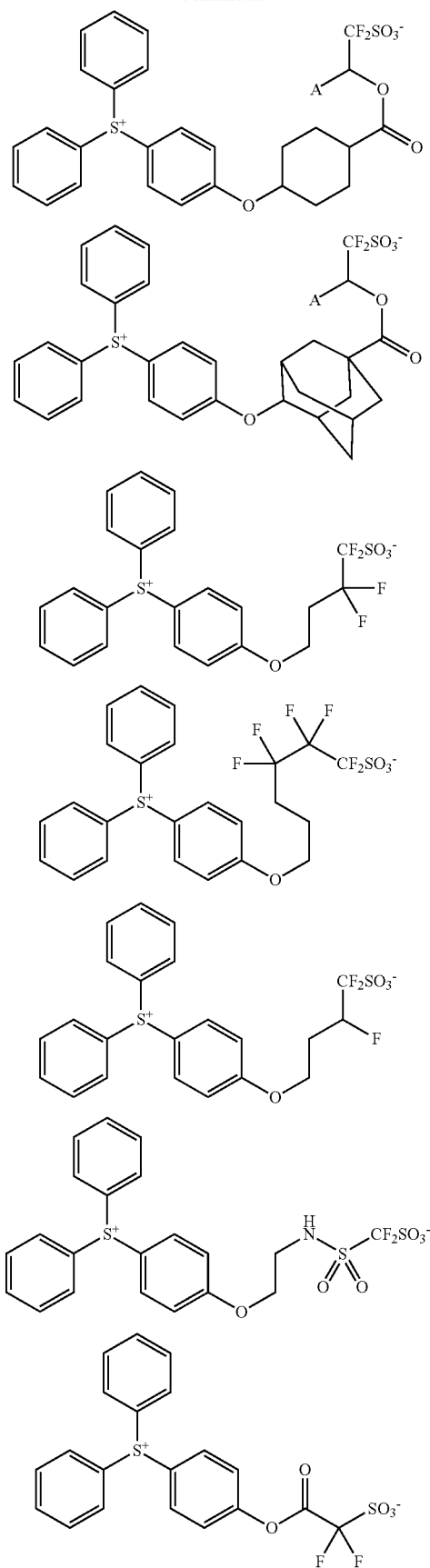

-continued

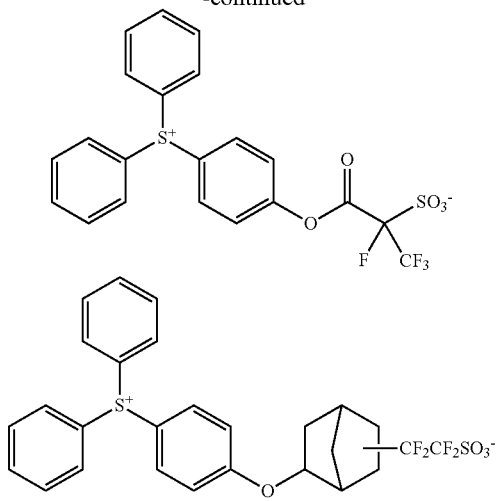

Of the foregoing PAGs, those having an anion of formula (12A') or (12D) are especially preferred because of reduced acid diffusion and high solubility in the resist solvent. Also those having an anion of formula (13') are especially preferred because of extremely reduced acid diffusion.

The acid generator is preferably added in an amount of 0 to 40 parts, more preferably 0.1 to 40 parts, and even more preferably 0.1 to 20 parts by weight per 100 parts by weight of the base resin. This range ensures satisfactory resolution and eliminates the risk of foreign particles being formed on the resist film after development or during stripping.

D. Organic Solvent

The organic solvent (D) used herein is a mixture of (D-1) a first solvent and (D-2) a second solvent. Specifically, the first solvent (D-1) is selected from among $C_5$-$C_8$ ketones, $C_4$-$C_6$ alcohols having at least one group selected from alkoxy, carbonyl and ester groups, $C_3$-$C_6$ ethers having a hydroxyl group or two ether groups, and $C_4$-$C_9$ esters having an ether or hydroxyl group. The second solvent (D-2) is a monocyclic lactone ring-containing $C_6$-$C_9$ compound.

Suitable $C_5$-$C_8$ ketones include cyclohexanone, cyclopentanone, 2-heptanone, and 2-octanone. Suitable $C_4$-$C_6$ alcohols having at least one group selected from alkoxy, carbonyl and ester groups include 3-methoxybutanol, 3-methyl-3-methoxybutanol, 1-methoxy-2-propanol, 1-ethoxy-2-propanol, and diacetone alcohol. Suitable $C_3$-$C_6$ ethers having a hydroxyl group or two ether groups include propylene glycol monomethyl ether, ethylene glycol monomethyl ether, propylene glycol monoethyl ether, ethylene glycol monoethyl ether, propylene glycol dimethyl ether, and diethylene glycol dimethyl ether. Suitable $C_4$-$C_9$ esters having an ether or hydroxyl group include ethylene glycol monoacetate, propylene glycol monoacetate, propylene glycol monomethyl ether acetate, propylene glycol monoethyl ether acetate, propylene glycol monopropyl ether acetate, propylene glycol monobutyl ether acetate, ethyl lactate, ethyl pyruvate, butyl pyruvate, butyl acetate, pentyl acetate, isopentyl acetate, hexyl acetate, methyl 3-methoxypropionate, ethyl 3-methoxypropionate, ethyl 3-ethoxypropionate, t-butyl acetate, t-butyl propionate, and propylene glycol mono-t-butyl ether acetate. These solvents may be used alone or in admixture as the first solvent.

The second solvent is preferably selected from among γ-hexalactone, δ-hexalactone, γ-heptalactone, δ-heptalactone, γ-octalactone, and δ-octalactone, which may be used alone or in admixture.

Due to its high boiling point, the second solvent is effective for retarding the evaporation rate of the solvent. Then the surface segregation rate of the fluorine-containing polymer (A) may be increased.

If a high-boiling lactone is added as a solvent, the high-boiling lactone solvent is left at a high concentration in the resist film nearly at the end of spin coating. While γ-butyrolactone is also a high-boiling solvent, it is so hydrophilic that the fluorine-containing polymer having high water repellency is less soluble therein. When γ-butyrolactone is used as the second solvent, it becomes more concentrated during coating, which causes the fluorine-containing polymer to precipitate, which in turn, causes formation of particle defects and a drop of water slip.

The monocyclic lactone ring-containing $C_6$-$C_9$ compound as the second solvent not only has a higher boiling point than γ-butyrolactone, but is also more hydrophobic due to the alkyl group included therein. Therefore, it has a high ability to dissolve the highly hydrophobic fluorine-containing polymer. For this reason, the second solvent is effective for preventing precipitation of the fluorine-containing polymer after coating and formation of particle defects.

For the purpose of suppressing acid diffusion, JP-A 2011-013479 proposes an acid generator capable of generating a bulky acid and JP-A 2011-016746 proposes a sulfonium salt of intramolecular salt formation type. The latter acid generator of inner salt type is highly effective for suppressing acid diffusion by the mechanism that sulfonic acid generated by photo-decomposition undergoes ion exchange with an undecomposed sulfonium salt to generate a giant acid which is an association between sulfonic acid and sulfonium salt. The acid generator of inner salt type, however, suffers from a low solvent solubility.

The solvents capable of dissolving the acid generator of inner salt type are alcohol and lactone solvents. The second solvent can dissolve not only the fluorine-containing polymer, but also the acid generator of inner salt type, and has a high boiling point and hence, a low evaporation rate, which helps increase the segregation rate of the fluorine-containing polymer toward the resist surface.

Preferably the first solvent is added in an amount of 200 to 5,000 parts by weight, more preferably 500 to 3,000 parts by weight per 100 parts by weight of the base resin. When the first solvent is added in the range, the resist film after spin coating is improved in flatness, and edge cutting becomes clean.

The second solvent should be added in an amount of more than 200 parts to 1,000 parts by weight, preferably 220 to 800 parts by weight per 100 parts by weight of the base resin. When the second solvent is added in the range, the solubility of acid generator and fluorine-containing polymer is improved, and the segregation rate of the fluorine-containing polymer toward the resist film surface after spin coating is accelerated.

In order to dissolve the acid generator of inner salt type, the monocyclic lactone solvent should preferably be added in a rather extra amount in excess of 200 parts by weight per 100 parts by weight of the base resin. However, if more than 1,000 parts by weight of the monocyclic lactone solvent is added, little drying occurs after spin coating. This gives rise to the problem that the resist composition can be blown over the edge even after edge cutting at the final stage of spin coating, interfering with clean edge cutting.

Other Components

To the resist composition comprising the fluorine-containing polymer, base resin, acid generator and organic solvent, any additives such as a quencher, surfactant, dissolution regulator, and acetylene alcohol may be added in any suitable combination, depending on a particular purpose.

As the quencher, basic compounds such as amines are suitable. Exemplary basic compounds include primary, secondary and tertiary amine compounds, specifically amine compounds having a hydroxyl, ether, ester, lactone, cyano or sulfonic ester group, as described in JP-A 2008-111103, paragraphs [0146]-[0164] (U.S. Pat. No. 7,537,880), and compounds having a carbamate group, as described in JP 3790649.

Also useful are quenchers of polymer type as described in JP-A 2008-239918. The polymeric quencher segregates at the resist surface after coating and thus enhances the rectangularity of resist pattern.

Onium salts such as sulfonium salts, iodonium salts and ammonium salts of sulfonic acids which are not fluorinated at α-position as described in JP-A 2008-158339 (US 20080153030) and similar onium salts of carboxylic acids as described in JP 3991462 may be used as the quencher. In case the acid labile group is an acetal group which is very sensitive to acid, the acid for eliminating the protective group need not necessarily be an α-fluorinated sulfonic acid, imide acid or methide acid. Sometimes, deprotection reaction may take place even with α-position non-fluorinated sulfonic acid. In this case, since an onium salt of sulfonic acid cannot be used as the quencher, an onium salt of carboxylic acid is preferably used alone as the quencher.

Exemplary surfactants are described in JP-A 2008-111103, paragraphs [0165]-[0166]. Exemplary dissolution regulators are described in JP-A 2008-122932 (US 2008090172), paragraphs [0155]-[0178], and exemplary acetylene alcohols in paragraphs [0179]-[0182].

Pattern Forming Process

The invention provides a pattern forming process comprising the steps of coating the resist composition onto a substrate, prebake, exposure, and development.

The technique of coating the resist composition is not particularly limited. Any of coating techniques such as spin coating, roll coating, flow coating, dip coating, spray coating, and doctor coating may be used, with spin coating being preferred. Since it is desirable to reduce the amount of the resist composition dispensed for spin coating, preferably the substrate is previously wetted with the resist solvent or a solvent miscible with the resist solvent before the resist composition is dispensed. See JP-A H09-246173, for example. The previous wetting assists in spreading of the resist composition solution over the substrate for thereby saving the amount of the resist composition dispensed for spin coating.

Then a coating of the resist composition on the substrate is prebaked. Prebake may be performed either on a hot plate or in an oven. During coating and prebake steps, the fluorine-containing polymer segregates at the surface. During prebake, the solvent in the resist coating evaporates to dryness. At this point of time, surface segregation of the fluorine-containing polymer is interrupted. When the second solvent is added to retard the evaporation rate of solvent, the surface segregation proportion of the fluorine-containing polymer is increased.

At the end of prebake, the resist film preferably has a thickness of 10 to 500 nm, more preferably 20 to 300 nm.

After the resist film is formed in this way, it is exposed to radiation, typically ArF excimer laser of wavelength 193 nm, EUV of wavelength 3 to 15 nm, or EB.

The ArF excimer laser lithography may be either dry lithography or immersion lithography in water, preferably immersion lithography with water inserted between the lens and the wafer. Now that the resist surface has been improved in water repellency and water slip by the prebake in a solvent atmosphere, the invention has the advantages that the scanning rate is accelerated, the throughput is improved, the amount of resist film leached out into water is reduced, and the projection lens in contact with water is prevented from fogging.

The EUV or EB lithography is carried out in vacuum. During exposure in vacuum, outgassing from the resist film occurs, and outgassed components deposit within the exposure tool. Most outgassed components are decomposition products of the acid generator and acid labile group. Since the fluorine-containing polymer does not contain an acid generator and acid labile group, the surface coverage with the fluorine-containing polymer shuts off outgassing.

The exposure may be followed by PEB if necessary. PEB may be carried out by heating on a hot plate at 60 to 150° C. for 1 to 5 minutes, preferably at 80 to 140° C. for 1 to 3 minutes.

Finally the resist film is developed. For the development, an alkaline developer may be used to form a positive tone pattern. Suitable alkaline developers include aqueous solutions of tetramethylammonium hydroxide (TMAH), tetraethylammonium hydroxide (TEAH), tetrapropylammonium hydroxide (TPAH), and tetrabutylammonium hydroxide (TBAH) in a concentration of 0.1 to 10% by weight, preferably 2 to 5% by weight.

After the development, the patterned resist film may be rinsed with deionized water. An aqueous solution containing a surfactant may also be used as the rinse liquid for preventing pattern collapse.

Alternatively, a negative tone pattern may be formed by organic solvent development. Preferred organic solvents used as the developer include ketones such as 2-octanone, 2-nonanone, 2-heptanone, 3-heptanone, 4-heptanone, 2-hexanone, 3-hexanone, diisobutyl ketone, methylcyclohexanone, acetophenone, and methylacetophenone, and esters such as propyl acetate, butyl acetate, isobutyl acetate, pentyl acetate, isopentyl acetate, butenyl acetate, methyl propionate, ethyl propionate, ethyl 3-ethoxypropionate, propyl formate, butyl formate, isobutyl formate, pentyl formate, isopentyl formate, methyl valerate, methyl pentenoate, methyl crotonate, ethyl crotonate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate. These organic solvents may be used alone or in admixture of two or more.

Optionally, a surfactant may be added to the developer. The surfactant used herein may be selected from the same compounds as the surfactant to be added to the resist composition.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. At the end of development, the resist film may be dried by spinning off the developer, without a need to rinse. In the positive development using an alkaline developer, rinsing is essential because the alkaline developer does not dry up. In the negative development using an organic solvent developer, rinsing is not essential because the developer is liable to dry up.

Specifically, suitable alcohols of 3 to 10 carbon atoms include n-propyl alcohol, isopropyl alcohol, 1-butyl alcohol, 2-butyl alcohol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-s-butyl ether, di-n-pentyl ether, diisopentyl ether, di-s-pentyl ether, di-t-pentyl ether, and di-n-hexyl ether. Suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. The solvents may be used alone or in admixture. Besides the foregoing solvents, aromatic solvents may be used, for example, toluene, xylene, ethylbenzene, isopropylbenzene, t-butylbenzene and mesitylene.

The rinse step is effective for preventing pattern collapse and reducing defect formation.

Either alkaline development or organic solvent development may be performed for 0.1 to 3 minutes, preferably 0.5 to 2 minutes, by any standard techniques such as dip, puddle and spray development, for thereby forming a positive or negative tone pattern of resist film on the substrate.

In addition to the foregoing steps, any extra steps such as etching, resist stripping and cleaning may be included.

EXAMPLE

Examples and Comparative Examples are given below for further illustrating the invention, but they should not be construed as limiting the invention thereto. All parts (pbw) are by weight.

The solvents in Tables are identified below.

PGMEA: propylene glycol monomethyl ether acetate

EEP: ethyl 3-ethoxypropionate

CyH: cyclohexanone

DAA: diacetone alcohol

GBL: γ-butyrolactone

GHexL: γ-hexalactone

GHepL: γ-heptalactone

DHexL: δ-hexalactone

DHepL: δ-heptalactone

FC-4430 is the trade name of a fluorochemical surfactant (3M).

[1] Resist Evaluation by ArF Immersion Lithography

[1-1] Preparation of Resist Composition

Examples 1-1 to 1-4 & Comparative Examples 1-1 to 1-2

Resist compositions were prepared by dissolving Base resin 1, Fluorine-containing polymers 1 to 4, acid generator (PAG1), Quencher 1, and surfactant in a solvent in accordance with the recipe shown in Table 1, and filtering through a polyethylene filter having a pore size of 0.2 μm. The components used herein are identified below. Resist composition A-6 of Comparative Example 1-2 was not filtered because the acid generator did not dissolve in the solvent.

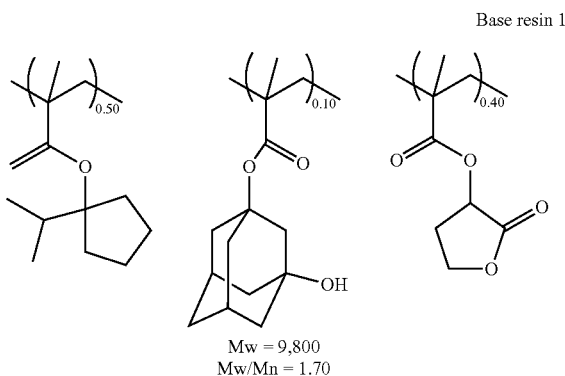

Base resin 1

Mw = 9,800
Mw/Mn = 1.70

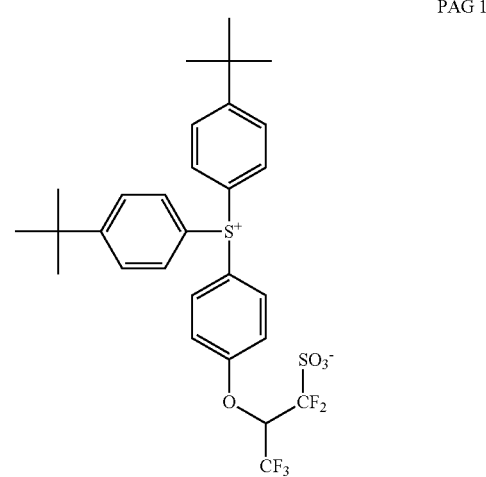

PAG 1

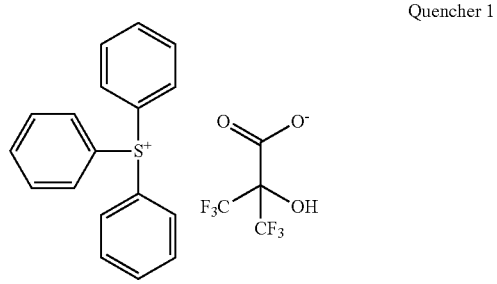

Quencher 1

Fluorine-containing polymer 1

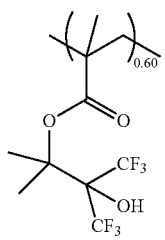 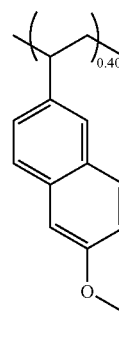

Mw = 7,600
Mw/Mn = 1.89

Fluorine-containing polymer 2

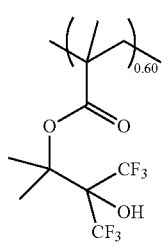 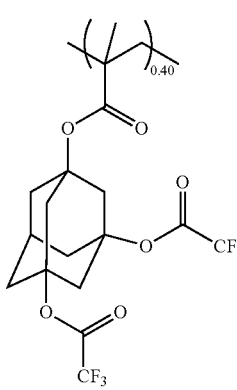

Mw = 9,700
Mw/Mn = 1.69

Fluorine-containing polymer 3

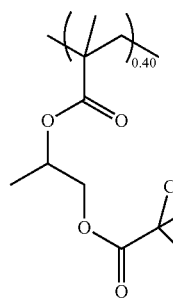 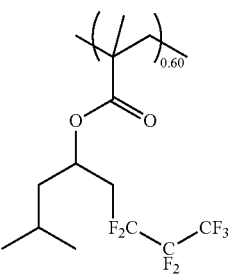

Mw = 10,300
Mw/Mn = 1.88

Fluorine-containing polymer 4

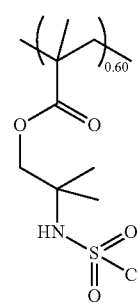 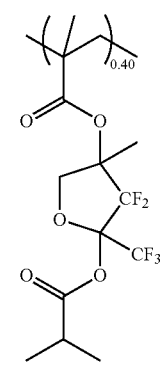

Mw = 10,300
Mw/Mn = 1.88

TABLE 1

|  | Resist composition | Polymer (pbw) | Fluorine-containing polymer (pbw) | Acid generator (pbw) | Quencher (pbw) | Surfactant (pbw) | Solvent 1 (pbw) | Solvent 2 (pbw) |
|---|---|---|---|---|---|---|---|---|
| Example | 1-1 | A-1 | Base resin 1 (100) | Fluorine-containing polymer 1 (11.0) | PAG 1 (6.0) | Quencher 1 (6.0) | FC-4430 (0.001) | PGMEA (1,900) | GHexL (500) |
|  | 1-2 | A-2 | Base resin 1 (100) | Fluorine-containing polymer 2 (8.0) | PAG 1 (6.0) | Quencher 1 (6.0) | FC-4430 (0.001) | PGMEA (1,400) DAA (700) | DHexL (220) |
|  | 1-3 | A-3 | Base resin 1 (100) | Fluorine-containing polymer 3 (8.0) | PAG 1 (6.0) | Quencher 1 (6.0) | FC-4430 (0.001) | EEP (2,000) | GHepL (250) |
|  | 1-4 | A-4 | Base resin 1 (100) | Fluorine-containing polymer 4 (8.0) | PAG 1 (6.0) | Quencher 1 (6.0) | FC-4430 (0.001) | PGMEA (1,500) CyH (500) | DHepL (250) |
| Comparative Example | 1-1 | A-5 | Base resin 1 (100) | Fluorine-containing polymer 1 (8.0) | PAG 1 (6.0) | Quencher 1 (6.0) | FC-4430 (0.001) | PGMEA (2,000) | GBL (500) |
|  | 1-2 | A-6 | Base resin 1 (100) | Fluorine-containing polymer 1 (8.0) | PAG 1 (6.0) | Quencher 1 (6.0) | FC-4430 (0.001) | PGMEA (2,450) | GBL (50) |

[1-2] Evaluation of Resist Film—Measurement of Sliding Angle and Receding Contact Angle

Examples 2-1 to 2-4 & Comparative Example 2-1

Using a coater/developer system Clean Track ACT-8 (Tokyo Electron Ltd.), each of the resist compositions in Examples 1-1 to 1-4 and Comparative Example 1-1 was spin coated onto a silicon substrate and prebaked at the temperature shown in Table 2 for 60 seconds to form a resist film of 90 nm thick.

A contact angle with water of the resist film was measured, using an inclination contact angle meter Drop Master 500 (Kyowa Interface Science Co., Ltd.). Specifically, the wafer coated with the resist film was kept horizontal, and 50 µL of pure water was dropped on the resist film to form a droplet. While the wafer was gradually inclined, the angle (sliding angle) at which the droplet started sliding down was determined as well as receding contact angle. The results are shown in Table 2.

TABLE 2

|  |  | Resist composition | PB temp. (° C.) | Sliding angle (°) | Receding contact angle (°) |
|---|---|---|---|---|---|
| Example | 2-1 | A-1 | 110 | 6 | 82 |
|  | 2-2 | A-2 | 110 | 6 | 82 |
|  | 2-3 | A-3 | 115 | 6 | 80 |
|  | 2-4 | A-4 | 115 | 8 | 81 |
| Comparative Example | 2-1 | A-5 | 100 | 14 | 73 |

[1-3] ArF Immersion Lithography Patterning Test

Examples 3-1 to 3-4 & Comparative Example 3-1

A spin-on carbon film ODL-102 (Shin-Etsu Chemical Co., Ltd.) was deposited on a silicon wafer to a thickness of 200 nm and a silicon-containing spin-on hard mask film SHB-A940 (Shin-Etsu Chemical Co., Ltd.) was deposited thereon to a thickness of 35 nm. Using a coater/developer system Clean Track ACT-8 (Tokyo Electron Ltd.), each of the resist compositions in Examples 1-1 to 1-4 and Comparative Example 1-1 was spin coated on this substrate for trilayer process, and prebaked (PB) on a hot plate at the temperature shown in Table 3 for 60 seconds to form a resist film of 90 nm thick.

Using an ArF excimer laser immersion lithography scanner NSR-610C (Nikon Corp., NA 1.30, σ 0.98/0.78, dipole opening 20 deg., azimuthally polarized illumination), the resist film was exposed in a varying dose through a 6% halftone phase shift mask. The resist film was baked (PEB) at the temperature shown in Table 3 for 60 seconds and puddle developed in an aqueous solution of 2.38 wt % tetramethylammonium hydroxide for 30 seconds, forming a 40-nm line-and-space pattern. At the end of development, the pattern was measured for LWR by a CD-SEM CG-4000 (Hitachi, Ltd.), with the results shown in Table 3.

TABLE 3

|  |  | Resist composition | PB temp. (° C.) | PEB temp. (° C.) | LWR (nm) |
|---|---|---|---|---|---|
| Example | 3-1 | A-1 | 110 | 95 | 2.1 |
|  | 3-2 | A-2 | 110 | 95 | 2.2 |
|  | 3-3 | A-3 | 115 | 95 | 2.3 |
|  | 3-4 | A-4 | 115 | 95 | 2.3 |
| Comparative Example | 3-1 | A-5 | 100 | 95 | 2.8 |

[2] Resist Evaluation by EB Lithography

[2-1] Preparation of Resist Composition

Examples 4-1 to 4-4 & Comparative Examples 4-1 to 4-3

Resist compositions were prepared by dissolving Base resin 2, Fluorine-containing polymers 5 to 7, Quencher 2, and surfactant in a solvent in accordance with the recipe shown in Table 4, and filtering through a polyethylene filter having a pore size of 0.2 µm. The components used herein are identified below. Resist composition E-7 of Comparative Example 4-3 was not filtered because Base resin 2 (PAG-bound polymer) did not dissolve in the solvent.

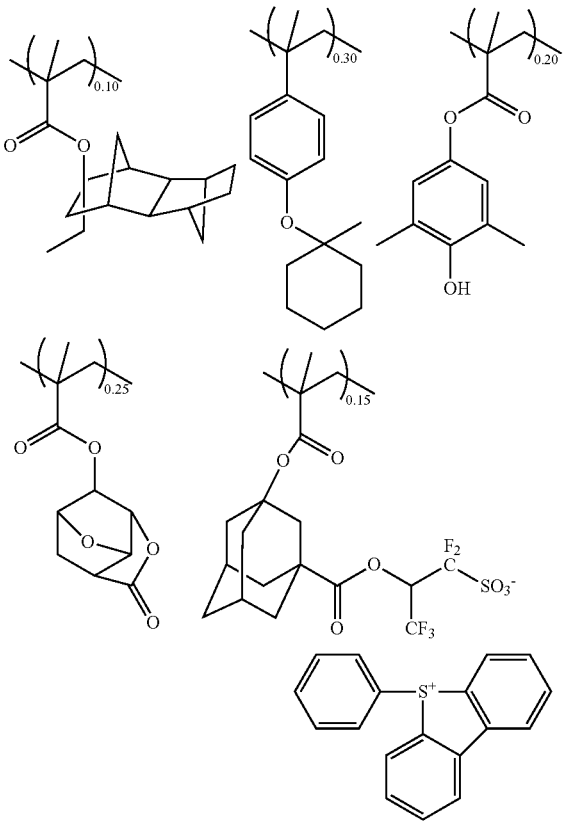

Base resin 2

Mw = 7,800
Mw/Mn = 1.56

Quencher 2

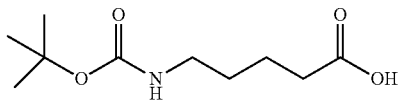

Fluorine-containing polymer 5

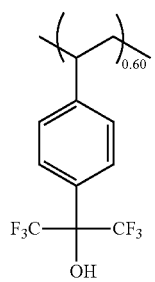

Mw = 7,600
Mw/Mn = 1.89

Fluorine-containing polymer 6

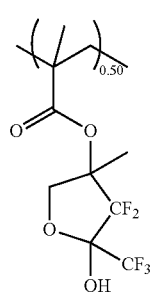 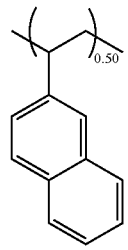

Mw = 8,700
Mw/Mn = 1.69

Fluorine-containing polymer 7

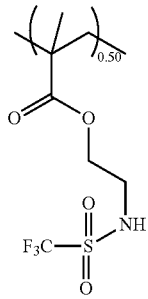 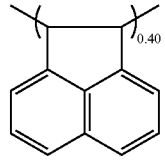

Mw = 8,100
Mw/Mn = 1.61

TABLE 4

|  |  | Resist composition | Polymer (pbw) | Fluorine-containing polymer (pbw) | Quencher (pbw) | Surfactant (pbw) | Solvent 1 (pbw) | Solvent 2 (pbw) |
|---|---|---|---|---|---|---|---|---|
| Example | 4-1 | E-1 | Base resin 2 (100) | Fluorine-containing polymer 5 (11.0) | Quencher 2 (0.5) | FC-4430 (0.001) | PGMEA (1,900) | GHexL (500) |
|  | 4-2 | E-2 | Base resin 2 (100) | Fluorine-containing polymer 6 (8.0) | Quencher 2 (0.5) | FC-4430 (0.001) | PGMEA (1,400) DAA (500) | DHexL (500) |
|  | 4-3 | E-3 | Base resin 2 (100) | Fluorine-containing polymer 7 (8.0) | Quencher 2 (0.5) | FC-4430 (0.001) | EEP (2,000) | GHepL (250) |
|  | 4-4 | E-4 | Base resin 2 (100) | Fluorine-containing polymer 5 (8.0) | Quencher 2 (0.5) | FC-4430 (0.001) | PGMEA (1,500) CyH (500) | DHepL (250) |
| Comparative Example | 4-1 | E-5 | Base resin 2 (100) | Fluorine-containing polymer 5 (8.0) | Quencher 2 (0.5) | FC-4430 (0.001) | PGMEA (2,000) | GBL (500) |
|  | 4-2 | E-6 | Base resin 2 (100) | Fluorine-containing polymer 5 (8.0) | Quencher 2 (0.5) | FC-4430 (0.001) | PGMEA (500) CyH (2,000) | — |
|  | 4-3 | E-7 | Base resin 2 (100) | Fluorine-containing polymer 5 (8.0) | Quencher 2 (0.5) | FC-4430 (0.001) | PGMEA (2,450) | GBL (50) |

[2-2] EB Writing Test

Examples 5-1 to 5-4 & Comparative Example 5-1

Using a coater/developer system Clean Track Mark 5 (Tokyo Electron Ltd.), each of the positive resist compositions in Examples 4-1 to 4-4 and Comparative Example 4-1 was spin coated onto a silicon substrate of diameter 6 inches and prebaked (PB) on a hot plate at the temperature shown in Table 5 for 60 seconds to form a resist film of 90 nm thick. Using a system HL-800D (Hitachi Ltd.) at a HV voltage of 50 keV, the resist film was exposed imagewise to EB in a vacuum chamber.

Using Clean Track Mark 5, immediately after the exposure, the resist film was baked (PEB) on a hot plate at the temperature shown in Table 5 for 60 seconds and puddle developed in a 2.38 wt % TMAH aqueous solution for 30 seconds to form a positive pattern.

A 100-nm line-and-space pattern printed at the exposure dose providing a 1:1 resolution was measured for roughness (LWR) under SEM. The results are shown in Table 5.

TABLE 5

| | | Resist composition | PB temp. (° C.) | PEB temp. (° C.) | LWR (nm) |
|---|---|---|---|---|---|
| Example | 5-1 | E-1 | 110 | 75 | 3.3 |
| | 5-2 | E-2 | 110 | 75 | 3.1 |
| | 5-3 | E-3 | 115 | 75 | 3.1 |
| | 5-4 | E-4 | 115 | 75 | 3.3 |
| Comparative Example | 5-1 | E-5 | 100 | 75 | 4.3 |

Japanese Patent Application No. 2015-130588 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising
(A) a fluorine-containing polymer,
(B) a base resin adapted to increase its solubility in alkaline developer under the action of acid,
(C) an acid generator, and
(D) an organic solvent mixture containing (D-1) a first solvent selected from the group consisting of $C_5$-$C_8$ ketones, $C_4$-$C_6$ alcohols having at least one group selected from alkoxy, carbonyl and ester groups, $C_3$-$C_6$ ethers having a hydroxyl group or two ether groups, and $C_4$-$C_9$ esters having an ether or hydroxyl group, and (D-2) a second solvent which is a monocyclic lactone ring-containing $C_6$-$C_9$ compound, the second solvent being added in an amount of more than 200 parts to 1,000 parts by weight per 100 parts by weight of the base resin.

2. The resist composition of claim 1 wherein
the $C_5$-$C_8$ ketones include cyclohexanone, cyclopentanone, 2-heptanone, and 2-octanone,
the $C_4$-$C_6$ alcohols having at least one group selected from alkoxy, carbonyl and ester groups include 3-methoxybutanol, 3-methyl-3-methoxybutanol, 1-methoxy-2-propanol, 1-ethoxy-2-propanol, and diacetone alcohol,
the $C_3$-$C_6$ ethers having a hydroxyl group or two ether groups include propylene glycol monomethyl ether, ethylene glycol monomethyl ether, propylene glycol monoethyl ether, ethylene glycol monoethyl ether, propylene glycol dimethyl ether, and diethylene glycol dimethyl ether, and
the $C_4$-$C_9$ esters having an ether or hydroxyl group include ethylene glycol monoacetate, propylene glycol monoacetate, propylene glycol monomethyl ether acetate, propylene glycol monoethyl ether acetate, propylene glycol monopropyl ether acetate, propylene glycol monobutyl ether acetate, ethyl lactate, ethyl pyruvate, butyl pyruvate, butyl acetate, pentyl acetate, isopentyl acetate, hexyl acetate, methyl 3-methoxypropionate, ethyl 3-methoxypropionate, ethyl 3-ethoxypropionate, t-butyl acetate, t-butyl propionate, and propylene glycol mono-t-butyl ether acetate.

3. The resist composition of claim 1 wherein the second solvent is at least one member selected from the group consisting of γ-hexalactone, δ-hexalactone, γ-heptalactone, δ-heptalactone, γ-octalactone, and δ-octalactone.

4. The resist composition of claim 1 wherein the fluorine-containing polymer contains an α-trifluoromethylhydroxy group and/or fluorinated hydrocarbon group.

5. The resist composition of claim 4 wherein the fluorine-containing polymer comprises recurring units having the formula (1) and/or recurring units having the formula (2):

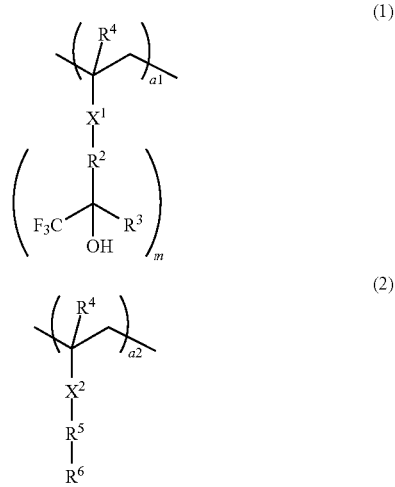

wherein $R^1$ and $R^4$ are each independently hydrogen or methyl,
$R^2$ is a single bond, a straight, branched or cyclic $C_1$-$C_{12}$ alkylene group which may contain an ether, ester or carbonyl moiety, or a phenylene group,
$R^3$ is hydrogen, fluorine, methyl, trifluoromethyl or difluoromethyl, or $R^3$ may bond with $R^2$ to form a ring which may contain an ether, fluorinated alkylene or trifluoromethyl moiety,
$R^5$ is a single bond or a straight, branched or cyclic $C_1$-$C_{12}$ alkylene group which may contain an ether, ester or carbonyl moiety,
$R^6$ is a fluorinated, straight, branched or cyclic $C_1$-$C_{10}$ alkyl or phenyl group, which may contain an ether, ester, sulfone, sulfonic acid ester or sulfonamide moiety,
m is 1 or 2, in case of m=1, $X^1$ is a single bond, phenylene group, —O—, —C(=O)—O—$R^7$— or —C(=O)—NH—$R^7$—, $R^7$ is a straight, branched or cyclic $C_1$-$C_{10}$ alkylene group which may contain an ester or ether moiety, in case of m=2, $X^1$ is benzenetriyl, —C(=O)—O—$R^8$= or —C(=O)—NH—$R^8$=, $R^8$ is an optionally ester or ether-containing, straight, branched or cyclic $C_1$-$C_{10}$ alkylene group, with one hydrogen atom eliminated, $X^2$ is a single bond, phenylene group, —O—, —C(=O)—O—$R^7$— or —C(=O)—NH—$R^7$—, a1 and a2 are numbers satisfying $0 \leq a1 < 1.0$, $0 \leq a2 < 1.0$, and $0.5 \leq a1+a2 \leq 1.0$.

6. The resist composition of claim 1 wherein the base resin comprises recurring units having the formula (7) and/or recurring units having the formula (8):

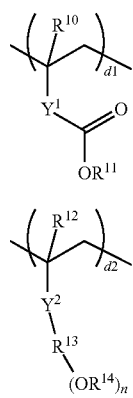

(7)

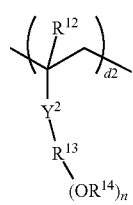

(8)

wherein $R^{10}$ and $R^{12}$ are each independently hydrogen or methyl, $R^{11}$ and $R^{14}$ are each independently an acid labile group, $Y^1$ is a single bond, phenylene, naphthylene or —C(=O)—O—$R^{15}$—, $R^{15}$ is a straight, branched or cyclic $C_1$-$C_{10}$ alkylene group which may contain an ether moiety, ester moiety, lactone ring or hydroxyl moiety, a phenylene group or naphthylene group, $Y^2$ is a single bond, phenylene, naphthylene, —C(=O)—O—$R^{16}$—, —C(=O)—NH—$R^{16}$—, —O—$R^{16}$— or —S—$R^{16}$—, $R^{16}$ is a straight, branched or cyclic $C_1$-$C_{10}$ alkylene group which may contain an ether moiety, ester moiety, lactone ring or hydroxyl moiety, $R^{13}$ is a single bond, a straight, branched or cyclic $C_1$-$C_{16}$ divalent to pentavalent aliphatic hydrocarbon group which may contain an ether or ester moiety, or a phenylene group, d1 and d2 are numbers satisfying $0 \leq d1 < 1.0$, $0 \leq d2 < 1.0$, and $0 < d1+d2 \leq 1.0$, and n is an integer of 1 to 4.

7. The resist composition of claim 1 wherein 0.1 to 15 parts by weight of the fluorine-containing polymer is present per 100 parts by weight of the base resin.

8. A pattern forming process comprising the steps of coating the resist composition of claim 1 onto a substrate, prebaking the composition to form a resist film, exposing the resist film, and developing the exposed resist film.

9. The process of claim 8 wherein the exposure step is to expose the resist film to KrF excimer laser of wavelength 248 nm, ArF excimer laser of wavelength 193 nm, EUV of wavelength 3 to 15 nm, or EB.

10. The process of claim 9 wherein the exposure step is to expose the resist film to ArF excimer laser by immersion lithography.

11. The resist composition of claim 1 wherein the second solvent is at least one member selected from the group consisting of γ-hexalactone, δ-hexalactone, γ-heptalactone, and δ-heptalactone.

12. The resist composition of claim 1 wherein the first solvent is added in an amount of 200 to 5,000 parts by weight per 100 parts by weight of the base resin.

13. The resist composition of claim 1 wherein the acid generator (C) has the formula (13):

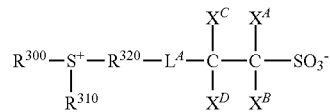

(13)

wherein $R^{300}$ and $R^{310}$ are each independently a straight, branched or cyclic $C_1$-$C_{30}$ monovalent hydrocarbon group which may contain a heteroatom, $R^{320}$ is a straight, branched or cyclic $C_1$-$C_{30}$ divalent hydrocarbon group which may contain a heteroatom, any two or more of $R^{300}$, $R^{310}$ and $R^{320}$ may bond together to form a ring with the sulfur atom to which they are attached, $L^A$ is a single bond, ether group, or a straight, branched or cyclic $C_1$-$C_{20}$ divalent hydrocarbon group which may contain a heteroatom, $X^A$, $X^B$, $X^C$ and $X^D$ are each independently hydrogen, fluorine or trifluoromethyl, with the proviso that at least one of $X^A$, $X^B$, $X^C$ and $X^D$ is fluorine or trifluoromethyl.

* * * * *